(12) United States Patent
Maxim et al.

(10) Patent No.: US 9,954,498 B2
(45) Date of Patent: *Apr. 24, 2018

(54) WEAKLY COUPLED TUNABLE RF RECEIVER ARCHITECTURE

(71) Applicant: Qorvo US, Inc., Greensboro, NC (US)

(72) Inventors: George Maxim, Saratoga, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/587,581

(22) Filed: May 5, 2017

(65) Prior Publication Data

US 2017/0237404 A1 Aug. 17, 2017

Related U.S. Application Data

(60) Division of application No. 14/450,199, filed on Aug. 1, 2014, now Pat. No. 9,705,478, which is a
(Continued)

(51) Int. Cl.
*H03J 3/06* (2006.01)
*H03H 7/01* (2006.01)
(Continued)

(52) U.S. Cl.
CPC ............... *H03F 3/193* (2013.01); *H03F 1/56* (2013.01); *H04B 1/04* (2013.01);
(Continued)

(58) Field of Classification Search
CPC .......... H03H 7/1775; H03H 7/09; H03H 7/38; H03H 2210/012; H03H 2210/02;
(Continued)

(56) References Cited

U.S. PATENT DOCUMENTS 3,465,431 A 9/1969 Henning
3,491,318 A 1/1970 Henning et al.
(Continued)

FOREIGN PATENT DOCUMENTS

EP 0957368 A2 11/1999
EP 1184977 A2 3/2002
(Continued)

OTHER PUBLICATIONS

Non-Final Office Action for U.S. Appl. No. 14/450,204, dated Feb. 1, 2017, 9 pages.
(Continued)

*Primary Examiner* — Pablo Tran
(74) *Attorney, Agent, or Firm* — Withrow & Terranova, P.L.L.C.

(57) ABSTRACT

RF communications circuitry, which includes a first tunable RF filter and a first RF low noise amplifier (LNA) is disclosed. The first tunable RF filter includes a pair of weakly coupled resonators, and receives and filters a first upstream RF signal to provide a first filtered RF signal. The first RF LNA is coupled to the first tunable RF filter, and receives and amplifies an RF input signal to provide an RF output signal.

20 Claims, 62 Drawing Sheets

Related U.S. Application Data continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,614,490.

(60) Provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/031,645, filed on Jul. 31, 2014, provisional application No. 62/011,629, filed on Jun. 13, 2014.

(51) Int. Cl.
  *H03H 7/46* (2006.01)
  *H03F 3/193* (2006.01)
  *H03F 1/56* (2006.01)
  *H04B 1/04* (2006.01)

(52) U.S. Cl.
  CPC .. *H03F 2200/165* (2013.01); *H03F 2200/222* (2013.01); *H03F 2200/294* (2013.01); *H03F 2200/451* (2013.01)

(58) Field of Classification Search
  CPC ........ H03H 2210/04; H03J 3/06; H03J 5/242; H03F 1/565; H03F 3/193; H03F 3/245; H03F 3/68; H03F 3/72; H03F 2200/391; H03F 2203/7209; H03F 2200/111; H03F 2200/267; H03F 2200/451
  See application file for complete search history.

(56) References Cited

U.S. PATENT DOCUMENTS

| | | |
|---|---|---|
| 3,597,709 A | 8/1971 | Rhodes |
| 3,718,874 A | 2/1973 | Cooper, Jr. |
| 3,794,941 A | 2/1974 | Templin |
| 4,361,894 A | 11/1982 | Kurihara et al. |
| 5,339,017 A | 8/1994 | Yang |
| 5,517,083 A | 5/1996 | Whitlock |
| 5,608,363 A | 3/1997 | Cameron et al. |
| 5,661,414 A | 8/1997 | Shigehara et al. |
| 5,689,144 A | 11/1997 | Williams |
| 5,757,247 A | 5/1998 | Koukkari et al. |
| 5,841,330 A | 11/1998 | Wenzel et al. |
| 5,880,620 A | 3/1999 | Gitlin et al. |
| 5,896,073 A | 4/1999 | Miyazaki et al. |
| 5,963,557 A | 10/1999 | Eng |
| 6,215,374 B1 | 4/2001 | Petrovic |
| 6,233,438 B1 | 5/2001 | Wynn |
| 6,239,673 B1 | 5/2001 | Wenzel et al. |
| 6,529,750 B1 | 3/2003 | Zhang et al. |
| 6,664,873 B2 | 12/2003 | Tiihonen |
| 6,801,102 B2 | 10/2004 | Shamsaifar et al. |
| 7,015,870 B2 | 3/2006 | Guitton et al. |
| 7,116,186 B2 | 10/2006 | Chen |
| 7,573,350 B2 | 8/2009 | Frank |
| 7,795,995 B2 | 9/2010 | White et al. |
| 7,809,349 B1 | 10/2010 | Granger-Jones et al. |
| 7,825,751 B2 | 11/2010 | Kawaguchi et al. |
| 8,204,446 B2 | 6/2012 | Scheer et al. |
| 8,314,653 B1 | 11/2012 | Granger-Jones et al. |
| 8,346,179 B2 | 1/2013 | Brunn et al. |
| 8,369,250 B1 | 2/2013 | Khlat |
| 8,626,083 B2 | 1/2014 | Greene et al. |
| 8,736,511 B2 | 5/2014 | Morris, III |
| 8,742,871 B2 | 6/2014 | Jin et al. |
| 8,751,993 B1 | 6/2014 | Fenzi et al. |
| 8,791,769 B2 | 7/2014 | Leong et al. |
| 8,803,632 B2 | 8/2014 | Takeuchi |
| 8,803,634 B2 | 8/2014 | Hanaoka |
| 8,841,983 B2 | 9/2014 | Newton et al. |
| 8,884,714 B2 | 11/2014 | Carey et al. |
| 8,977,216 B2 | 3/2015 | Weissman et al. |
| 9,002,309 B2 | 4/2015 | Sahota et al. |
| 9,054,648 B1 | 6/2015 | Xu |
| 9,094,104 B2 | 7/2015 | Din et al. |
| 9,124,355 B2 | 9/2015 | Black et al. |
| 9,203,455 B2 | 12/2015 | Yang et al. |
| 9,369,162 B2 | 6/2016 | Lo et al. |
| 9,391,650 B2 | 7/2016 | Aparin |
| 9,444,417 B2 | 9/2016 | Maxim et al. |
| 9,628,045 B2 | 4/2017 | Leipold et al. |
| 9,698,751 B2 | 7/2017 | Leipold et al. |
| 2001/0020877 A1 | 9/2001 | Hasegawa et al. |
| 2002/0057139 A1 | 5/2002 | Matsumura et al. |
| 2003/0008577 A1 | 1/2003 | Quigley et al. |
| 2003/0128084 A1 | 7/2003 | Chang et al. |
| 2003/0151409 A1 | 8/2003 | Marek |
| 2003/0155988 A1 | 8/2003 | Douziech et al. |
| 2003/0222732 A1 | 12/2003 | Matthaei |
| 2004/0127178 A1 | 7/2004 | Kuffner |
| 2004/0130414 A1 | 7/2004 | Marquardt et al. |
| 2004/0162042 A1 | 8/2004 | Chen et al. |
| 2004/0196085 A1 | 10/2004 | Shen |
| 2004/0222868 A1 | 11/2004 | Rathgeber et al. |
| 2004/0227578 A1 | 11/2004 | Hamalainen |
| 2004/0266378 A1 | 12/2004 | Fukamachi et al. |
| 2005/0195063 A1 | 9/2005 | Mattsson |
| 2005/0237144 A1 | 10/2005 | Einzinger et al. |
| 2006/0033602 A1 | 2/2006 | Mattsson |
| 2006/0035600 A1 | 2/2006 | Lee et al. |
| 2006/0038635 A1 | 2/2006 | Richiuso et al. |
| 2006/0058629 A1 | 3/2006 | Warntjes et al. |
| 2006/0125465 A1 | 6/2006 | Xiang et al. |
| 2006/0220727 A1 | 10/2006 | Yen |
| 2006/0226943 A1 | 10/2006 | Marques |
| 2006/0261890 A1 | 11/2006 | Floyd et al. |
| 2006/0281431 A1 | 12/2006 | Isaac et al. |
| 2007/0091006 A1 | 4/2007 | Thober et al. |
| 2007/0161361 A1 | 7/2007 | Vaisanen et al. |
| 2007/0182520 A1 | 8/2007 | Kawakubo et al. |
| 2007/0194859 A1 | 8/2007 | Brobston et al. |
| 2007/0241839 A1 | 10/2007 | Taniguchi |
| 2007/0290767 A1 | 12/2007 | Ali-Ahmad et al. |
| 2008/0096516 A1 | 4/2008 | Mun et al. |
| 2008/0122560 A1 | 5/2008 | Liu |
| 2008/0220735 A1 | 9/2008 | Kim et al. |
| 2008/0297299 A1 | 12/2008 | Yun et al. |
| 2009/0058589 A1 | 3/2009 | Chen et al. |
| 2009/0088110 A1 | 4/2009 | Schuur et al. |
| 2009/0134947 A1* | 5/2009 | Tarng ...................... H03B 5/04 331/116 FE |
| 2009/0134953 A1 | 5/2009 | Hunt et al. |
| 2009/0261936 A1 | 10/2009 | Widjaja et al. |
| 2009/0289721 A1 | 11/2009 | Rajendran et al. |
| 2010/0060354 A1 | 3/2010 | Maeda |
| 2010/0144305 A1 | 6/2010 | Cook et al. |
| 2010/0188171 A1 | 7/2010 | Mohajer-Iravani et al. |
| 2010/0283557 A1 | 11/2010 | Taniguchi |
| 2011/0010749 A1 | 1/2011 | Alkan |
| 2011/0103494 A1 | 5/2011 | Ahmadi |
| 2011/0156835 A1 | 6/2011 | Nagai |

(56) References Cited

U.S. PATENT DOCUMENTS

| | | |
|---|---|---|
| 2011/0159834 A1 | 6/2011 | Salvi |
| 2011/0163824 A1 | 7/2011 | Kawano |
| 2011/0169589 A1 | 7/2011 | Franzon et al. |
| 2011/0210787 A1 | 9/2011 | Lee et al. |
| 2011/0241163 A1 | 10/2011 | Liu et al. |
| 2012/0051409 A1 | 3/2012 | Brobston et al. |
| 2012/0081192 A1 | 4/2012 | Hanaoka |
| 2012/0230227 A1 | 9/2012 | Weiss |
| 2012/0249266 A1 | 10/2012 | Lim et al. |
| 2012/0262252 A1 | 10/2012 | Tseng et al. |
| 2012/0286900 A1 | 11/2012 | Kadota et al. |
| 2013/0049902 A1 | 2/2013 | Hendry et al. |
| 2013/0143381 A1 | 6/2013 | Kikukawa |
| 2013/0244591 A1 | 9/2013 | Weissman et al. |
| 2013/0281031 A1 | 10/2013 | Gingrich et al. |
| 2013/0295863 A1 | 11/2013 | Shanan |
| 2014/0015603 A1 | 1/2014 | Scott et al. |
| 2014/0035358 A1 | 2/2014 | Ichikawa |
| 2014/0106698 A1 | 4/2014 | Mi et al. |
| 2014/0113573 A1 | 4/2014 | Khatri et al. |
| 2014/0133189 A1 | 5/2014 | Worek |
| 2014/0141738 A1 | 5/2014 | Janesch |
| 2014/0146737 A1 | 5/2014 | Ohshima et al. |
| 2014/0162712 A1 | 6/2014 | Feld et al. |
| 2014/0167877 A1 | 6/2014 | Shimizu et al. |
| 2014/0192845 A1 | 7/2014 | Szini et al. |
| 2014/0225680 A1 | 8/2014 | Fujiwara et al. |
| 2014/0232467 A1 | 8/2014 | Mukai et al. |
| 2014/0266531 A1 | 9/2014 | Leipold et al. |
| 2014/0285286 A1 | 9/2014 | Bojer |
| 2014/0323046 A1 | 10/2014 | Asai et al. |
| 2014/0323071 A1 | 10/2014 | Liao |
| 2014/0328220 A1 | 11/2014 | Khlat et al. |
| 2014/0361848 A1 | 12/2014 | Leipold et al. |
| 2014/0361849 A1 | 12/2014 | Maxim et al. |
| 2014/0361852 A1 | 12/2014 | Leipold et al. |
| 2014/0364077 A1 | 12/2014 | Maxim et al. |
| 2015/0002240 A1 | 1/2015 | Reiha |
| 2015/0035612 A1 | 2/2015 | Maxim et al. |
| 2015/0035617 A1 | 2/2015 | Leipold et al. |
| 2015/0035622 A1 | 2/2015 | Maxim et al. |
| 2015/0035637 A1 | 2/2015 | Maxim et al. |
| 2015/0038094 A1 | 2/2015 | Maxim et al. |
| 2015/0038101 A1 | 2/2015 | Maxim et al. |
| 2015/0042399 A1 | 2/2015 | Imbornone et al. |
| 2015/0056939 A1* | 2/2015 | Ong .................. H04B 1/109 455/306 |
| 2015/0061680 A1 | 3/2015 | Leskowitz |
| 2015/0065070 A1 | 3/2015 | Maxim et al. |
| 2015/0084699 A1 | 3/2015 | Maxim et al. |
| 2015/0084713 A1 | 3/2015 | Maxim et al. |
| 2015/0084718 A1 | 3/2015 | Maxim et al. |
| 2015/0092625 A1 | 4/2015 | Leipold et al. |
| 2015/0094008 A1 | 4/2015 | Maxim et al. |
| 2015/0102887 A1 | 4/2015 | Park |
| 2015/0116950 A1 | 4/2015 | Yoo et al. |
| 2015/0117280 A1* | 4/2015 | Khlat .................. H04B 1/50 370/297 |
| 2015/0117281 A1* | 4/2015 | Khlat .................. H03H 7/463 370/297 |
| 2016/0126613 A1 | 5/2016 | Leipold et al. |
| 2016/0126623 A1 | 5/2016 | Maxim et al. |
| 2016/0359510 A1 | 12/2016 | Scott et al. |
| 2016/0359511 A1 | 12/2016 | Maxim et al. |
| 2017/0062119 A1 | 3/2017 | Zybura et al. |
| 2017/0084991 A1* | 3/2017 | Mayo .................. H01Q 1/526 |
| 2017/0134058 A1 | 5/2017 | Leipold et al. |

FOREIGN PATENT DOCUMENTS

| | | |
|---|---|---|
| JP | 06082539 A | 3/1994 |
| JP | 07015253 A | 1/1995 |
| JP | 2010141827 A | 6/2010 |
| KR | 100812098 B1 | 3/2008 |
| WO | 0146971 A1 | 6/2001 |
| WO | 2005117255 A1 | 12/2005 |

OTHER PUBLICATIONS

Notice of Allowance and Examiner-Initiated Interview Summary for U.S. Appl. No. 14/450,200, dated Feb. 10, 2017, 8 pages.
Non-Final Office Action for U.S. Appl. No. 14/555,557, dated Feb. 13, 2017, 21 pages.
Non-Final Office Action for U.S. Appl. No. 14/554,975, dated Feb. 16, 2017, 9 pages.
Notice of Allowance for U.S. Appl. No. 15/223,416, dated Feb. 28, 2017, 8 pages.
Non-Final Office Action for U.S. Appl. No. 15/240,420, dated Jan. 26, 2017, 7 pages.
Non-Final Office Action for U.S. Appl. No. 15/241,823, dated Jan. 17, 2017, 6 pages.
Final Office Action for U.S. Appl. No. 14/449,764, dated Mar. 2, 2017, 10 pages.
Corrected Notice of Allowability for U.S. Appl. No. 14/450,200, dated Mar. 1, 2017, 3 pages.
Advisory Action for U.S. Appl. No. 14/215,800, dated Apr. 20, 2017, 2 pages.
Notice of Allowance for U.S. Appl. No. 14/298,863, dated May 31, 2017, 6 pages.
Final Office Action for U.S. Appl. No. 14/450,156, dated Apr. 27, 2017, 12 pages.
Notice of Allowance for U.S. Appl. No. 14/450,028, dated May 3, 2017, 5 pages.
Notice of Allowance and Examiner-Initiated Interview Summary for U.S. Appl. No. 14/449,764, dated May 19, 2017, 8 pages.
Notice of Allowance for U.S. Appl. No. 14/450,204, dated Jun. 28, 2017, 8 pages.
Notice of Allowance for U.S. Appl. No. 14/555,371, dated Mar. 31, 2017, 8 pages.
Notice of Allowance and Examiner-Initiated Inteview Summary for U.S. Appl. No. 14/554,975, dated Jul. 17, 2017, 9 pages.
Notice of Allowance for U.S. Appl. No. 15/240,420, dated May 10, 2017, 8 pages.
Notice of Allowance for U.S. Appl. No. 15/241,823, dated May 9, 2017, 7 pages.
Non-Final Office Action for U.S. Appl. No. 15/587,581, dated Jun. 30, 2017, 6 pages.
Non-Final Office Action for U.S. Appl. No. 15/415,538, dated Jul. 17, 2017, 18 pages.
Hoppenjans, Eric E. et al., "A Vertically Integrated Tunable UHF Filter," International Microwave Symposium Digest (MTT), May 23-28, 2010, Anaheim, California, IEEE, pp. 1380-1383.
Joshi, H. et al., "Tunable high Q narrow-band triplexer," IEEE MTT-S International Microwave Symposium Digest, Jun. 7-12, 2009, Boston, MA, IEEE, pp. 1477-1480.
Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.
International Search Report and Written Opinion for PCT/US2014/030431, dated Jun. 20, 2014, 14 pages.
International Preliminary Report on Patentability for PCT/US/2014/030431, dated Sep. 24, 2015, 10 pages.
Non-Final Office Action for U.S. Appl. No. 14/215,800, dated Nov. 20, 2015, 5 pages.
Final Office Action for U.S. Appl. No. 14/215,800, dated Mar. 11, 2016, 6 pages.
Non-Final Office Action for U.S. Appl. No. 14/215,800, dated Aug. 11, 2016, 6 pages.
Invitation to Pay Additional Fees and, Where Applicable, Protest Fee for PCT/US2014/048608, dated Oct. 21, 2014, 7 pages.
International Search Report and Written Opinion for PCT/US2014/048608, dated Dec. 16, 2014, 18 pages.

(56) References Cited

OTHER PUBLICATIONS

International Preliminary Report on Patentability for PCT/US2014/048608, dated Feb. 11, 2016, 14 pages.
Non-Final Office Action for U.S. Appl. No. 14/298,829, dated Jun. 22, 2015, 8 pages.
Final Office Action for U.S. Appl. No. 14/298,829, dated Feb. 3, 2016, 10 pages.
Notice of Allowance for U.S. Appl. No. 14/298,829, dated May 20, 2016, 9 pages.
Non-Final Office Action for U.S. Appl. No. 14/298,830, dated Dec. 3, 2015, 10 pages.
Notice of Allowance for U.S. Appl. No. 14/298,830, dated Apr. 7, 2016, 9 pages.
Non-Final Office Action for U.S. Appl. No. 14/298,863, dated Jan. 7, 2016, 16 pages.
Final Office Action for U.S. Appl. No. 14/298,863, dated Jun. 3, 2016, 17 pages.
Non-Final Office Action for U.S. Appl. No. 14/449,913, dated Mar. 28, 2016, 15 pages.
Final Office Action for U.S. Appl. No. 14/449,913, dated Sep. 7, 2016, 14 pages.
Non-Final Office Action for U.S. Appl. No. 14/298,852, dated Dec. 22, 2015, 7 pages.
Notice of Allowance for U.S. Appl. No. 14/298,852, dated May 13, 2016, 9 pages.
Notice of Allowance for U.S. Appl. No. 14/298,852, dated Jul. 13, 2016, 9 pages.
Non-Final Office Action for U.S. Appl. No. 14/450,156, dated Mar. 14, 2016, 11 pages.
Non-Final Office Action for U.S. Appl. No. 14/450,156, dated Sep. 15, 2016, 11 pages.
Non-Final Office Action for U.S. Appl. No. 14/450,028, dated Dec. 10, 2015, 11 pages.
Final Office Action for U.S. Appl. No. 14/450,028, dated Mar. 31, 2016, 12 pages.
Advisory Action for U.S. Appl. No. 14/450,028, dated Aug. 2, 2016, 3 pages.
Non-Final Office Action for U.S. Appl. No. 14/449,764, dated May 4, 2016, 12 pages.
Non-Final Office Action for U.S. Appl. No. 14/450,199, dated Apr. 20, 2016, 7 pages.
Notice of Allowance for U.S. Appl. No. 14/450,199, dated Aug. 1, 2016, 7 pages.
Non-Final Office Action for U.S. Appl. No. 14/450,204, dated Apr. 22, 2016, 8 pages.
Non-Final Office Action for U.S. Appl. No. 14/555,053, dated Dec. 31, 2015, 5 pages.
Notice of Allowance for U.S. Appl. No. 14/555,053, dated Apr. 19, 2016, 7 pages.
Non-Final Office Action for U.S. Appl. No. 14/450,200, dated Feb. 29, 2016, 13 pages.
Final Office Action for U.S. Appl. No. 14/450,200, dated Jun. 14, 2016, 13 pages.
Non-Final Office Action for U.S. Appl. No. 14/450,200, dated Sep. 8, 2016, 14 pages.
Non-Final Office Action for U.S. Appl. No. 14/554,943, dated Jun. 30, 2016, 14 pages.
Non-Final Office Action for U.S. Appl. No. 14/555,557, dated Jun. 13, 2016, 28 pages.
Non-Final Office Action for U.S. Appl. No. 14/298,863, dated Sep. 26, 2016, 9 pages.
Non-Final Office Action for U.S. Appl. No. 14/450,028, dated Sep. 26, 2016, 14 pages.
Non-Final Office Action for U.S. Appl. No. 14/449,764, dated Oct. 17, 2016, 10 pages.
Final Office Action for U.S. Appl. No. 14/555,557, dated Sep. 20, 2016, 23 pages.
Non-Final Office Action for U.S. Appl. No. 14/553,371, dated Oct. 25, 2016, 19 pages.
Notice of Allowance for U.S. Appl. No. 14/449,913, dated Dec. 7, 2016, 7 pages.
Notice of Allowance and Examiner-Initiated Interview Summary for U.S. Appl. No. 14/554,943, dated Nov. 16, 2016, 8 pages.
Notice of Allowance for U.S. Appl. No. 15/223,416, dated Dec. 2, 2016, 8 pages.
Final Office Action for U.S. Appl. No. 14/215,800, dated Feb. 8, 2017, 7 pages.
Final Office Action for U.S. Appl. No. 14/298,863, dated Feb. 14, 2017, 10 pages.
Final Office Action for U.S. Appl. No. 14/450,028, dated Jan. 19, 2017, 12 pages.
Non-Final Office Action for U.S. Appl. No. 14/215,800, dated Aug. 15, 2017, 6 pages.
Notice of Allowance for U.S. Appl. No. 14/450,156, dated Oct. 11, 2017, 10 pages.
Supplemental Notice of Allowability for U.S. Appl. No. 14/450,204, dated Aug. 28, 2017, 5 pages.
Notice of Allowance for U.S. Appl. No. 14/554,943, dated Aug. 31, 2017, 7 pages.
Final Office Action for U.S. Appl. No. 14/555,557, dated Aug. 7, 2017, 21 pages.
Notice of Allowance for U.S. Appl. No. 14/215,800, dated Jan. 9, 2018, 8 pages.
Advisory Action for U.S. Appl. No. 14/555,557, dated Nov. 3, 2017, 3 pages.

\* cited by examiner

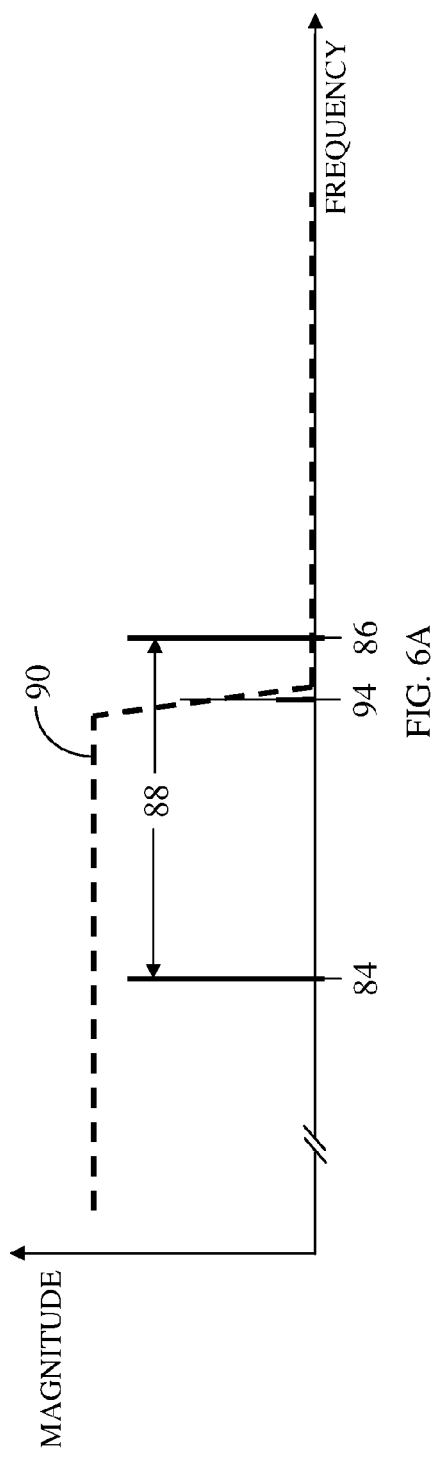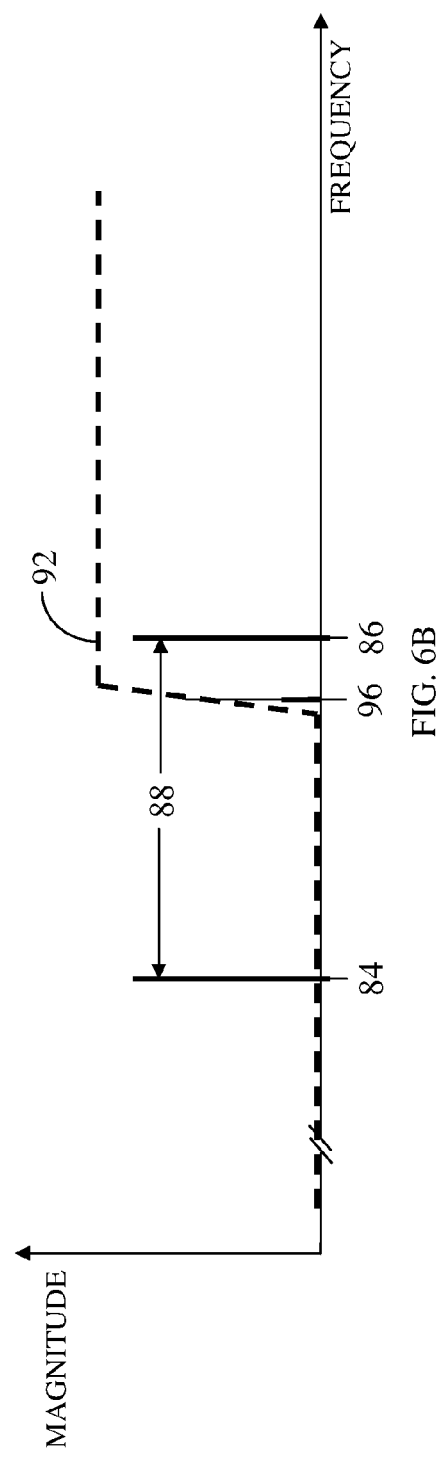

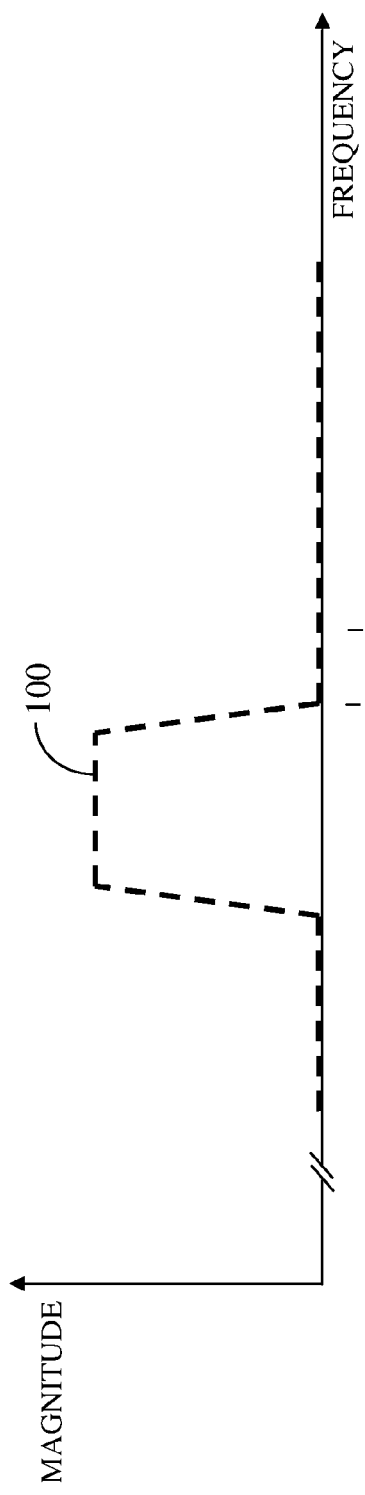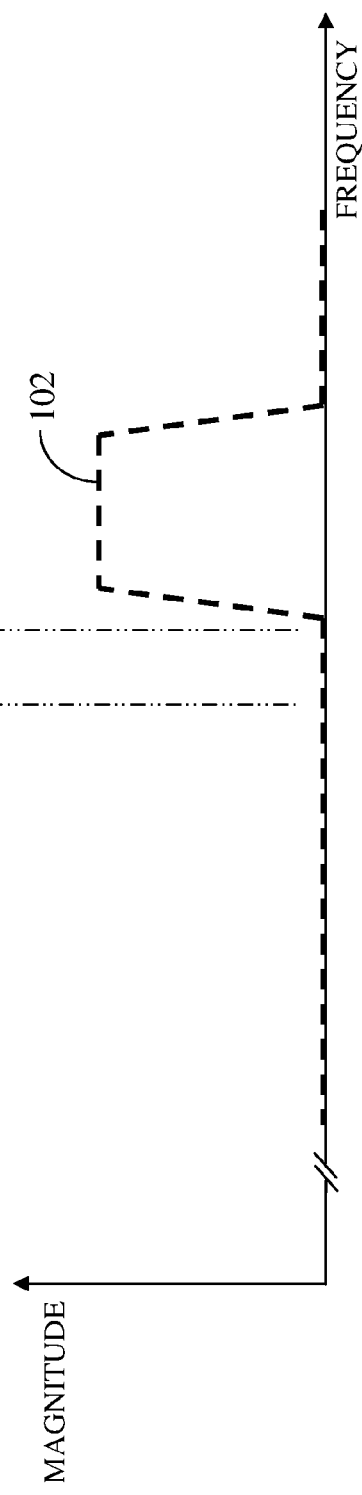

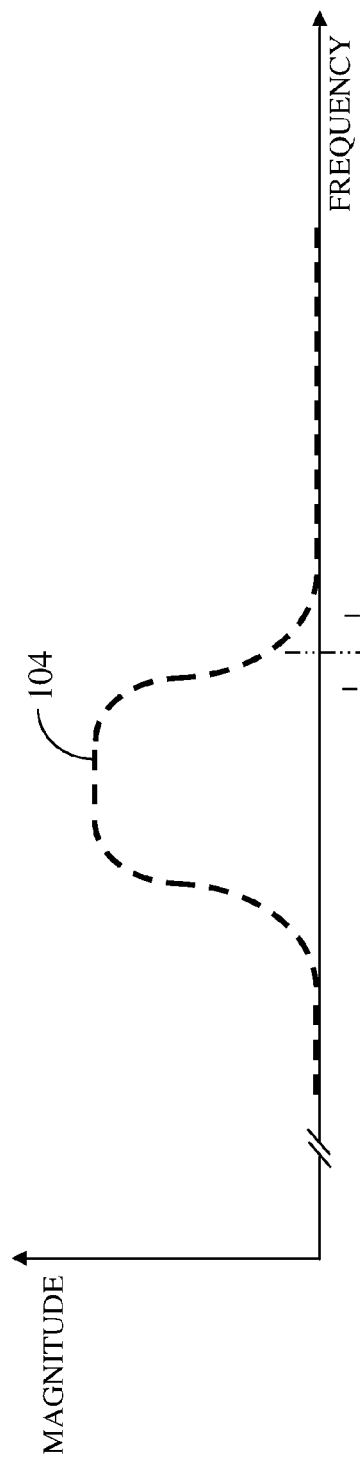
FIG. 10A – Prior Art
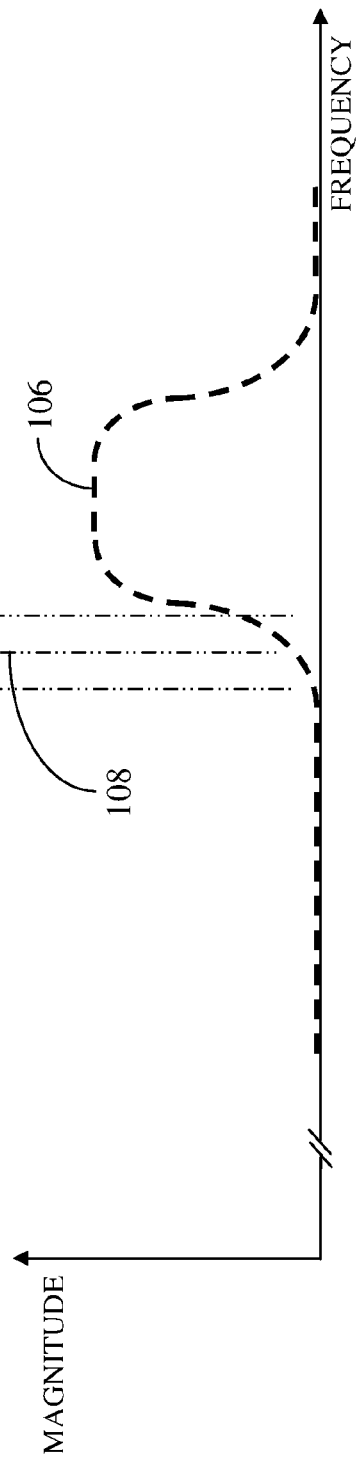
FIG. 10B – Prior Art

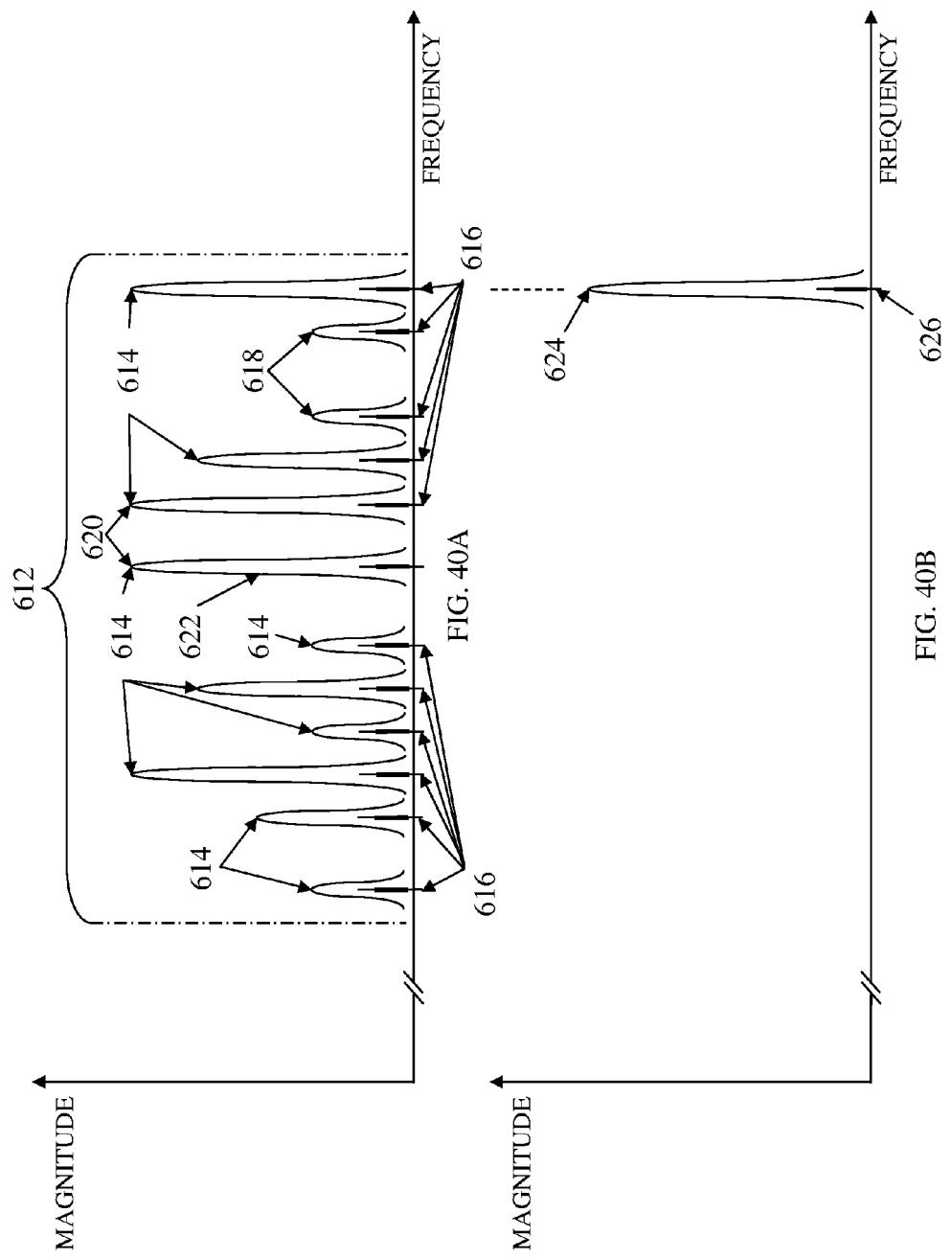

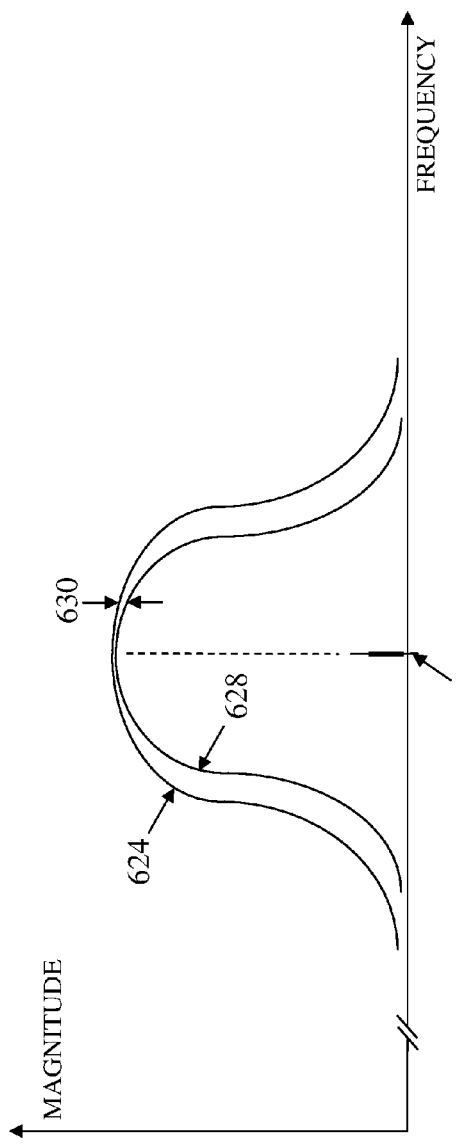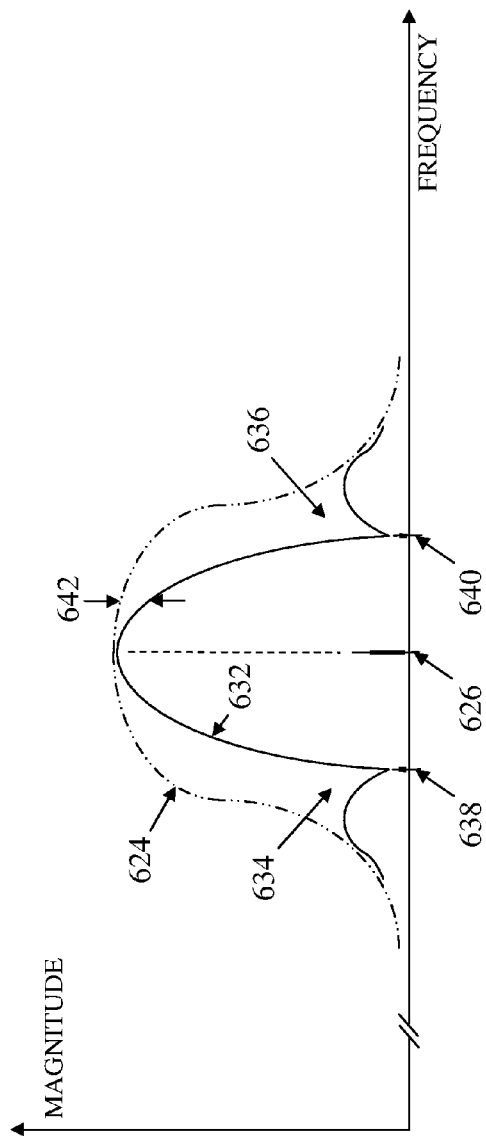

WEAKLY COUPLED TUNABLE RF RECEIVER ARCHITECTURE

RELATED APPLICATIONS

The present application is a divisional of U.S. patent application Ser. No. 14/450,199, filed Aug. 1, 2014, entitled "WEAKLY COUPLED TUNABLE RF RECEIVER ARCHITECTURE, now U.S. Pat. No. 9,705,478, which claims priority to U.S. Provisional Patent Application No. 61/860,932, filed Aug. 1, 2013; U.S. Provisional Patent Application No. 61/909,028, filed Nov. 26, 2013; U.S. Provisional Patent Application No. 61/938,884, filed Feb. 12, 2014; U.S. Provisional Patent Application No. 61/949,581, filed Mar. 7, 2014; U.S. Provisional Patent Application No. 61/951,844, filed Mar. 12, 2014; U.S. Provisional Patent Application No. 61/982,946, filed Apr. 23, 2014; U.S. Provisional Patent Application No. 61/982,952, filed Apr. 23, 2014; U.S. Provisional Patent Application No. 61/982,971, filed Apr. 23, 2014; U.S. Provisional Patent Application No. 62/008,192, filed Jun. 5, 2014; U.S. Provisional Patent Application No. 62/011,629, filed Jun. 13, 2014; and U.S. Provisional Patent Application No. 62/031,645, filed Jul. 31, 2014.

U.S. patent application Ser. No. 14/450,199 claims the benefit of and is a Continuation-in-Part of U.S. patent application Ser. No. 14/298,829, filed Jun. 6, 2014, entitled "TUNABLE RF FILTER STRUCTURE FORMED BY A MATRIX OF WEAKLY COUPLED RESONATORS," now U.S. Pat. No. 9,455,680; U.S. patent application Ser. No. 14/298,830, filed Jun. 6, 2014, entitled "TUNABLE RF FILTER PATHS FOR TUNABLE RF FILTER STRUCTURES," now U.S. Pat. No. 9,419,578; U.S. patent application Ser. No. 14/298,834, filed Jun. 6, 2014, entitled "HIGH QUALITY FACTOR INTERCONNECT FOR RF CIRCUITS," now U.S. Pat. No. 9,893,710; U.S. patent application Ser. No. 14/298,872, filed Jun. 6, 2014, entitled "NONLINEAR CAPACITANCE LINEARIZATION," now U.S. Pat. No. 9,484,879; U.S. patent application Ser. No. 14/298,863, filed Jun. 6, 2014, entitled "TUNABLE RF FILTER BASED RF COMMUNICATIONS SYSTEM," now U.S. Pat. No. 9,866,197; and U.S. patent application Ser. No. 14/298,852, filed Jun. 6, 2014, entitled "MULTI-BAND INTERFERENCE OPTIMIZATION," Now U.S. Pat. No. 9,614,490.

All of the applications listed above are hereby incorporated herein by reference in their entireties.

FIELD OF THE DISCLOSURE

Embodiments of the present disclosure relate to radio frequency (RF) communications systems, which may include RF front-end circuitry, RF transceiver circuitry, RF amplifiers, direct current (DC)-DC converters, RF filters, RF antennas, RF switches, RF combiners, RF splitters, the like, or any combination thereof.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, flexible, and efficient as is practical. Thus, there is a need for RF circuitry in a communications device that is low cost, small, simple, flexible, and efficient.

SUMMARY

RF communications circuitry, which includes a first tunable RF filter and a first RF low noise amplifier (LNA), is disclosed according to one embodiment of the present disclosure. The first tunable RF filter includes a pair of weakly coupled resonators, and receives and filters a first upstream RF signal to provide a first filtered RF signal. The first RF LNA is coupled to the first tunable RF filter, and receives and amplifies an RF input signal to provide an RF output signal.

In one embodiment of the RF communications circuitry, the RF communications circuitry includes an RF receiver, which includes the first tunable RF filter and the first RF LNA. In some embodiments of the first tunable RF filter, the first tunable RF filter provides impedance matching, noise filtering, harmonic rejection, the like, or any combination thereof.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 6A and 6B are graphs illustrating filtering characteristics of the first tunable RF filter path and the second tunable RF filter path, respectively, illustrated in FIG. 4 according to an alternate embodiment of the first tunable RF filter path and the second tunable RF filter path, respectively.

FIGS. 9A and 9B are graphs illustrating filtering characteristics of the first tunable RF filter path and the second tunable RF filter path, respectively, illustrated in FIG. 8 according to an additional embodiment of the first tunable RF filter path and the second tunable RF filter path.

FIGS. 10A and 10B are graphs illustrating filtering characteristics of a first traditional RF duplexer and a second traditional RF duplexer, respectively, illustrated in FIG. 3 according to the prior art.

FIG. 40A is a graph illustrating a profile of an RF communications band of interest according to one embodiment of the RF communications band.

FIG. 40B is a graph illustrating a first bandpass filter response of the first tunable RF receive filter shown in FIG. 38 according to one embodiment of the first tunable RF receive filter.

FIG. 41A is a graph illustrating the first bandpass filter response and a second bandpass filter response of the first tunable RF receive filter shown in FIG. 38 according to one embodiment of the first tunable RF receive filter.

FIG. 41B is a graph illustrating the first bandpass filter response and a third bandpass filter response of the first tunable RF receive filter shown in FIG. 38 according to one embodiment of the first tunable RF receive filter.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

RF communications circuitry, which includes a first RF filter structure, is disclosed according to a first embodiment of the present disclosure. The first RF filter structure includes a first tunable RF filter path and a second tunable RF filter path. The first tunable RF filter path includes a pair of weakly coupled resonators. Additionally, a first filter parameter of the first tunable RF filter path is tuned based on a first filter control signal. A first filter parameter of the second tunable RF filter path is tuned based on a second filter control signal.

In one embodiment of the first RF filter structure, the first tunable RF filter path is directly coupled between a first common connection node and a first connection node. The second tunable RF filter path is directly coupled between a second connection node and the first common connection node.

In one embodiment of the RF communications system, the first tunable RF filter path and the second tunable RF filter path do not significantly load one another at frequencies of interest. As such, by directly coupling the first tunable RF filter path and the second tunable RF filter path to the first common connection node; front-end RF switching elements may be avoided, thereby reducing cost, size, and non-linearity; and increasing efficiency and flexibility of the RF communications system. In one embodiment of the RF communications system, the first common connection node is coupled to an antenna.

Embodiments of the RF communications system include frequency division duplex (FDD) applications, time division duplex (TDD) applications, carrier-aggregation (CA) applications, multiple antenna applications, MIMO applications, hybrid applications, applications supporting multiple communications bands, the like, or any combination thereof.

Figure 1:
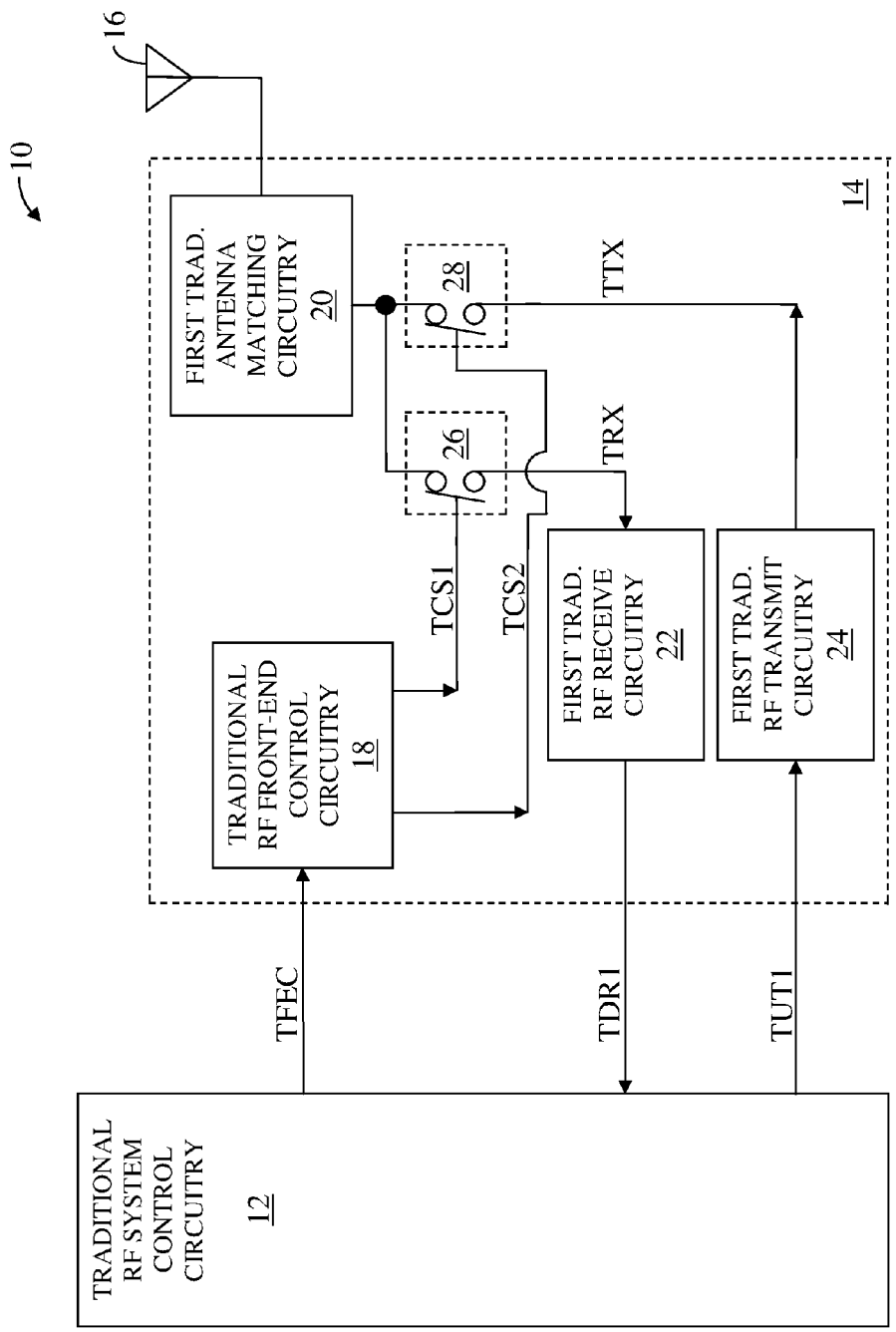
FIG. 1 shows traditional communications circuitry according to the prior art.

FIG. 1 shows traditional communications circuitry 10 according to the prior art. The traditional communications circuitry 10 illustrated in FIG. 1 is a time-division duplex (TDD) system, which is capable of transmitting and receiving RF signals, but not simultaneously. Such a system may also be called a half-duplex system. Additionally, the traditional communications circuitry 10 may be used as a simplex system, which is a system that only transmits RF signals or only receives RF signals. Traditional communications systems often use fixed frequency filters. As a result, to cover multiple communications bands, switching elements are needed to select between different signal paths.

The traditional communications circuitry 10 includes traditional RF system control circuitry 12, traditional RF front-end circuitry 14, and a first RF antenna 16. The traditional RF front-end circuitry 14 includes traditional RF front-end control circuitry 18, first traditional antenna matching circuitry 20, first traditional RF receive circuitry 22, first traditional RF transmit circuitry 24, a first traditional RF switch 26, and a second traditional RF switch 28. The first traditional RF switch 26 is coupled between the first traditional antenna matching circuitry 20 and the first traditional RF receive circuitry 22. The second traditional RF switch 28 is coupled between the first traditional antenna matching circuitry 20 and the first traditional RF transmit circuitry 24. The first RF antenna 16 is coupled to the first traditional antenna matching circuitry 20. The first traditional antenna matching circuitry 20 provides at least partial impedance matching between the first RF antenna 16 and either the first traditional RF receive circuitry 22 or the first traditional RF transmit circuitry 24.

The traditional RF system control circuitry 12 provides the necessary control functions needed to facilitate RF communications between the traditional communications circuitry 10 and other RF devices. The traditional RF system control circuitry 12 processes baseband signals needed for the RF communications. As such, the traditional RF system control circuitry 12 provides a first traditional upstream transmit signal TUT1 to the first traditional RF transmit circuitry 24. The first traditional upstream transmit signal TUT1 may be a baseband transmit signal, an intermediate frequency (IF) transmit signal, or an RF transmit signal. Conversely, the traditional RF system control circuitry 12 receives a first traditional downstream receive signal TDR1 from the first traditional RF receive circuitry 22. The first traditional downstream receive signal TDR1 may be a baseband receive signal, an IF receive signal, or an RF receive signal.

The first traditional RF transmit circuitry 24 may include up-conversion circuitry, amplification circuitry, power supply circuitry, filtering circuitry, switching circuitry, combining circuitry, splitting circuitry, dividing circuitry, clocking circuitry, the like, or any combination thereof. Similarly, the first traditional RF receive circuitry 22 may include down-conversion circuitry, amplification circuitry, power supply circuitry, filtering circuitry, switching circuitry, combining circuitry, splitting circuitry, dividing circuitry, clocking circuitry, the like, or any combination thereof.

The traditional RF system control circuitry 12 provides a traditional front-end control signal TFEC to the traditional RF front-end control circuitry 18. The traditional RF front-end control circuitry 18 provides a first traditional switch control signal TCS1 and a second traditional switch control signal TCS2 to the first traditional RF switch 26 and the second traditional RF switch 28, respectively, based on the traditional front-end control signal TFEC. As such, the traditional RF system control circuitry 12 controls the first traditional RF switch 26 and the second traditional RF switch 28 via the traditional front-end control signal TFEC. The first traditional RF switch 26 is in one of an ON state and an OFF state based on the first traditional switch control signal TCS1. The second traditional RF switch 28 is in one of an ON state and an OFF state based on the second traditional switch control signal TCS2.

Half-duplex operation of the traditional communications circuitry 10 is accomplished using the first traditional RF switch 26 and the second traditional RF switch 28. When the traditional communications circuitry 10 is transmitting RF signals via the first RF antenna 16, the first traditional RF switch 26 is in the OFF state and the second traditional RF switch 28 is in the ON state. As such, the first traditional antenna matching circuitry 20 is electrically isolated from the first traditional RF receive circuitry 22 and the first traditional antenna matching circuitry 20 is electrically coupled to the first traditional RF transmit circuitry 24. In this regard, the traditional RF system control circuitry 12 provides the first traditional upstream transmit signal TUT1 to the first traditional RF transmit circuitry 24, which provides a traditional transmit signal TTX to the first RF antenna 16 via the second traditional RF switch 28 and the first traditional antenna matching circuitry 20 based on the first traditional upstream transmit signal TUT1.

When the traditional communications circuitry 10 is receiving RF signals via the first RF antenna 16, the first traditional RF switch 26 is in the ON state and the second traditional RF switch 28 is in the OFF state. As such, the first traditional antenna matching circuitry 20 is isolated from the first traditional RF transmit circuitry 24 and the first traditional antenna matching circuitry 20 is electrically coupled to the first traditional RF receive circuitry 22. In this regard, the first traditional antenna matching circuitry 20 receives the RF signals from the first RF antenna 16 and forwards the RF signals via the first traditional RF switch 26 to the first traditional RF receive circuitry 22. The first traditional RF switch 26 provides a traditional receive signal TRX to the first traditional RF receive circuitry 22, which provides a first traditional downstream receive signal TDR1 to the traditional RF system control circuitry 12 based on the traditional receive signal TRX.

Since the traditional communications circuitry 10 illustrated in FIG. 1 is a half-duplex system, during operation, the first traditional RF switch 26 and the second traditional RF switch 28 are not simultaneously in the ON state. Therefore, the first traditional RF receive circuitry 22 and the first traditional RF transmit circuitry 24 are isolated from one another. As such, the first traditional RF receive circuitry 22 and the first traditional RF transmit circuitry 24 are prevented from interfering with one another.

Figure 2:
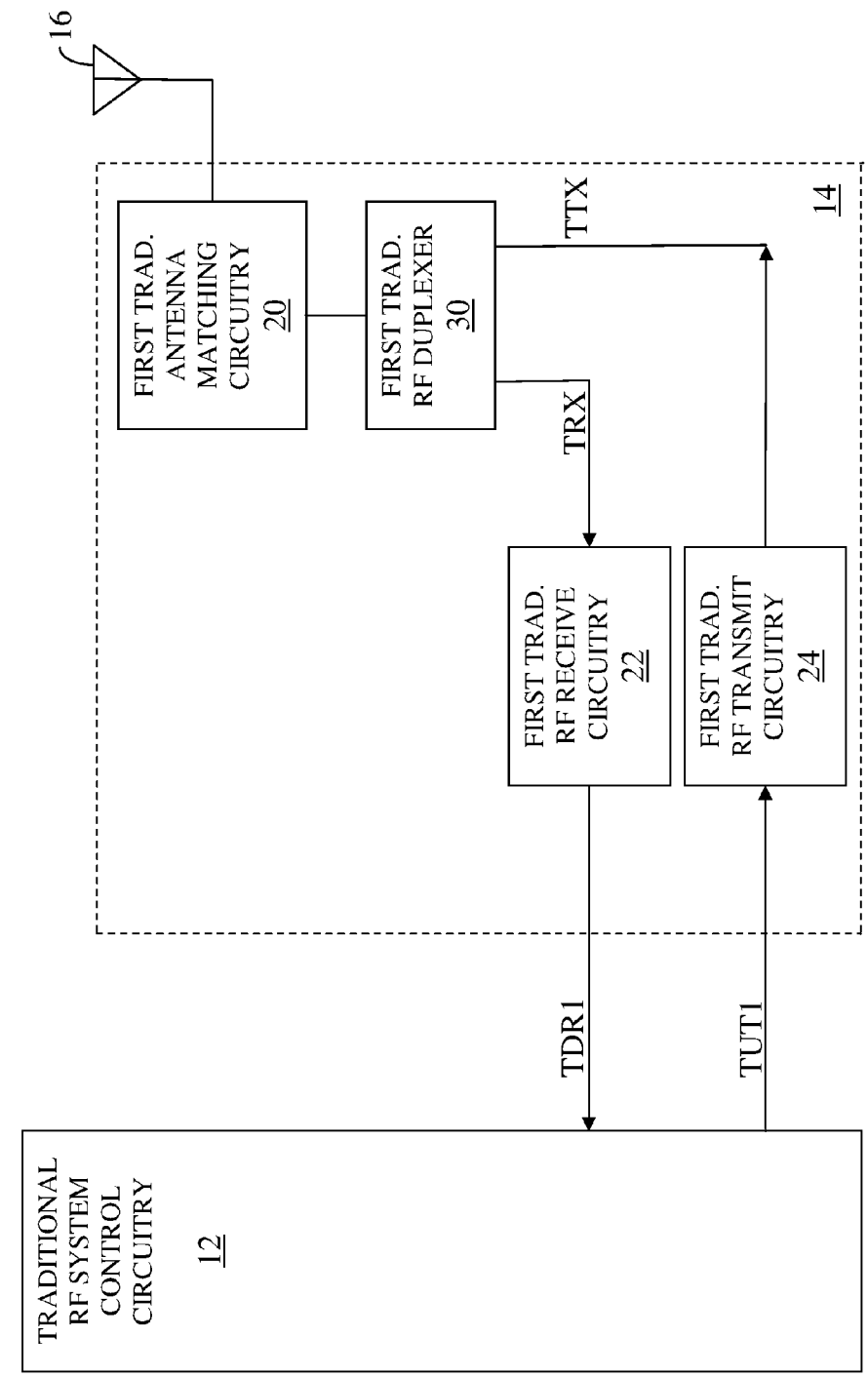
FIG. 2 shows the traditional communications circuitry according to the prior art.

FIG. 2 shows the traditional communications circuitry 10 according to the prior art. The traditional communications circuitry 10 illustrated in FIG. 2 is similar to the traditional communications circuitry 10 illustrated in FIG. 1, except in the traditional communications circuitry 10 illustrated in FIG. 2, the traditional RF front-end control circuitry 18, the first traditional RF switch 26, and the second traditional RF switch 28 are omitted, and the traditional RF front-end circuitry 14 further includes a first traditional RF duplexer 30. The first traditional RF duplexer 30 is coupled between the first traditional antenna matching circuitry 20 and the first traditional RF receive circuitry 22, and is further coupled between the first traditional antenna matching circuitry 20 and the first traditional RF transmit circuitry 24.

The traditional communications circuitry 10 illustrated in FIG. 2 may be used as a TDD system or a simplex system. However, the traditional communications circuitry 10 illustrated in FIG. 2 may also be used as a frequency-division duplex (FDD) system, which is capable of transmitting and receiving RF signals simultaneously. Such a system may also be called a full-duplex system.

When the traditional communications circuitry 10 is transmitting RF signals via the first RF antenna 16, the traditional RF system control circuitry 12 provides the first traditional upstream transmit signal TUT1 to the first traditional RF transmit circuitry 24, which provides the traditional transmit signal TTX to the first RF antenna 16 via first traditional RF duplexer 30 based on the first traditional upstream transmit signal TUT1.

When the traditional communications circuitry 10 is receiving RF signals via the first RF antenna 16, the first traditional antenna matching circuitry 20 receives the RF signals from the first RF antenna 16 and forwards the RF signals via the first traditional RF duplexer 30 to the first traditional RF receive circuitry 22. As such, the first traditional RF duplexer 30 provides the traditional receive signal TRX to the first traditional RF receive circuitry 22, which provides the first traditional downstream receive signal TDR1 to the traditional RF system control circuitry 12 based on the traditional receive signal TRX.

The first traditional RF duplexer 30 provides filtering, such that the first traditional RF receive circuitry 22 and the first traditional RF transmit circuitry 24 are substantially isolated from one another. As such, the first traditional RF receive circuitry 22 and the first traditional RF transmit circuitry 24 are prevented from interfering with one another. Traditional FDD systems using duplexers with high rejection ratios have a fixed frequency transfer. Covering multiple communications bands requires multiple duplexers and switches to route RF signals through appropriate signal paths.

Figure 3:
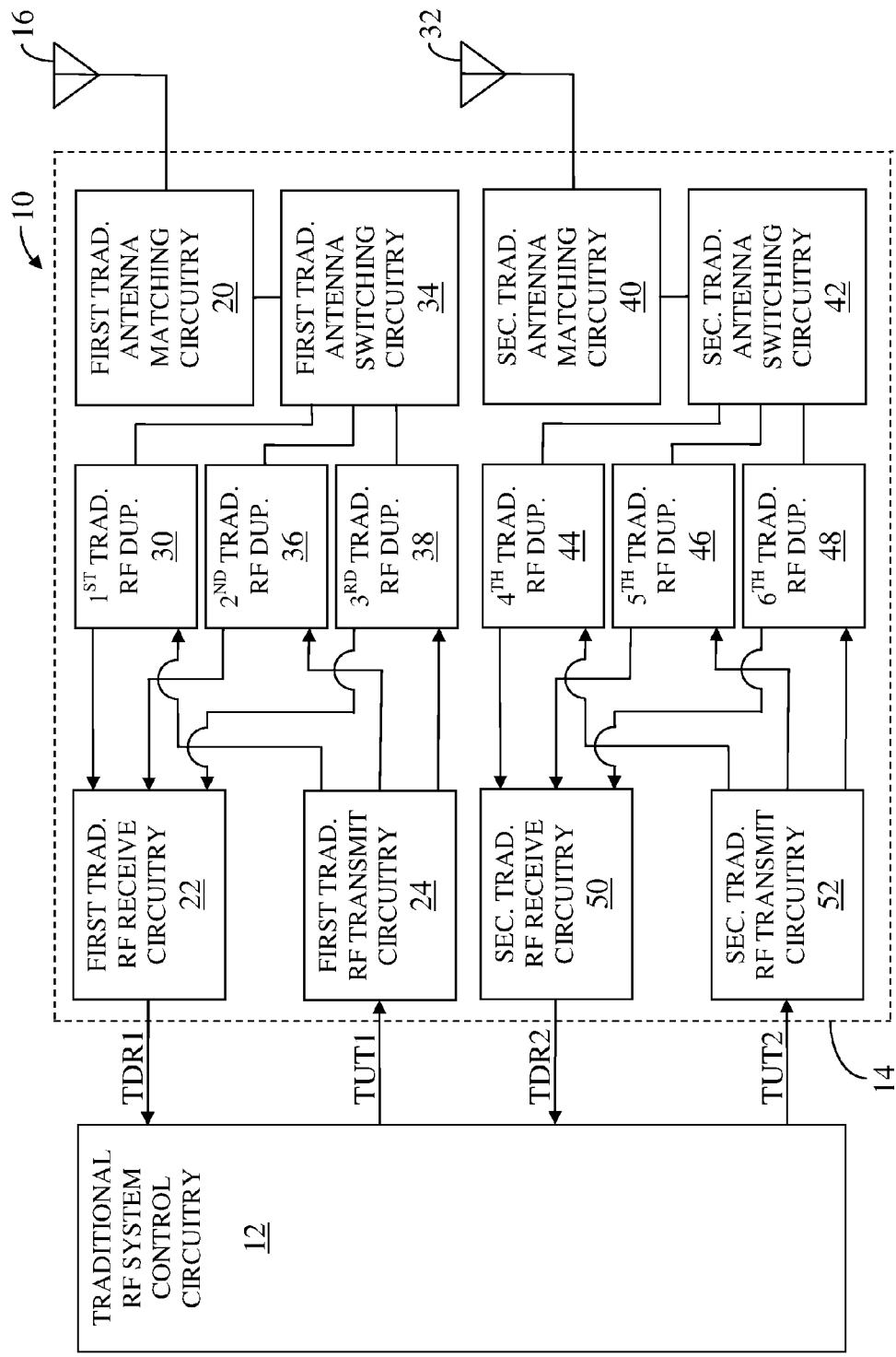
FIG. 3 shows the traditional communications circuitry according to the prior art.

FIG. 3 shows the traditional communications circuitry 10 according to the prior art. The traditional communications circuitry 10 illustrated in FIG. 3 is a carrier aggregation (CA) based system, which is capable of transmitting or receiving multiple simultaneous transmit signals or multiple simultaneous receive signals, respectively, or both. Each of the simultaneous transmit signals is in a frequency band that is different from each frequency band of a balance of the simultaneous transmit signals. Similarly, each of the simultaneous receive signals is in a frequency band that is different from each frequency band of a balance of the simultaneous receive signals. The traditional communications circuitry 10 may operate as a simplex system, a half-duplex system, or a full-duplex system.

The traditional communications circuitry 10 includes the traditional RF system control circuitry 12, the traditional RF front-end circuitry 14, the first RF antenna 16, and a second RF antenna 32. The traditional RF front-end circuitry 14 includes the first traditional antenna matching circuitry 20, the first traditional RF receive circuitry 22, the first traditional RF transmit circuitry 24, the first traditional RF duplexer 30, first traditional antenna switching circuitry 34, a second traditional RF duplexer 36, a third traditional RF duplexer 38, second traditional antenna matching circuitry 40, second traditional antenna switching circuitry 42, a fourth traditional RF duplexer 44, a fifth traditional RF duplexer 46, a sixth traditional RF duplexer 48, second traditional RF receive circuitry 50, and second traditional RF transmit circuitry 52. Traditional CA systems use fixed frequency filters and diplexers, triplexers, or both to combine signal paths, which increases complexity. Alternatively, additional switch paths may be used, but may degrade performance.

The first traditional antenna matching circuitry 20 is coupled between the first RF antenna 16 and the first traditional antenna switching circuitry 34. The second traditional antenna matching circuitry 40 is coupled between the second RF antenna 32 and the second traditional antenna switching circuitry 42. The first traditional RF duplexer 30 is coupled between the first traditional antenna switching circuitry 34 and the first traditional RF receive circuitry 22, and is further coupled between the first traditional antenna switching circuitry 34 and the first traditional RF transmit circuitry 24. The second traditional RF duplexer 36 is coupled between the first traditional antenna switching circuitry 34 and the first traditional RF receive circuitry 22, and is further coupled between the first traditional antenna switching circuitry 34 and the first traditional RF transmit circuitry 24. The third traditional RF duplexer 38 is coupled between the first traditional antenna switching circuitry 34 and the first traditional RF receive circuitry 22, and is further coupled between the first traditional antenna switching circuitry 34 and the first traditional RF transmit circuitry 24.

The fourth traditional RF duplexer 44 is coupled between the second traditional antenna switching circuitry 42 and the second traditional RF receive circuitry 50, and is further coupled between the second traditional antenna switching circuitry 42 and the second traditional RF transmit circuitry 52. The fifth traditional RF duplexer 46 is coupled between the second traditional antenna switching circuitry 42 and the second traditional RF receive circuitry 50, and is further coupled between the second traditional antenna switching circuitry 42 and the second traditional RF transmit circuitry 52. The sixth traditional RF duplexer 48 is coupled between the second traditional antenna switching circuitry 42 and the second traditional RF receive circuitry 50, and is further coupled between the second traditional antenna switching circuitry 42 and the second traditional RF transmit circuitry 52.

The first traditional RF duplexer 30 is associated with a first aggregated receive band, a first aggregated transmit band, or both. The second traditional RF duplexer 36 is associated with a second aggregated receive band, a second aggregated transmit band, or both. The third traditional RF duplexer 38 is associated with a third aggregated receive band, a third aggregated transmit band, or both. The fourth traditional RF duplexer 44 is associated with a fourth aggregated receive band, a fourth aggregated transmit band, or both. The fifth traditional RF duplexer 46 is associated with a fifth aggregated receive band, a fifth aggregated transmit band, or both. The sixth traditional RF duplexer 48 is associated with a sixth aggregated receive band, a sixth aggregated transmit band, or both.

The first traditional antenna switching circuitry 34 couples a selected one of the first traditional RF duplexer 30, the second traditional RF duplexer 36, and the third traditional RF duplexer 38 to the first traditional antenna matching circuitry 20. Therefore, the first RF antenna 16 is associated with a selected one of the first aggregated receive band, the second aggregated receive band, and the third aggregated receive band; with a selected one of the first aggregated transmit band, the second aggregated transmit band, and the third aggregated transmit band; or both.

Similarly, the second traditional antenna switching circuitry 42 couples a selected one of the fourth traditional RF duplexer 44, the fifth traditional RF duplexer 46, and the sixth traditional RF duplexer 48 to the second traditional antenna matching circuitry 40. Therefore, the second RF antenna 32 is associated with a selected one of the fourth aggregated receive band, the fifth aggregated receive band, and the sixth aggregated receive band; with a selected one of the fourth aggregated transmit band, the fifth aggregated transmit band, and the sixth aggregated transmit band; or both.

During transmit CA, the traditional RF system control circuitry 12 provides the first traditional upstream transmit signal TUT1 to the first traditional RF transmit circuitry 24, which forwards the first traditional upstream transmit signal TUT1 to the first RF antenna 16 for transmission via the selected one of the first traditional RF duplexer 30, the second traditional RF duplexer 36, and the third traditional RF duplexer 38; via the first traditional antenna switching circuitry 34; and via the first traditional antenna matching circuitry 20.

Additionally, during transmit CA, the traditional RF system control circuitry 12 provides a second traditional upstream transmit signal TUT2 to the second traditional RF transmit circuitry 52, which forwards the second traditional upstream transmit signal TUT2 to the second RF antenna 32 for transmission via the selected one of the fourth traditional RF duplexer 44, the fifth traditional RF duplexer 46, and the sixth traditional RF duplexer 48; via the second traditional antenna switching circuitry 42; and via the second traditional antenna matching circuitry 40.

During receive CA, the first RF antenna 16 forwards a received RF signal to the first traditional RF receive circuitry 22 via the first traditional antenna matching circuitry 20, the first traditional antenna switching circuitry 34, and the selected one of the first traditional RF duplexer 30, the second traditional RF duplexer 36, and the third traditional RF duplexer 38. The first traditional RF receive circuitry 22 provides the first traditional downstream receive signal TDR1 to the traditional RF system control circuitry 12 based on the received RF signal.

Additionally, during receive CA, the second RF antenna 32 forwards a received RF signal to the second traditional RF receive circuitry 50 via the second traditional antenna matching circuitry 40, the second traditional antenna switching circuitry 42, and the selected one of the fourth traditional RF duplexer 44, the fifth traditional RF duplexer 46, and the sixth traditional RF duplexer 48. The second traditional RF receive circuitry 50 provides a second traditional downstream receive signal TDR2 to the traditional RF system control circuitry 12 based on the received RF signal.

Since only the selected one of the first traditional RF duplexer 30, the second traditional RF duplexer 36, and the third traditional RF duplexer 38 is coupled to the first traditional antenna matching circuitry 20; the first traditional antenna switching circuitry 34 isolates each of the first traditional RF duplexer 30, the second traditional RF duplexer 36, and the third traditional RF duplexer 38 from one another; and prevents each of the first traditional RF duplexer 30, the second traditional RF duplexer 36, and the third traditional RF duplexer 38 from interfering with one another.

Similarly, since only the selected one of the fourth traditional RF duplexer 44, the fifth traditional RF duplexer 46, and the sixth traditional RF duplexer 48 is coupled to the second traditional antenna matching circuitry 40; the second traditional antenna matching circuitry 40 isolates each of the fourth traditional RF duplexer 44, the fifth traditional RF duplexer 46, and the sixth traditional RF duplexer 48 from one another; and prevents each of the fourth traditional RF duplexer 44, the fifth traditional RF duplexer 46, and the sixth traditional RF duplexer 48 from interfering with one another.

Figure 4:
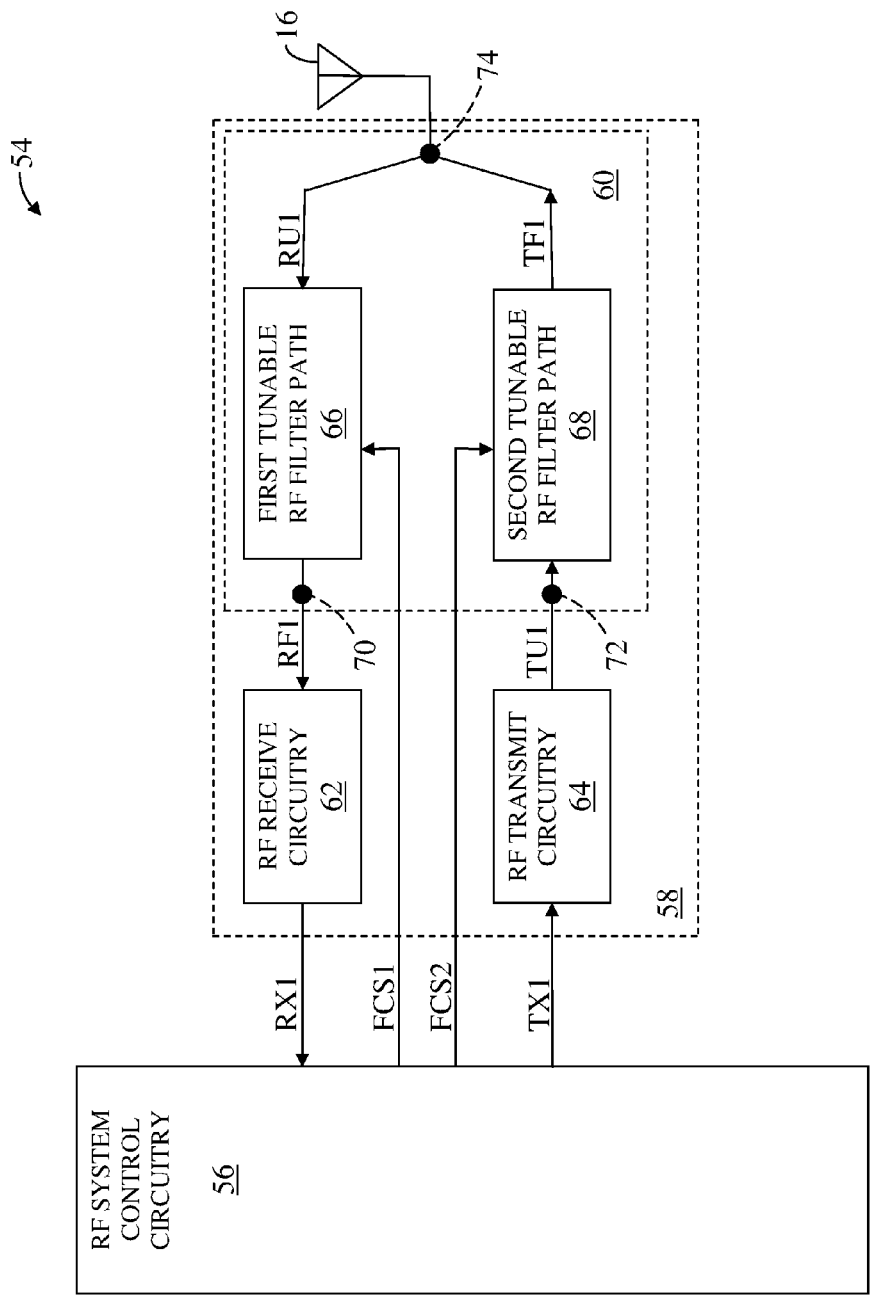
FIG. 4 shows RF communications circuitry according to one embodiment of the RF communications circuitry.
Figure 21:
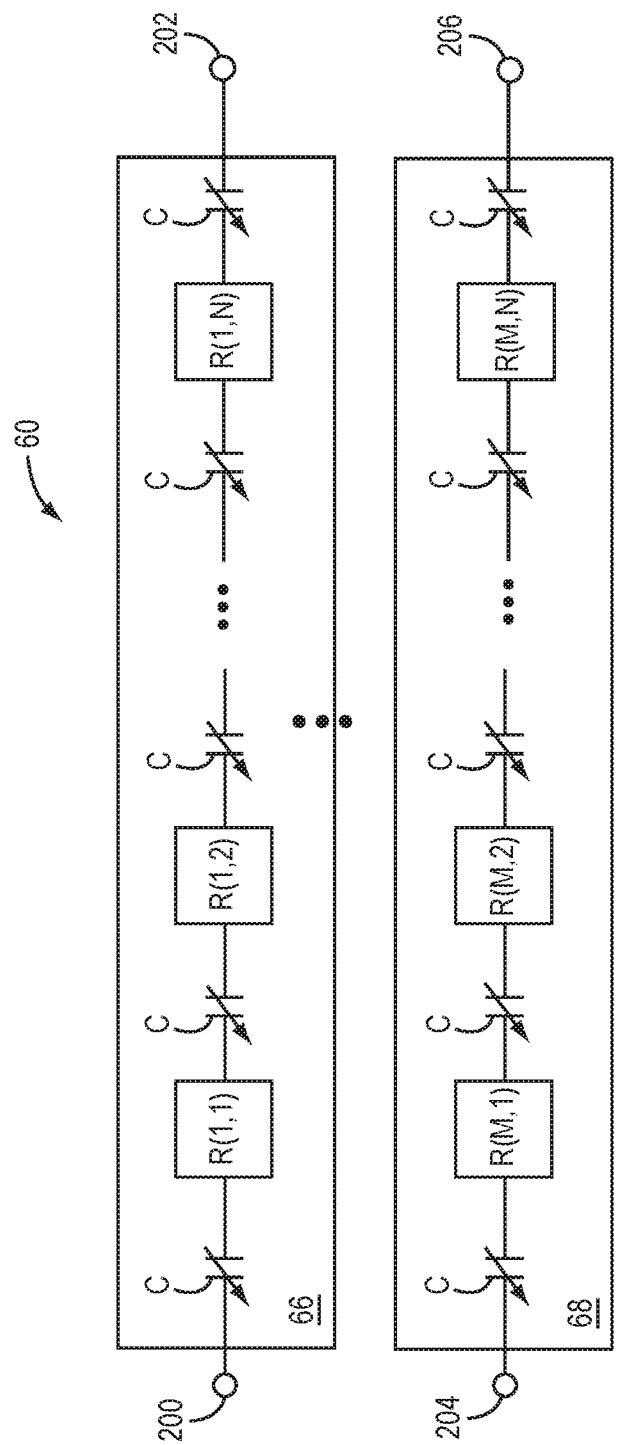
FIG. 21 illustrates one embodiment of a tunable radio frequency (RF) filter structure that defines multiple tunable RF filtering paths that are independent of each other.
Figure 22:
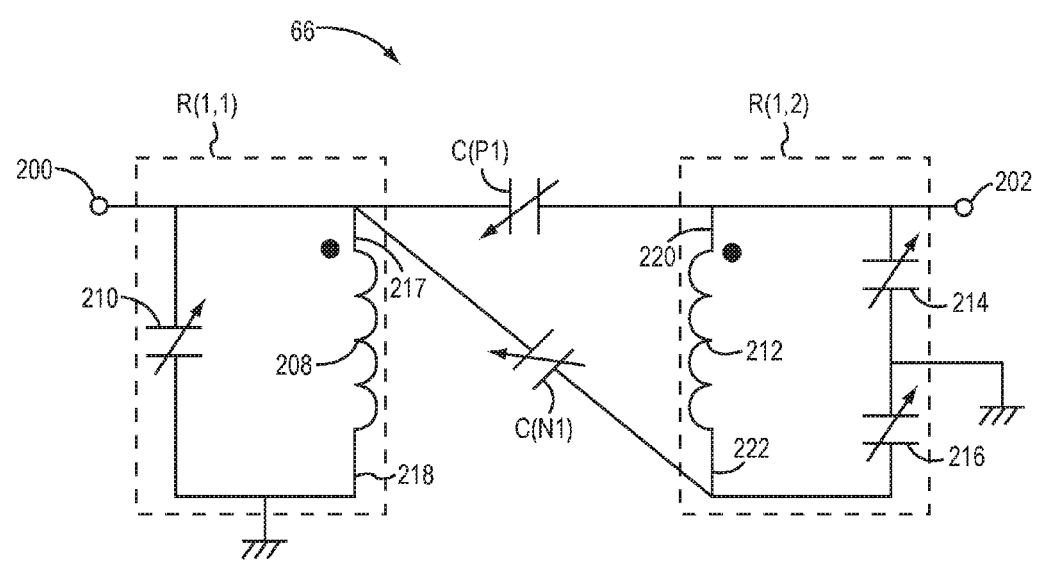
FIG. 22 illustrates one embodiment of a tunable RF filter path shown in FIG. 21 having cross-coupling capacitors arranged in a V-bridge structure.

FIG. 4 shows RF communications circuitry 54 according to one embodiment of the RF communications circuitry 54. The RF communications circuitry 54 includes RF system control circuitry 56, RF front-end circuitry 58, and the first RF antenna 16. The RF front-end circuitry 58 includes a first RF filter structure 60, RF receive circuitry 62, and RF transmit circuitry 64. The first RF filter structure 60 includes a first tunable RF filter path 66 and a second tunable RF filter path 68. Additionally, the first RF filter structure 60 has a first connection node 70, a second connection node 72, and a first common connection node 74. In one embodiment of the RF system control circuitry 56, the RF system control circuitry 56 is an RF transceiver. In one embodiment of the first tunable RF filter path 66, the first tunable RF filter path 66 includes a pair of weakly coupled resonators R(1,1), R(1,2) (FIG. 22). As such, in one embodiment of the first RF filter structure 60, the RF filter structure 60 includes the pair of weakly coupled resonators R(1,1), R(1,2) (FIG. 21).

In alternate embodiments of the first RF filter structure 60, any or all of the first connection node 70, the second connection node 72, and the first common connection node 74 are external to the first RF filter structure 60. In one embodiment of the first tunable RF filter path 66, the first tunable RF filter path 66 includes a first pair (not shown) of weakly coupled resonators. In one embodiment of the second tunable RF filter path 68, the second tunable RF filter path 68 includes a second pair (not shown) of weakly coupled resonators.

In one embodiment of the first RF filter structure 60, the first tunable RF filter path 66 is directly coupled between the first common connection node 74 and the first connection node 70, the second tunable RF filter path 68 is directly coupled between the second connection node 72 and the first common connection node 74, and the first RF antenna 16 is directly coupled to the first common connection node 74. In another embodiment of the RF communications circuitry 54, the first RF antenna 16 is omitted. Additionally, the RF receive circuitry 62 is coupled between the first connection node 70 and the RF system control circuitry 56, and the RF transmit circuitry 64 is coupled between the second connection node 72 and the RF system control circuitry 56.

In one embodiment of the RF communications circuitry 54, the first tunable RF filter path 66 is a first RF receive filter, such that the first RF antenna 16 forwards a received RF signal via the first common connection node 74 to provide a first upstream RF receive signal RU1 to the first tunable RF filter path 66, which receives and filters the first upstream RF receive signal RU1 to provide a first filtered RF receive signal RF1 to the RF receive circuitry 62. The RF receive circuitry 62 may include down-conversion circuitry, amplification circuitry, power supply circuitry, filtering circuitry, switching circuitry, combining circuitry, splitting circuitry, dividing circuitry, clocking circuitry, the like, or any combination thereof. The RF receive circuitry 62 processes the first filtered RF receive signal RF1 to provide a first receive signal RX1 to the RF system control circuitry 56.

In one embodiment of the RF communications circuitry 54, the second tunable RF filter path 68 is a first RF transmit filter, such that the RF system control circuitry 56 provides a first transmit signal TX1 to the RF transmit circuitry 64, which processes the first transmit signal TX1 to provide a first upstream RF transmit signal TU1 to the second tunable RF filter path 68. The RF transmit circuitry 64 may include up-conversion circuitry, amplification circuitry, power supply circuitry, filtering circuitry, switching circuitry, combining circuitry, splitting circuitry, dividing circuitry, clocking circuitry, the like, or any combination thereof. The second tunable RF filter path 68 receives and filters the first upstream RF transmit signal TU1 to provide a first filtered RF transmit signal TF1, which is transmitted via the first common connection node 74 by the first RF antenna 16.

The RF system control circuitry 56 provides a first filter control signal FCS1 to the first tunable RF filter path 66 and provides a second filter control signal FCS2 to the second tunable RF filter path 68. As such, in one embodiment of the RF communications circuitry 54, the RF system control circuitry 56 tunes a first filter parameter of the first tunable RF filter path 66 using the first filter control signal FCS1. Additionally, the RF system control circuitry 56 tunes a first filter parameter of the second tunable RF filter path 68 using the second filter control signal FCS2.

In one embodiment of the RF communications circuitry 54, the first tunable RF filter path 66 and the second tunable RF filter path 68 do not significantly load one another at frequencies of interest. As such, by directly coupling the first tunable RF filter path 66 and the second tunable RF filter path 68 to the first common connection node 74; front-end RF switching elements may be avoided, thereby reducing cost, size, and non-linearity; and increasing efficiency and flexibility of the RF communications circuitry 54. Since tunable RF filters can support multiple communications bands using a single signal path, they can simplify front-end architectures by eliminating switching and duplexing components.

In one embodiment of the RF communications circuitry 54, the RF communications circuitry 54 is used as an FDD communications system, such that the first upstream RF receive signal RU1 and the first filtered RF transmit signal TF1 are full-duplex signals. In an alternate embodiments of the RF communications circuitry 54, the RF communications circuitry 54 is used as a TDD communications system, such that the first upstream RF receive signal RU1 and the first filtered RF transmit signal TF1 are half-duplex signals. In additional embodiments of the RF communications circuitry 54, the RF communications circuitry 54 is used as a simplex communications system, such that the first upstream RF receive signal RU1 is a simplex signal and the first filtered RF transmit signal TF1 is not present. In other embodiments of the RF communications circuitry 54, the RF communications circuitry 54 is used as a simplex communications system, such that the first upstream RF receive signal RU1 is not present and the first filtered RF transmit signal TF1 is a simplex signal.

Figure 5:
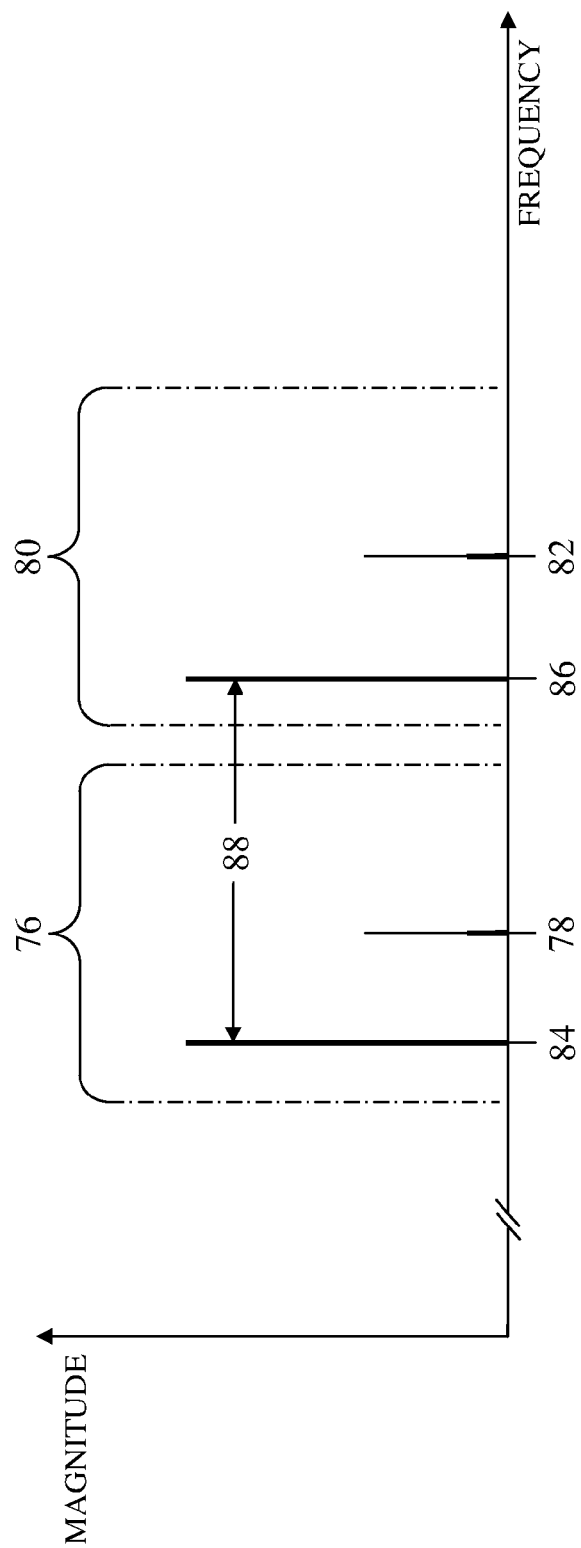
FIG. 5 is a graph illustrating filtering characteristics of a first tunable RF filter path and a second tunable RF filter path illustrated in FIG. 4 according to one embodiment of the first tunable RF filter path and the second tunable RF filter path.

FIG. 5 is a graph illustrating filtering characteristics of the first tunable RF filter path 66 and the second tunable RF filter path 68 illustrated in FIG. 4 according to one embodiment of the first tunable RF filter path 66 and the second tunable RF filter path 68. The first tunable RF filter path 66 is a first RF bandpass filter, which functions as the first RF receive filter, and the second tunable RF filter path 68 is a second RF bandpass filter, which functions as the first RF transmit filter. A bandwidth 76 of the first RF bandpass filter, a center frequency 78 of the first RF bandpass filter, a bandwidth 80 of the second RF bandpass filter, a center frequency 82 of the second RF bandpass filter, a frequency 84 of the first upstream RF receive signal RU1 (FIG. 4), and a frequency 86 of the first filtered RF transmit signal TF1 (FIG. 4) are shown. Operation of the first RF bandpass filter and the second RF bandpass filter is such that the first RF bandpass filter and the second RF bandpass filter do not significantly interfere with one another. In this regard, the bandwidth 76 of the first RF bandpass filter does not overlap the bandwidth 80 of the second RF bandpass filter.

In one embodiment of the first RF receive filter and the first RF transmit filter, the first RF receive filter and the first RF transmit filter in combination function as an RF duplexer. As such, a duplex frequency 88 of the RF duplexer is about equal to a difference between the frequency 84 of the first upstream RF receive signal RU1 (FIG. 4) and the frequency 86 of the first filtered RF transmit signal TF1 (FIG. 4).

In one embodiment of the first tunable RF filter path 66, the first filter parameter of the first tunable RF filter path 66 is tunable based on the first filter control signal FCS1. In an alternate embodiment of the first tunable RF filter path 66, both the first filter parameter of the first tunable RF filter path 66 and a second filter parameter of the first tunable RF filter path 66 are tunable based on the first filter control signal FCS1. Similarly, in one embodiment of the second tunable RF filter path 68, the first filter parameter of the second tunable RF filter path 68 is tunable based on the second filter control signal FCS2. In an alternate embodiment of the second tunable RF filter path 68, both the first filter parameter of the second tunable RF filter path 68 and a second filter parameter of the second tunable RF filter path 68 are tunable based on the second filter control signal FCS2.

The first filter parameter of the first tunable RF filter path 66 is the center frequency 78 of the first RF bandpass filter. The second filter parameter of the first tunable RF filter path 66 is the bandwidth 76 of the first RF bandpass filter. The first filter parameter of the second tunable RF filter path 68 is the center frequency 82 of the second RF bandpass filter. The second filter parameter of the second tunable RF filter path 68 is the bandwidth 80 of the second RF bandpass filter.

FIGS. 6A and 6B are graphs illustrating filtering characteristics of the first tunable RF filter path 66 and the second tunable RF filter path 68, respectively, illustrated in FIG. 4 according to an alternate embodiment of the first tunable RF filter path 66 and the second tunable RF filter path 68, respectively. The first tunable RF filter path 66 is an RF lowpass filter and the second tunable RF filter path 68 is an RF highpass filter. FIG. 6A shows a frequency response curve 90 of the RF lowpass filter and FIG. 6B shows a frequency response curve 92 of the RF highpass filter. Additionally FIG. 6A shows a break frequency 94 of the RF lowpass filter and FIG. 6B shows a break frequency 96 of the RF highpass filter. Both FIGS. 6A and 6B show the frequency 84 of the first upstream RF receive signal RU1 (FIG. 4), the frequency 86 of the first filtered RF transmit signal TF1 (FIG. 4), and the duplex frequency 88 of the RF duplexer for clarification. However, the RF lowpass filter and the RF highpass filter in combination function as an RF diplexer. The first filter parameter of the first tunable RF filter path 66 is the break frequency 94 of the RF lowpass filter. In one embodiment of the RF lowpass filter, the RF lowpass filter has bandpass filter characteristics. The first filter parameter of the second tunable RF filter path 68 is the break frequency 96 of the RF highpass filter. In one embodiment of the RF highpass filter, the RF highpass filter has bandpass filter characteristics. In one embodiment of the RF diplexer, the break frequency 96 of the RF highpass filter is about equal to the break frequency 94 of the RF lowpass filter.

Figure 7:
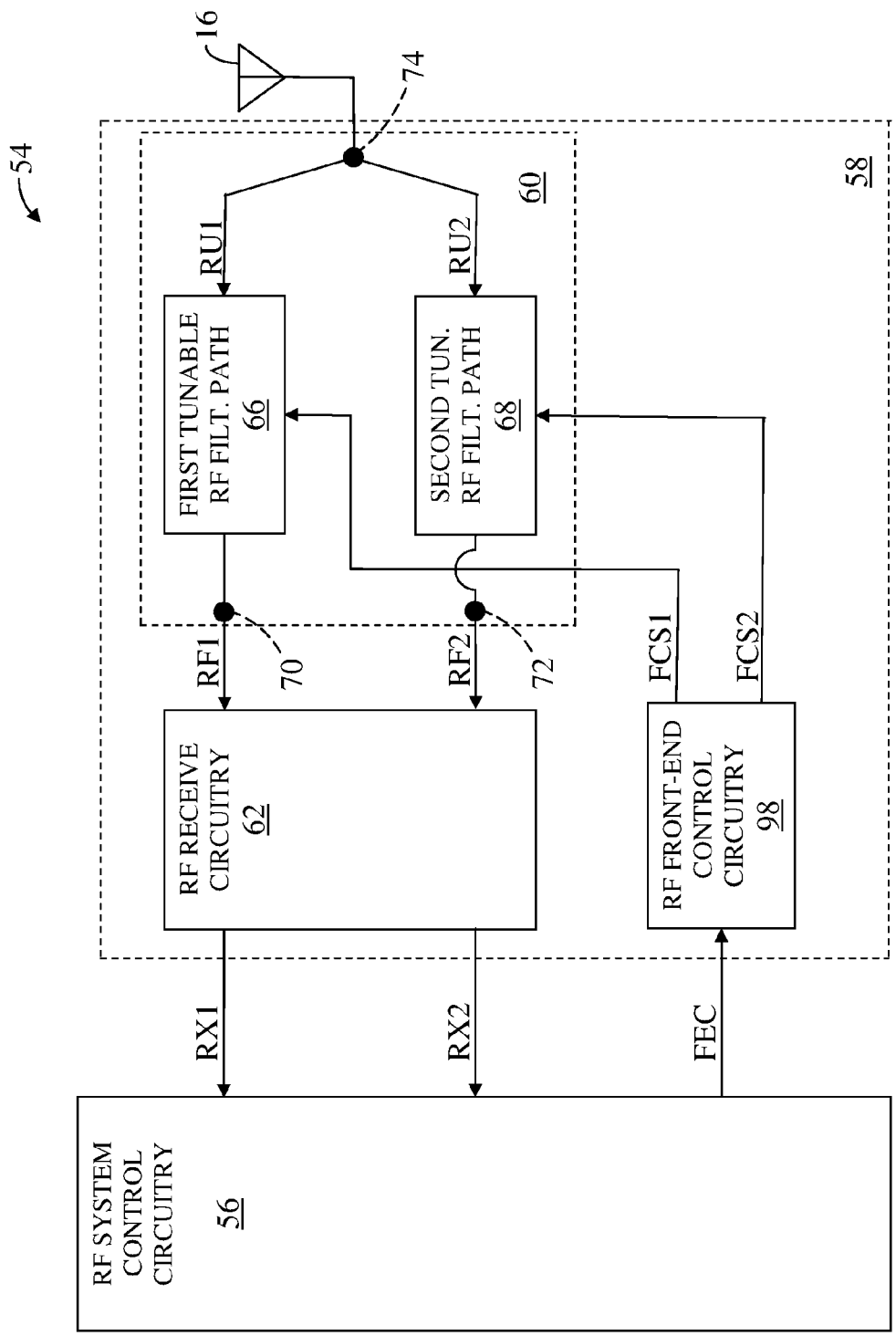
FIG. 7 shows the RF communications circuitry according to one embodiment of the RF communications circuitry.

FIG. 7 shows the RF communications circuitry 54 according to one embodiment of the RF communications circuitry 54. The RF communications circuitry 54 illustrated in FIG. 7 is similar to the RF communications circuitry 54 illustrated in FIG. 4, except in the RF front-end circuitry 58 illustrated in FIG. 7, the RF transmit circuitry 64 (FIG. 4) is omitted and the RF front-end circuitry 58 further includes RF front-end control circuitry 98.

The RF system control circuitry 56 provides a front-end control signal FEC to the RF front-end control circuitry 98. The RF front-end control circuitry 98 provides the first filter control signal FCS1 and the second filter control signal FCS2 based on the front-end control signal FEC. In the RF communications circuitry 54 illustrated in FIG. 4, the RF system control circuitry 56 provides the first filter control signal FCS1 and the second filter control signal FCS2 directly. In general, the RF communications circuitry 54 includes control circuitry, which may be either the RF system control circuitry 56 or the RF front-end control circuitry 98, that provides the first filter control signal FCS1 and the second filter control signal FCS2. As such, in one embodiment of the RF communications circuitry 54, the control circuitry tunes a first filter parameter of the first tunable RF filter path 66 using the first filter control signal FCS1. Additionally, the control circuitry tunes a first filter parameter of the second tunable RF filter path 68 using the second filter control signal FCS2. In an additional embodiment of the RF communications circuitry 54, the control circuitry further tunes a second filter parameter of the first tunable RF filter path 66 using the first filter control signal FCS1; and the control circuitry further tunes a second filter parameter of the second tunable RF filter path 68 using the second filter control signal FCS2.

In alternate embodiments of the first RF filter structure 60, any or all of the first connection node 70, the second connection node 72, and the first common connection node 74 are external to the first RF filter structure 60. In one embodiment of the first tunable RF filter path 66, the first tunable RF filter path 66 includes a first pair (not shown) of weakly coupled resonators. In one embodiment of the second tunable RF filter path 68, the second tunable RF filter path 68 includes a second pair (not shown) of weakly coupled resonators.

In one embodiment of the first RF filter structure 60, the first tunable RF filter path 66 is directly coupled between the first common connection node 74 and the first connection node 70, the second tunable RF filter path 68 is directly coupled between the second connection node 72 and the first common connection node 74, and the first RF antenna 16 is directly coupled to the first common connection node 74. In another embodiment of the RF communications circuitry 54, the first RF antenna 16 is omitted. Additionally, the RF receive circuitry 62 is coupled between the first connection node 70 and the RF system control circuitry 56, and the RF receive circuitry 62 is further coupled between the second connection node 72 and the RF system control circuitry 56.

In one embodiment of the RF communications circuitry 54, the first tunable RF filter path 66 is a first RF receive filter, such that the first RF antenna 16 forwards a first received RF signal via the first common connection node 74 to provide a first upstream RF receive signal RU1 to the first tunable RF filter path 66, which receives and filters the first upstream RF receive signal RU1 to provide a first filtered RF receive signal RF1 to the RF receive circuitry 62. Additionally, the second tunable RF filter path 68 is a second RF receive filter, such that the first RF antenna 16 forwards a second received RF signal via the first common connection node 74 to provide a second upstream RF receive signal RU2 to the second tunable RF filter path 68, which receives and filters the second upstream RF receive signal RU2 to provide a second filtered RF receive signal RF2 to the RF receive circuitry 62.

The RF receive circuitry 62 may include down-conversion circuitry, amplification circuitry, power supply circuitry, filtering circuitry, switching circuitry, combining circuitry, splitting circuitry, dividing circuitry, clocking circuitry, the like, or any combination thereof. The RF receive circuitry 62 processes the first filtered RF receive signal RF1 to provide a first receive signal RX1 to the RF system control circuitry 56. Additionally, the RF receive circuitry 62 processes the second filtered RF receive signal RF2 to provide a second receive signal RX2 to the RF system control circuitry 56.

In one embodiment of the RF communications circuitry 54, the first tunable RF filter path 66 and the second tunable RF filter path 68 do not significantly load one another at frequencies of interest. As such, by directly coupling the first tunable RF filter path 66 and the second tunable RF filter path 68 to the first common connection node 74; front-end RF switching elements may be avoided, thereby reducing cost, size, and non-linearity; and increasing efficiency and flexibility of the RF communications circuitry 54.

In this regard, in one embodiment of the first tunable RF filter path 66 and the second tunable RF filter path 68, each of the first tunable RF filter path 66 and the second tunable RF filter path 68 is a bandpass filter having a unique center frequency. As such, the first filter parameter of each of the first tunable RF filter path 66 and the second tunable RF filter path 68 is a unique center frequency.

In an alternate embodiment of the first tunable RF filter path 66 and the second tunable RF filter path 68, one of the first tunable RF filter path 66 and the second tunable RF filter path 68 is a lowpass filter, and another of the first tunable RF filter path 66 and the second tunable RF filter path 68 is a highpass filter. As such, the first filter parameter of each of the first tunable RF filter path 66 and the second tunable RF filter path 68 is a break frequency.

In an additional embodiment of the first tunable RF filter path 66 and the second tunable RF filter path 68, one of the first tunable RF filter path 66 and the second tunable RF filter path 68 is a lowpass filter, and another of the first tunable RF filter path 66 and the second tunable RF filter path 68 is a bandpass filter. As such, the first filter parameter of one of the first tunable RF filter path 66 and the second tunable RF filter path 68 is a center frequency, and the first filter parameter of another of the first tunable RF filter path 66 and the second tunable RF filter path 68 is a break frequency.

In an additional embodiment of the first tunable RF filter path 66 and the second tunable RF filter path 68, one of the first tunable RF filter path 66 and the second tunable RF filter path 68 is a highpass filter, and another of the first tunable RF filter path 66 and the second tunable RF filter path 68 is a bandpass filter. As such, the first filter parameter of one of the first tunable RF filter path 66 and the second tunable RF filter path 68 is a center frequency, and the first filter parameter of another of the first tunable RF filter path 66 and the second tunable RF filter path 68 is a break frequency.

In one embodiment of the RF communications circuitry 54, the RF communications circuitry 54 is a receive only CA system, such that the first tunable RF filter path 66, which is the first RF receive filter, and the second tunable RF filter path 68, which is the second RF receive filter, simultaneously receive and filter the first upstream RF receive signal RU1 and the second upstream RF receive signal RU2, respectively, via the first common connection node 74. As such, the first RF filter structure 60 functions as a de-multiplexer. In this regard, each of the first upstream RF receive signal RU1 and the second upstream RF receive signal RU2 has a unique carrier frequency. Using receive CA may increase an effective receive bandwidth of the RF communications circuitry 54.

In another embodiment of the RF communications circuitry 54, the RF communications circuitry 54 is a receive only communications system, such that the first tunable RF filter path 66, which is the first RF receive filter, and the second tunable RF filter path 68, which is the second RF receive filter, do not simultaneously receive and filter the first upstream RF receive signal RU1 and the second upstream RF receive signal RU2, respectively. As such, the first upstream RF receive signal RU1 and the second upstream RF receive signal RU2 are nonsimultaneous signals. Each of the first upstream RF receive signal RU1 and the second upstream RF receive signal RU2 may be associated with a unique RF communications band.

Figure 8:
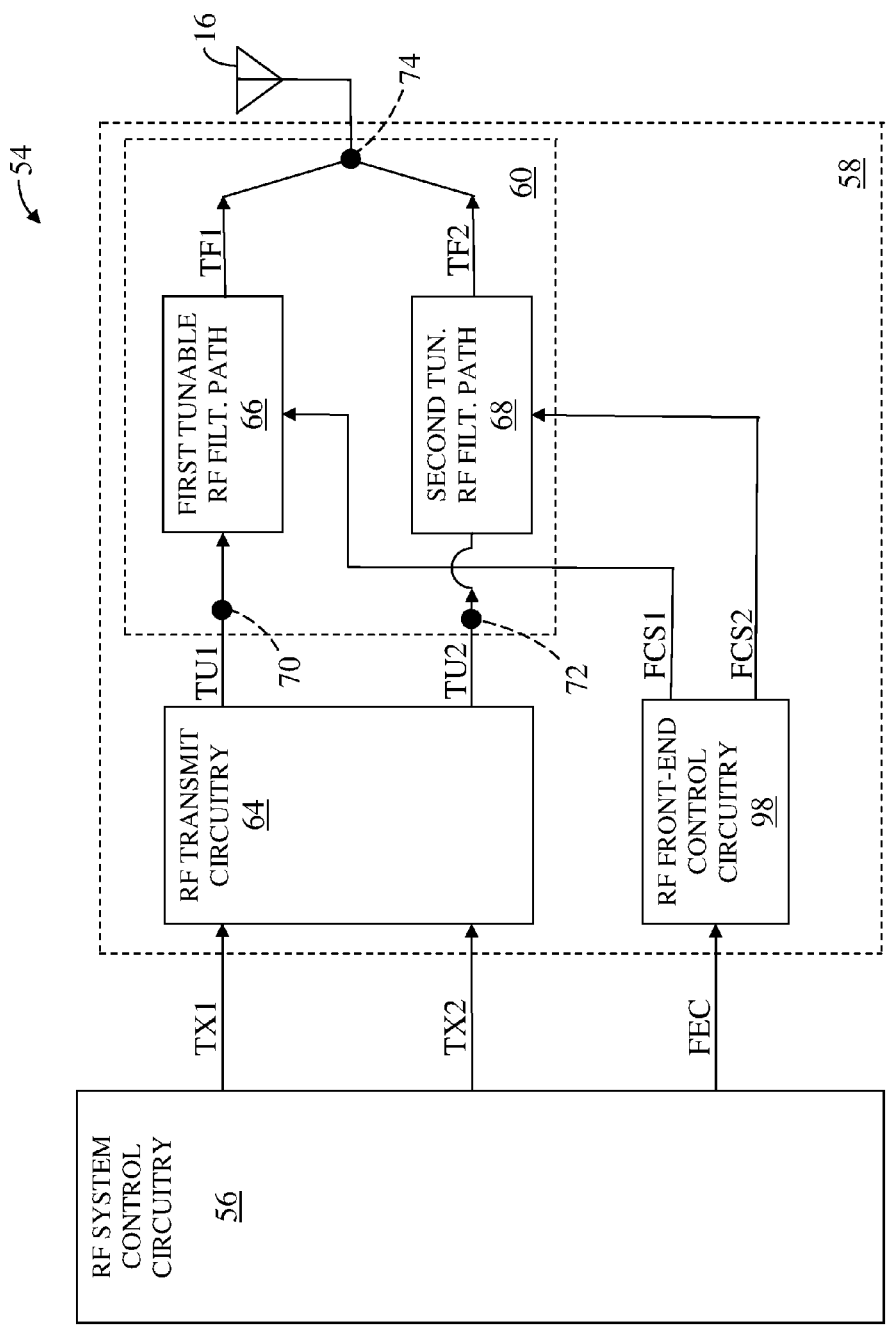
FIG. 8 shows the RF communications circuitry according to an alternate embodiment of the RF communications circuitry.

FIG. 8 shows the RF communications circuitry 54 according to an alternate embodiment of the RF communications circuitry 54. The RF communications circuitry 54 illustrated in FIG. 8 is similar to the RF communications circuitry 54 illustrated in FIG. 7, except in the RF front-end circuitry 58 illustrated in FIG. 8, the RF receive circuitry 62 is omitted and the RF transmit circuitry 64 is included.

The RF system control circuitry 56 provides the front-end control signal FEC to the RF front-end control circuitry 98. The RF front-end control circuitry 98 provides the first filter control signal FCS1 and the second filter control signal FCS2 based on the front-end control signal FEC. In the RF communications circuitry 54 illustrated in FIG. 4, the RF system control circuitry 56 provides the first filter control signal FCS1 and the second filter control signal FCS2 directly. In general, the RF communications circuitry 54 includes control circuitry, which may be either the RF system control circuitry 56 or the RF front-end control circuitry 98, that provides the first filter control signal FCS1 and the second filter control signal FCS2. As such, in one embodiment of the RF communications circuitry 54, the control circuitry tunes a first filter parameter of the first tunable RF filter path 66 using the first filter control signal FCS1. Additionally, the control circuitry tunes a first filter parameter of the second tunable RF filter path 68 using the second filter control signal FCS2. In an additional embodiment of the RF communications circuitry 54, the control circuitry further tunes a second filter parameter of the first tunable RF filter path 66 using the first filter control signal FCS1; and the control circuitry further tunes a second filter parameter of the second tunable RF filter path 68 using the second filter control signal FCS2.

In alternate embodiments of the first RF filter structure 60, any or all of the first connection node 70, the second connection node 72, and the first common connection node 74 are external to the first RF filter structure 60. In one embodiment of the first tunable RF filter path 66, the first tunable RF filter path 66 includes a first pair (not shown) of weakly coupled resonators. In one embodiment of the second tunable RF filter path 68, the second tunable RF filter path 68 includes a second pair (not shown) of weakly coupled resonators.

In one embodiment of the first RF filter structure 60, the first tunable RF filter path 66 is directly coupled between the first common connection node 74 and the first connection node 70, the second tunable RF filter path 68 is directly coupled between the second connection node 72 and the first common connection node 74, and the first RF antenna 16 is directly coupled to the first common connection node 74. In another embodiment of the RF communications circuitry 54, the first RF antenna 16 is omitted. Additionally, the RF transmit circuitry 64 is coupled between the first connection node 70 and the RF system control circuitry 56, and the RF transmit circuitry 64 is further coupled between the second connection node 72 and the RF system control circuitry 56.

In one embodiment of the RF communications circuitry 54, the first tunable RF filter path 66 is a first RF transmit filter, such that the RF system control circuitry 56 provides the first transmit signal TX1 to the RF transmit circuitry 64, which processes the first transmit signal TX1 to provide a first upstream RF transmit signal TU1 to the first tunable RF filter path 66. Similarly, the second tunable RF filter path 68 is a second RF transmit filter, such that the RF system control circuitry 56 provides a second transmit signal TX2 to the RF transmit circuitry 64, which processes the second transmit signal TX2 to provide a second upstream RF transmit signal TU2 to the second tunable RF filter path 68.

The RF transmit circuitry 64 may include up-conversion circuitry, amplification circuitry, power supply circuitry, filtering circuitry, switching circuitry, combining circuitry, splitting circuitry, dividing circuitry, clocking circuitry, the like, or any combination thereof. The first tunable RF filter path 66 receives and filters the first upstream RF transmit signal TU1 to provide the first filtered RF transmit signal TF1, which is transmitted via the first common connection node 74 by the first RF antenna 16. Similarly, the second tunable RF filter path 68 receives and filters the second upstream RF transmit signal TU2 to provide a second filtered RF transmit signal TF2, which is transmitted via the first common connection node 74 by the first RF antenna 16.

In one embodiment of the RF communications circuitry 54, the first tunable RF filter path 66 and the second tunable RF filter path 68 do not significantly load one another at frequencies of interest. As such, by directly coupling the first tunable RF filter path 66 and the second tunable RF filter path 68 to the first common connection node 74; front-end RF switching elements may be avoided, thereby reducing cost, size, and non-linearity; and increasing efficiency and flexibility of the RF communications circuitry 54.

In this regard, in one embodiment of the first tunable RF filter path 66 and the second tunable RF filter path 68, each of the first tunable RF filter path 66 and the second tunable RF filter path 68 is a bandpass filter having a unique center frequency. As such, the first filter parameter of each of the first tunable RF filter path 66 and the second tunable RF filter path 68 is a unique center frequency.

In an alternate embodiment of the first tunable RF filter path 66 and the second tunable RF filter path 68, one of the first tunable RF filter path 66 and the second tunable RF filter path 68 is a lowpass filter, and another of the first tunable RF filter path 66 and the second tunable RF filter path 68 is a highpass filter. As such, the first filter parameter of each of the first tunable RF filter path 66 and the second tunable RF filter path 68 is a break frequency.

In an additional embodiment of the first tunable RF filter path 66 and the second tunable RF filter path 68, one of the first tunable RF filter path 66 and the second tunable RF filter path 68 is a lowpass filter, and another of the first tunable RF filter path 66 and the second tunable RF filter path 68 is a bandpass filter. As such, the first filter parameter of one of the first tunable RF filter path 66 and the second tunable RF filter path 68 is a center frequency, and the first filter parameter of another of the first tunable RF filter path 66 and the second tunable RF filter path 68 is a break frequency.

In an additional embodiment of the first tunable RF filter path 66 and the second tunable RF filter path 68, one of the first tunable RF filter path 66 and the second tunable RF filter path 68 is a highpass filter, and another of the first tunable RF filter path 66 and the second tunable RF filter path 68 is a bandpass filter. As such, the first filter parameter of one of the first tunable RF filter path 66 and the second tunable RF filter path 68 is a center frequency, and the first filter parameter of another of the first tunable RF filter path 66 and the second tunable RF filter path 68 is a break frequency.

In one embodiment of the RF communications circuitry 54, the RF communications circuitry 54 is a transmit only CA system, such that the first tunable RF filter path 66, which is the first RF transmit filter, and the second tunable RF filter path 68, which is the second RF transmit filter, simultaneously receive and filter the first upstream RF transmit signal TU1 and the second upstream RF transmit signal TU2, respectively, to simultaneously provide the first filtered RF transmit signal TF1 and the second filtered RF transmit signal TF2, respectively, via the first common connection node 74. As such, the first RF filter structure 60 functions as a multiplexer. In this regard, each of the first filtered RF transmit signal TF1 and the second filtered RF transmit signal TF2 has a unique carrier frequency. Using transmit CA may increase an effective transmit bandwidth of the RF communications circuitry 54.

In another embodiment of the RF communications circuitry 54, the RF communications circuitry 54 is a transmit only communications system, such that the first tunable RF filter path 66, which is the first RF transmit filter, and the second tunable RF filter path 68, which is the second RF transmit filter, do not simultaneously receive and filter the first upstream RF transmit signal TU1 and the second upstream RF transmit signal TU2, respectively. As such, the first filtered RF transmit signal TF1 and the second filtered RF transmit signal TF2 are nonsimultaneous signals. Each of the first filtered RF transmit signal TF1 and the second filtered RF transmit signal TF2 may be associated with a unique RF communications band.

FIGS. 9A and 9B are graphs illustrating filtering characteristics of the first tunable RF filter path 66 and the second tunable RF filter path 68, respectively, illustrated in FIG. 8 according to an additional embodiment of the first tunable RF filter path 66 and the second tunable RF filter path 68, respectively. FIG. 9A shows a frequency response curve 100 of the first tunable RF filter path 66 and FIG. 9B shows a frequency response curve 102 of the second tunable RF filter path 68. The first tunable RF filter path 66 and the second tunable RF filter path 68 are both bandpass filters having the frequency response curves 100, 102 illustrated in FIGS. 9A and 9B, respectively. In this regard, the first tunable RF filter path 66 and the second tunable RF filter path 68 can be directly coupled to one another via the first common connection node 74 (FIG. 8) without interfering with one another.

FIGS. 10A and 10B are graphs illustrating filtering characteristics of the first traditional RF duplexer 30 and the second traditional RF duplexer 36, respectively, illustrated in FIG. 3 according to the prior art. FIG. 10A shows a frequency response curve 104 of the first traditional RF duplexer 30 and FIG. 10B shows a frequency response curve 106 of the second traditional RF duplexer 36. There is interference 108 between the frequency response curve 104 of the first traditional RF duplexer 30 and the frequency response curve 106 of the second traditional RF duplexer 36 as shown in FIGS. 10A and 10B. In this regard, the first traditional RF duplexer 30 and the second traditional RF duplexer 36 cannot be directly coupled to one another without interfering with one another. To avoid interference between different filters, traditional systems use RF switches to disconnect unused filters.

Figure 11:
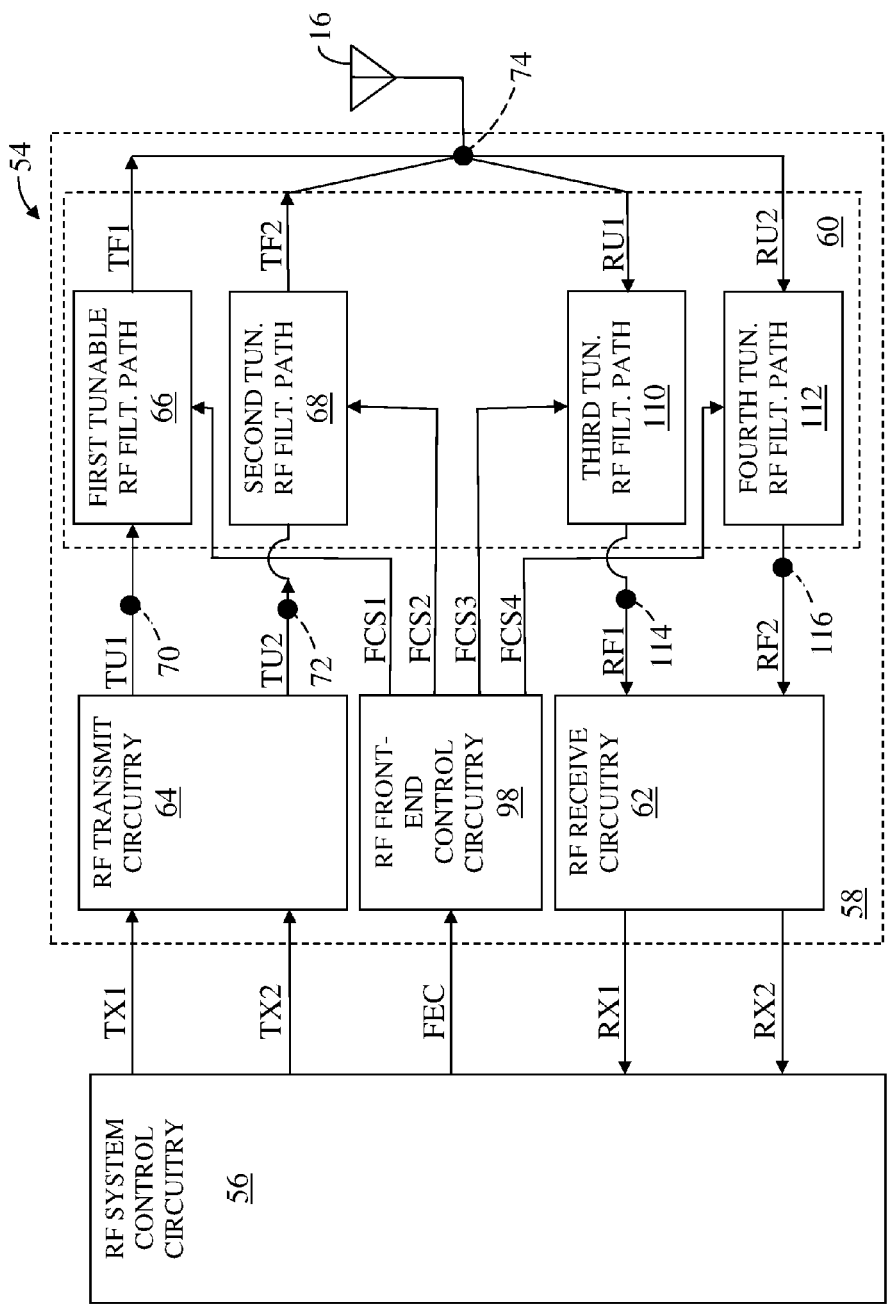
FIG. 11 shows the RF communications circuitry according to one embodiment of the RF communications circuitry.

FIG. 11 shows the RF communications circuitry 54 according to one embodiment of the RF communications circuitry 54. The RF communications circuitry 54 illustrated in FIG. 11 is similar to the RF communications circuitry 54 illustrated in FIG. 8, except in the RF communications circuitry 54 illustrated in FIG. 11, the RF front-end circuitry 58 further includes the RF receive circuitry 62 and the first RF filter structure 60 further includes a third tunable RF filter path 110 and a fourth tunable RF filter path 112. Additionally, the RF front-end circuitry 58 has the first connection node 70, the second connection node 72, the first common connection node 74, a third connection node 114 and a fourth connection node 116, such that all of the first connection node 70, the second connection node 72, the first common connection node 74, the third connection node 114 and the fourth connection node 116 are external to the first RF filter structure 60. In an alternate of the RF front-end circuitry 58, any or all of the first connection node 70, the second connection node 72, the first common connection node 74, a third connection node 114 and a fourth connection node 116 are internal to the first RF filter structure 60.

The RF front-end control circuitry 98 further provides a third filter control signal FCS3 to the third tunable RF filter path 110 and a fourth filter control signal FCS4 to the fourth tunable RF filter path 112 based on the front-end control signal FEC. In one embodiment of the RF communications circuitry 54, the control circuitry tunes a first filter parameter of the third tunable RF filter path 110 using the third filter control signal FCS3. Additionally, the control circuitry tunes a first filter parameter of the fourth tunable RF filter path 112 using the fourth filter control signal FCS4. In an additional embodiment of the RF communications circuitry 54, the control circuitry further tunes a second filter parameter of the third tunable RF filter path 110 using the third filter control signal FCS3; and the control circuitry further tunes a second filter parameter of the fourth tunable RF filter path 112 using the fourth filter control signal FCS4.

In one embodiment of the third tunable RF filter path 110, the third tunable RF filter path 110 includes a third pair (not shown) of weakly coupled resonators. In one embodiment of the fourth tunable RF filter path 112, the fourth tunable RF filter path 112 includes a fourth pair (not shown) of weakly coupled resonators.

In one embodiment of the third tunable RF filter path 110 and the fourth tunable RF filter path 112, the third tunable RF filter path 110 is directly coupled between the first common connection node 74 and the third connection node 114, and the fourth tunable RF filter path 112 is directly coupled between the fourth connection node 116 and the first common connection node 74. In another embodiment of the RF communications circuitry 54, the first RF antenna 16 is omitted. Additionally, the RF receive circuitry 62 is coupled between the third connection node 114 and the RF system control circuitry 56, and the RF receive circuitry 62 is further coupled between the fourth connection node 116 and the RF system control circuitry 56.

In one embodiment of the RF communications circuitry 54, the third tunable RF filter path 110 is the first RF receive filter, such that the first RF antenna 16 forwards a first received RF signal via the first common connection node 74 to provide the first upstream RF receive signal RU1 to the third tunable RF filter path 110, which receives and filters the first upstream RF receive signal RU1 to provide the first filtered RF receive signal RF1 to the RF receive circuitry 62. Additionally, the fourth tunable RF filter path 112 is a second RF receive filter, such that the first RF antenna 16 forwards a second received RF signal via the first common connection node 74 to provide the second upstream RF receive signal RU2 to the fourth tunable RF filter path 112, which receives and filters the second upstream RF receive signal RU2 to provide the second filtered RF receive signal RF2 to the RF receive circuitry 62.

The RF receive circuitry 62 may include down-conversion circuitry, amplification circuitry, power supply circuitry, filtering circuitry, switching circuitry, combining circuitry, splitting circuitry, dividing circuitry, clocking circuitry, the like, or any combination thereof. The RF receive circuitry 62 processes the first filtered RF receive signal RF1 to provide the first receive signal RX1 to the RF system control circuitry 56. Additionally, the RF receive circuitry 62 processes the second filtered RF receive signal RF2 to provide the second receive signal RX2 to the RF system control circuitry 56.

In one embodiment of the RF communications circuitry 54, the first tunable RF filter path 66, the second tunable RF filter path 68, the third tunable RF filter path 110, and the fourth tunable RF filter path 112 do not significantly load one another at frequencies of interest. As such, by directly coupling the first tunable RF filter path 66, the second tunable RF filter path 68, the third tunable RF filter path 110, and the fourth tunable RF filter path 112 to the first common connection node 74; front-end RF switching elements may be avoided, thereby reducing cost, size, and non-linearity; and increasing efficiency and flexibility of the RF communications circuitry 54.

In this regard, in one embodiment of the third tunable RF filter path 110 and the fourth tunable RF filter path 112, each of the third tunable RF filter path 110 and the fourth tunable RF filter path 112 is a bandpass filter having a unique center frequency. As such, the first filter parameter of each of the third tunable RF filter path 110 and the fourth tunable RF filter path 112 is a unique center frequency.

In an alternate embodiment of the third tunable RF filter path 110 and the fourth tunable RF filter path 112, one of the third tunable RF filter path 110 and the fourth tunable RF filter path 112 is a lowpass filter, and another of the third tunable RF filter path 110 and the fourth tunable RF filter path 112 is a highpass filter. As such, the first filter parameter of each of the third tunable RF filter path 110 and the fourth tunable RF filter path 112 is a break frequency.

In an additional embodiment of the third tunable RF filter path 110 and the fourth tunable RF filter path 112, one of the third tunable RF filter path 110 and the fourth tunable RF filter path 112 is a lowpass filter, and another of the third tunable RF filter path 110 and the fourth tunable RF filter path 112 is a bandpass filter. As such, the first filter parameter of one of the third tunable RF filter path 110 and the fourth tunable RF filter path 112 is a center frequency, and the first filter parameter of another of the third tunable RF filter path 110 and the fourth tunable RF filter path 112 is a break frequency.

In an additional embodiment of the third tunable RF filter path 110 and the fourth tunable RF filter path 112, one of the third tunable RF filter path 110 and the fourth tunable RF filter path 112 is a highpass filter, and another of the third tunable RF filter path 110 and the fourth tunable RF filter path 112 is a bandpass filter. As such, the first filter parameter of one of the third tunable RF filter path 110 and the fourth tunable RF filter path 112 is a center frequency, and the first filter parameter of another of the third tunable RF filter path 110 and the fourth tunable RF filter path 112 is a break frequency.

In one embodiment of the RF communications circuitry 54, the RF communications circuitry 54 is a CA system, such that the third tunable RF filter path 110, which is the first RF receive filter, and the fourth tunable RF filter path 112, which is the second RF receive filter, simultaneously receive and filter the first upstream RF receive signal RU1 and the second upstream RF receive signal RU2, respectively, via the first common connection node 74. As such, the first RF filter structure 60 functions as a de-multiplexer using the third tunable RF filter path 110 and the fourth tunable RF filter path 112. In one embodiment of the first RF filter structure 60, the first RF filter structure 60 further functions as a multiplexer using the first tunable RF filter path 66 and the second tunable RF filter path 68. In this regard, each of the first upstream RF receive signal RU1 and the second upstream RF receive signal RU2 has a unique carrier frequency.

In another embodiment of the RF communications circuitry 54, the RF communications circuitry 54 is a receive communications system, such that the third tunable RF filter path 110, which is the first RF receive filter, and the fourth tunable RF filter path 112, which is the second RF receive filter, do not simultaneously receive and filter the first upstream RF receive signal RU1 and the second upstream RF receive signal RU2, respectively. As such, the first upstream RF receive signal RU1 and the second upstream RF receive signal RU2 are nonsimultaneous signals. Each of the first upstream RF receive signal RU1 and the second upstream RF receive signal RU2 may be associated with a unique RF communications band.

Figure 12:
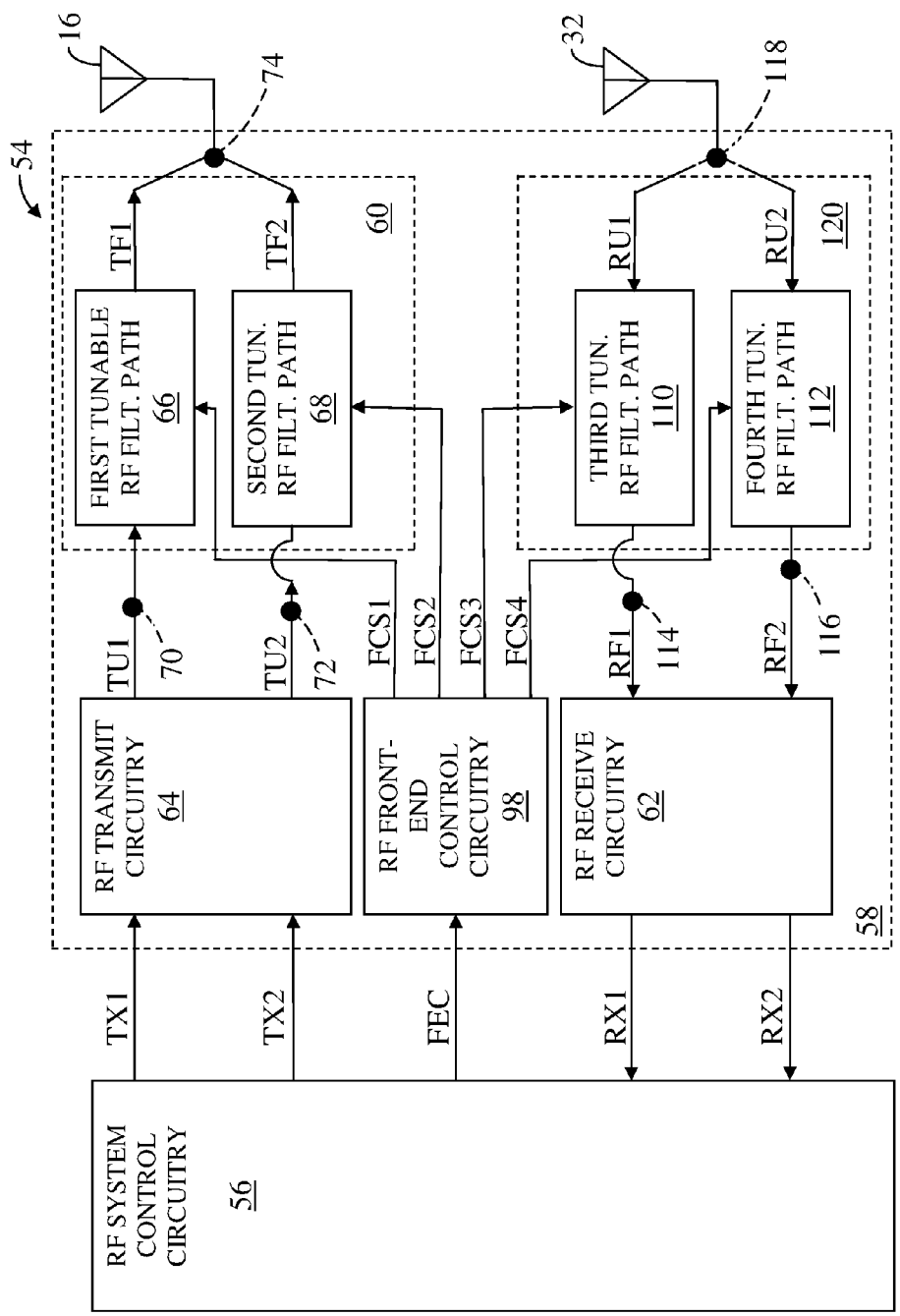
FIG. 12 shows the RF communications circuitry according to an alternate embodiment of the RF communications circuitry.

FIG. 12 shows the RF communications circuitry 54 according to an alternate embodiment of the RF communications circuitry 54. The RF communications circuitry 54 illustrated in FIG. 12 is similar to the RF communications circuitry 54 illustrated in FIG. 11, except the RF communications circuitry 54 illustrated in FIG. 12 further includes the second RF antenna 32. Additionally, the RF front-end circuitry 58 further includes a second common connection node 118 and a second RF filter structure 120. The third tunable RF filter path 110 and the fourth tunable RF filter path 112 are included in the second RF filter structure 120 instead of being included in the first RF filter structure 60. Instead of being coupled to the first common connection node 74, the third tunable RF filter path 110 and the fourth tunable RF filter path 112 are coupled to the second common connection node 118. In one embodiment of the third tunable RF filter path 110 and the fourth tunable RF filter path 112, the third tunable RF filter path 110 and the fourth tunable RF filter path 112 are directly coupled to the second common connection node 118. In one embodiment of the RF communications circuitry 54, the second RF antenna 32 is coupled to the second common connection node 118.

Figure 13:
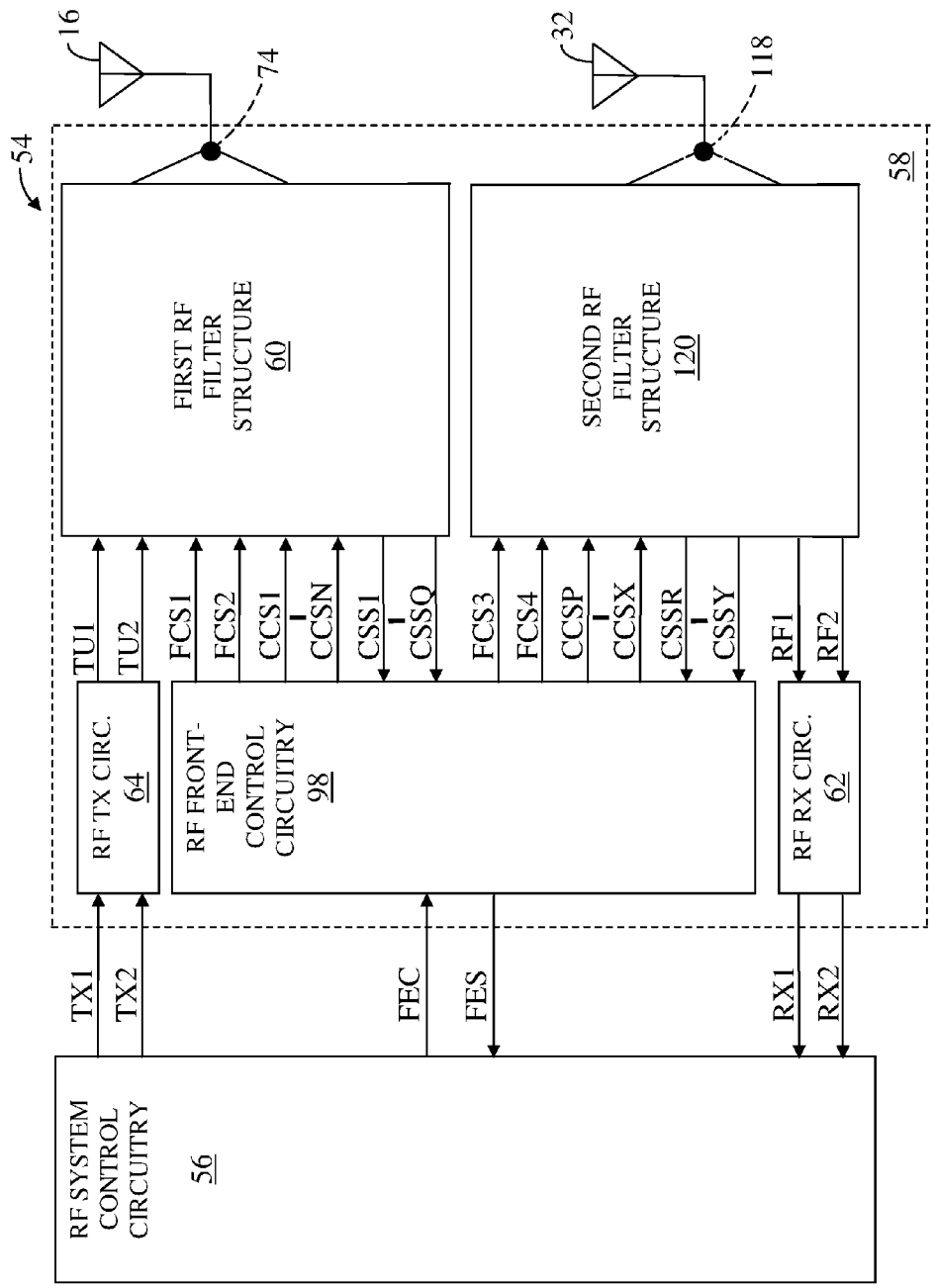
FIG. 13 shows the RF communications circuitry according to an additional embodiment of the RF communications circuitry.

FIG. 13 shows the RF communications circuitry 54 according to an additional embodiment of the RF communications circuitry 54. The RF communications circuitry 54 illustrated in FIG. 13 is similar to the RF communications circuitry 54 illustrated in FIG. 12, except in the RF communications circuitry 54 illustrated in FIG. 13; the RF front-end control circuitry 98 provides a front-end status signal FES to the RF system control circuitry 56. Additionally, the RF front-end control circuitry 98 provides a first calibration control signal CCS1 and up to and including an $N^{TH}$ calibration control signal CCSN to the first RF filter structure 60. The RF front-end control circuitry 98 provides a $P^{TH}$ calibration control signal CCSP and up to and including an $X^{TH}$ calibration control signal CCSX to the second RF filter structure 120. Details of the first RF filter structure 60 and the second RF filter structure 120 are not shown to simplify FIG. 13.

The first RF filter structure 60 provides a first calibration status signal CSS1 and up to and including a $Q^{TH}$ calibration status signal CSSQ to the RF front-end control circuitry 98. The second RF filter structure 120 provides an $R^{TH}$ calibration status signal CSSR and up to and including a $Y^{TH}$ calibration status signal CSSY to the RF front-end control circuitry 98. In an alternate embodiment of the RF front-end circuitry 58, any or all of the $N^{TH}$ calibration control signal CCSN, the $Q^{TH}$ calibration status signal CSSQ, the $X^{TH}$ calibration control signal CCSX, and the $Y^{TH}$ calibration status signal CSSY are omitted.

In one embodiment of the RF front-end circuitry 58, the RF front-end circuitry 58 operates in one of a normal operating mode and a calibration mode. During the calibration mode, the RF front-end control circuitry 98 performs a calibration of the first RF filter structure 60, the second RF filter structure 120, or both. As such, the RF front-end control circuitry 98 provides any or all of the filter control signals FCS1, FCS2, FCS3, FCS4 and any or all of the calibration control signals CCS1, CCSN, CCSP, CCSX needed for calibration. Further, the RF front-end control circuitry 98 receives any or all of the calibration status signals CSS1, CSSQ, CSSR, CSSY needed for calibration.

During the normal operating mode, the RF front-end control circuitry 98 provides any or all of the filter control signals FCS1, FCS2, FCS3, FCS4 and any or all of the calibration control signals CCS1, CCSN, CCSP, CCSX needed for normal operation. Further, the RF front-end control circuitry 98 receives any or all of the calibration status signals CSS1, CSSQ, CSSR, CSSY needed for normal operation. Any or all of the calibration control signals CCS1, CCSN, CCSP, CCSX may be based on the front-end control signal FEC. The front-end status signal FES may be based on any or all of the calibration status signals CSS1, CSSQ, CSSR, CSSY. Further, during the normal operating mode, the RF front-end circuitry 58 processes signals as needed for normal operation. Other embodiments described in the present disclosure may be associated with normal operation.

The RF communications circuitry 54 illustrated in FIG. 13 includes the first RF antenna 16 and the second RF antenna 32. In general, the RF communications circuitry 54 is a multiple antenna system. A single-input single-output (SISO) antenna system is a system in which RF transmit signals may be transmitted from the first RF antenna 16 and RF receive signals may be received via the second RF antenna 32. In one embodiment of the RF communications circuitry 54, the antenna system in the RF communications circuitry 54 is a SISO antenna system, as illustrated in FIG. 13.

A single-input multiple-output (SIMO) antenna system is a system in which RF transmit signals may be simultaneously transmitted from the first RF antenna 16 and the second RF antenna 32, and RF receive signals may be received via the second RF antenna 32. In an alternate embodiment of the RF communications circuitry 54, the second RF filter structure 120 is coupled to the RF transmit circuitry 64, such that the antenna system in the RF communications circuitry 54 is a SIMO antenna system.

A multiple-input single-output (MISO) antenna system is a system in which RF transmit signals may be transmitted from the first RF antenna 16, and RF receive signals may be simultaneously received via the first RF antenna 16 and the second RF antenna 32. In an additional embodiment of the RF communications circuitry 54, the first RF filter structure 60 is coupled to the RF receive circuitry 62, such that the antenna system in the RF communications circuitry 54 is a MISO antenna system.

A multiple-input multiple-output (MIMO) antenna system is a system in which RF transmit signals may be simultaneously transmitted from the first RF antenna 16 and the second RF antenna 32, and RF receive signals may be simultaneously received via the first RF antenna 16 and the second RF antenna 32. In another embodiment of the RF communications circuitry 54, the second RF filter structure 120 is coupled to the RF transmit circuitry 64 and the first RF filter structure 60 is coupled to the RF receive circuitry 62, such that the antenna system in the RF communications circuitry 54 is a MIMO antenna system.

Figure 14:
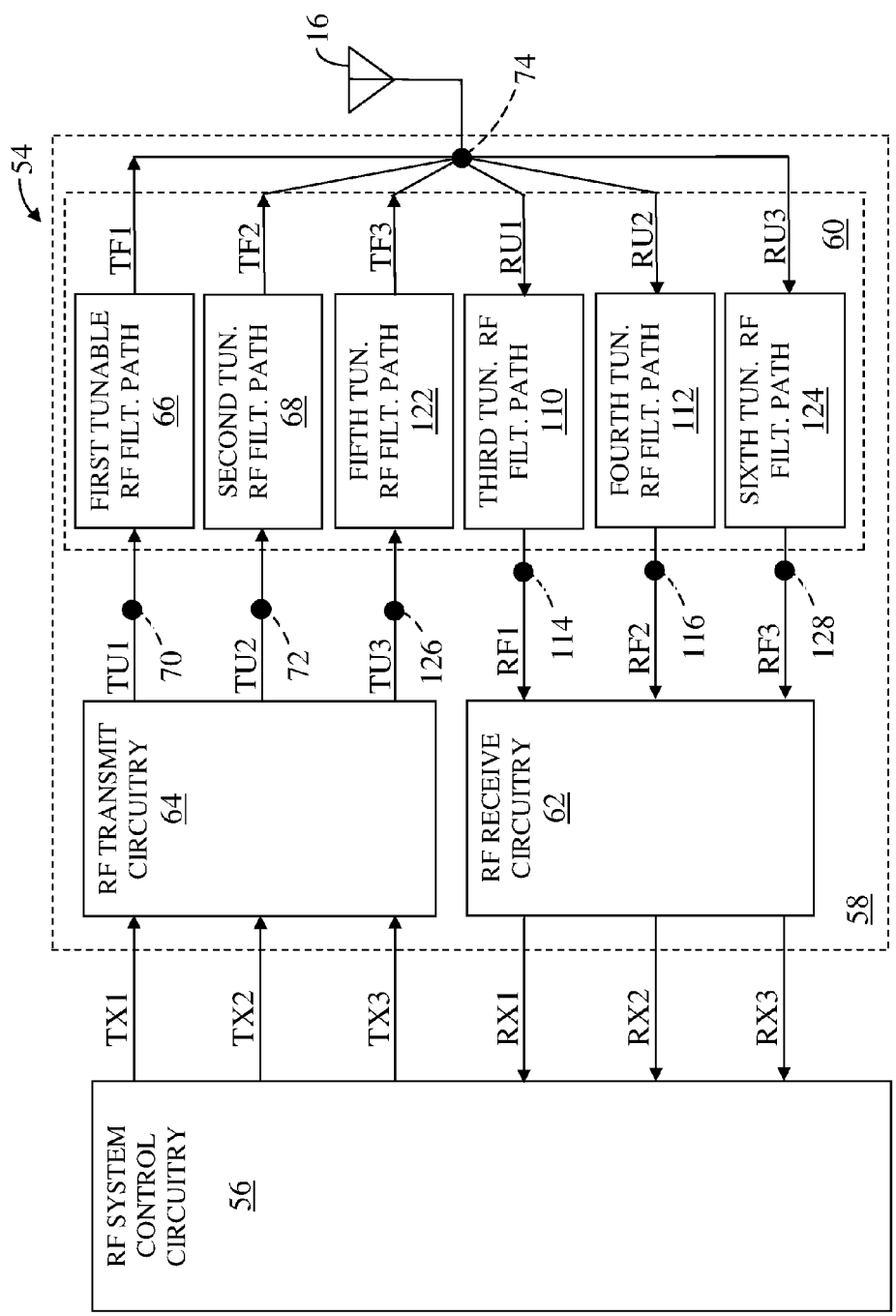
FIG. 14 shows the RF communications circuitry according to another embodiment of the RF communications circuitry.

FIG. 14 shows the RF communications circuitry 54 according to another embodiment of the RF communications circuitry 54. The RF communications circuitry 54 illustrated in FIG. 14 is similar to the RF communications circuitry 54 illustrated in FIG. 11, except in the RF communications circuitry 54 illustrated in FIG. 14, the first RF filter structure 60 further includes a fifth tunable RF filter path 122 and a sixth tunable RF filter path 124, and the RF front-end circuitry 58 further includes a fifth connection node 126 and a sixth connection node 128. Additionally, the RF front-end control circuitry 98 shown in FIG. 11 is not shown in FIG. 14 to simplify FIG. 14.

In one embodiment of the fifth tunable RF filter path 122, the fifth tunable RF filter path 122 includes a fifth pair (not shown) of weakly coupled resonators. In one embodiment of the sixth tunable RF filter path 124, the sixth tunable RF filter path 124 includes a sixth pair (not shown) of weakly coupled resonators.

In one embodiment of the fifth tunable RF filter path 122 and the sixth tunable RF filter path 124, the fifth tunable RF filter path 122 is directly coupled between the first common connection node 74 and the fifth connection node 126, and the sixth tunable RF filter path 124 is directly coupled between the sixth connection node 128 and the first common connection node 74. In another embodiment of the RF communications circuitry 54, the first RF antenna 16 is omitted. Additionally, the RF receive circuitry 62 is further coupled between the sixth connection node 128 and the RF system control circuitry 56, and the RF transmit circuitry 64 is further coupled between the fifth connection node 126 and the RF system control circuitry 56.

In one embodiment of the RF communications circuitry 54, the sixth tunable RF filter path 124 is a third RF receive filter, such that the first RF antenna 16 forwards a third received RF signal via the first common connection node 74 to provide a third upstream RF receive signal RU3 to the sixth tunable RF filter path 124, which receives and filters the third upstream RF receive signal RU3 to provide a third filtered RF receive signal RF3 to the RF receive circuitry 62, which processes the third filtered RF receive signal RF3 to provide the third receive signal RX3 to the RF system control circuitry 56.

In one embodiment of the RF communications circuitry 54, the fifth tunable RF filter path 122 is a third RF transmit filter, such that the RF system control circuitry 56 provides a third transmit signal TX3 to the RF transmit circuitry 64, which processes the third transmit signal TX3 to provide a third upstream RF transmit signal TU3 to the fifth tunable RF filter path 122. The fifth tunable RF filter path 122 receives and filters the third upstream RF transmit signal TU3 to provide a third filtered RF transmit signal TF3, which is transmitted via the first common connection node 74 by the first RF antenna 16.

In one embodiment of the RF communications circuitry 54, the first tunable RF filter path 66, the second tunable RF filter path 68, the third tunable RF filter path 110, the fourth tunable RF filter path 112, the fifth tunable RF filter path 122, and the sixth tunable RF filter path 124 do not significantly load one another at frequencies of interest. Therefore, antenna switching circuitry 34, 42 (FIG. 3) may be avoided. As such, by directly coupling the first tunable RF filter path 66, the second tunable RF filter path 68, the third tunable RF filter path 110, the fourth tunable RF filter path 112, the fifth tunable RF filter path 122 and the sixth tunable RF filter path 124 to the first common connection node 74; front-end RF switching elements may be avoided, thereby reducing cost, size, and non-linearity; and increasing efficiency and flexibility of the RF communications circuitry 54.

In one embodiment of the RF communications circuitry 54, the RF communications circuitry 54 is an FDD communications system, such that each of the first tunable RF filter path 66, the second tunable RF filter path 68, the third tunable RF filter path 110, the fourth tunable RF filter path 112, the fifth tunable RF filter path 122, and the sixth tunable RF filter path 124 is a bandpass filter having a unique center frequency. As such, in one embodiment of the RF system control circuitry 56, the first filter parameter of each of the first tunable RF filter path 66, the second tunable RF filter path 68, the third tunable RF filter path 110, the fourth tunable RF filter path 112, the fifth tunable RF filter path 122, and the sixth tunable RF filter path 124 is a unique center frequency.

Figure 15:
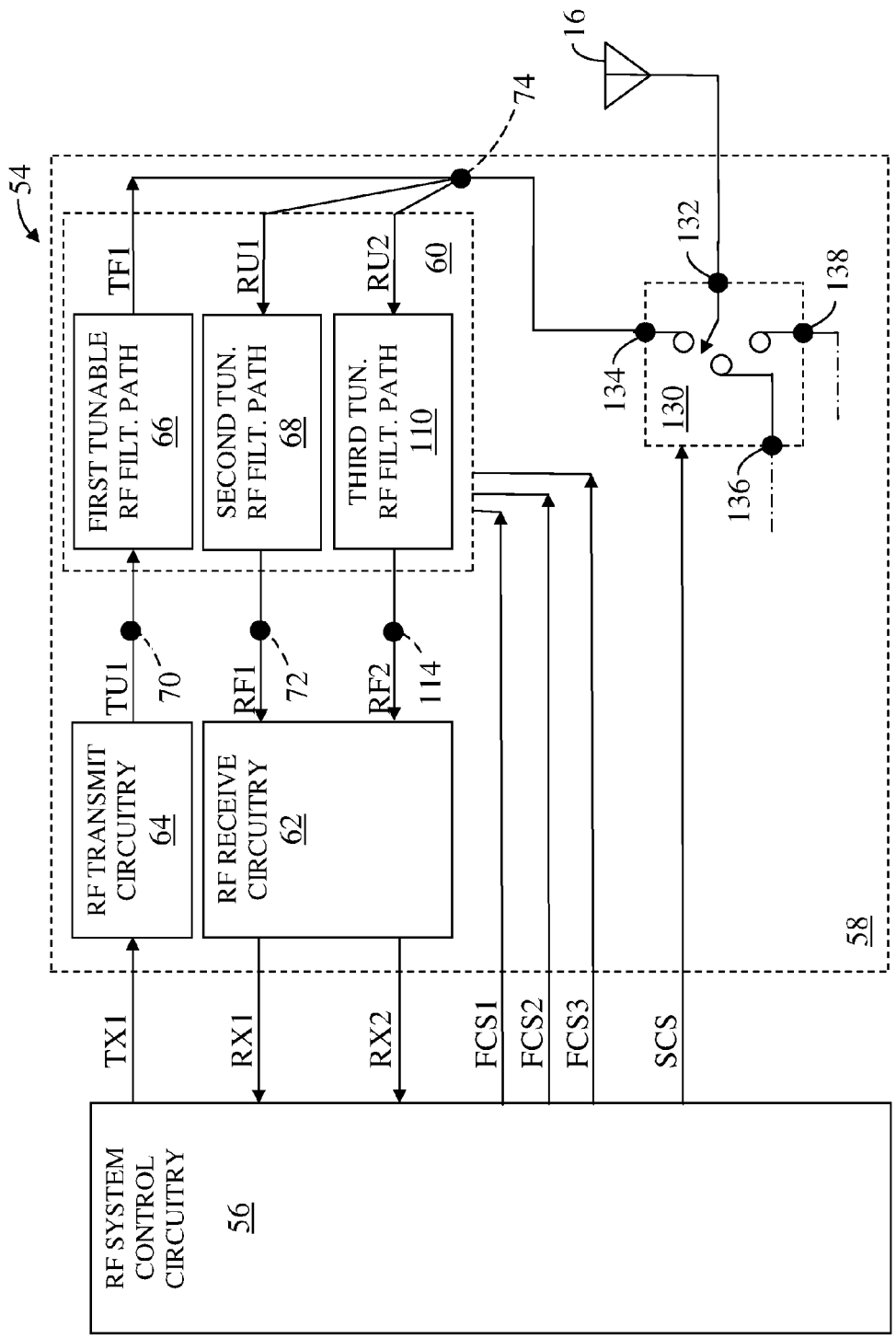
FIG. 15 shows the RF communications circuitry according to a further embodiment of the RF communications circuitry.

FIG. 15 shows the RF communications circuitry 54 according to a further embodiment of the RF communications circuitry 54. The RF communications circuitry 54 illustrated in FIG. 15 is similar to the RF communications circuitry 54 illustrated in FIG. 4, except in the RF communications circuitry 54 illustrated in FIG. 15, the RF front-end circuitry 58 further includes an RF antenna switch 130 and the third connection node 114. Additionally, the first RF filter structure 60 further includes the third tunable RF filter path 110. Instead of the first RF antenna 16 being directly coupled to the first common connection node 74, as illustrated in FIG. 4, the RF antenna switch 130 is coupled between the first RF antenna 16 and the first common connection node 74. As such, the first common connection node 74 is coupled to the first RF antenna 16 via the RF antenna switch 130. In this regard, the RF communications circuitry 54 is a hybrid RF communications system.

The RF antenna switch 130 has an antenna switch common connection node 132, an antenna switch first connection node 134, an antenna switch second connection node 136, and an antenna switch third connection node 138. The antenna switch common connection node 132 is coupled to the first RF antenna 16. In one embodiment of the RF antenna switch 130, the antenna switch common connection node 132 is directly coupled to the first RF antenna 16. The antenna switch first connection node 134 is coupled to the first common connection node 74. In one embodiment of the RF antenna switch 130, the antenna switch first connection node 134 is directly coupled to the first common connection node 74. The antenna switch second connection node 136 may be coupled to other circuitry (not shown). The antenna switch third connection node 138 may be coupled to other circuitry (not shown). In another embodiment of the RF antenna switch 130, the antenna switch third connection node 138 is omitted. In a further embodiment of the RF antenna switch 130, the RF antenna switch 130 has at least one additional connection node.

The RF system control circuitry 56 provides a switch control signal SCS to the RF antenna switch 130. As such, the RF system control circuitry 56 selects one of the antenna switch first connection node 134, the antenna switch second connection node 136, and the antenna switch third connection node 138 to be coupled to the antenna switch common connection node 132 using the switch control signal SCS.

The third tunable RF filter path 110 is directly coupled between the first common connection node 74 and the third connection node 114. In one embodiment of the RF communications circuitry 54, the third tunable RF filter path 110 is a second RF receive filter, such that the first RF antenna 16 forwards a received RF signal via the RF antenna switch 130 and the first common connection node 74 to provide the second upstream RF receive signal RU2 to the third tunable RF filter path 110, which receives and filters the second upstream RF receive signal RU2 to provide the second filtered RF receive signal RF2 to the RF receive circuitry 62. The RF receive circuitry 62 processes the second filtered RF receive signal RF2 to provide a second receive signal RX2 to the RF system control circuitry 56.

The RF system control circuitry 56 further provides the third filter control signal FCS3. As such, in one embodiment of the RF communications circuitry 54, the RF system control circuitry 56 tunes a first filter parameter of the third tunable RF filter path 110 using the third filter control signal FCS3. In one embodiment of the RF communications circuitry 54, the RF communications circuitry 54 uses the second tunable RF filter path 68 and the third tunable RF filter path 110 to provide receive CA. In an alternate embodiment of the RF communications circuitry 54, tunable RF filters allow for sharing a signal path to provide both an FDD signal path and a TDD signal path, thereby lowering front-end complexity.

Figure 16:
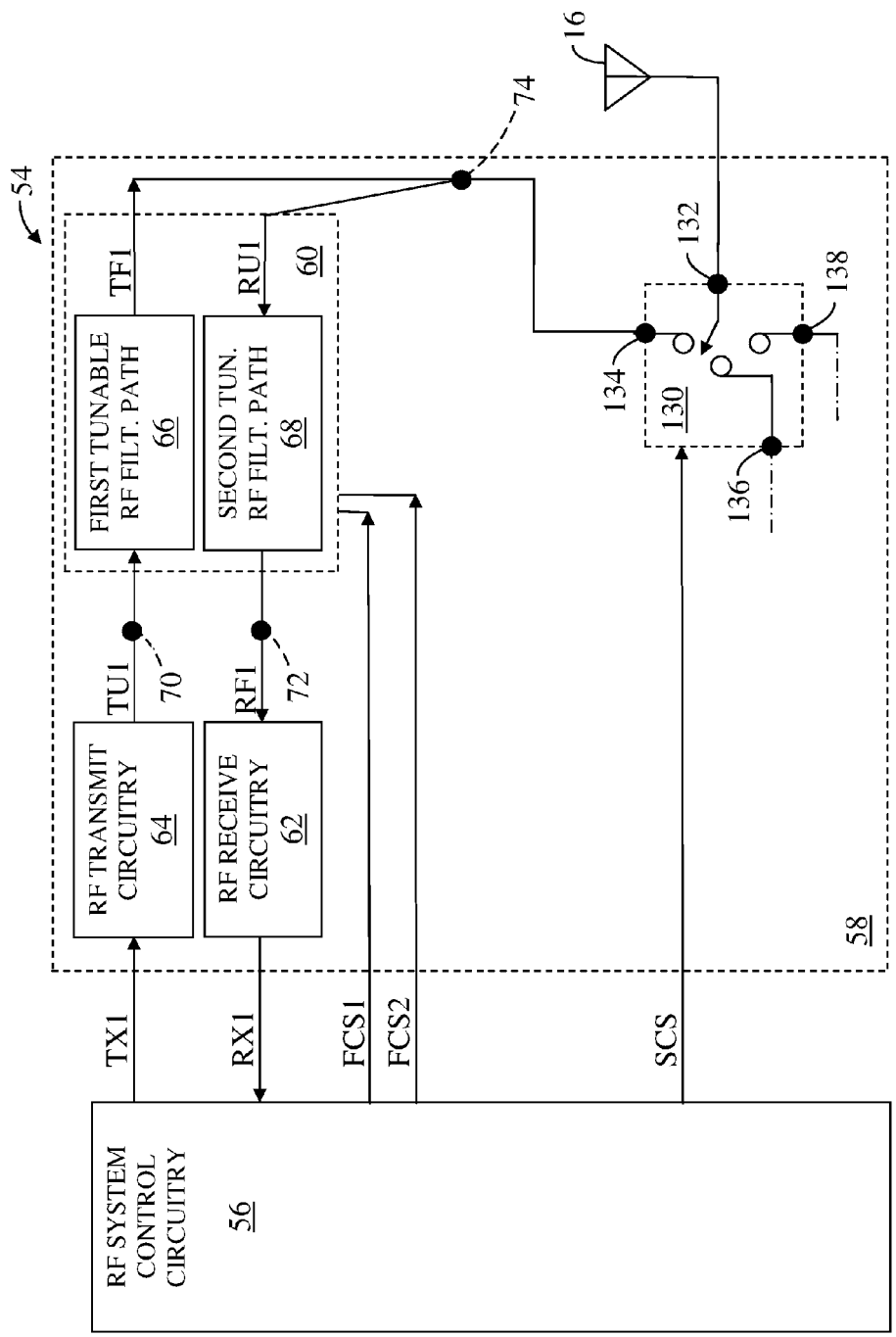
FIG. 16 shows the RF communications circuitry according to one embodiment of the RF communications circuitry.

FIG. 16 shows the RF communications circuitry 54 according to one embodiment of the RF communications circuitry 54. The RF communications circuitry 54 illustrated in FIG. 16 is similar to the RF communications circuitry 54 illustrated in FIG. 15, except in the RF communications circuitry 54 illustrated in FIG. 16, the third tunable RF filter path 110 is omitted. Additionally, in one embodiment of the RF communications circuitry 54, the RF receive circuitry 62, the RF transmit circuitry 64, and the first RF filter structure 60 are all broadband devices. As such, the RF communications circuitry 54 is broadband circuitry capable of processing RF signals having wide frequency ranges.

Figure 17:
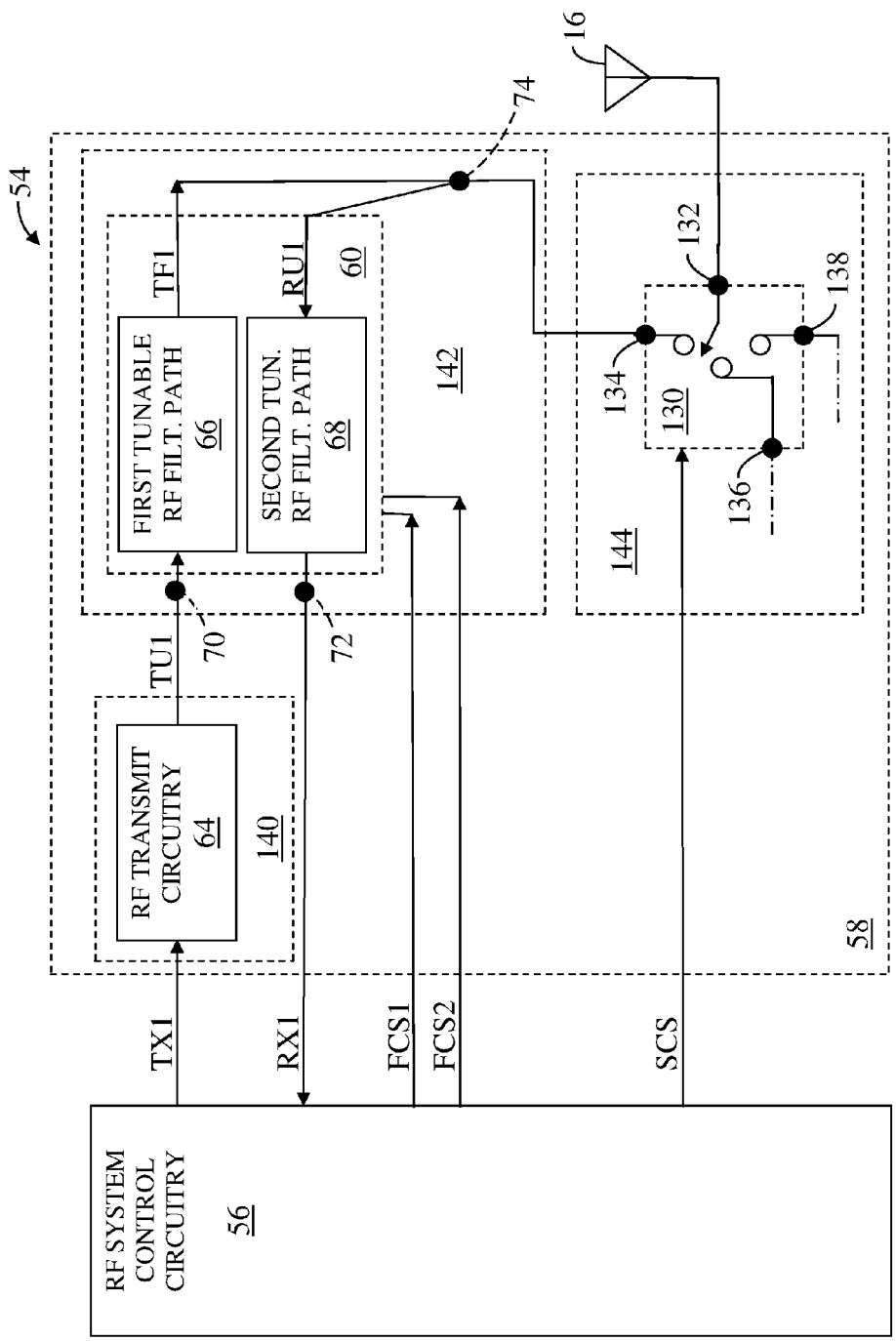
FIG. 17 shows the RF communications circuitry according to an alternate embodiment of the RF communications circuitry.

FIG. 17 shows the RF communications circuitry 54 according to an alternate embodiment of the RF communications circuitry 54. The RF communications circuitry 54 illustrated in FIG. 17 is similar to the RF communications circuitry 54 illustrated in FIG. 16, except in the RF communications circuitry 54 illustrated in FIG. 17, the RF receive circuitry 62 is omitted and the RF front-end circuitry 58 further includes a first RF front-end circuit 140, a second RF front-end circuit 142, and a third RF front-end circuit 144.

The first RF front-end circuit 140 includes the RF transmit circuitry 64. The second RF front-end circuit 142 includes the first RF filter structure 60, the first connection node 70, the second connection node 72, and the first common connection node 74. The third RF front-end circuit 144 includes the RF antenna switch 130. In one embodiment of the first RF front-end circuit 140, the first RF front-end circuit 140 is a first RF front-end integrated circuit (IC). In one embodiment of the second RF front-end circuit 142, the second RF front-end circuit 142 is a second RF front-end IC. In one embodiment of the third RF front-end circuit 144, the third RF front-end circuit 144 is a third RF front-end IC.

Figure 18:
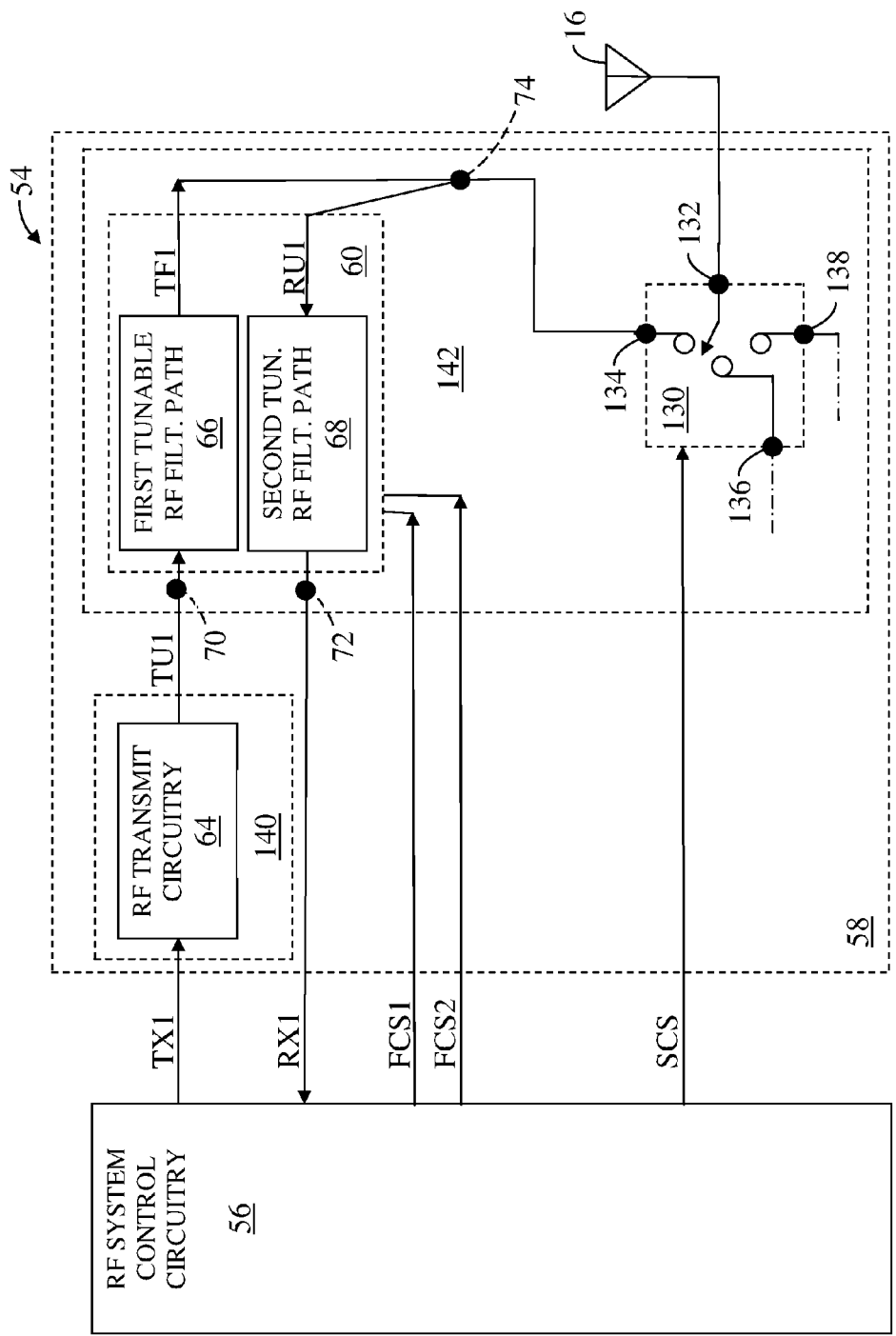
FIG. 18 shows the RF communications circuitry according to an additional embodiment of the RF communications circuitry.

FIG. 18 shows the RF communications circuitry 54 according to an additional embodiment of the RF communications circuitry 54. The RF communications circuitry 54 illustrated in FIG. 18 is similar to the RF communications circuitry 54 illustrated in FIG. 16, except in the RF communications circuitry 54 illustrated in FIG. 18, the RF receive circuitry 62 is omitted and the RF front-end circuitry 58 further includes the first RF front-end circuit 140 and the second RF front-end circuit 142.

The first RF front-end circuit 140 includes the RF transmit circuitry 64. The second RF front-end circuit 142 includes the first RF filter structure 60, the RF antenna switch 130, the first connection node 70, the second connection node 72, and the first common connection node 74. In one embodiment of the first RF front-end circuit 140, the first RF front-end circuit 140 is the first RF front-end IC. In one embodiment of the second RF front-end circuit 142, the second RF front-end circuit 142 is the second RF front-end IC.

Figure 19:
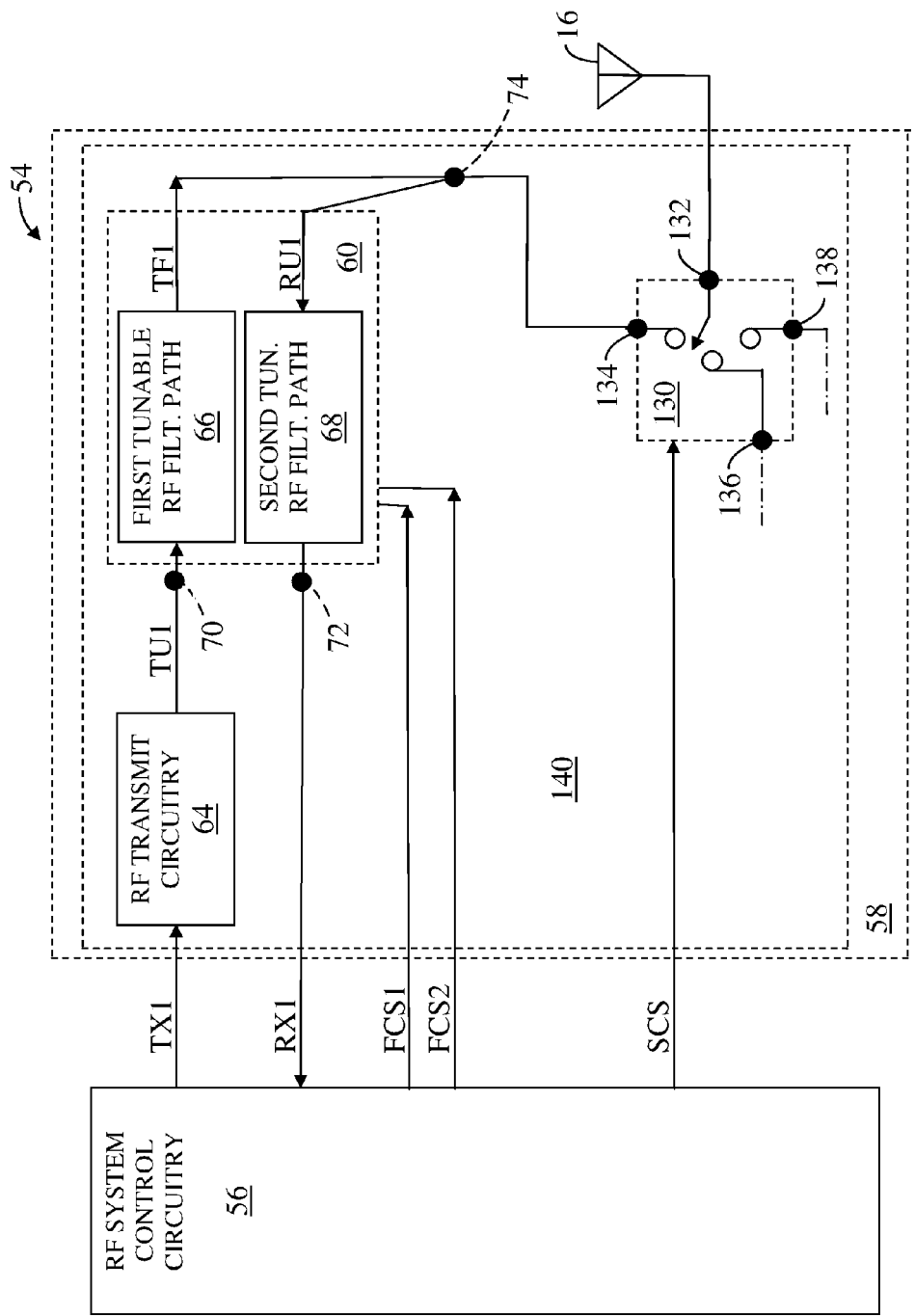
FIG. 19 shows the RF communications circuitry according to another embodiment of the RF communications circuitry.

FIG. 19 shows the RF communications circuitry 54 according to another embodiment of the RF communications circuitry 54. The RF communications circuitry 54 illustrated in FIG. 19 is similar to the RF communications circuitry 54 illustrated in FIG. 16, except in the RF communications circuitry 54 illustrated in FIG. 19, the RF receive circuitry 62 is omitted and the RF front-end circuitry 58 further includes the first RF front-end circuit 140.

The first RF front-end circuit 140 includes the RF transmit circuitry 64, the first RF filter structure 60, the RF antenna switch 130, the first connection node 70, the second connection node 72, and the first common connection node 74. In one embodiment of the first RF front-end circuit 140, the first RF front-end circuit 140 is the first RF front-end IC.

Figure 20:
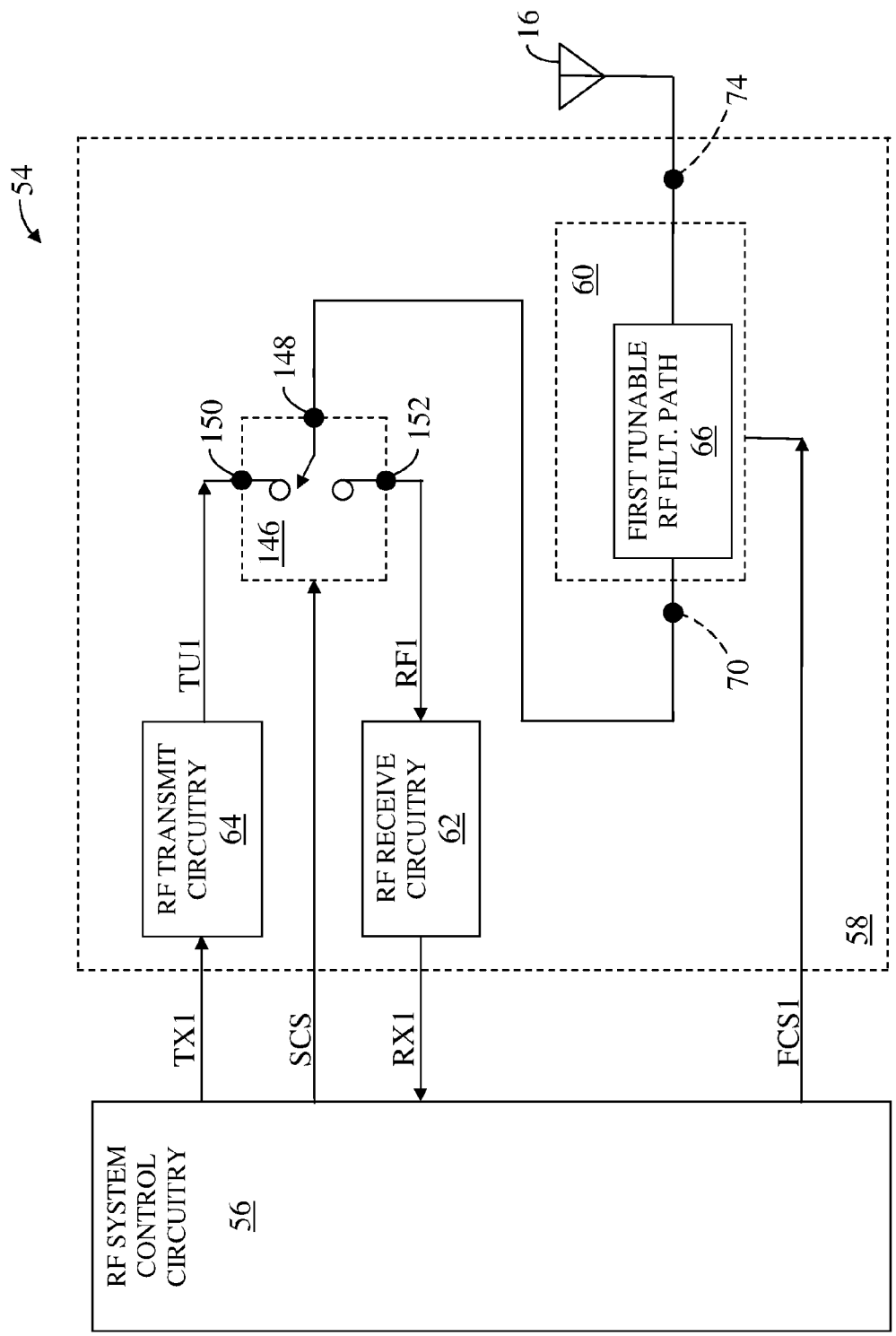
FIG. 20 shows the RF communications circuitry according to a further embodiment of the RF communications circuitry.

FIG. 20 shows the RF communications circuitry 54 according to a further embodiment of the RF communications circuitry 54. The RF communications circuitry 54 illustrated in FIG. 20 is a TDD system, which is capable of transmitting and receiving RF signals, but not simultaneously. As such, the RF communications circuitry 54 illustrated in FIG. 20 is similar to the RF communications circuitry 54 illustrated in FIG. 4, except in the RF communications circuitry 54 illustrated in FIG. 20, the second tunable RF filter path 68 and the second connection node 72 are omitted, and the RF front-end circuitry 58 further includes an RF transmit/receive switch 146 coupled between the first tunable RF filter path 66 and the RF receive circuitry 62, and further coupled between the first tunable RF filter path 66 and the RF transmit circuitry 64.

Since the RF communications circuitry 54 does not simultaneously transmit and receive RF signals, the first tunable RF filter path 66 provides front-end transmit filtering when the RF communications circuitry 54 is transmitting RF signals and the first tunable RF filter path 66 provides front-end receive filtering when the RF communications circuitry 54 is receiving RF signals. In this regard, the first tunable RF filter path 66 processes half-duplex signals.

The RF transmit/receive switch 146 has a transmit/receive switch common connection node 148, a transmit/receive switch first connection node 150, and a transmit/receive switch second connection node 152. The RF receive circuitry 62 is coupled between the RF system control circuitry 56 and the transmit/receive switch second connection node 152. The RF transmit circuitry 64 is coupled between the RF system control circuitry 56 and the transmit/receive switch first connection node 150. The first connection node 70 is coupled to the transmit/receive switch common connection node 148.

The RF system control circuitry 56 provides a switch control signal SCS to the RF transmit/receive switch 146. As such, the RF system control circuitry 56 selects either the transmit/receive switch first connection node 150 or the transmit/receive switch second connection node 152 to be coupled to the transmit/receive switch common connection node 148 using the switch control signal SCS. Therefore, when the RF communications circuitry 54 is transmitting RF signals, the RF transmit circuitry 64 is coupled to the first tunable RF filter path 66 and the RF receive circuitry 62 is not coupled to the first tunable RF filter path 66. Conversely, when the RF communications circuitry 54 is receiving RF signals, the RF receive circuitry 62 is coupled to the first tunable RF filter path 66 and the RF transmit circuitry 64 is not coupled to the first tunable RF filter path 66.

FIG. 21 illustrates an exemplary embodiment of the first RF filter structure 60. The first RF filter structure 60 includes a plurality of resonators (referred to generically as elements R and specifically as elements R(i,j), where an integer i indicates a row position and an integer j indicates a column position, where $1 \leq i \leq M$, $1 \leq j \leq N$ and M is any integer greater than 1 and N is any integer greater than to 1. It should be noted that in alternative embodiments the number of resonators R in each row and column may be the same or different). The first tunable RF filter path 66 includes row 1 of weakly coupled resonators R(1,1), R(1,2) through (R(1,N). All of the weakly coupled resonators R(1,1), R(1,2) through (R(1,N) are weakly coupled to one another. Furthermore, the first tunable RF filter path 66 is electrically connected between terminal 200 and terminal 202. In this manner, the first tunable RF filter path 66 is configured to receive RF signals and output filtered RF signals. The second tunable RF filter path 68 includes row M of weakly coupled resonators R(M,1), R(M,2) through R(M,N). All of the weakly coupled resonators R(M,1), R(M,2) through R(M,N) are weakly coupled to one another. Furthermore, the second tunable RF filter path 68 is electrically connected between terminal 204 and terminal 206. In this manner, the second tunable RF filter path 68 is configured to receive RF signals and output filtered RF signals. It should be noted that the first RF filter structure 60 may include any number of tunable RF filter paths, such as, for example, the third tunable RF filter path 110, the fourth tunable RF filter path 112, the fifth tunable RF filter path 122, and the sixth tunable RF filter path 124, described above with respect to FIGS. 11-14. Each of the resonators R may be a tunable resonator, which allows for a resonant frequency of each of the resonators R to be varied to along a frequency range. In some embodiments, not all of the couplings between the resonators R are weak. A hybrid architecture having at least one pair of weakly coupled resonators R and strongly or moderately coupled resonators R is also possible.

Cross-coupling capacitive structures C are electrically connected to and between the resonators R. In this embodiment, each of the cross-coupling capacitive structures C is a variable cross-coupling capacitive structure, such as a varactor or an array of capacitors. To be independent, the magnetic couplings may be negligible. Alternatively, the cross-coupling capacitive structures C may simply be provided by a capacitor with a fixed capacitance. With regard to the exemplary embodiment shown in FIG. 21, the tunable RF filter paths of the first RF filter structure 60 are independent of one another. As such, the first tunable RF filter path 66 and the second tunable RF filter path 68 are independent of one another and thus do not have cross-coupling capacitive structures C between their resonators. Thus, in this embodiment, the cross-coupling capacitive structures C do not connect any of the weakly coupled resonators R(1,1), R(1,2) through (R(1,N) to any of the weakly coupled resonators R(M,1), R(M,2) through (R(M,N). This provides increased isolation between the first tunable RF filter path 66 and the second tunable RF filter path 68. In general, energy transfer between two weakly coupled resonators R in the first tunable RF filter path 66 and the second tunable RF filter path 68 may be provided by multiple energy transfer components. For example, energy may be transferred between the resonators R only through mutual magnetic coupling, only through mutual electric coupling, or through both mutual electric coupling and mutual magnetic coupling. Ideally, all of the mutual coupling coefficients are provided as designed, but in practice, the mutual coupling coefficients also be the result of parasitics. The inductors of the resonators R may also have magnetic coupling between them. A total coupling between the resonators R is given by the sum of magnetic and electric coupling.

In order to provide the transfer functions of the tunable RF filter paths 66, 68 with high out-of-band attenuation and a relatively low filter order, the tunable RF filter paths 66, 68 are configured to adjust notches in the transfer function, which are provided by the resonators R within the tunable RF filter paths 66, 68. The notches can be provided using parallel tanks connected in series or in shunt along a signal path of the first tunable RF filter path 66. To provide the notches, the parallel tanks operate approximately as an open circuit or as short circuits at certain frequencies. The notches can also be provided using multi-signal path cancellation. In this case, the tunable RF filter paths 66, 68 may be smaller and/or have fewer inductors. To tune the total mutual coupling coefficients between the resonators R towards a desired value, the tunable RF filter paths 66, 68 are configured to vary variable electric coupling coefficients so that parasitic couplings between the resonators R in the tunable RF filter paths 66, 68 are absorbed into a desired frequency transfer function.

FIG. 22 illustrates an exemplary embodiment of the first tunable RF filter path 66 in the first RF filter structure 60 shown in FIG. 21. While the exemplary embodiment shown in FIG. 22 is of the first tunable RF filter path 66, any of the tunable RF filter paths shown in the first RF filter structure 60 of FIG. 21 may be arranged in accordance with the exemplary embodiment shown in FIG. 22. The first tunable RF filter path 66 shown in FIG. 22 includes an embodiment of the resonator R(1,1) and an embodiment of the resonator R(1,2). The resonator R(1,1) and the resonator R(1,2) are weakly coupled to one another. More specifically, the resonator R(1,1) includes an inductor 208 and a capacitive structure 210. The resonator R(1,2) includes an inductor 212, a capacitive structure 214, and a capacitive structure 216.

The resonator R(1,1) and the resonator R(1,2) are a pair of weakly coupled resonators. The resonator R(1,1) and the resonator R(1,2) are weakly coupled by providing the inductor 208 and the inductor 212 such that the inductor 208 and the inductor 212 are weakly magnetically coupled. Although the resonator R(1,1) and the resonator R(1,2) are weakly coupled, the inductor 212 has a maximum lateral width and a displacement between the inductor 208 and the inductor 212 is less than or equal to half the maximum lateral width of the inductor 212. As such, the inductor 208 and the inductor 212 are relatively close to one another. The displacement between the inductor 208 and the inductor 212 may be measured from a geometric centroid of the inductor 208 to a geometric centroid of the inductor 212. The maximum lateral width may be a maximum dimension of the inductor 212 along a plane defined by its largest winding. The weak coupling between the inductor 208 and the inductor 212 is obtained through topological techniques. For example, the inductor 208 and the inductor 212 may be fully or partially aligned, where winding(s) of the inductor 208 and winding(s) of the inductor 212 are configured to provide weak coupling through cancellation. Alternatively or additionally, a plane defining an orientation of the winding(s) of the inductor 208 and a plane defining an orientation of the winding(s) of the inductor 212 may be fully or partially orthogonal to one another. Some of the magnetic couplings between the resonators R can be unidirectional (passive or active). This can significantly improve isolation (e.g., transmit and receive isolation in duplexers).

To maximize the quality (Q) factor of the tunable RF filter paths 66 through 68, most of the total mutual coupling should be realized magnetically, and only fine-tuning is provided electrically. This also helps to reduce common-mode signal transfer in the differential resonators and thus keeps the Q factor high. While the magnetic coupling can be adjusted only statically, with a new layout design, the electric coupling can be tuned on the fly (after fabrication). The filter characteristics (e.g., bias network structure, resonator capacitance) can be adjusted based on given coupling coefficients to maximize filter performance.

To provide a tuning range to tune a transfer function of the first tunable RF filter path 66 and provide a fast roll-off from a low-frequency side to a high-frequency side of the transfer function, the first tunable RF filter path 66 is configured to change a sign of a total mutual coupling coefficient between the resonator R(1,1) and the resonator R(1,2). Accordingly, the first tunable RF filter path 66 includes a cross-coupling capacitive structure C(P1) and a cross-coupling capacitive structure C(N1). The cross-coupling capacitive structure C(P1) and the cross-coupling capacitive structure C(N1) are embodiments of the cross-coupling capacitive structures C described above with regard to FIG. 21. As shown in FIG. 22, the cross-coupling capacitive structure C(P1) is electrically connected between the resonator R(1,1) and the resonator R(1,2) so as to provide a positive coupling coefficient between the resonator R(1,1) and the resonator R(1,2). The cross-coupling capacitive structure C(P1) is a variable cross-coupling capacitive structure configured to vary the positive coupling coefficient provided between the resonator R(1,1) and the resonator R(1,2). The cross-coupling capacitive structure C(N1) is electrically connected between the resonator R(1,1) and the resonator R(1,2) so as to provide a negative coupling coefficient between the resonator R(1,1) and the resonator R(1,2). The cross-coupling capacitive structure C(N1) is a variable cross-coupling capacitive structure configured to vary the negative coupling coefficient provided between the resonator R(1,1) and the resonator R(1,2). The arrangement of the cross-coupling capacitive structure C(P1) and the cross-coupling capacitive structure C(N1) shown in FIG. 22 is a V-bridge structure. In alternative embodiments, some or all of the cross-coupling capacitive structures is fixed (not variable).

In the resonator R(1,1), the inductor 208 and the capacitive structure 210 are electrically connected in parallel. More specifically, the inductor 208 has an end 217 and an end 218, which are disposed opposite to one another. The ends 217, 218 are each electrically connected to the capacitive structure 210, which is grounded. Thus, the resonator R(1,1) is a single-ended resonator. On the other hand, the inductor 212 is electrically connected between the capacitive structure 214 and the capacitive structure 216. More specifically, the inductor 212 has an end 220 and an end 222, which are disposed opposite to one another. The end 220 is electrically connected to the capacitive structure 214 and the end 222 is electrically connected to the capacitive structure 216. Both the capacitive structure 214 and the capacitive structure 216 are grounded. Thus, the resonator R(1,2) is a differential resonator. In an alternative, an inductor with a center tap can be used. The tap can be connected to ground and only a single capacitive structure can be used. In yet another embodiment, both an inductor and a capacitive structure may have a center tap that is grounded. In still another embodiment, neither the inductor nor the capacitive structure may have a grounded center tap.

The inductor 208 is magnetically coupled to the inductor 212 such that an RF signal received at the end 217 of the inductor 208 with a voltage polarity (i.e., either a positive voltage polarity or a negative voltage polarity) results in a filtered RF signal being transmitted out the end 220 of the inductor 212 with the same voltage polarity. Also, the inductor 212 is magnetically coupled to the inductor 208 such that an RF signal received at the end 220 of the inductor 212 with a voltage polarity (i.e., either a positive voltage polarity or a negative voltage polarity) results in a filtered RF signal being transmitted out the end 217 of the inductor 208 with the same voltage polarity. This is indicated in FIG. 22 by the dot convention where a dot is placed at the end 217 of the inductor 208 and a dot is placed at the end 220 of the inductor 212. By using two independent and adjustable coupling coefficients (i.e., the positive coupling coefficient and the negative coupling coefficient) with the resonator R(1,2) (i.e., the differential resonator), the transfer function of the first tunable RF filter path 66 is provided so as to be fully adjustable. More specifically, the inductors 208, 212 may be magnetically coupled so as to have a low magnetic coupling coefficient through field cancellation, with the variable positive coupling coefficient and the variable negative coupling coefficient. In this case, the inductor 208 and the inductor 212 are arranged such that a mutual magnetic coupling between the inductor 208 and the inductor 212 cancel. Alternatively, the inductor 208 and the inductor 212 are arranged such that the inductor 212 reduces a mutual magnetic coupling coefficient of the inductor 208. With respect to the magnetic coupling coefficient, the variable positive coupling coefficient is a variable positive electric coupling coefficient and the variable negative coupling coefficient is a variable negative electric coupling coefficient. The variable positive electric coupling coefficient and the variable negative electric coupling coefficient oppose each other to create a tunable filter characteristic.

The resonator R(1,2) is operably associated with the resonator R(1,1) such that an energy transfer factor between the resonator R(1,1) and the resonator R(1,2) is less than 10%. A total mutual coupling between the resonator R(1,1) and the resonator R(1,2) is provided by a sum total of the mutual magnetic factor between the resonator R(1,1) and the resonator R(1,2) and the mutual electric coupling coefficients between the resonator R(1,1) and the resonator R(1,2). In this embodiment, the mutual magnetic coupling coefficient between the inductor 208 and the inductor 212 is a fixed mutual magnetic coupling coefficient. Although embodiments of the resonators R(1,1), R(1,2) may be provided so as to provide a variable magnetic coupling coefficient between the resonators R(1,1), R(1,2), embodiments of the resonators R(1,1), R(1,2) that provide variable magnetic couplings can be costly and difficult to realize. However, providing variable electric coupling coefficients (i.e., the variable positive electric coupling coefficient and the variable electric negative coupling coefficient) is easier and more economical. Thus, using the cross-coupling capacitive structure C(P1) and the cross-coupling capacitive structure C(N1) to provide the variable positive electric coupling coefficient and the variable electric negative coupling coefficient is an economical technique for providing a tunable filter characteristic between the resonators R(1,1), R(1,2). Furthermore, since the mutual magnetic coupling coefficient between the inductor 208 and the inductor 212 is fixed, the first tunable RF filter path 66 has lower insertion losses.

In the embodiment shown in FIG. 22, the inductor 208 and the 212 inductor are the same size. Alternatively, the inductor 208 and the inductor 212 may be different sizes. For example, the inductor 212 may be smaller than the inductor 208. By determining a distance between the inductor 208 and the inductor 212, the magnetic coupling coefficient between the inductor 208 and the inductor 212 can be set. With regard to the inductors 208, 212 shown in FIG. 22, the inductor 208 may be a folded inductor configured to generate a first confined magnetic field, while the inductor 212 may be a folded inductor configured to generate a second confined magnetic field. Magnetic field lines of the first confined magnetic field and of the second confined magnetic field that are external to the inductor 208 and inductor 212 are cancelled by opposing magnetic field lines in all directions. When the inductor 208 and the inductor 212 are folded inductors, the folded inductors can be stacked. This allows building the first tunable RF filter path 66 such that several inductors 208, 212 are stacked. Furthermore, this arrangement allows for a specially sized interconnect structure that electrically connects the inductors 208, 212 to the capacitive structure 210, the capacitive structure 214, the capacitive structure 216, the cross-coupling capacitive structure C(P1), and the cross-coupling capacitive structure C(N1). The specially sized interconnect increases the Q factor of the capacitive structure 210, the capacitive structure 214, the capacitive structure 216, the cross-coupling capacitive structure C(P1), and the cross-coupling capacitive structure C(N1), and allows for precise control of their variable capacitances. Weakly coupled filters can also be realized with planar field cancellation structures.

Figure 23:
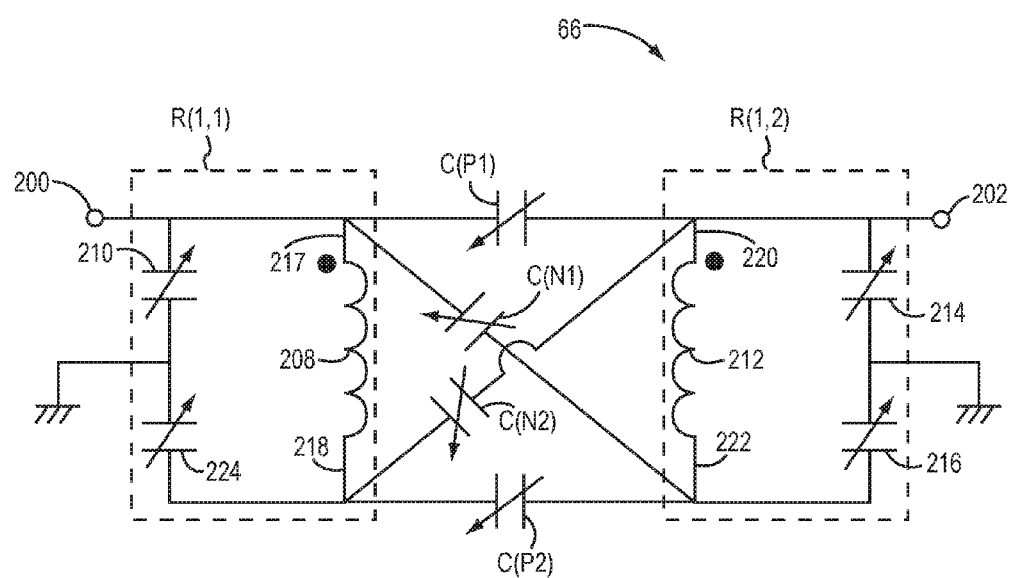
FIG. 23 illustrates another embodiment of the tunable RF filter path shown in FIG. 21 having cross-coupling capacitors arranged in an X-bridge structure.

FIG. 23 illustrates an exemplary embodiment of the first tunable RF filter path 66 in the first RF filter structure 60 shown in FIG. 21. While the exemplary embodiment shown in FIG. 23 is of the first tunable RF filter path 66, any of the tunable RF filter paths shown in the first RF filter structure 60 of FIG. 21 may be arranged in accordance with the exemplary embodiment shown in FIG. 23. The first tunable RF filter path 66 shown in FIG. 23 includes an embodiment of the resonator R(1,1) and an embodiment of the resonator R(1,2). The resonator R(1,1) and the resonator R(1,2) are weakly coupled to one another. The embodiment of the resonator R(1,2) is the same as the embodiment of the resonator R(1,2) shown in FIG. 22. Thus, the resonator R(1,2) shown in FIG. 23 is a differential resonator that includes the inductor 212, the capacitive structure 214, and the capacitive structure 216. Additionally, like the embodiment of the resonator R(1,1) shown in FIG. 22, the embodiment of the resonator R(1,1) shown in FIG. 23 includes the inductor 208 and the capacitive structure 210. However, in this embodiment, the resonator R(1,1) shown in FIG. 23 is a differential resonator and further includes a capacitive structure 224. More specifically, the end 217 of the inductor 208 is electrically connected to the capacitive structure 210 and the end 218 of the inductor 208 is electrically connected to the capacitive structure 224. Both the capacitive structure 210 and the capacitive structure 224 are grounded. Like the capacitive structure 210, the capacitive structure 224 is also a variable capacitive structure, such as a programmable array of capacitors or a varactor. Alternatively, a center tap of an inductor may be grounded. In yet another embodiment, the inductor and a capacitive structure may be RF floating (a low-resistance connection to ground).

The resonator R(1,1) and the resonator R(1,2) are a pair of weakly coupled resonators. Like the first tunable RF filter path 66 shown in FIG. 22, the resonator R(1,1) and the resonator R(1,2) are weakly coupled by providing the inductor 208 and the inductor 212 such that the inductor 208 and the inductor 212 are weakly coupled. Thus, the inductor 208 and the inductor 212 may have a magnetic coupling coefficient that is less than or equal to approximately 0.3. Although the resonator R(1,1) and the resonator R(1,2) are weakly coupled, a displacement between the inductor 208 and the inductor 212 is less than or equal to half the maximum lateral width of the inductor 212. As such, the inductor 208 and the inductor 212 are relatively close to one another. The displacement between the inductor 208 and the inductor 212 may be measured from a geometric centroid of the inductor 208 to a geometric centroid of the inductor 212. The maximum lateral width may be a maximum dimension of the inductor 212 along a plane defined by its largest winding.

The weak coupling between the inductor 208 and the inductor 212 is obtained through topological techniques. For example, the inductor 208 and the inductor 212 may be fully or partially aligned, where winding(s) of the inductor 208 and winding(s) of the inductor 212 are configured to provide weak coupling through cancellation. Alternatively or additionally, a plane defining an orientation of the windings of the inductor 208 and a plane defining an orientation of the windings of the inductor 212 may be fully or partially orthogonal to one another.

The resonator R(1,2) is operably associated with the resonator R(1,1) such that an energy transfer factor between the resonator R(1,1) and the resonator R(1,2) is less than 10%. To provide a tuning range to tune a transfer function of the first tunable RF filter path 66 such to provide a fast roll-off from a low-frequency side to a high-frequency side requires changing a sign of the total mutual coupling coefficient between the resonator R(1,1) and the resonator R(1,2). Like the embodiment of the first tunable RF filter path 66 shown in FIG. 22, the first tunable RF filter path 66 shown in FIG. 23 includes the cross-coupling capacitive structure C(P1) and the cross-coupling capacitive structure C(N1). The cross-coupling capacitive structure C(P1) and the cross-coupling capacitive structure C(N1) are arranged in the same manner described above with respect to FIG. 22. However, in this embodiment, the first tunable RF filter path 66 shown in FIG. 23 also includes a cross-coupling capacitive structure C(P2) and a cross-coupling capacitive structure C(N2). The cross-coupling capacitive structure C(P2) and the cross-coupling capacitive structure C(N2) are also embodiments of the cross-coupling capacitive structures C described above with regard to FIG. 21.

As described above with respect to FIG. 22, the cross-coupling capacitive structure C(P1) is electrically connected between the resonator R(1,1) and the resonator R(1,2) so as to provide the positive coupling coefficient (i.e., the variable positive electric coupling coefficient) between the resonator R(1,1) and the resonator R(1,2). Also as described above with respect to FIG. 22, the cross-coupling capacitive structure C(N1) is electrically connected between the resonator R(1,1) and the resonator R(1,2) so as to provide the negative coupling coefficient (i.e., the variable negative electric coupling coefficient) between the resonator R(1,1) and the resonator R(1,2). With regard to the cross-coupling capacitive structure C(P2), the cross-coupling capacitive structure C(P2) is electrically connected between the resonator R(1,1) and the resonator R(1,2) so as to provide another positive coupling coefficient (i.e., another variable positive electric coupling coefficient) between the resonator R(1,1) and the resonator R(1,2). In this embodiment, the cross-coupling capacitive structure C(P2) is electrically connected between the end 218 of the inductor 208 and the end 222 of the inductor 212. The cross-coupling capacitive structure C(P2) is a variable cross-coupling capacitive structure configured to vary the other positive coupling coefficient (i.e., the other variable positive electric coupling coefficient) provided between the resonator R(1,1) and the resonator R(1,2). With regard to the cross-coupling capacitive structure C(N2), the cross-coupling capacitive structure C(N2) is electrically connected between the resonator R(1,1) and the resonator R(1,2) so as to provide another negative coupling coefficient (i.e., another variable negative electric coupling coefficient) between the resonator R(1,1) and the resonator R(1,2). In this embodiment, the cross-coupling capacitive structure C(N2) is electrically connected between the end 218 of the inductor 208 and the end 220 of the inductor 212. The cross-coupling capacitive structure C(N2) is a variable cross-coupling capacitive structure configured to vary the negative coupling coefficient (i.e., the other variable negative electric coupling coefficient) provided between the resonator R(1,1) and the resonator R(1,2). The arrangement of the cross-coupling capacitive structure C(P1), the cross-coupling capacitive structure C(N1), the cross-coupling capacitive structure C(P2), and the cross-coupling capacitive structure C(N2) shown in FIG. 23 is an X-bridge structure.

As shown in FIG. 23, the resonator R(1,2) is operably associated with the resonator R(1,1) such that an energy transfer factor between the resonator R(1,1) and the resonator R(1,2) is less than 10%. The total mutual coupling between the resonator R(1,1) and the resonator R(1,2) is provided by a sum total of the mutual magnetic factor between the resonator R(1,1) and the resonator R(1,2) and the mutual electric coupling coefficients between the resonator R(1,1) and the resonator R(1,2). Thus, in this embodiment, the total mutual coupling between the resonator R(1,1) and the resonator R(1,2) is provided by the sum total of the mutual magnetic coupling coefficient, the variable positive electric coupling coefficient provided by the cross-coupling capacitive structure C(P1), the variable negative electric coupling coefficient provided by the cross-coupling capacitive structure C(N1), the other variable positive electric coupling coefficient provided by the cross-coupling capacitive structure C(P2), and the other variable negative electric coupling coefficient provided by the cross-coupling capacitive structure C(N2).

Figure 24:
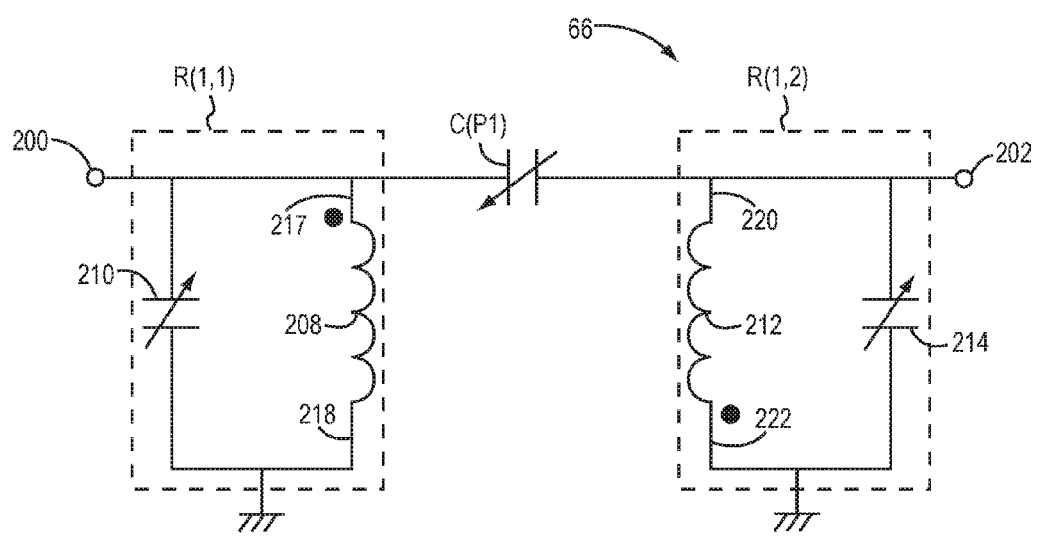
FIG. 24 illustrates another embodiment of the tunable RF filter path shown in FIG. 21 having a cross-coupling capacitor arranged in a single positive bridge structure.

FIG. 24 illustrates an exemplary embodiment of the first tunable RF filter path 66 in the first RF filter structure 60 shown in FIG. 21. While the exemplary embodiment shown in FIG. 24 is of the first tunable RF filter path 66, any of the tunable RF filter paths shown in the first RF filter structure 60 of FIG. 21 may be arranged in accordance with the exemplary embodiment shown in FIG. 24. The first tunable RF filter path 66 shown in FIG. 24 includes an embodiment of the resonator R(1,1) and an embodiment of the resonator R(1,2). The resonator R(1,1) and the resonator R(1,2) are weakly coupled to one another. The embodiment of the resonator R(1,1) is the same as the embodiment of the resonator R(1,1) shown in FIG. 22. Thus, the resonator R(1,1) shown in FIG. 24 is a single-ended resonator that includes the inductor 208 and the capacitive structure 210. Additionally, like the embodiment of the resonator R(1,2) shown in FIG. 22, the embodiment of the resonator R(1,2) shown in FIG. 24 includes the inductor 212 and the capacitive structure 214. However, in this embodiment, the resonator R(1,2) shown in FIG. 24 is a single-ended resonator. More specifically, the end 220 and the end 222 of the inductor 212 are each electrically connected to the capacitive structure 214, which is grounded.

The resonator R(1,1) and the resonator R(1,2) are a pair of weakly coupled resonators. Like the first tunable RF filter path 66 shown in FIG. 22, the resonator R(1,1) and the resonator R(1,2) are weakly coupled by providing the inductor 208 and the inductor 212 such that the inductor 208 and the inductor 212 are weakly coupled. Thus, the inductor 208 and the inductor 212 may have a magnetic coupling coefficient that is less than or equal to approximately 0.3. Although the resonator R(1,1) and the resonator R(1,2) are weakly coupled, the displacement between the inductor 208 and the inductor 212 is less than or equal to half the maximum lateral width of the inductor 212. As such, the inductor 208 and the inductor 212 are relatively close to one another. The displacement between the inductor 208 and the inductor 212 may be measured from the geometric centroid of the inductor 208 to the geometric centroid of the inductor 212. The maximum lateral width may be a maximum dimension of the inductor 212 along a plane defined by its largest winding. The weak coupling between the inductor 208 and the inductor 212 is obtained through topological techniques. For example, the inductor 208 and the inductor 212 may be fully or partially aligned, where winding(s) of the inductor 208 and winding(s) of the inductor 212 are configured to provide weak coupling through cancellation. Alternatively or additionally, a plane defining an orientation of the windings of the inductor 208 and a plane defining an orientation of the windings of the inductor 212 may be fully or partially orthogonal to one another.

The resonator R(1,2) is operably associated with the resonator R(1,1) such that an energy transfer factor between the resonator R(1,1) and the resonator R(1,2) is less than 10%. To provide a tuning range to tune a transfer function of the first tunable RF filter path 66 and provide a fast roll-off from a low-frequency side to a high-frequency side of the transfer function, the first tunable RF filter path 66 is configured to change a sign of a total mutual coupling coefficient between the resonator R(1,1) and the resonator R(1,2). However, in this embodiment, the first tunable RF filter path 66 shown in FIG. 24 only includes the cross-coupling capacitive structure C(P1), which is electrically connected between the end 217 of the inductor 208 and the end 220 of the inductor 212. As discussed above with respect to FIGS. 22 and 23, the cross-coupling capacitive structure C(P1) is a variable cross-coupling capacitive structure configured to vary the positive coupling coefficient (i.e., the variable positive electric coupling coefficient) provided between the resonator R(1,1) and the resonator R(1,2). Thus, in order to allow for the sign of the total mutual coupling coefficient between the resonator R(1,1) and the resonator R(1,2) to be changed, the inductor 208 and the inductor 212 are arranged so as to provide a fixed negative mutual magnetic coupling coefficient between the inductor 208 of the resonator R(1,1) and the inductor 212 of the resonator R(1,2). As such, varying the variable positive electric coupling coefficient allows for the sign of the total mutual coupling coefficient between the resonator R(1,1) and the resonator R(1,2) to be changed using only the cross-coupling capacitive structure C(P1).

As such, in this embodiment, the inductor 208 is magnetically coupled to the inductor 212 such that an RF signal received at the end 217 of the inductor 208 with a voltage polarity (i.e., either a positive voltage polarity or a negative voltage polarity) results in a filtered RF signal with the same voltage polarity being transmitted out the end 222 of the inductor 212. In addition, the inductor 212 is magnetically coupled to the inductor 208 such that an RF signal received at the end 222 of the inductor 212 with a voltage polarity (i.e., either a positive voltage polarity or a negative voltage polarity) results in a filtered RF signal with the same voltage polarity being transmitted out the end 217 of the inductor 208. This is indicated in FIG. 24 by the dot convention where a dot is placed at the end 217 of the inductor 208 and a dot is placed at the end 222 of the inductor 212. By using the fixed negative mutual magnetic coupling coefficient and the variable positive electric coupling coefficient, the transfer function of the first tunable RF filter path 66 is provided so to be fully adjustable. The arrangement of the cross-coupling capacitive structure C(P1) shown in FIG. 24 is a single positive bridge structure.

Figure 25:
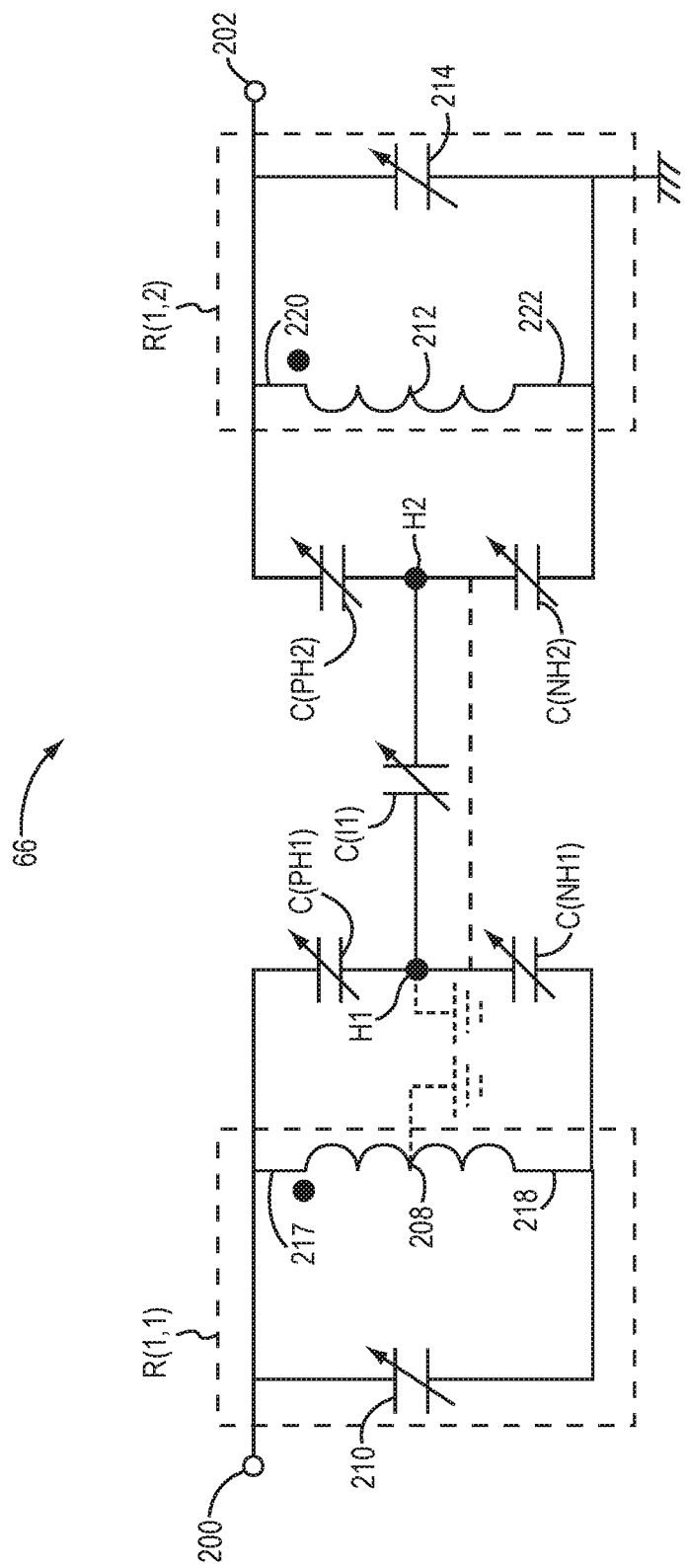
FIG. 25 illustrates another embodiment of the tunable RF filter path shown in FIG. 21 having cross-coupling capacitors arranged in an H-bridge structure.

FIG. 25 illustrates another exemplary embodiment of the first tunable RF filter path 66 in the first RF filter structure 60 shown in FIG. 21. While the exemplary embodiment shown in FIG. 25 is of the first tunable RF filter path 66, any of the tunable RF filter paths shown in the first RF filter structure 60 of FIG. 21 may be arranged in accordance with the exemplary embodiment shown in FIG. 25. The first tunable RF filter path 66 shown in FIG. 25 includes an embodiment of the resonator R(1,1) and an embodiment of the resonator R(1,2). The resonator R(1,1) and the resonator R(1,2) are weakly coupled to one another. The embodiment of the resonator R(1,1) is the same as the embodiment of the resonator R(1,1) shown in FIG. 22. Thus, the resonator R(1,1) shown in FIG. 25 is a single-ended resonator that includes the inductor 208 and the capacitive structure 210, which are arranged in the same manner described above with respect to FIG. 22. Like the resonator R(1,2) shown in FIG. 24, the resonator R(1,2) shown in FIG. 25 is a single-ended resonator that includes the inductor 212 and the capacitive structure 214. However, the inductor 208 shown in FIG. 25 is magnetically coupled to the inductor 212 such that an RF signal received at the end 217 of the inductor 208 with a voltage polarity (i.e., either a positive voltage polarity or a negative voltage polarity) results in a filtered RF signal with the same voltage polarity being transmitted out the end 220 of the inductor 212. Also, the inductor 212 shown in FIG. 25 is magnetically coupled to the inductor 208 such that an RF signal received at the end 220 of the inductor 212 with a voltage polarity (i.e., either a positive voltage polarity or a negative voltage polarity) results in a filtered RF signal with the same voltage polarity being transmitted out the end 217 of the inductor 208. This is indicated in FIG. 25 by the dot convention where a dot is placed at the end 217 of the inductor 208 and a dot is placed at the end 220 of the inductor 212. In alternative embodiments, the resonator R(1,2) is a differential resonator. In yet another alternative embodiment, the resonator R(1,1) is a single-ended resonator while the resonator R(1,2) is a differential resonator.

The resonator R(1,1) and the resonator R(1,2) are a pair of weakly coupled resonators. Like the first tunable RF filter path 66 shown in FIG. 22, the resonator R(1,1) and the resonator R(1,2) are weakly coupled by providing the inductor 208 and the inductor 212 such that the inductor 208 and the inductor 212 are weakly coupled. Thus, the inductor 208 and the inductor 212 may have a fixed magnetic coupling coefficient that is less than or equal to approximately 0.3. Although the resonator R(1,1) and the resonator R(1,2) are weakly coupled, a displacement between the inductor 208 and the inductor 212 is less than or equal to half the maximum lateral width of the inductor 212. As such, the inductor 208 and the inductor 212 are relatively close to one another. The displacement between the inductor 208 and the inductor 212 may be measured from a geometric centroid of the inductor 208 to a geometric centroid of the inductor 212. The maximum lateral width may be a maximum dimension of the inductor 212 along a plane defined by its largest winding.

The weak coupling between the inductor 208 and the inductor 212 is obtained through topological techniques. For example, the inductor 208 and the inductor 212 may be fully or partially aligned, where winding(s) of the inductor 208 and winding(s) of the inductor 212 are configured to provide weak coupling through cancellation. Alternatively or additionally, a plane defining an orientation of the windings of the inductor 208 and a plane defining an orientation of the windings of the inductor 212 may be fully or partially orthogonal to one another.

The resonator R(1,2) is operably associated with the resonator R(1,1) such that an energy transfer factor between the resonator R(1,1) and the resonator R(1,2) is less than 10%. To provide a tuning range to tune the transfer function of the first tunable RF filter path 66 and to provide a fast roll-off from the low-frequency side to the high-frequency side of the transfer function, the first tunable RF filter path 66 is configured to change the sign of the total mutual coupling coefficient between the resonator R(1,1) and the resonator R(1,2). In this embodiment, the first tunable RF filter path 66 shown in FIG. 25 includes a cross-coupling capacitive structure C(PH1), a cross-coupling capacitive structure (CNH1), a cross-coupling capacitive structure C(I1), a cross-coupling capacitive structure C(PH2), and a cross-coupling capacitive structure C(NH2). The cross-coupling capacitive structure C(PH1), the cross-coupling capacitive structure (CNH1), the cross-coupling capacitive structure C(I1), the cross-coupling capacitive structure C(PH2), and the cross-coupling capacitive structure C(NH2) are also embodiments of the cross-coupling capacitive structures C described above with regard to FIG. 21.

The cross-coupling capacitive structure C(PH1) and the cross-coupling capacitive structure C(NH1) are arranged to form a first capacitive voltage divider. The first capacitive voltage divider is electrically connected to the resonator R(1,1). More specifically, the cross-coupling capacitive structure C(PH1) is electrically connected between the end 217 of the inductor 208 and a common connection node H1. The cross-coupling capacitive structure C(NH1) is electrically connected between the end 218 of the inductor 208 and the common connection node H1. Additionally, the cross-coupling capacitive structure C(PH2) and the cross-coupling capacitive structure C(NH2) are arranged to form a second capacitive voltage divider. The second capacitive voltage divider is electrically connected to the resonator R(1,2). More specifically, the cross-coupling capacitive structure C(PH2) is electrically connected between the end 220 of the inductor 212 and a common connection node H2. The cross-coupling capacitive structure C(NH2) is electrically connected between the end 222 of the inductor 212 and the common connection node H2. As shown in FIG. 25, the cross-coupling capacitive structure C(I1) is electrically connected between the first capacitive voltage divider and the second capacitive voltage divider. More specifically, the cross-coupling capacitive structure C(I1) is electrically connected between the common connection node H1 and the common connection node H2. The arrangement of the cross-coupling capacitive structure C(PH1), the cross-coupling capacitive structure C(NH1), the cross-coupling capacitive structure C(PH2), the cross-coupling capacitive structure C(NH2), and the cross-coupling capacitive structure C(I1) shown in FIG. 25 is an H-bridge structure. In an alternative H-bridge structure, the cross-coupling capacitive structure C(I1) is not provided and instead there is a short between the common connection node H1 and the common connection node H2. In addition, a center tap of the inductor 208 may be grounded and/or the common connection node H1 may be grounded. Finally, a high impedance to ground may be provided at the common connection node H1.

With regard to the first capacitive voltage divider, the cross-coupling capacitive structure C(PH1) is a variable cross-coupling capacitive structure configured to vary a first variable positive electric coupling coefficient provided between the resonator R(1,1) and the common connection node H1. The cross-coupling capacitive structure C(NH1) is a variable cross-coupling capacitive structure configured to vary a first variable negative electric coupling coefficient provided between the resonator R(1,1) and the common connection node H1. Thus, a mutual electric coupling coefficient of the resonator R(1,1) is approximately equal to the first variable positive electric coupling coefficient and the first variable negative electric coupling coefficient.

With regard to the second capacitive voltage divider, the cross-coupling capacitive structure C(PH2) is a variable cross-coupling capacitive structure configured to vary a second variable positive electric coupling coefficient provided between the resonator R(1,2) and the common connection node H2. The cross-coupling capacitive structure C(NH2) is a variable cross-coupling capacitive structure configured to vary a second variable negative electric coupling coefficient provided between the resonator R(1,2) and the common connection node H2. Thus, a mutual electric coupling coefficient of the resonator R(1,2) is approximately equal to the second variable positive electric coupling coefficient and the second variable negative electric coupling coefficient. Furthermore, the cross-coupling capacitive structure C(I1) is a variable cross-coupling capacitive structure configured to vary a first variable intermediate electric coupling coefficient provided between the common connection node H1 and the common connection node H2. The first tunable RF filter path 66 shown in FIG. 25 thus has a total mutual coupling coefficient between the resonator R(1,1) and the resonator R(1,2) equal to the sum total of the mutual magnetic coupling coefficient between the inductor 208 and the inductor 212, the mutual electric coupling coefficient of the resonator R(1,1), the mutual electric coupling coefficient of the resonator R(1,2), and the first variable intermediate electric coupling coefficient provided between the common connection node H1 and the common connection node H2. In alternative embodiments, cross-coupling capacitive structures with fixed capacitances are provided.

In one embodiment, the cross-coupling capacitive structure C(PH1), the cross-coupling capacitive structure C(NH1), the cross-coupling capacitive structure C(PH2), the cross-coupling capacitive structure C(NH2), and the cross-coupling capacitive structure C(I1) may each be provided as a varactor. However, the cross-coupling capacitive structure C(PH1), the cross-coupling capacitive structure C(NH1), the cross-coupling capacitive structure C(PH2), the cross-coupling capacitive structure C(NH2), and the cross-coupling capacitive structure C(I1) may each be provided as a programmable array of capacitors in order to reduce insertion losses and improve linearity. The cross-coupling capacitive structure C(PH1), the cross-coupling capacitive structure C(NH1), the cross-coupling capacitive structure C(PH2), the cross-coupling capacitive structure C(NH2), and the cross-coupling capacitive structure C(I1) can also be any combination of suitable variable cross-coupling capacitive structures, such as combinations of varactors and programmable arrays of capacitors. Although the H-bridge structure can provide good linearity and low insertion losses, the H-bridge structure can also suffer from common-mode signal transfer.

Figure 26:
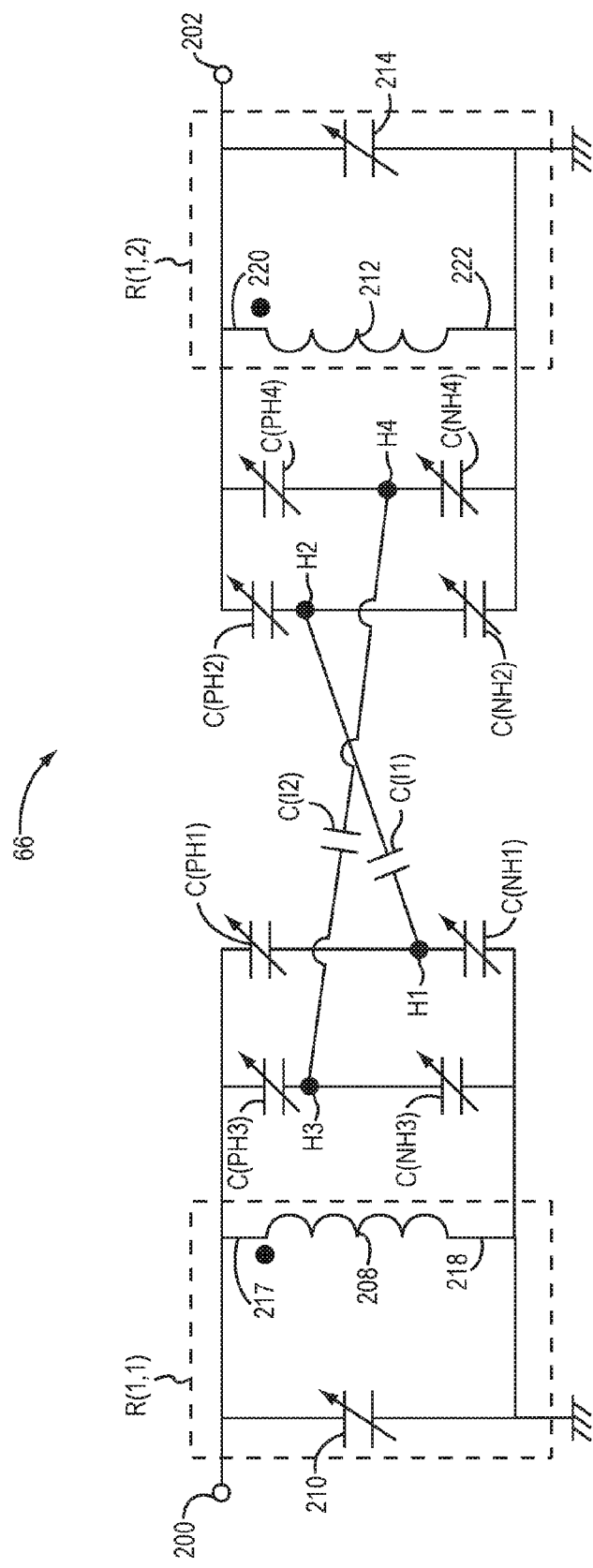
FIG. 26 illustrates another embodiment of the tunable RF filter path shown in FIG. 21 having cross-coupling capacitors arranged in a double H-bridge structure.

FIG. 26 illustrates yet another exemplary embodiment of the first tunable RF filter path 66 in the first RF filter structure 60 shown in FIG. 21. While the exemplary embodiment shown in FIG. 26 is of the first tunable RF filter path 66, any of the tunable RF filter paths shown in the first RF filter structure 60 of FIG. 21 may be arranged in accordance with the exemplary embodiment shown in FIG. 26. The first tunable RF filter path 66 shown in FIG. 26 can be used to ameliorate the common-mode signal transfer of the H-bridge structure shown in FIG. 25. More specifically, the first tunable RF filter path 66 shown in FIG. 26 includes the same embodiment of the resonator R(1,1) and the same embodiment of the resonator R(1,2) described above with respect to FIG. 25. Furthermore, the first tunable RF filter path 66 shown in FIG. 26 includes the first capacitive voltage divider with the cross-coupling capacitive structure C(PH1) and the cross-coupling capacitive structure C(NH1) described above with respect to FIG. 25, the second capacitive voltage divider with the cross-coupling capacitive structure C(PH2) and the cross-coupling capacitive structure (CNH2) described above with respect to FIG. 25, and the cross-coupling capacitive structure C(I1) described above with respect to FIG. 25. However, in this embodiment, the first tunable RF filter path 66 shown in FIG. 26 also includes a cross-coupling capacitive structure C(PH3), a cross-coupling capacitive structure (CNH3), a cross-coupling capacitive structure C(I2), a cross-coupling capacitive structure C(PH4), and a cross-coupling capacitive structure C(NH4). The cross-coupling capacitive structure C(PH3), the cross-coupling capacitive structure (CNH3), the cross-coupling capacitive structure C(I2), the cross-coupling capacitive structure C(PH4), and the cross-coupling capacitive structure C(NH4) are also embodiments of the cross-coupling capacitive structures C described above with regard to FIG. 21.

As shown in FIG. 26, the cross-coupling capacitive structure C(PH3) and the cross-coupling capacitive structure C(NH3) are arranged to form a third capacitive voltage divider. The third capacitive voltage divider is electrically connected to the resonator R(1,1). More specifically, the cross-coupling capacitive structure C(PH3) is electrically connected between the end 217 of the inductor 208 and a common connection node H3. The cross-coupling capacitive structure C(NH3) is electrically connected between the end 218 of the inductor 208 and the common connection node H3. Additionally, the cross-coupling capacitive structure C(PH4) and the cross-coupling capacitive structure C(NH4) are arranged to form a fourth capacitive voltage divider. The fourth capacitive voltage divider is electrically connected to the resonator R(1,2). More specifically, the cross-coupling capacitive structure C(PH4) is electrically connected between the end 220 of the inductor 212 and a common connection node H4. The cross-coupling capacitive structure C(NH4) is electrically connected between the end 222 of the inductor 212 and the common connection node H4. As shown in FIG. 26, the cross-coupling capacitive structure C(I2) is electrically connected between first capacitive voltage divider and the second capacitive voltage divider. More specifically, the cross-coupling capacitive structure C(I2) is electrically connected between the common connection node H3 and the common connection node H4. Alternatively, the cross-coupling capacitive structure C(I1) and the cross-coupling capacitive structure C(I2) can be replaced with shorts. The arrangement of the cross-coupling capacitive structure C(PH1), the cross-coupling capacitive structure C(NH1), the cross-coupling capacitive structure C(PH2), the cross-coupling capacitive structure C(NH2), the cross-coupling capacitive structure C(I1), the cross-coupling capacitive structure C(PH3), the cross-coupling capacitive structure C(NH3), the cross-coupling capacitive structure C(PH4), the cross-coupling capacitive structure C(NH4), and the cross-coupling capacitive structure C(I2) shown in FIG. 26 is a double H-bridge structure.

With regard to the third capacitive voltage divider, the cross-coupling capacitive structure C(PH3) is a variable cross-coupling capacitive structure configured to vary a third variable positive electric coupling coefficient provided between the resonator R(1,1) and the common connection node H3. The cross-coupling capacitive structure C(NH3) is a variable cross-coupling capacitive structure configured to vary a third variable negative electric coupling coefficient provided between the resonator R(1,1) and the common connection node H3. Thus, a mutual electric coupling coefficient of the resonator R(1,1) is approximately equal to the first variable positive electric coupling coefficient, the third variable positive electric coupling coefficient, the first variable negative electric coupling coefficient and the third variable negative electric coupling coefficient.

With regard to the fourth capacitive voltage divider, the cross-coupling capacitive structure C(PH4) is a variable cross-coupling capacitive structure configured to vary a fourth variable positive electric coupling coefficient provided between the resonator R(1,2) and the common connection node H4. The cross-coupling capacitive structure C(NH4) is a variable cross-coupling capacitive structure configured to vary a fourth variable negative electric coupling coefficient provided between the resonator R(1,2) and the common connection node H4. Thus, a mutual electric coupling coefficient of the resonator R(1,2) is approximately equal to the second variable positive electric coupling coefficient, the fourth variable positive coupling coefficient, the second variable negative coupling coefficient, and the fourth variable negative electric coupling coefficient. Furthermore, the cross-coupling capacitive structure C(I2) is a variable cross-coupling capacitive structure configured to vary a second variable intermediate electric coupling coefficient provided between the common connection node H3 and the common connection node H4. The first tunable RF filter path 66 shown in FIG. 26 thus has a total mutual coupling coefficient between the resonator R(1,1) and the resonator R(1,2) equal to the sum total of the mutual magnetic coupling coefficient between the inductor 208 and the inductor 212, the mutual electric coupling coefficient of the resonator R(1,1), the mutual electric coupling coefficient of the resonator R(1,2), the first variable intermediate electric coupling coefficient provided between the common connection node H1 and the common connection node H2 and the second variable intermediate electric coupling coefficient provided between the common connection node H3 and the common connection node H4. The double H-bridge structure thus includes two H-bridge structures. The two H-bridge structures allow for common-mode signal transfers of the two H-bridge structures to oppose one another and thereby be reduced and even cancelled.

Figure 27:
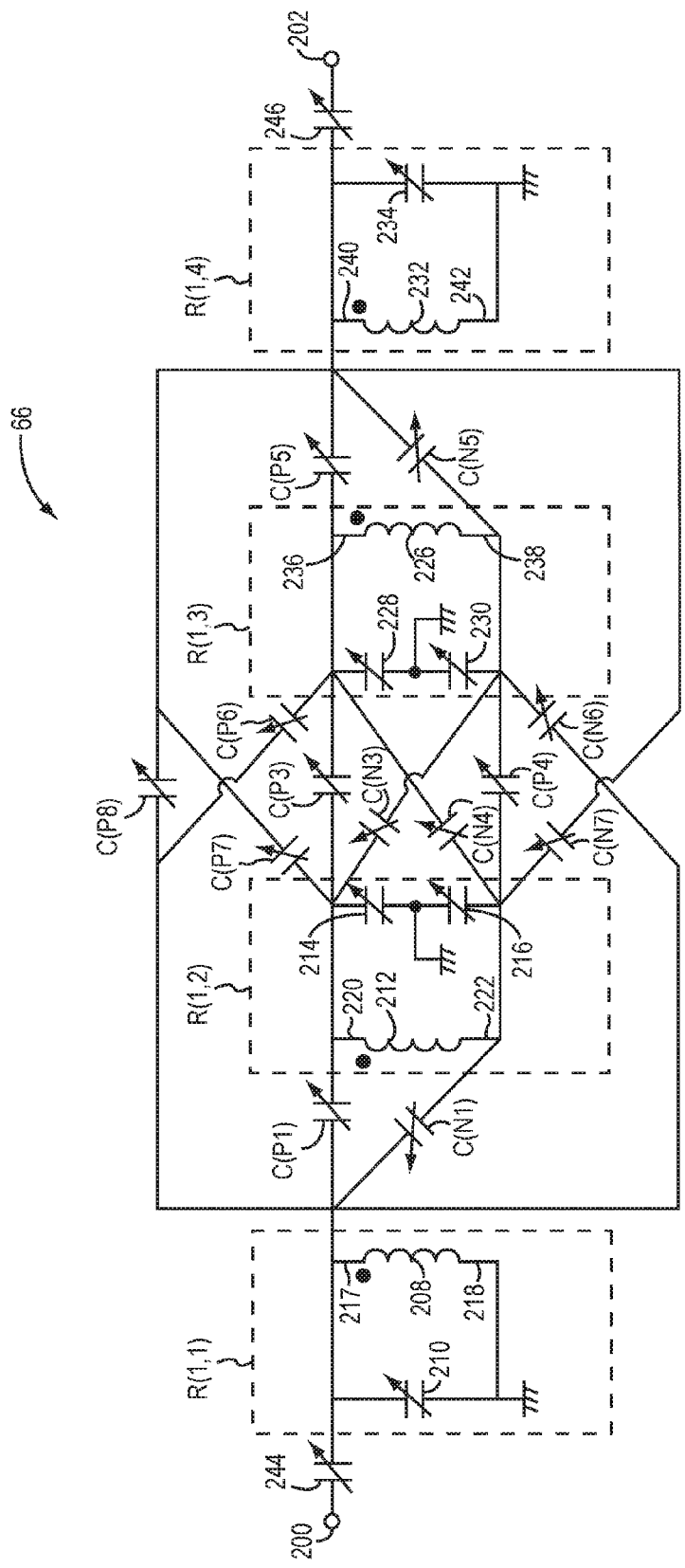
FIG. 27 illustrates another embodiment of the tunable RF filter path shown in FIG. 21 having four weakly coupled resonators with magnetic and electric couplings between them.

FIG. 27 illustrates still another exemplary embodiment of the first tunable RF filter path 66 in the first RF filter structure 60 shown in FIG. 21. While the exemplary embodiment shown in FIG. 27 is of the first tunable RF filter path 66, any of the tunable RF filter paths shown in the first RF filter structure 60 of FIG. 21 may be arranged in accordance with the exemplary embodiment shown in FIG. 27. The first tunable RF filter path 66 shown in FIG. 27 includes the same embodiment of the resonator R(1,1) and the same embodiment of the resonator R(1,2) described above with respect to FIG. 22. In addition, the first tunable RF filter path 66 shown in FIG. 27 includes the cross-coupling capacitive structure C(P1) and the cross-coupling capacitive structure (CN1) that form the V-bridge structure described above with respect to FIG. 22. However, the first tunable RF filter path 66 shown in FIG. 27 further includes a resonator R(1,3) and a resonator R(1,4). More specifically, the resonator R(1,3) includes an inductor 226, a capacitive structure 228, and a capacitive structure 230. The resonator R(1,4) includes an inductor 232 and a capacitive structure 234.

With regard to the resonator R(1,3), the inductor 226 is electrically connected between the capacitive structure 228 and the capacitive structure 230. More specifically, the inductor 226 has an end 236 and an end 238, which are disposed opposite to one another. The end 236 is electrically connected to the capacitive structure 228 and the end 238 is electrically connected to the capacitive structure 230. Both the capacitive structure 228 and the capacitive structure 230 are grounded. Thus, the resonator R(1,3) is a differential resonator. In this embodiment, each of the capacitive structure 228 and the capacitive structure 230 is a variable capacitive structure.

With regard to the resonator R(1,4), the inductor 232 and the capacitive structure 234 are electrically connected in parallel. More specifically, the inductor 232 has an end 240 and an end 242, which are disposed opposite to one another. The ends 240, 242 are each electrically connected to the capacitive structure 234, which is grounded. Thus, the resonator R(1,4) is a single-ended resonator.

In this embodiment, the resonator R(1,1), the resonator R(1,2), the resonator R(1,3), and the resonator R(1,4) are all weakly coupled to one another. The resonator R(1,3) and the resonator R(1,4) are weakly coupled by providing the inductor 226 and the inductor 232 such that the inductor 226 and the inductor 232 are weakly coupled. The resonators R(1,1), R(1,2), R(1,3), and R(1,4) are each operably associated with one another such that energy transfer factors between the resonators R(1,1), R(1,2), R(1,3), and R(1,4) are less than 10%. Although the resonator R(1,3) and the resonator R(1,4) are weakly coupled, the inductor 232 has a maximum lateral width and a displacement between the inductor 226 and the inductor 232 is less than or equal to half the maximum lateral width of the inductor 232. As such, the inductor 226 and the inductor 232 are relatively close to one another. The displacement between the inductor 226 and the inductor 232 may be measured from a geometric centroid of the inductor 226 to a geometric centroid of the inductor 232. The maximum lateral width may be a maximum dimension of the inductor 232 along a plane defined by its largest winding. The weak coupling between the inductor 226 and the inductor 232 is obtained through topological techniques. For example, the inductor 226 and the inductor 232 may be fully or partially aligned, where winding(s) of the inductor 226 and winding(s) of the inductor 232 are configured to provide weak coupling through cancellation. Alternatively or additionally, a plane defining an orientation of the windings of the inductor 226 and a plane defining an orientation of the windings of the inductor 232 may be fully or partially orthogonal to one another.

In some embodiments, all of the inductors 208, 212, 226, 232 are provided such that displacements between each of the inductors 208, 212, 226, 232 are less than or equal to half the maximum lateral width of the inductor 212. Alternatively, in other embodiments, only a proper subset of the inductors 208, 212, 226, 232 has displacements that are less than or equal to half the maximum lateral width of the inductor 212. For example, while the displacement between the inductor 208 and the inductor 212 may be less than or equal to half the maximum lateral width of the inductor 212 and the displacement between the inductor 226 and the inductor 232 may be less than or equal to half the maximum lateral width of the inductor 232, the displacements from the inductor 208 and the inductor 212 to the inductor 226 and the inductor 232 may each be greater than half the maximum lateral width of the inductor 212 and half the maximum lateral width of the inductor 232.

The inductors 208, 212, 226, and 232 are magnetically coupled to the each other such that an RF signal received at the end 217 of the inductor 208 with a voltage polarity (i.e., either a positive voltage polarity or a negative voltage polarity) results in filtered RF signals with the same voltage polarity being transmitted out the end 220 of the inductor 212, the end 236 of the inductor 226, and the end 240 of the inductor 232. Also, the inductors 208, 212, 226, and 232 are magnetically coupled to the each other such that an RF signal received at the end 240 of the inductor 232 with a voltage polarity (i.e., either a positive voltage polarity or a negative voltage polarity) results in filtered RF signals with the same voltage polarity being transmitted out the end 217 of the inductor 208, the end 220 of the inductor 212, and the end 236 of the inductor 226. This is indicated in FIG. 27 by the dot convention where a dot is placed at the end 217 of the inductor 208, a dot is placed at the end 220 of the inductor 212, a dot is placed at the end 236 of the inductor 226, and a dot is placed at the end 240 of the inductor 232.

The first tunable RF filter path 66 shown in FIG. 27 includes a cross-coupling capacitive structure C(P3), a cross-coupling capacitive structure C(N3), a cross-coupling capacitive structure C(P4), and a cross-coupling capacitive structure C(N4) electrically connected between the resonator R(1,2) and the resonator R(1,3). With respect to the resonator R(1,2) and the resonator R(1,3), the cross-coupling capacitive structure C(P3), the cross-coupling capacitive structure C(N3), the cross-coupling capacitive structure C(P4) and the cross-coupling capacitive structure C(N4) are arranged to have the X-bridge structure described above with respect to FIG. 23. Thus, the cross-coupling capacitive structure C(P3) is electrically connected between the end 220 and the end 236 so as to provide a variable positive electric coupling coefficient between the resonator R(1,2) and the resonator R(1,3). The cross-coupling capacitive structure C(P3) is a variable cross-coupling capacitive structure configured to vary the variable positive electric coupling coefficient provided between the resonator R(1,2) and the resonator R(1,3). Also, the cross-coupling capacitive structure C(N3) is electrically connected between the end 220 and the end 238 so as to provide a variable negative electric coupling coefficient between the resonator R(1,2) and the resonator R(1,3). The cross-coupling capacitive structure C(N3) is a variable cross-coupling capacitive structure configured to vary the variable negative electric coupling coefficient provided between the resonator R(1,2) and the resonator R(1,3).

Additionally, the cross-coupling capacitive structure C(P4) is electrically connected between the end 222 and the end 238 so as to provide another variable positive electric coupling coefficient between the resonator R(1,2) and the resonator R(1,3). The cross-coupling capacitive structure C(P4) is a variable cross-coupling capacitive structure configured to vary the other variable positive electric coupling coefficient provided between the resonator R(1,2) and the resonator R(1,3). Finally, the cross-coupling capacitive structure C(N4) is electrically connected between the end 222 and the end 236 so as to provide another variable negative electric coupling coefficient between the resonator R(1,2) and the resonator R(1,3). The cross-coupling capacitive structure C(N4) is a variable cross-coupling capacitive structure configured to vary the other variable negative electric coupling coefficient provided between the resonator R(1,2) and the resonator R(1,3).

With respect to the resonator R(1,3) and the resonator R(1,4), the first tunable RF filter path 66 shown in FIG. 27 includes a cross-coupling capacitive structure C(P5) and a cross-coupling capacitive structure C(N5) electrically connected between the resonator R(1,3) and the resonator R(1,4). With respect to the resonator R(1,3) and the resonator R(1,4), the cross-coupling capacitive structure C(P5) and the cross-coupling capacitive structure C(N5) are arranged to have the V-bridge structure described above with respect to FIG. 22. Thus, the cross-coupling capacitive structure C(P5) is electrically connected between the end 236 and the end 240 so as to provide a variable positive electric coupling coefficient between the resonator R(1,3) and the resonator R(1,4). The cross-coupling capacitive structure C(P5) is a variable cross-coupling capacitive structure configured to vary the variable positive electric coupling coefficient provided between the resonator R(1,3) and the resonator R(1,4). Also, the cross-coupling capacitive structure C(N5) is electrically connected between the end 238 and the end 240 so as to provide a variable negative electric coupling coefficient between the resonator R(1,3) and the resonator R(1,4). The cross-coupling capacitive structure C(N5) is a variable cross-coupling capacitive structure configured to vary the variable negative electric coupling coefficient provided between the resonator R(1,3) and the resonator R(1,4).

The embodiment of first RF filter structure 60 shown in FIG. 27 also includes a cross-coupling capacitive structure C(P6), a cross-coupling capacitive structure C(N6), a cross-coupling capacitive structure C(P7), a cross-coupling capacitive structure C(N7), and a cross-coupling capacitive structure C(P8). With respect to the resonator R(1,1) and the resonator R(1,3), the cross-coupling capacitive structure C(P6) and the cross-coupling capacitive structure C(N6) are each electrically connected between the resonator R(1,1) and the resonator R(1,3). The cross-coupling capacitive structure C(P6) is electrically connected between the end 217 and the end 236 so as to provide a variable positive electric coupling coefficient between the resonator R(1,1) and the resonator R(1,3). The cross-coupling capacitive structure C(P6) is a variable cross-coupling capacitive structure configured to vary the variable positive electric coupling coefficient provided between the resonator R(1,1) and the resonator R(1,3). Also, the cross-coupling capacitive structure C(N6) is electrically connected between the end 217 and the end 238 so as to provide a variable negative electric coupling coefficient between the resonator R(1,1) and the resonator R(1,3). The cross-coupling capacitive structure C(N6) is a variable cross-coupling capacitive structure configured to vary the variable negative electric coupling coefficient provided between the resonator R(1,1) and the resonator R(1,3).

With respect to the resonator R(1,2) and the resonator R(1,4), the cross-coupling capacitive structure C(P7) and the cross-coupling capacitive structure C(N7) are each electrically connected between the resonator R(1,2) and the resonator R(1,4). The cross-coupling capacitive structure C(P7) is electrically connected between the end 220 and the end 240 so as to provide a variable positive electric coupling coefficient between the resonator R(1,2) and the resonator R(1,4). The cross-coupling capacitive structure C(P7) is a variable cross-coupling capacitive structure configured to vary the variable positive electric coupling coefficient provided between the resonator R(1,2) and the resonator R(1,4). Also, the cross-coupling capacitive structure C(N7) is electrically connected between the end 222 and the end 240 so as to provide a variable negative electric coupling coefficient between the resonator R(1,2) and the resonator R(1,4). The cross-coupling capacitive structure C(N7) is a variable cross-coupling capacitive structure configured to vary the variable negative electric coupling coefficient provided between the resonator R(1,2) and the resonator R(1,4).

With respect to the resonator R(1,1) and the resonator R(1,4), the cross-coupling capacitive structure C(P8) is electrically connected between the resonator R(1,1) and the resonator R(1,4). The cross-coupling capacitive structure C(P8) is electrically connected between the end 217 and the end 240 so as to provide a variable positive electric coupling coefficient between the resonator R(1,1) and the resonator R(1,4). The cross-coupling capacitive structure C(P8) is a variable cross-coupling capacitive structure configured to vary the variable positive electric coupling coefficient provided between the resonator R(1,1) and the resonator R(1,4).

Furthermore, in this embodiment, a variable capacitive structure 244 is electrically connected in series between the terminal 200 and the resonator R(1,1). The variable capacitive structure 244 is configured to vary a variable impedance of the first tunable RF filter path 66 as measured into the terminal 200 in order to match a source or a load impedance at the terminal 200. In addition, a variable capacitive structure 245 is electrically connected in series between the resonator R(1,4) and the terminal 202. The variable capacitive structure 245 is configured to vary a variable impedance of the first tunable RF filter path 66 as seen into the terminal 202 in order to match a source or a load impedance at the terminal 202.

FIGS. 28A through 28D illustrate different embodiments of the first RF filter structure 60, wherein each of the embodiments has different combinations of input terminals and output terminals. The first RF filter structure 60 can have various topologies. For example, the embodiment of the first RF filter structure 60 shown in FIG. 28A has a single input terminal IN and an integer number i of output terminals OUT$_1$-OUT$_i$. As will be discussed below, the first RF filter structure 60 may define various tunable RF filter paths (e.g., the first tunable RF filter path 66, the second tunable RF filter path 68, the third tunable RF filter path 110, the fourth tunable RF filter path 112, the fifth tunable RF filter path 122, and the sixth tunable RF filter path 124 shown in FIGS. 4, 8, 11, 12, and 14-20) that may be used to receive different RF signals at the input terminal IN and transmit a different filtered RF signal from each of the output terminals OUT$_1$-OUT$_i$. As such, the first RF filter structure 60 shown in FIG. 28A may be specifically configured to provide Single Input Multiple Output (SIMO) operations.

Figure 28A:
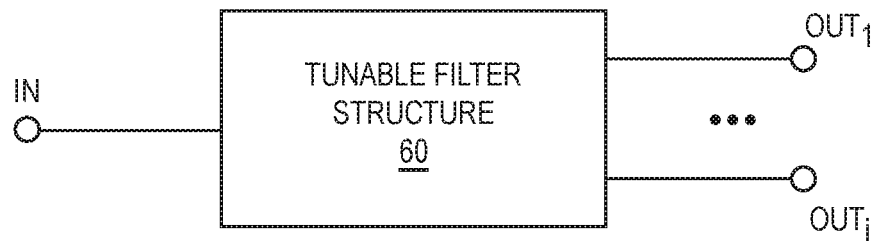
FIGS. 28A-28D disclose different embodiments of a tunable RF filter structure, each with a different number of input terminals and output terminals.
Figure 28B:
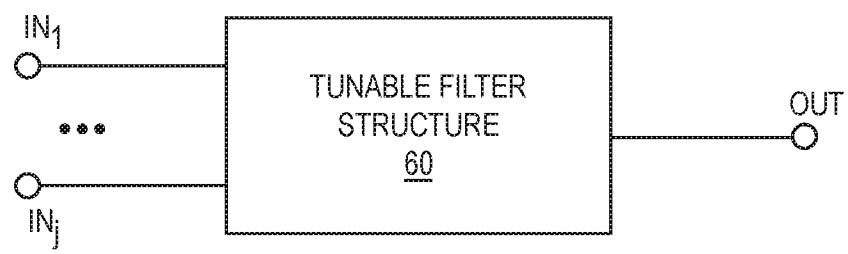

With regard to the embodiment of the first RF filter structure 60 shown in FIG. 28B, the first RF filter structure 60 has an integer number j of input terminals IN$_1$-IN$_j$ and a single output terminal OUT. As will be discussed below, the first RF filter structure 60 may define various tunable RF filter paths (e.g., the first tunable RF filter path 66, the second tunable RF filter path 68, the third tunable RF filter path 110, the fourth tunable RF filter path 112, the fifth tunable RF filter path 122, and the sixth tunable RF filter path 124 shown in FIGS. 4, 8, 11, 12, and 14-20) that may be used to receive a different RF signal at each of the input terminals IN$_1$-IN$_j$ and transmit different filtered RF signals from the single output terminal OUT. As such, the first RF filter structure 60 shown in FIG. 28B may be specifically configured to provide Multiple Input Single Output (MISO) operations.

Figure 28C:

With regard to the embodiment of the first RF filter structure 60 shown in FIG. 28C, the first RF filter structure 60 has a single input terminal IN and a single output terminal OUT. As will be discussed below, the first RF filter structure 60 may define various tunable RF filter paths (e.g., the first tunable RF filter path 66, the second tunable RF filter path 68, the third tunable RF filter path 110, the fourth tunable RF filter path 112, the fifth tunable RF filter path 122, and the sixth tunable RF filter path 124 shown in FIGS. 4, 8, 11, 12, and 14-20) that may be used to receive different RF signals at the single input terminal IN and transmit different filtered RF signals from the output terminal OUT. As such, the first RF filter structure 60 shown in FIG. 28A may be specifically configured to provide Single Input Single Output (SISO) operations.

Figure 28D:
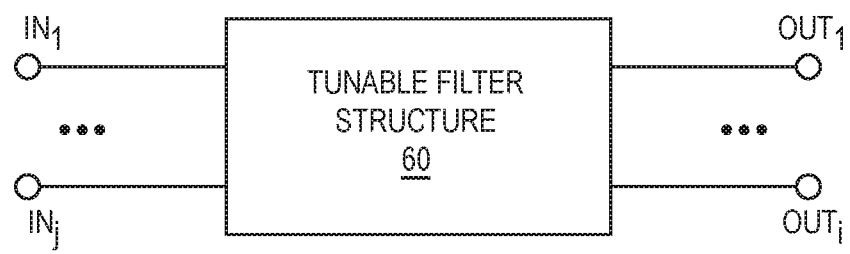

With regard to the embodiment of the first RF filter structure 60 shown in FIG. 28D, the first RF filter structure 60 has the input terminals IN$_1$-IN$_j$ and the output terminals OUT$_1$-OUT$_i$. As will be discussed below, the first RF filter structure 60 may define various tunable RF filter paths (e.g., the first tunable RF filter path 66, the second tunable RF filter path 68, the third tunable RF filter path 110, the fourth tunable RF filter path 112, the fifth tunable RF filter path 122, and the sixth tunable RF filter path 124 shown in FIGS. 4, 8, 11, 12, and 14-20) that may be used to receive a different RF signal at each of the input terminal IN$_1$-IN$_j$ and transmit a different filtered RF signal from each of the output terminals OUT$_1$-OUT$_i$.

Figure 29:
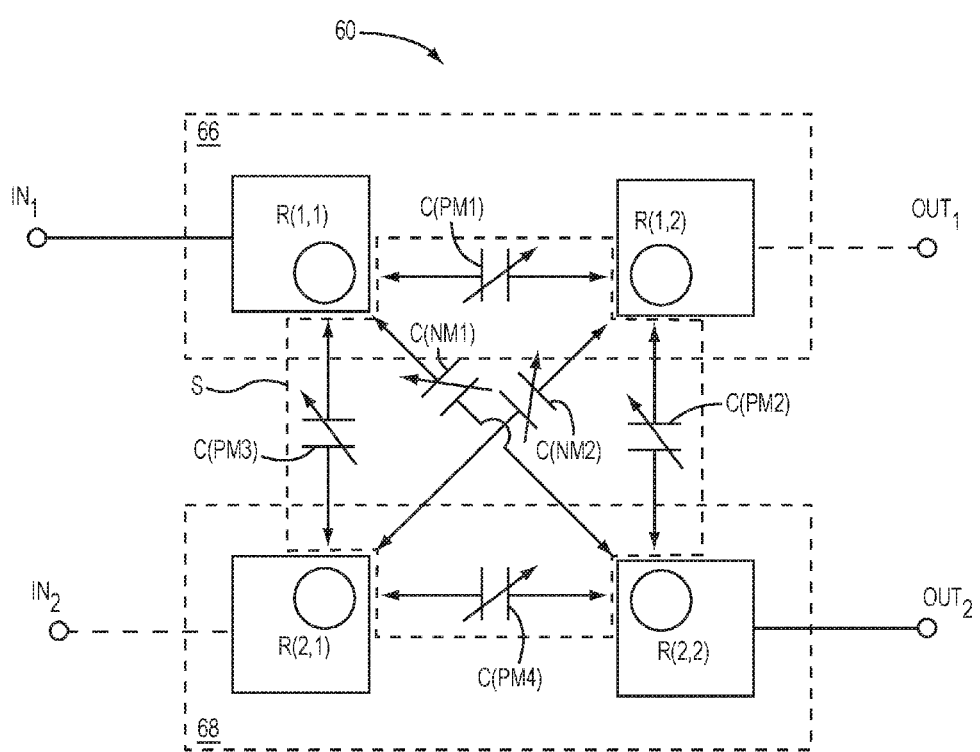
FIG. 29 illustrates one embodiment of a tunable radio frequency (RF) filter structure having four resonators and cross-coupling capacitive structures electrically connected between the four resonators so as to form a 2×2 matrix with the four resonators. In alternative embodiments, fewer (e.g., three) resonators or more (e.g., five or more) resonators may be provided.

FIG. 29 illustrates another embodiment of the first RF filter structure 60. The first RF filter structure 60 shown in FIG. 29 includes one embodiment of the first tunable RF filter path 66 and one embodiment of the second tunable RF filter path 68. The first tunable RF filter path 66 includes the resonator R(1,1) and the resonator R(1,2). The resonator R(1,1) and the resonator R(1,2) are thus a first pair of weakly coupled resonators in the first tunable RF filter path 66. The second tunable RF filter path 68 includes the resonator R(2,1) and the resonator R(2,2). The resonator R(2,1) and the resonator R(2,2) are thus a second pair of weakly coupled resonators in the second tunable RF filter path 68.

As explained in further detail below, a set S of cross-coupling capacitive structures is electrically connected between the resonator R(1,1), the resonator R(1,2), the resonator R(2,1), and the resonator R(2,2) in the first tunable RF filter path 66 and the second tunable RF filter path 68. More specifically, the set S includes a cross-coupling capacitive structure C(PM1), a cross-coupling capacitive structure C(PM2), a cross-coupling capacitive structure C(PM3), a cross-coupling capacitive structure C(PM4), a cross-coupling capacitive structure C(NM1), and a cross-coupling capacitive structure C(NM2). The set S of cross-coupling capacitive structures interconnects the resonator R(1,1), the resonator R(1,2), the resonator R(2,1), and the resonator R(2,2) so that the first RF filter structure 60 shown in FIG. 29 is a matrix (in this embodiment, a 2×2 matrix) of the resonators R. In alternative embodiments, some of the cross-coupling capacitive structures C(PM1), C(PM2), C(PM3), C(PM4), C(NM1), and C(NM2) may be omitted depending on the filter transfer function to be provided.

Unlike in the embodiment of the first RF filter structure 60 shown in FIG. 21, in this embodiment, the first tunable RF filter path 66 and the second tunable RF filter path 68 are not independent of one another. The set S of cross-coupling capacitive structures thus provides for additional tunable RF filter paths to be formed from the resonator R(1,1), the resonator R(1,2), the resonator R(2,1), and the resonator R(2,2). As discussed in further detail below, the arrangement of the first RF filter structure 60 shown in FIG. 29 can be used to realize examples of each of the embodiments of the first RF filter structure 60 shown in FIGS. 28A-28D.

The cross-coupling capacitive structure C(PM1) is electrically connected within the first tunable RF filter path 66, while the cross-coupling capacitive structure C(PM4) is electrically connected within the second tunable RF filter path 68. More specifically, the cross-coupling capacitive structure C(PM1) is electrically connected between the resonator R(1,1) and the resonator R(1,2) in the first tunable RF filter path 66. The cross-coupling capacitive structure C(PM1) is a variable cross-coupling capacitive structure configured to provide and vary a (e.g., positive or negative) electric coupling coefficient between the resonator R(1,1) and the resonator R(1,2). The cross-coupling capacitive structure C(PM4) is a variable cross-coupling capacitive structure configured to provide and vary a (e.g., positive or negative) electric coupling coefficient between the resonator R(2,1) and the resonator R(2,2) in the second tunable RF filter path 68.

To provide additional tunable RF filter paths, the cross-coupling capacitive structure C(PM2), the cross-coupling capacitive structure C(PM3), the cross-coupling capacitive structure C(NM1), and the cross-coupling capacitive structure C(NM2) are each electrically connected between the first tunable RF filter path 66 and the second tunable RF filter path 68. The cross-coupling capacitive structure C(PM2) is a variable cross-coupling capacitive structure configured to provide and vary a (e.g., positive or negative) electric coupling coefficient between the resonator R(1,2) and the resonator R(2,2). The cross-coupling capacitive structure C(PM3) is a variable cross-coupling capacitive structure configured to provide and vary a (e.g., positive or negative) electric coupling coefficient between the resonator R(1,1) and the resonator R(2,1). The cross-coupling capacitive structure C(NM1) is a variable cross-coupling capacitive structure configured to provide and vary a (e.g., positive or negative) electric coupling coefficient between the resonator R(1,1) and the resonator R(2,2). The cross-coupling capacitive structure C(NM2) is a variable cross-coupling capacitive structure configured to provide and vary a (e.g., positive or negative) electric coupling coefficient between the resonator R(1,2) and the resonator R(2,1).

The first tunable RF filter path 66 is electrically connected between the input terminal IN$_1$ and the output terminal OUT$_1$. In addition, the second tunable RF filter path 68 is electrically connected between an input terminal IN$_2$ and an output terminal OUT$_2$. Accordingly, the first RF filter structure 60 shown in FIG. 29 is an embodiment of the first RF filter structure 60 shown in FIG. 28D. However, the input terminal IN$_2$ and the output terminal OUT$_1$ are optional and may be excluded in other embodiments. For example, if the input terminal IN$_2$ were not provided, but the output terminal OUT$_1$ and the output terminal OUT$_2$ were provided, the first RF filter structure 60 shown in FIG. 29 would be provided as an embodiment of the first RF filter structure 60 shown in FIG. 28A. It might, for example, provide a diplexing or a duplexing function. Furthermore, more than two input terminals or output terminals can be provided. Some examples include embodiments of the first RF filter structure 60 used for triplexing, quadplexing, herplexing, and providing FDD and carrier aggregation.

The first tunable RF filter path 66 still provides a path between the input terminal IN$_1$ and the output terminal OUT$_1$. However, assuming that the input terminal IN$_2$ is not provided for SIMO operation, the cross-coupling capacitive structure C(NM1) is electrically connected between the first tunable RF filter path 66 and the second tunable RF filter path 68 to define a first additional tunable RF filter path between the input terminal IN$_1$ and the output terminal OUT$_2$. The first additional tunable RF filter path is thus provided by a portion of the first tunable RF filter path 66 and a portion of the second tunable RF filter path 68. More specifically, the first additional tunable RF filter path includes the resonator R(1,1) and the resonator R(2,2). The first additional tunable RF filter path also includes the cross-coupling capacitive structure C(NM1) that is electrically connected between the resonator R(1,1) and the resonator R(1,2). A second additional tunable RF filter path, a third additional tunable RF filter path, a fourth additional tunable RF filter path, and a fifth additional tunable RF filter path are also defined from the input terminal IN$_1$ to the output terminal OUT$_2$. The second additional tunable RF filter path includes the resonator R(1,1), the cross-coupling capacitive structure C(PM1), the resonator R(1,2), the cross-coupling capacitive C(PM2), and the resonator R(2,2). Additionally, the third additional tunable RF filter path includes the resonator R(1,1), the cross-coupling capacitive structure C(PM3), the resonator R(2,1), the cross-coupling capacitive C(PM4), and the resonator R(2,2). The fourth additional tunable RF filter path includes the resonator R(1,1), the cross-coupling capacitive structure C(PM1), the resonator R(1,2), the cross-coupling capacitive C(NM2), the resonator R(2,1), the cross-coupling capacitive structure C(PM4), and the resonator R(2,2). Finally, the fifth additional tunable RF filter path includes the resonator R(1,1), the cross-coupling capacitive structure C(PM3), the resonator R(2,1), the cross-coupling capacitive C(NM2), the resonator R(1,2), the cross-coupling capacitive structure C(PM2), and the resonator R(2,2).

If the output terminal $OUT_1$ were not provided, but the input terminal $IN_1$ and the input terminal $IN_2$ were provided, the first RF filter structure 60 shown in FIG. 29 would be provided as an embodiment of the first RF filter structure 60 shown in FIG. 28B. In this case, the second tunable RF filter path 68 still provides a path between the input terminal $IN_2$ and the output terminal $OUT_2$. However, assuming that the output terminal $OUT_1$ is not provided for MISO operation, the first additional tunable RF filter path, the second additional tunable RF filter path, the third additional tunable RF filter path, the fourth additional tunable RF filter path, and the fifth additional tunable RF filter path would provide the paths from the input terminal $IN_1$ to the output terminal $OUT_2$.

Finally, if the input terminal $IN_2$ and the output terminal $OUT_2$ were not provided, the first RF filter structure 60 shown in FIG. 29 would be provided as an embodiment of the first RF filter structure 60 shown in FIG. 28C. In this case, the second tunable RF filter path 68 still provides a path between the input terminal $IN_2$ and the output terminal $OUT_2$. However, assuming that the output terminal $IN_1$ is not provided for MISO operation, the first additional tunable RF filter path, the second additional tunable RF filter path, the third additional tunable RF filter path, the fourth additional tunable RF filter path, and the fifth additional tunable RF filter path would provide the paths from the input terminal $IN_1$ to the output terminal $OUT_2$. This may constitute a SISO filter implemented with an array to allow for a large number of signal paths and thus create one or more notches in the transfer function.

With regard to the resonators R(1,1), R(1,2), R(2,1), R(2,2) shown in FIG. 29, the resonators R(1,1), R(1,2), R(2,1), R(2,2) may each be single-ended resonators, differential resonators, or different combinations of single-ended resonators and differential resonators. The resonator R(1,1) and the resonator R(1,2) in the first tunable RF filter path 66 may each be provided in accordance with any of the embodiments of the resonator R(1,1) and the resonator R(1,2) described above with respect to FIGS. 22-27. For example, the resonator R(1,1) may include the inductor 208 (see FIG. 24) and the capacitive structure 210 (see FIG. 24). The resonator R(1,2) may include the inductor 212 (see FIG. 24) and the capacitive structure 214 (see FIG. 24). The resonator R(2,1) may include an inductor (like the inductor 208 in FIG. 24) and a capacitive structure (like the capacitive structure 210 shown in FIG. 24). The resonator R(2,2) may include an inductor (like the inductor 212 in FIG. 24) and a capacitive structure (like the capacitive structure 214 shown in FIG. 24).

Additionally, one or more of the resonators R(1,1), R(1,2) in the first tunable RF filter path 66 and one or more of the resonators R(2,1), R(2,2) in the second tunable RF filter path 68 may be weakly coupled. Thus, the resonators R(1,1), R(1,2), R(2,1), R(2,2) may be operably associated with one another such that an energy transfer factor between each of the resonators R(1,1), R(1,2), R(2,1), R(2,2) is less than 10%. Alternatively, the energy transfer factor between only a subset of the resonators R(1,1), R(1,2), R(2,1), R(2,2) is less than 10%. In addition, in at least some embodiments, not all of the resonators R(1,1), R(1,2), R(2,1), R(2,2) are weakly coupled to one another.

In this embodiment, the inductor 208 (see FIG. 24) of the resonator R(1,1), the inductor 212 (see FIG. 24) of the resonator R(1,2), the inductor of the resonator R(2,1), and the inductor of the resonator R(2,2) may all be weakly coupled to one another. In some embodiments, displacements between the inductor 208 (see FIG. 24) of the resonator R(1,1), the inductor 212 (see FIG. 24) of the resonator R(1,2), the inductor of the resonator R(2,1), and the inductor of the resonator R(2,2) may all be less than or equal to half the maximum lateral width of the inductor 212. Alternatively, in other embodiments, only a proper subset of the inductor 208 (see FIG. 24) of the resonator R(1,1), the inductor 212 (see FIG. 24) of the resonator R(1,2), the inductor of the resonator R(2,1), and the inductor of the resonator R(2,2) may have displacements that are less than or equal to half the maximum lateral width of the inductor 212.

Figure 30:
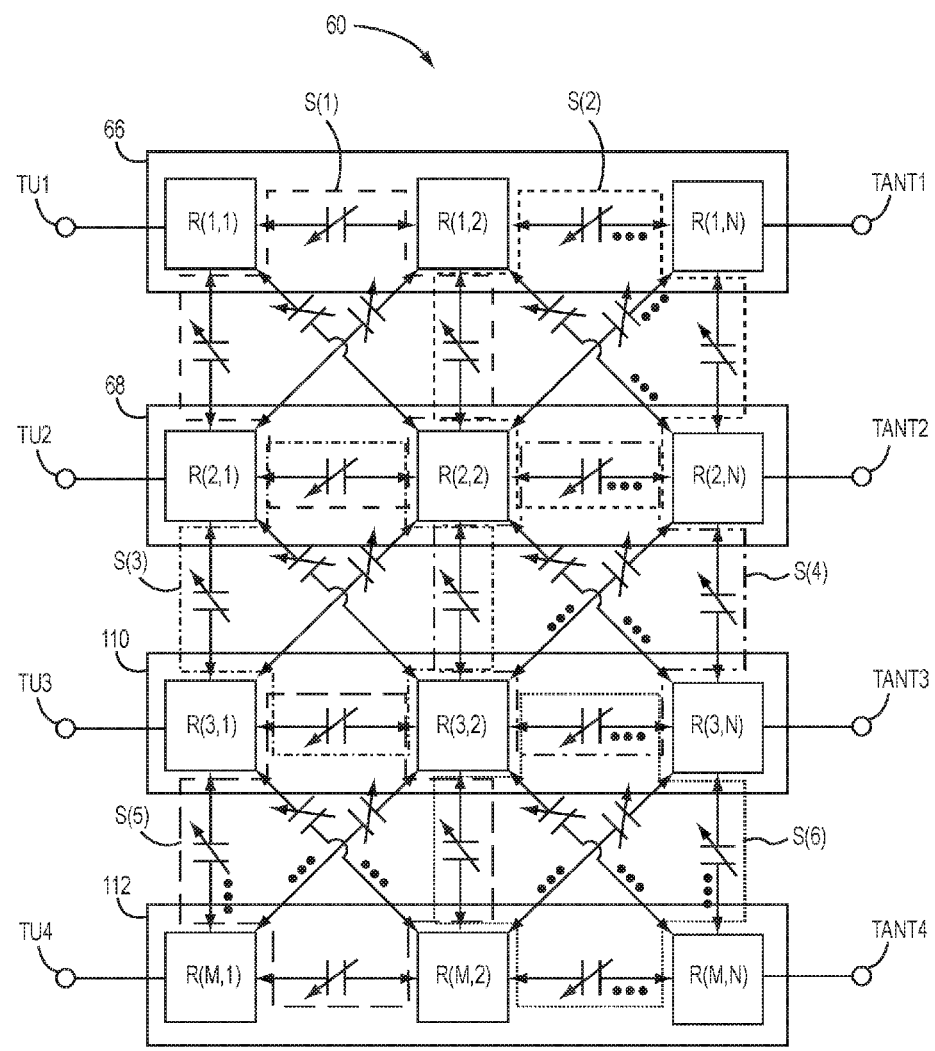
FIG. 30 illustrates another embodiment of a tunable RF filter structure having M number of rows and N number of columns of resonators that are electrically connected by cross-coupling capacitive structures so that the tunable RF filter structure is arranged so as to form an M×N two-dimensional matrix of the resonators.

FIG. 30 illustrates yet another embodiment of the first RF filter structure 60. The first RF filter structure 60 includes the resonators R described above with respect to FIG. 21. The resonators R of the first RF filter structure 60 shown in FIG. 30 are arranged as a two-dimensional matrix of the resonators R. In this embodiment, the first RF filter structure 60 includes an embodiment of the first tunable RF filter path 66, an embodiment of the second tunable RF filter path 68, an embodiment of the third tunable RF filter path 110, and an embodiment of the fourth tunable RF filter path 112. Thus, the integer M for the first RF filter structure 60 shown in FIG. 30 is four (4) or greater. Additionally, the integer N for the first RF filter structure 60 shown in FIG. 30 is 3 or greater. Note that in alternative embodiments, the integer M may be two (2) or greater and the integer N may be two(2) or greater. It should be noted that in alternative embodiments the number of resonators R in each row and column may be the same or different.

In the embodiment of the first RF filter structure 60 shown in FIG. 30, the first tunable RF filter path 66 includes the resonator R(1,1), the resonator R(1,2), and one or more additional resonators R, such as the resonator R(1,N), since the integer N is 3 or greater. All of the weakly coupled resonators R(1,1) through R(1,N) are weakly coupled to one another. Furthermore, the first tunable RF filter path 66 is electrically connected between a terminal TU1 and a terminal TANT1. With regard to the second tunable RF filter path 68, the second tunable RF filter path 68 includes the resonator R(2,1), the resonator R(2,2), and one or more additional resonators R, such as the resonator R(2,N), since the integer N is 3 or greater. All of the weakly coupled resonators R(2,1) through R(2,N) are weakly coupled to one another. Furthermore, the second tunable RF filter path 68 is electrically connected between a terminal TU2 and a terminal TANT2.

With regard to the third tunable RF filter path 110, the third tunable RF filter path 110 includes a resonator R(3,1), a resonator R(3,2), and one or more additional resonators R, such as a resonator R(3,N), since the integer N is 3 or greater. All of the weakly coupled resonators R(3,1) through R(3,N) are weakly coupled to one another. Alternatively, only a proper subset of them may be weakly coupled to one another. Furthermore, the third tunable RF filter path 110 is electrically connected between a terminal TU3 and a terminal TANT3. With regard to the fourth tunable RF filter path 112, the fourth tunable RF filter path 112 includes the resonator R(M,1), the resonator R(M,2), and one or more additional resonators R, such as the resonator R(M,N), since the integer N is 3 or greater. All of the weakly coupled resonators R(M,1) through R(M,N) are weakly coupled to one another. Alternatively, only a proper subset of them may be weakly coupled to one another. Furthermore, the fourth tunable RF filter path 112 is electrically connected between a terminal TU4 and a terminal TANT4.

The first tunable RF filter path 66 is configured to receive RF signals and output filtered RF signals. It should be noted that the first RF filter structure 60 may include any number of tunable RF filter paths, such as, for example, the third tunable RF filter path 110, the fourth tunable RF filter path 112, the fifth tunable RF filter path 122, and the sixth tunable RF filter path 124, described above with respect to FIGS. 11-14. Each of the resonators R may be a tunable resonator, which allows for a resonant frequency of each of the resonators to be varied to along a frequency range. In alternative embodiments, only a proper subset of the resonators R may be tunable. In still another embodiment, all of the resonators R are not tunable, but rather have a fixed transfer function.

In some embodiments, all of the resonators R in the first RF filter structure 60 shown in FIG. 30 are weakly coupled to one another. Thus, the resonators R may all be operably associated with one another such that energy transfer factors between the resonators R are less than 10%. Alternatively, the energy transfer factor is less than 10% only among a proper subset of the resonators R. In other embodiments, only the resonators R in adjacent tunable RF filter paths 66, 68, 110, 112 are weakly coupled to one another. For example, all the resonators R(1,1) through R(1,N) may be weakly coupled to all the resonators R(2,1) through R(2,N). In still other embodiments, only subsets of adjacent resonators R may be weakly coupled to each other. For example, the resonators R(1,1), R(1,2) may be weakly coupled to the resonators R(2,1), R(2,2), while the resonators R(3,1), R(3, 2) may be weakly coupled to the resonators R(M,1), R(M,2). These and other combinations would be apparent to one of ordinary skill in the art in light of this disclosure.

Sets S(1), S(2), S(3), S(4), S(5), and S(6) of cross-coupled capacitive structures are electrically connected between the resonators R. Each of the sets S(1), S(2), S(3), S(4), S(5), and S(6) is arranged like the set S of cross-coupled capacitive structures described above with respect to FIG. 29. For example, in one particular exemplary embodiment (e.g., when M=4 and N=3), the set S(1) of cross-coupled capacitive structures is electrically connected between the resonators R(1,1), R(1,2) in the first tunable RF filter path 66 and the resonators R(2,1), R(2,2) in the second tunable RF filter path 68. The set S(2) of cross-coupled capacitive structures is electrically connected between the resonators R(1,2), R(1,N) in the first tunable RF filter path 66 and the resonators R(2,2), R(2,N) in the second tunable RF filter path 68. The set S(3) of cross-coupled capacitive structures is electrically connected between the resonators R(2,1), R(2,2) in the second tunable RF filter path 68 and the resonators R(3,1), R(3,2) in the third tunable RF filter path 110. The set S(4) of cross-coupled capacitive structures is electrically connected between the resonators R(2,2), R(2,N) in the second tunable RF filter path 68 and the resonators R(3,2), R(3,N) in the third tunable RF filter path 110. The set S(5) of cross-coupled capacitive structures is electrically connected between the resonators R(3,1), R(3,2) in the third tunable RF filter path 110 and the resonators R(M,1), R(M,2) in the fourth tunable RF filter path 112. Finally, the set S(6) of cross-coupled capacitive structures is electrically connected between the resonators R(3,2), R(3,N) in the third tunable RF filter path 110 and the resonators R(M,2), R(M,N) in the fourth tunable RF filter path 112. Note that some cross-coupled capacitive structures in the sets S(1), S(2), S(3), S(4), S(5), and S(6) of cross-coupled capacitive structures for the resonators R in adjacent columns or in adjacent ones of the tunable RF filter paths 66, 68, 110, 112 overlap. This is because in the matrix of the resonators R, each of the resonators R is adjacent to multiple other ones of the resonators R. In another embodiment, the sets S(1), S(2), S(3), S(4), S(5), and S(6) of cross-coupled capacitive structures may be connected between non-adjacent resonators R. For example, there may be cross-coupled capacitive structures between resonators R that are more than one column or row apart.

Figure 31:
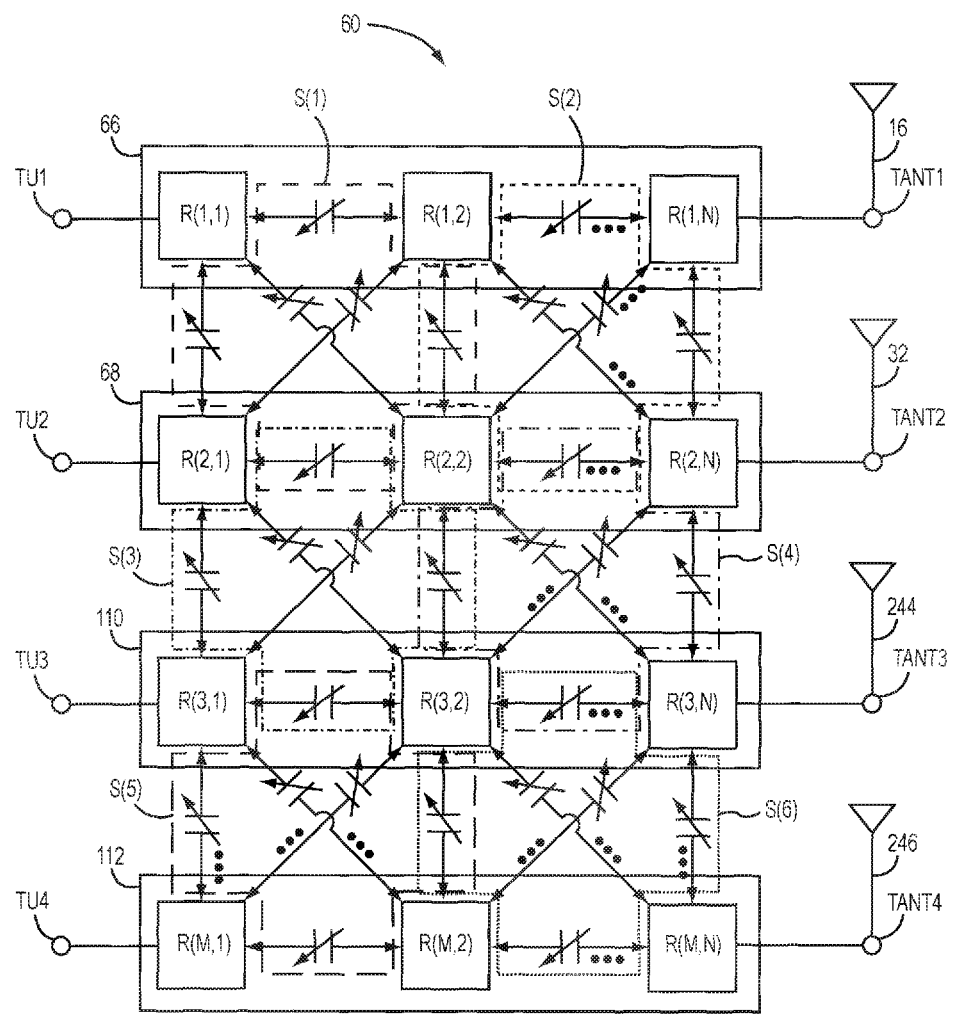
FIG. 31 illustrates the tunable RF filter structure shown in FIG. 30 electrically connected to various RF antennas.

FIG. 31 illustrates the embodiment of the first RF filter structure 60 shown in FIG. 30 electrically connected to the first RF antenna 16, the second RF antenna 32, a third RF antenna 246, and a fourth RF antenna 247. More specifically, the first tunable RF filter path 66 is electrically connected to the first RF antenna 16 at the terminal TANT1. The second tunable RF filter path 68 is electrically connected to the second RF antenna 32 at the terminal TANT2. The third tunable RF filter path 110 is electrically connected to the third RF antenna 246 at the terminal TANT3. The fourth tunable RF filter path 112 is electrically connected to the fourth RF antenna 247 at the terminal TANT4. With the sets S(1), S(2), S(3), S(4), S(5), and S(6) of cross-coupled capacitive structures, the first RF filter structure 60 shown in FIG. 31 forms an interconnected two-dimensional matrix of the resonators R. Thus, in addition to the first tunable RF filter path 66, the second tunable RF filter path 68, the third tunable RF filter path 110, and the fourth tunable RF filter path 112, the sets S(1), S(2), S(3), S(4), S(5), and S(6) of cross-coupled capacitive structures provide a multitude of additional tunable RF filter paths between the terminals TU1, TU2, TU3, TU4 and the terminals TANT1, TANT2, TANT3, TANT4. It should be noted that in alternative embodiments, the terminals TANT1, TANT2, TANT3, TANT4 may not be connected to antennas. Some antennas may be omitted depending on the functionality being realized.

By tuning the sets S(1), S(2), S(3), S(4), S(5), and S(6), the first RF filter structure 60 shown in FIG. 31 can be tuned so that any combination of the resonators R is selectable for the propagation of RF signals. More specifically, the first RF filter structure 60 shown in FIG. 31 is tunable to route RF receive signals from any combination of the terminals TANT1, TANT2, TANT3, TANT4 to any combination of the terminals TU1, TU2, TU3, TU4. Additionally, the first RF filter structure 60 shown in FIG. 31 is tunable to route RF transmission signals from any combination of the terminals TU1, TU2, TU3, TU4 to the terminals TANT1, TANT2, TANT3, TANT4. Accordingly, the first RF filter structure 60 can be configured to implement various MIMO, SIMO, MISO, and SISO operations.

Figure 32:
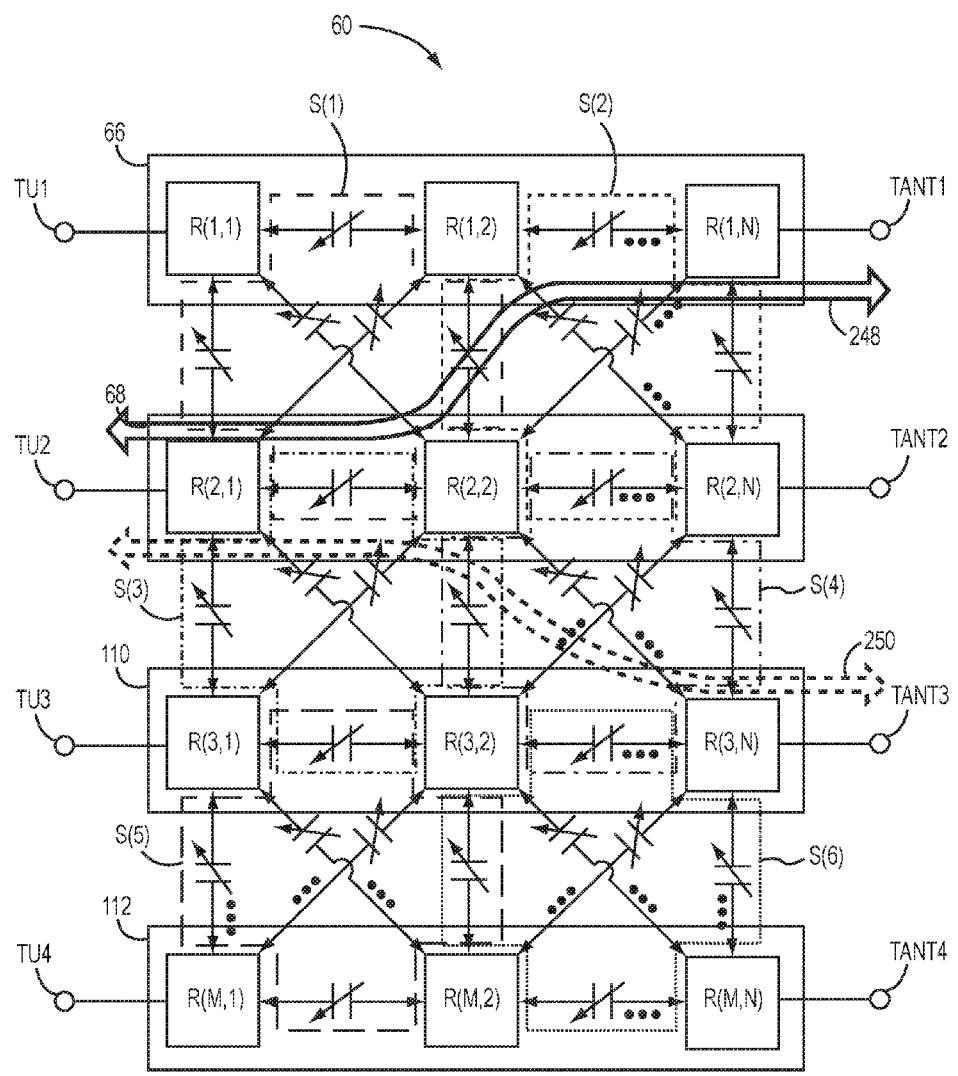
FIG. 32 illustrates the tunable RF filter structure shown in FIG. 30 with two tunable RF filter paths highlighted for performing Multiple Input Multiple Output (MIMO), Single Input Multiple Output (SIMO), Multiple Input Single Output (MISO), and Single Input Single Output (SISO) operations.

FIG. 32 illustrates the first RF filter structure 60 shown in FIGS. 30 and 31 with examples of additional tunable RF filter paths 248, 250 highlighted. It should be noted, however, that there are a vast number of additional combinations of the resonators R that may be selected to provide tunable RF filter paths (e.g., the first tunable RF filter path 66, the second tunable RF filter path 68, the third tunable RF filter path 110, the fourth tunable RF filter path 112, the additional tunable RF filter path 248, and the additional tunable RF filter path 250) between the terminals TU1, TU2, TU3, TU4 and the terminals TANT1, TANT2, TANT3, TANT4. An explicit description of all of the various combinations of the resonators R that may be implemented with the first RF filter structure 60 shown in FIGS. 30-32 is simply impractical given the high number of possible combinations. Along with the previous descriptions, the additional tunable RF filter paths 248, 250 are highlighted in FIG. 32 simply to give examples of the basic concepts. However, the combinations provided for the additional tunable RF filter paths 248, 250 are in no way limiting, as any combination of the resonators R may be selected to route RF signals between the terminals TU1, TU2, TU3, TU4 and the terminals TANT1, TANT2, TANT3, TANT4. Any number of functions, such as signal combining, splitting, multiplexing, and demultiplexing, with various filtering profiles for each, may be realized.

With regard to the additional tunable RF filter paths 248, 250 highlighted in FIG. 32, the additional tunable RF filter paths 248, 250 may be used during MIMO, SIMO, MISO, and SISO operations. More specifically, the additional tunable RF filter path 248 connects the terminal TANT1 to the terminal TU2. The additional tunable RF filter path 250 connects the terminal TANT3 to the terminal TU2. As such, the first RF filter structure 60 may be tuned so that the additional tunable RF filter path 248 and the additional tunable RF filter path 250 are selected in a MISO operation from the terminal TANT1 and the terminal TANT3 to the terminal TU2. The additional tunable RF filter paths 248, 250 may also be used in SIMO operations. For example, the first RF filter structure 60 may be tuned so that the first tunable RF filter path 66 and the additional tunable RF filter path 248 are selected in a SIMO operation from the terminal TU2 to the terminal TANT1. The additional tunable RF filter paths 248, 250 can also be used in SISO operations from the terminal TANT1 to the terminal TU2 or from the terminal TANT3 to the terminal TU2. Finally, the additional tunable RF filter paths 248, 250 may also be used in SIMO operations. For instance, the first RF filter structure 60 may be tuned so that the first tunable RF filter path 66 and the additional tunable RF filter path 250 are selected in a SIMO operation from the terminal TANT1 to the terminal TU1 and from the terminal TANT3 to the terminal TU2.

In some applications involving the first RF filter structure 60 in FIGS. 30-32, MISO and SIMO operations can be used in conjunction with wideband antenna cables or fiber for transmitting RF signals in multiple RF communication frequency bands. Specific communication frequency bands can be processed by certain dedicated RF filtering paths in the first RF filter structure 60. For example, different RF signals may be injected from a wideband antenna and then propagated along different dedicated tunable RF filter paths in the first RF filter structure 60 to the terminals TU1, TU2, TU3, TU4. These dedicated tunable RF filter paths can be configured to have a transfer function that is specifically designed to handle these RF signals. Furthermore, the first RF filter structure 60 shown in FIGS. 30-32 is configured to tune a transfer function of any of the specific tunable RF filter paths (e.g., the first tunable RF filter path 66, the second tunable RF filter path 68, the third tunable RF filter path 110, the fourth tunable RF filter path 112, the additional tunable RF filter path 248, and the additional tunable RF filter path 250) in the first RF filter structure 60 by tuning resonators R that are not in the specific tunable RF filter path being used to route RF signals. This can help reduce out-of-band noise and reduce insertion losses. It can also improve isolation and out-of-band attenuation.

Figure 33:
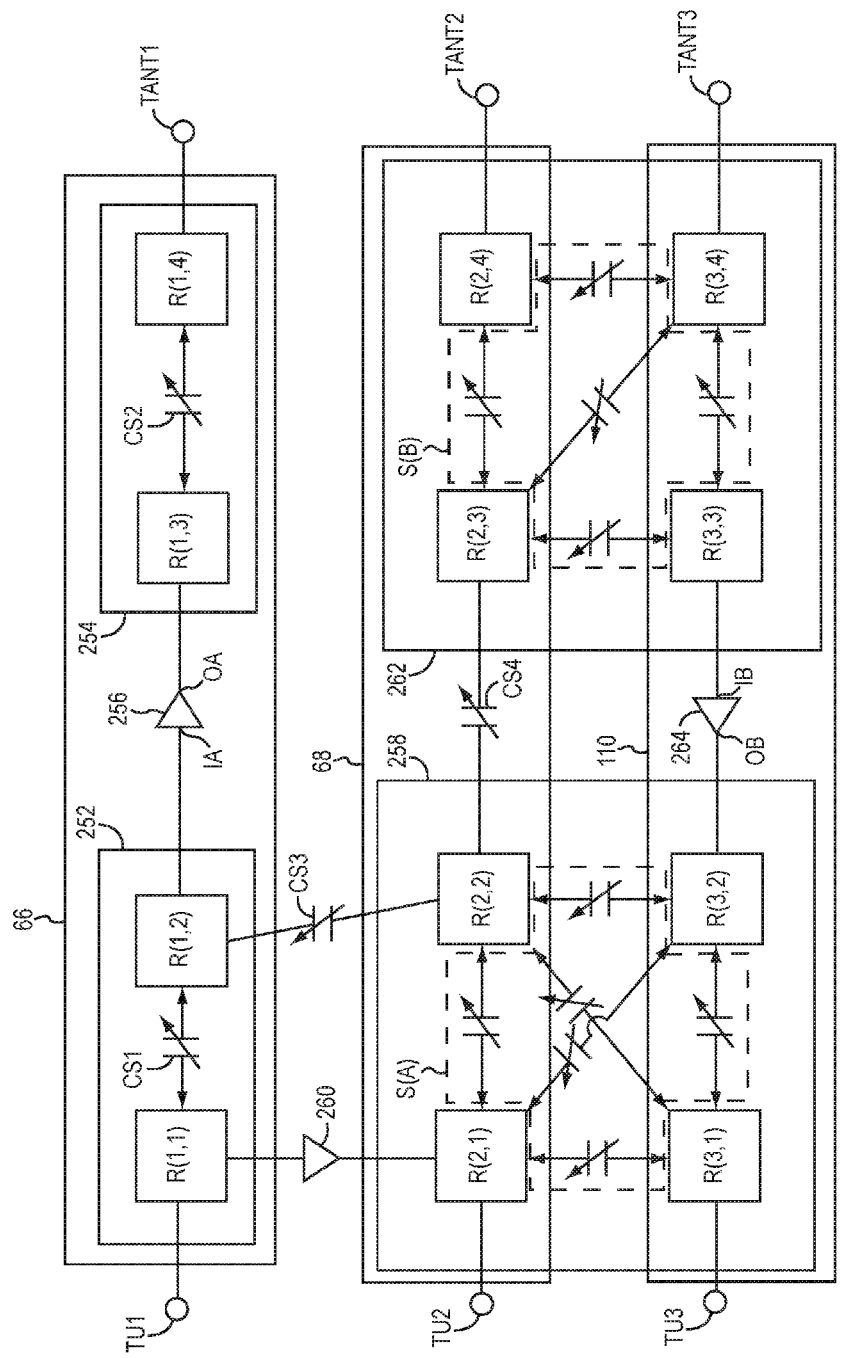
FIG. 33 illustrates another embodiment of a tunable RF filter structure with amplifier stages electrically connected within and between tunable RF filter paths.

FIG. 33 illustrates yet another embodiment of the first RF filter structure 60. The first RF filter structure 60 includes the resonators R and is arranged as a two-dimensional matrix of the resonators R, where N is equal to four (4) and M is equal to three (3). In this embodiment, the first RF filter structure 60 includes an embodiment of the first tunable RF filter path 66, an embodiment of the second tunable RF filter path 68, and an embodiment of the third tunable RF filter path 110.

It should be noted that in alternative embodiments, the number of resonators R in each row and column may be the same or different.

In the embodiment of the first RF filter structure 60 shown in FIG. 33, the first tunable RF filter path 66 includes the resonator R(1,1), the resonator R(1,2), the resonator R(1,3), and the resonator R(1,4). Furthermore, the first tunable RF filter path 66 is electrically connected between the terminal TU1 and the terminal TANT1. With regard to the second tunable RF filter path 68, the second tunable RF filter path 68 includes the resonator R(2,1), the resonator R(2,2), a resonator R(2,3), and a resonator R(2,4). Furthermore, the second tunable RF filter path 68 is electrically connected between the terminal TU2 and the terminal TANT2. With regard to the third tunable RF filter path 110, the third tunable RF filter path 110 includes the resonator R(3,1), the resonator R(3,2), a resonator R(3,3), and a resonator R(3,4). Furthermore, the third tunable RF filter path 110 is electrically connected between the terminal TU3 and the terminal TANT3.

In this embodiment, the resonators R in a subset 252 of the resonators R(1,1), R(1,2) in the first tunable RF filter path 66 are weakly coupled to one another. A cross-coupling capacitive structure CS1 is electrically connected between the resonators R(1,1), R(1,2). The cross-coupling capacitive structure CS1 is a variable cross-coupling capacitive structure configured to vary a variable electric coupling coefficient between the resonators R(1,1), R(1,2). A subset 254 of the resonators R(1,3), and R(1,4) in the second tunable RF filter path 68 is also weakly coupled to each other. A cross-coupling capacitive structure CS2 is electrically connected between the resonators R(1,3), R(1,4). The cross-coupling capacitive structure CS2 is a variable cross-coupling capacitive structure configured to vary a variable electric coupling coefficient between the resonators R(1,3), R(1,4).

As shown in FIG. 33, a unidirectional coupling stage 256 is electrically connected within the first tunable RF filter path 66. The unidirectional coupling stage 256 defines an amplifier gain and is configured to provide amplification within the first tunable RF filter path 66 in accordance with the amplifier gain. In some embodiments, the amplifier gain of the unidirectional coupling stage 256 is a variable amplifier gain. In this embodiment, the unidirectional coupling stage 256 is electrically connected between the resonator R(1,2) and the resonator R(1,3). The variable amplifier gain can thus control a variable electric coupling coefficient between the resonator R(1,2) in the subset 252 and the resonator R(1,3) in the subset 254. Since the unidirectional coupling stage 256 is an active semiconductor component, the unidirectional coupling stage 256 is unidirectional and thus only allows signal propagations from an input terminal IA of the unidirectional coupling stage 256 to an output terminal OA of the unidirectional coupling stage 256. Thus, the resonator R(1,2) in the subset 252 is unidirectionally mutual electrically coupled to the resonator R(1,3) in the subset 254.

Note that the resonators R(1,3), R(1,4) in the subset 254 are not electrically connected to the second tunable RF filter path 68 and the third tunable RF filter path 110. As such, the unidirectional coupling stage 256 thus results in a portion of the first tunable RF filter path 66 with the subset 254 of the resonators R(1,3), R(1,4) to be unidirectional. Consequently, signal flow can be to the terminal TANT1 but not from the terminal TANT1. Since the unidirectional coupling stage 256 is unidirectional, the variable amplifier gain (and thus the variable electric coupling coefficient between the resonator R(1,2) and the resonator R(1,3)) may be controlled using feed-forward control techniques and/or feedback control techniques.

Next, the resonators R in a subset 258 of the resonators R(2,1), R(2,2), R(3,1), and R(3,2) in the second tunable RF filter path 68 and in the third tunable RF filter path 110 are weakly coupled to one another. An unidirectional coupling stage 260 is electrically connected between the first tunable RF filter path 66 and the second tunable RF filter path 68. More specifically, the unidirectional coupling stage 260 is electrically connected between the resonator R(1,1) and the resonator R(2,1). The unidirectional coupling stage 260 defines an amplifier gain and is configured to provide amplification in accordance with the amplifier gain. In some embodiments, the amplifier gain of the unidirectional coupling stage 260 is a variable amplifier gain. The variable amplifier gain thus can control a variable electric coupling coefficient between the resonator R(1,1) in the subset 252 and the resonator R(2,1) in the subset 258. A cross-coupling capacitive structure CS3 is electrically connected between the resonator R(1,2) and the resonator R(2,2). The cross-coupling capacitive structure CS3 is a variable cross-coupling capacitive structure configured to vary a variable electric coupling coefficient between the resonators R(1,2), R(2,2).

To interconnect the resonators R(2,1), R(2,2), R(3,1), and R(3,2), a set S(A) of cross-coupling capacitive structures is electrically connected between the resonators R(2,1), R(2,2), R(3,1), and R(3,2) in the subset 258. The set S(A) of cross-coupling capacitive structures is arranged like the set S of cross-coupling capacitive structures described above with respect to FIG. 29. Additionally, the resonators R in a subset 262 of the resonators R(2,3), R(2,4), R(3,3), and R(3,4) in the second tunable RF filter path 68 and in the third tunable RF filter path 110 are weakly coupled to one another. A set S(B) of cross-coupling capacitive structures is electrically connected between the resonators R(2,3), R(2,4), R(3,3), and R(3,4) in the subset 262. The set S(B) of cross-coupling capacitive structures is arranged like the set S of cross-coupling capacitive structures described above with respect to FIG. 29.

To interconnect the subset 258 and the subset 262, the first RF filter structure 60 shown in FIG. 33 includes a cross-coupling capacitive structure CS4 and a unidirectional coupling stage 264. The cross-coupling capacitive structure CS4 is electrically connected between the resonators R(2,2), R(2,3). The cross-coupling capacitive structure CS4 is a variable cross-coupling capacitive structure configured to vary a variable electric coupling coefficient between the resonators R(2,2), R(2,3). The unidirectional coupling stage 264 is electrically connected within the third tunable RF filter path 110. In this embodiment, the unidirectional coupling stage 264 is electrically connected between the resonator R(3,3) and the resonator R(3,2). The unidirectional coupling stage 264 defines an amplifier gain and is configured to provide amplification within the third tunable RF filter path 110 in accordance with the amplifier gain. In some embodiments, the amplifier gain of the unidirectional coupling stage 264 is a variable amplifier gain. The variable amplifier gain can thus control a variable electric coupling coefficient between the resonator R(3,3) in the subset 262 and the resonator R(3,2) in the subset 258. Since the unidirectional coupling stage 264 is an active semiconductor component, the unidirectional coupling stage 264 is unidirectional and thus only allows signal propagations from an input terminal IB of the unidirectional coupling stage 264 to an output terminal OB of the unidirectional coupling stage 264. Thus, the resonator R(3,3) in the subset 262 is unidirectionally mutual electrically coupled to the resonator R(3,2) in the subset 258. Consequently, the third tunable RF filter path 110 shown in FIG. 33 is unidirectional if the signal flow is between the terminal TANT3 and the terminal TU3 though the third tunable RF filter path 110. As such signal flow between the terminal TANT3 and the terminal TU3 is provided only through the third tunable RF filter path 110, signal flow can only be from the terminal TANT3 to the terminal TU3, and not vice versa. In other cases, an additional tunable RF signal path (e.g., the additional RF terminal tunable RF signal path that includes the resonators R(3,1), R(2,2), R(2,3) and R(3,4)) can be tuned to provide bidirectional signal flow between the terminal TU3 and the terminal TANT3 through the cross-coupling capacitive structure CS4. The unidirectional coupling stages 256, 260, 264 may be active devices, such as amplifiers, diodes, transistors, networks of transistors, buffer stages, attenuation stages, and the like. The unidirectional coupling stages 256, 260, 264 can have gains higher than one (1), lower than one (1), or equal to one (1). Additionally, the unidirectional coupling stages 256, 260, 264 may be passive devices. The unidirectional coupling stages 256, 260, 264 may not be entirely or ideally unilateral, but may have some finite reverse coupling. In this case, the unidirectional coupling stages 256, 260, 264 may be predominately unilateral. One example in which the unidirectional coupling stages 256, 260, 264 may be used for multi-resonator applications and may improve isolation between certain parts, such as transmission ports and receive ports of a duplexer.

Figure 34:
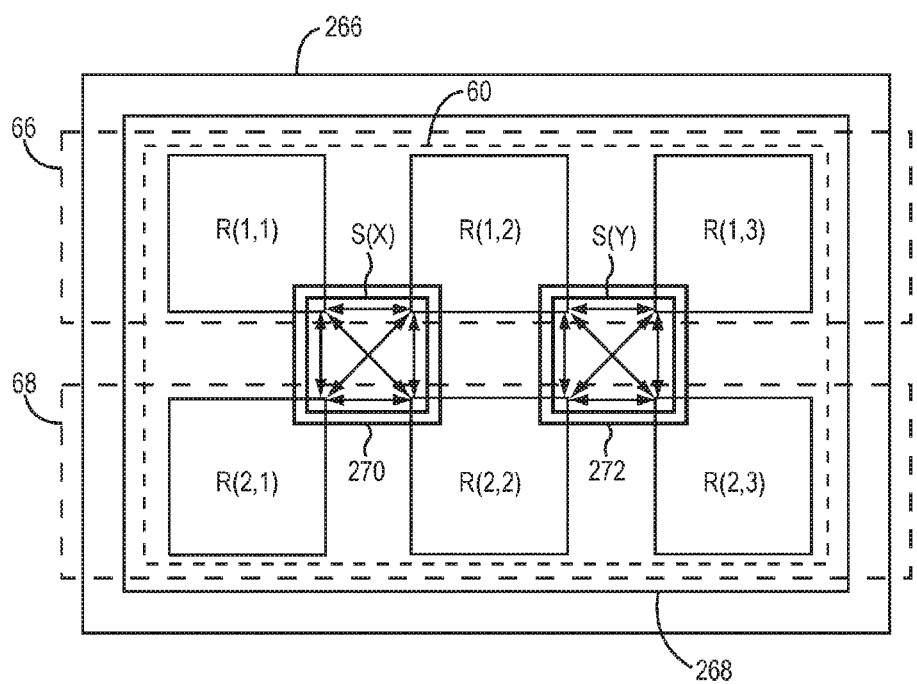
FIG. 34 illustrates an embodiment of a tunable RF filter structure integrated into an integrated circuit (IC) package with multiple and separate semiconductor dies.

FIG. 34 illustrates yet another embodiment of the first RF filter structure 60. The first RF filter structure 60 shown in FIG. 34 is integrated into an IC package 266. The first RF filter structure 60 shown in FIG. 34 includes the resonators R and is arranged as a two-dimensional matrix of the resonators R, where N is equal to three (3) and M is equal to two (2). It should be noted that in alternative embodiments the number of resonators R in each row and column may be the same or different.

In this embodiment, the first RF filter structure 60 includes an embodiment of the first tunable RF filter path 66 and an embodiment of the second tunable RF filter path 68. The first tunable RF filter path 66 includes the resonator R(1,1), the resonator R(1,2), and the resonator R(1,3). The second tunable RF filter path 68 includes the resonator R(2,1), the resonator R(2,2), and the resonator R(2,3). A set S(X) of cross-coupling capacitive structures is electrically connected between the resonators R(1,1), R(1,2), R(2,1), and R(2,2). The set S(X) of cross-coupling capacitive structures is arranged like the set S of cross-coupling capacitive structures described above with respect to FIG. 29. A set S(Y) of cross-coupling capacitive structures is electrically connected between the resonators R(1,2), R(1,3), R(2,2), and R(2,3). The set S(Y) of cross-coupling capacitive structures is also arranged like the set S of cross-coupling capacitive structures described above with respect to FIG. 29.

As shown in FIG. 34, the IC package 266 houses a package substrate 268, a semiconductor die 270, and a semiconductor die 272. The semiconductor die 270 and the semiconductor die 272 are mounted on the package substrate 268. In this embodiment, the resonators R of the first RF filter structure 60 are formed by the package substrate 268. The set S(X) of cross-coupling capacitive structures is formed by the semiconductor die 270. On the other hand, the set S(Y) of cross-coupling capacitive structures is formed by the semiconductor die 272. Thus, the set S(X) of cross-coupling capacitive structures and the set S(Y) of cross-coupling capacitive structures are formed on multiple and separate semiconductor dies 270, 272. Using the multiple and separate semiconductor dies 270, 272 may be helpful in order to increase isolation. The multiple and separate semiconductor dies 270, 272 may have less area than the semiconductor die 268 shown in FIG. 34. As such, the embodiment shown in FIG. 35 may consume less die area.

Figure 35:
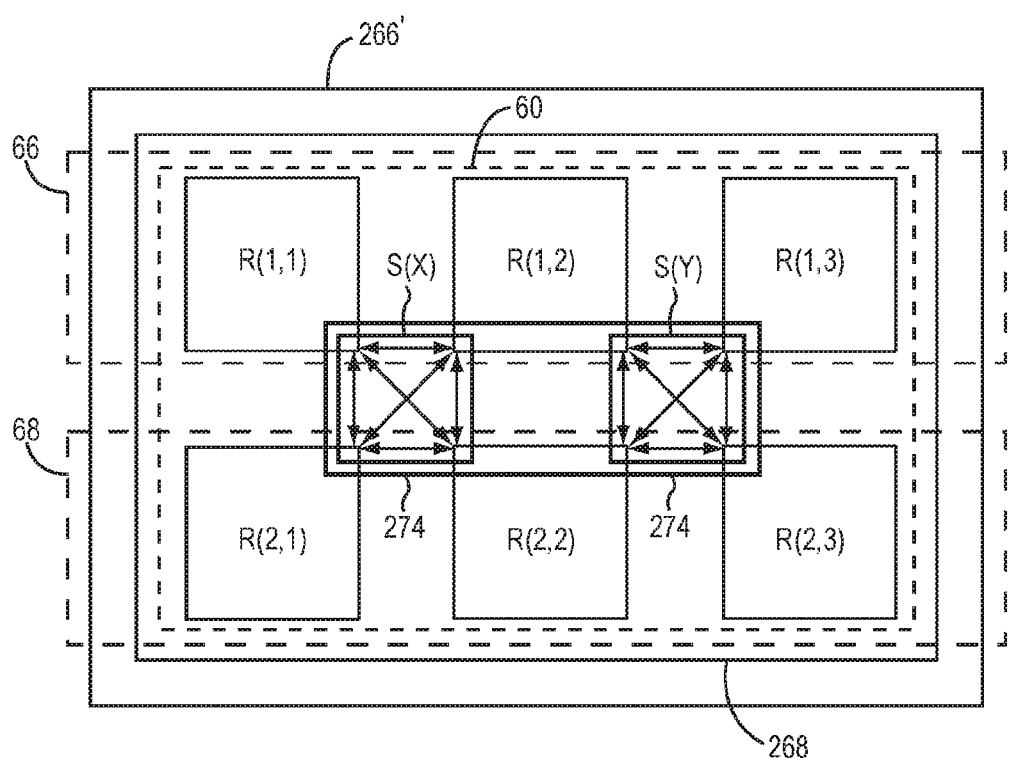
FIG. 35 illustrates an embodiment of the same tunable RF filter structure shown in FIG. 34, but now integrated into an IC package with a single semiconductor die.

FIG. 35 illustrates another embodiment of an IC package 266' that houses the same embodiment of the first RF filter structure 60 described above with regard to FIG. 34. The IC package 266' is the same as the IC package 266 shown in FIG. 34, except that the IC package 266' only has a single semiconductor die 274. In this embodiment, both the set S(X) of cross-coupling capacitive structures and the set S(Y) of cross-coupling capacitive structures are formed by the semiconductor die 272. Thus, the IC package 266' allows for a more compact arrangement than the IC package 266.

Figure 36:
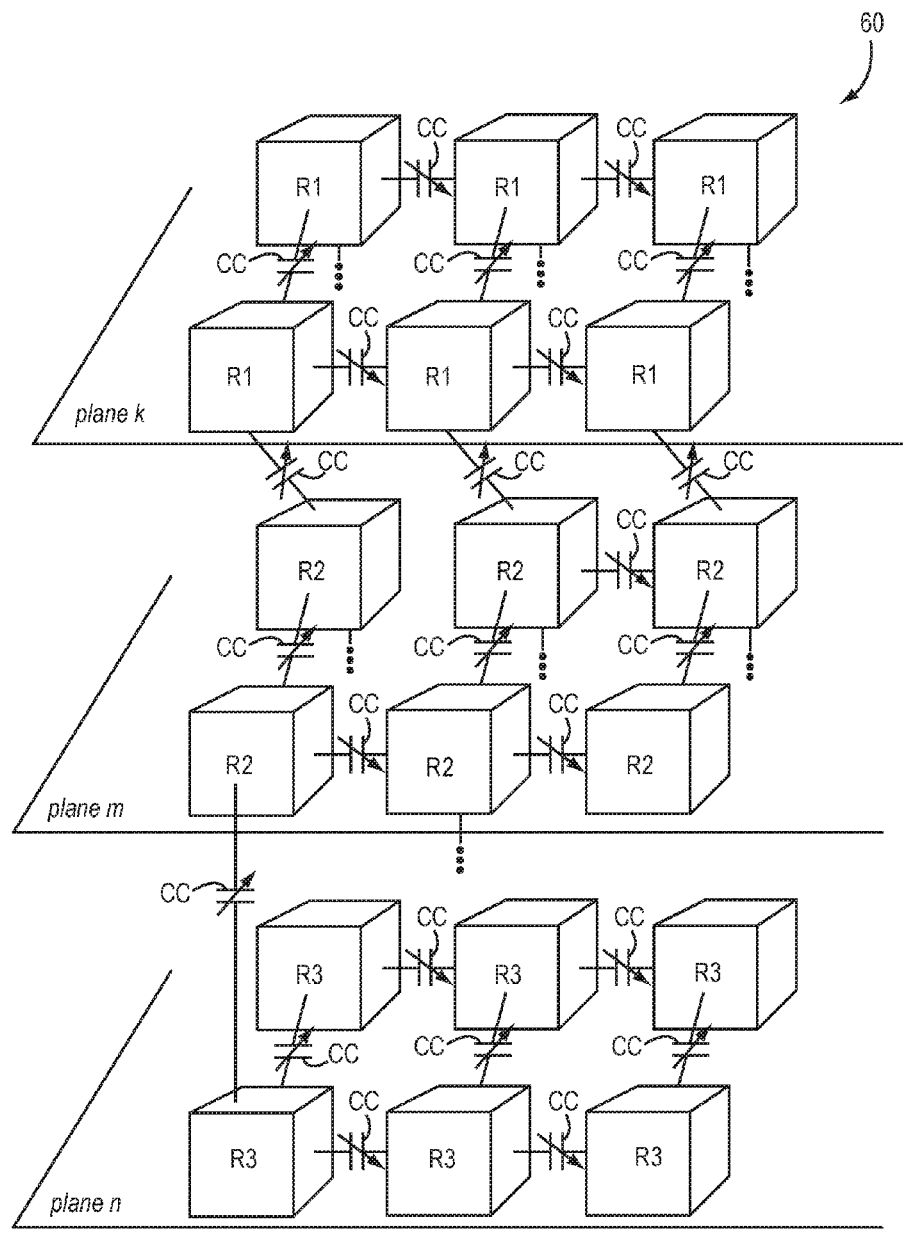
FIG. 36 illustrates one embodiment of a tunable RF filter structure having resonators and cross-coupling capacitive structures electrically connected between the resonators so as to form a three-dimensional matrix of the resonators.

FIG. 36 illustrates yet another embodiment of the first RF filter structure 60. In this embodiment, the first RF filter structure 60 is arranged as a three-dimensional matrix of resonators R1, R2, R3. More specifically, a two-dimensional matrix of the resonators R1 is provided on a plane k, a two-dimensional array of the resonators R2 is provided on a plane m, and a two-dimensional array of the resonators R3 is provided on a plane n. Cross-coupling capacitive structures CC are electrically connected between the resonators R1, R2, R3 that are adjacent to one another in the same plane k,m,n and in the different planes k,m,n. The three-dimensional matrix of resonators R1, R2, R3 thus allows for more resonators to be cross-coupled to one another. This allows for the first RF filter structure 60 to provide greater numbers of tunable RF filter paths and allows for the first RF filter structure 60 to be tuned more accurately.

In general, having more tunable RF filter paths allows for the synthesis of a more complex transfer function with multiple notches for better blocker rejection. The number of resonators R1, R2, R3 in each of the planes k, n, m may be different or the same. The three-dimensional matrix of resonators can be used in MIMO, SIMO, MISO, and SISO applications.

Figure 37:
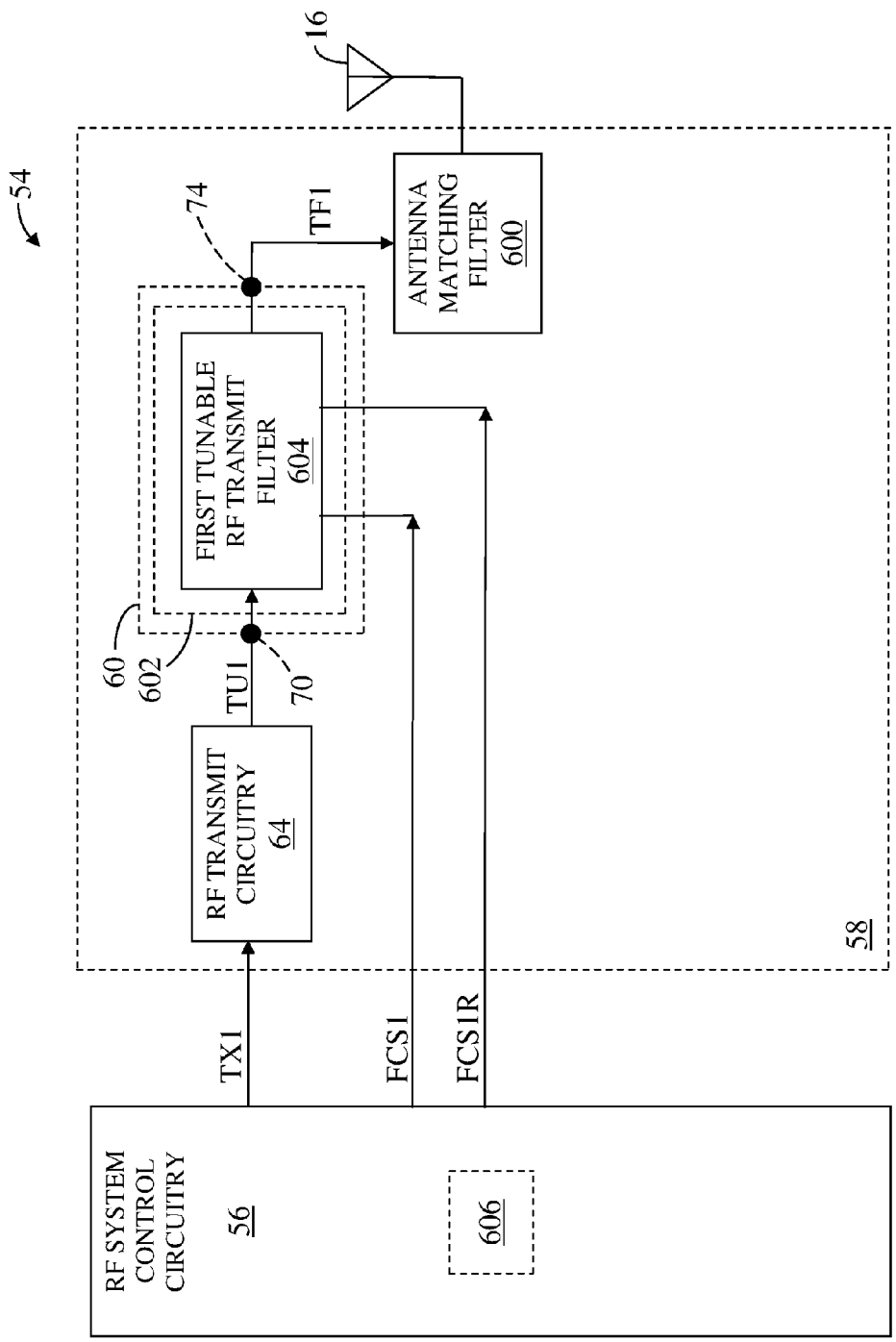
FIG. 37 shows the RF communications circuitry according to one embodiment of the RF communications circuitry.

FIG. 37 shows the RF communications circuitry 54 according to one embodiment of the RF communications circuitry 54. The RF communications circuitry 54 illustrated in FIG. 37 is similar to the RF communications circuitry 54 illustrated in FIG. 4, except in the RF communications circuitry 54 illustrated in FIG. 37, the RF receive circuitry 62, the first tunable RF filter path 66, and the second tunable RF filter path 68 are omitted. Additionally, the RF front-end circuitry 58 further includes an antenna matching filter 600; the first RF filter structure 60 includes a first tunable RF filter 602, which is a first tunable RF transmit filter 604 in one embodiment of the first tunable RF filter 602; and the RF system control circuitry 56 includes a measurement-based RF spectrum profile 606.

In one embodiment of the first RF filter structure 60, the RF filter structure 60 includes the pair of weakly coupled resonators R(1,1), R(1,2) (FIG. 21). Additionally, the first RF filter structure 60 includes the first connection node 70 and the first common connection node 74. The first tunable RF filter 602 is directly coupled between the first connection node 70 and the first common connection node 74. The antenna matching filter 600 is coupled between the first common connection node 74 and the first RF antenna 16, such that the first tunable RF filter 602 is coupled to the first RF antenna 16 via the antenna matching filter 600. In an alternate embodiment of the RF front-end circuitry 58, the antenna matching filter 600 is omitted, such that the first tunable RF filter 602 is directly coupled to the first RF antenna 16. In another embodiment of the RF front-end circuitry 58, the antenna matching filter 600 includes both filtering circuitry and switching circuitry. In a further embodiment of the RF front-end circuitry 58, the antenna matching filter 600 is replaced with switching circuitry (not shown).

The RF system control circuitry 56 provides a first filter control signal FCS1 and a first filter reconfiguration signal FCS1R to the first tunable RF filter 602 in general, and to the first tunable RF transmit filter 604 in particular. In general, the RF communications circuitry 54 includes control circuitry 56, 98 (FIG. 39), which may be either the RF system control circuitry 56 or the RF front-end control circuitry 98 (FIG. 39), that provides the first filter control signal FCS1 and the first filter reconfiguration signal FCS1R. In one embodiment of the first filter control signal FCS1, the first filter control signal FCS1 is based on the measurement-based RF spectrum profile 606. In one embodiment of the first filter reconfiguration signal FCS1R, the first filter reconfiguration signal FCS1R is based on the measurement-based RF spectrum profile 606. In an alternate embodiment of the RF communications circuitry 54, the first filter reconfiguration signal FCS1R is omitted.

The RF system control circuitry 56 provides the first transmit signal TX1 to the RF transmit circuitry 64, which receives and processes the first transmit signal TX1 to provide the first upstream RF transmit signal TU1 to the first tunable RF filter 602 via the first connection node 70. The first tunable RF transmit filter 604 receives and filters the first upstream RF transmit signal TU1 to provide the first filtered RF transmit signal TF1 to the antenna matching filter 600 via the first common connection node 74.

In general, in one embodiment of the first tunable RF filter 602, the first tunable RF filter 602 receives and filters an upstream RF signal to provide a first filtered RF signal, such that a center frequency, which is a tunable center frequency 626 (FIG. 40B) of the first tunable RF filter 602, is based on the first filter control signal FCS1. In one embodiment of the first tunable RF filter 602, the first tunable RF filter 602 is a reconfigurable tunable RF filter 602, such that a shape of a transfer function of the first tunable RF filter 602 is reconfigurable. As such, in one embodiment of the first tunable RF filter 602, a configuration of the first tunable RF filter 602 is based on the first filter reconfiguration signal FCS1R.

Figure 38:
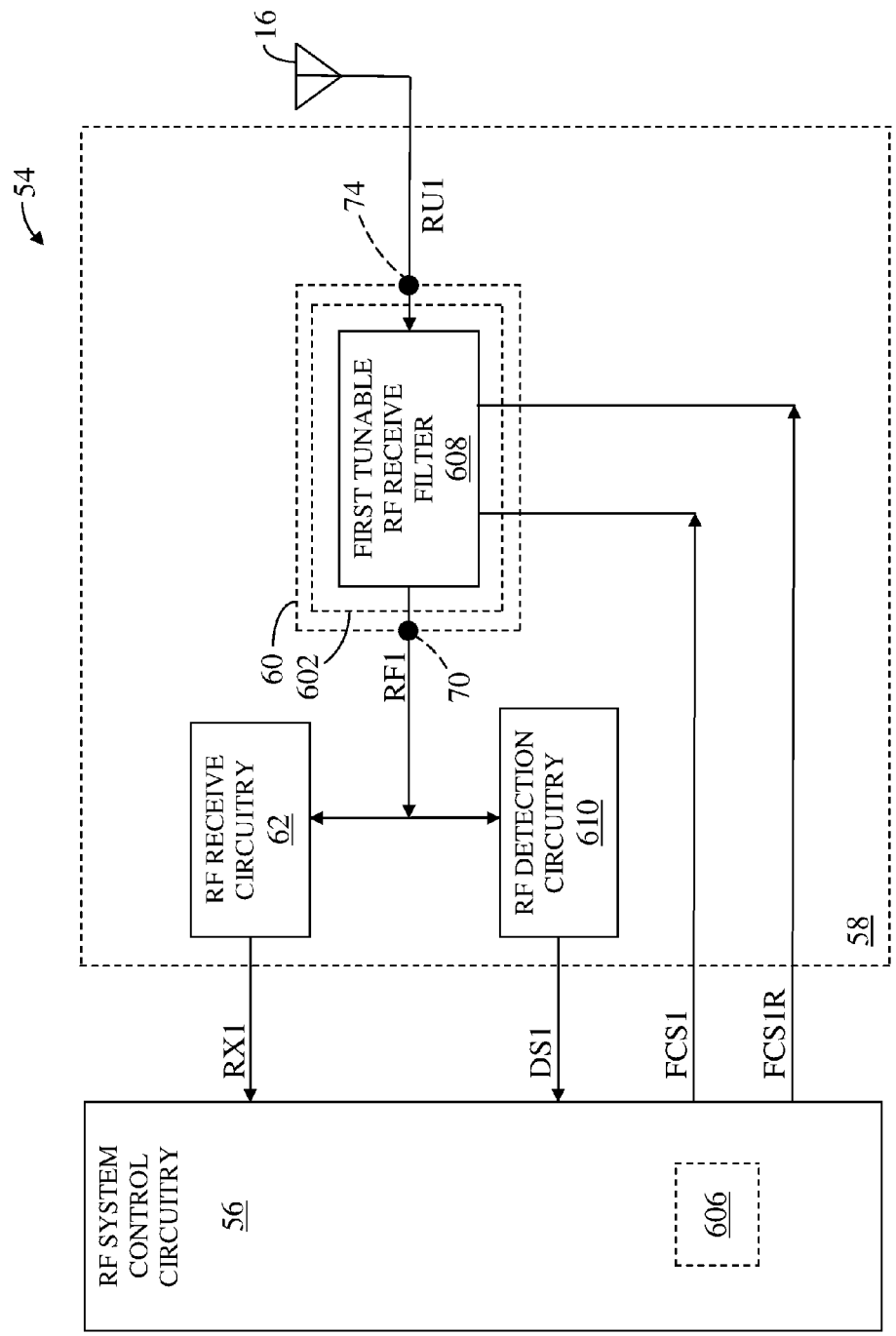
FIG. 38 shows the RF communications circuitry according to an alternate embodiment of the RF communications circuitry.

FIG. 38 shows the RF communications circuitry 54 according to an alternate embodiment of the RF communications circuitry 54. The RF communications circuitry 54 illustrated in FIG. 38 is similar to the RF communications circuitry 54 illustrated in FIG. 37, except in the RF communications circuitry 54 illustrated in FIG. 38; the RF transmit circuitry 64, the antenna matching filter 600, and the first tunable RF transmit filter 604 are omitted; and the first tunable RF filter 602 is a first tunable RF receive filter 608. Additionally, the RF front-end circuitry 58 further includes the RF receive circuitry 62 and RF detection circuitry 610. The RF receive circuitry 62 illustrated in FIG. 38 may be similar to the RF receive circuitry 62 illustrated in FIG. 4. The first tunable RF filter 602 is directly coupled to the first RF antenna 16 via the first common connection node 74.

The first tunable RF receive filter 608 receives and filters the first upstream RF receive signal RU1 via the first RF antenna 16 to provide the first filtered RF receive signal RF1 to the RF receive circuitry 62 and to the RF detection circuitry 610 via the first connection node 70. The RF receive circuitry 62 receives and processes the first filtered RF receive signal RF1 to provide the first receive signal RX1 to the RF system control circuitry 56. Additionally, the RF detection circuitry 610 receives and detects the first filtered RF receive signal RF1 to provide a first detected signal DS1 to the RF system control circuitry 56.

In one embodiment of the RF detection circuitry 610, detection of the first filtered RF receive signal RF1 is direct RF detection, which excludes any down-conversion of the first filtered RF receive signal RF1. By using direct RF detection, artifacts created by down-conversion techniques are avoided.

In a first embodiment of the RF communications circuitry 54, the RF communications circuitry 54 is used to create a group of measurements using at least the first detected signal DS1 to obtain a profile of an RF communications band 612 (FIG. 40A) of interest. Therefore, the RF communications circuitry 54 operates as profiling circuitry to obtain the measurement-based RF spectrum profile 606. As such, the measurement-based RF spectrum profile 606 is based on the group of measurements, which are based on the RF communications band 612 (FIG. 40A). In one embodiment of the control circuitry 56, 98 (FIG. 39), the control circuitry 56, 98 (FIG. 39) constructs the measurement-based RF spectrum profile 606 based on the group of measurements. In one embodiment of the RF front-end circuitry 58, the RF receive circuitry 62 is omitted.

In a second embodiment of the RF communications circuitry 54, the measurement-based RF spectrum profile 606 was previously provided to the RF system control circuitry 56, and the RF communications circuitry 54 is used to receive RF signals for normal operations, such as normal RF communications. Therefore, the RF communications circuitry 54 operates as a slave, which uses a previously defined measurement-based RF spectrum profile 606. In one embodiment of the RF front-end circuitry 58, the RF detection circuitry 610 is omitted.

In a third embodiment of the RF communications circuitry 54, the RF communications circuitry 54 is used for both profiling and normal operations. As such, the control circuitry 56, 98 (FIG. 39) selects one of a normal operating mode and a profiling mode. During the profiling mode, the RF detection circuitry 610 provides at least the first detected signal DS1 for the group of measurements, which are used to construct the measurement-based RF spectrum profile 606. During the normal operating mode, the first tunable RF filter 602 receives and filters the upstream RF signal to provide the first filtered RF signal for normal operations. Therefore, the RF communications circuitry 54 operates autonomously. During the profiling mode, the RF communications circuitry 54 operates as profiling circuitry to obtain the measurement-based RF spectrum profile 606. During the normal operating mode, the RF communications circuitry 54 operates as a slave, which uses the measurement-based RF spectrum profile 606 that was obtained during the profiling mode.

In both embodiments of the first tunable RF filter 602 illustrated in FIGS. 37 and 38 in which the first tunable RF filter 602 is the first tunable RF transmit filter 604 and the first tunable RF receive filter 608, respectively, the center frequency, which is the tunable center frequency 626 (FIG. 40B) of the first tunable RF filter 602, is based on the first filter control signal FCS1. Further, in one embodiment of the first tunable RF filter 602, the first tunable RF filter 602 is the reconfigurable tunable RF filter 602, such that the shape of the transfer function of the first tunable RF filter 602 is reconfigurable. As such, in one embodiment of the first tunable RF filter 602, the configuration of the first tunable RF filter 602 is based on the first filter reconfiguration signal FCS1R.

Figure 39:
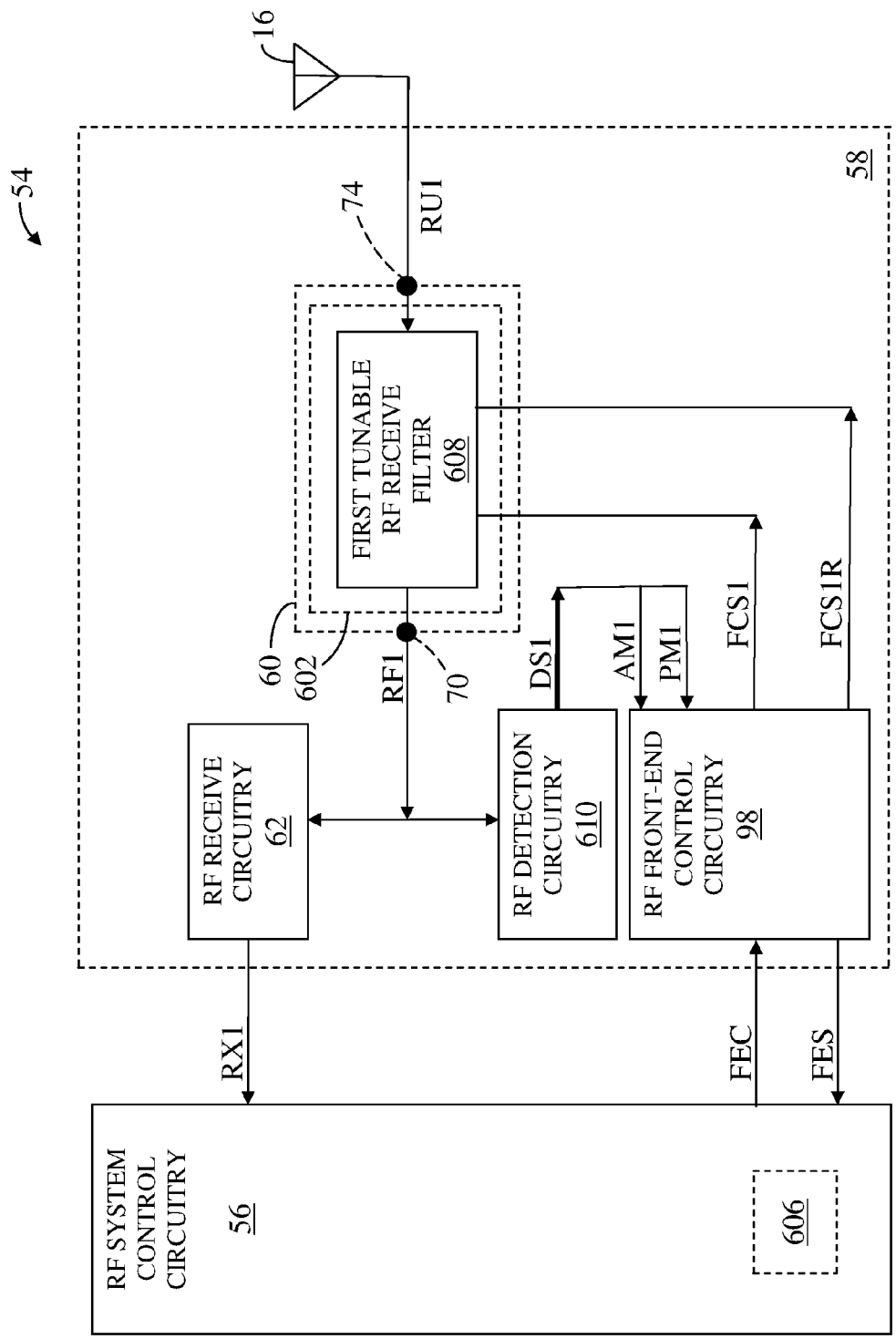
FIG. 39 shows the RF communications circuitry according to an additional embodiment of the RF communications circuitry.

FIG. 39 shows the RF communications circuitry 54 according to an additional embodiment of the RF communications circuitry 54. The RF communications circuitry 54 illustrated in FIG. 39 is similar to the RF communications circuitry 54 illustrated in FIG. 38, except in the RF communications circuitry 54 illustrated in FIG. 39, the RF front-end circuitry 58 further includes the RF front-end control circuitry 98 and the first detected signal DS1 includes a first detected amplitude modulation (AM) signal AM1 and a first detected phase modulation (PM) signal PM1. In an alternate embodiment of the first detected signal DS1, the first detected PM signal PM1 is omitted.

The RF system control circuitry 56 provides the front-end control signal FEC to the RF front-end control circuitry 98. The RF front-end control circuitry 98 provides the first filter control signal FCS1 and the first filter reconfiguration signal FCS1R to the first tunable RF filter 602 based on the front-end control signal FEC. The RF front-end control circuitry 98 provides the front-end status signal FES to the RF system control circuitry 56 based on the first detected signal DS1. As such, the control circuitry 56, 98 includes the RF system control circuitry 56, the RF front-end control circuitry 98, or both.

In one embodiment of the RF detection circuitry 610, the detection of the first filtered RF receive signal RF1 includes AM detection, such that the first detected AM signal AM1 is based on the AM detection. In one embodiment of the measurement-based RF spectrum profile 606, the measurement-based RF spectrum profile 606 is based on at least the first detected AM signal AM1.

In an alternate embodiment of the RF detection circuitry 610, the detection of the first filtered RF receive signal RF1 includes both AM detection and PM detection, such that the first detected AM signal AM1 is based on the AM detection and the first detected PM signal PM1 is based on the PM detection. In one embodiment of the measurement-based RF spectrum profile 606, the measurement-based RF spectrum profile 606 is based on at least the first detected AM signal AM1 and the first detected PM signal PM1.

FIG. 40A is a graph illustrating a profile of an RF communications band 612 of interest according to one embodiment of the RF communications band 612. The RF communications band 612 includes a group of active RF signals 614, such that each of the group of active RF signals 614 has a corresponding center frequency 616. FIG. 40B is a graph illustrating a first bandpass filter response 624 of the first tunable RF receive filter 608 (FIG. 39) according to one embodiment of the first tunable RF receive filter 608 (FIG. 39). The first tunable RF receive filter 608 (FIG. 39) has a tunable center frequency 626.

In one embodiment of the RF communications circuitry 54 (FIG. 39), the first tunable RF receive filter 608 (FIG. 39) is used to measure and profile the RF communications band 612 by identifying the active RF signals 614 in the RF communications band 612. The profile is used to develop the measurement-based RF spectrum profile 606 (FIG. 39) of the RF communications band 612. The active RF signals 614 may be blocking signals in some RF communications systems and desired signals in other RF communications systems. The measurement-based RF spectrum profile 606 (FIG. 39) may be used to help reject the blocking signals and accept the desired signals.

In this regard, in one embodiment of the control circuitry 56, 98 (FIG. 39), as previously mentioned, the control circuitry 56, 98 (FIG. 39) constructs the measurement-based RF spectrum profile 606 (FIG. 39) based on the group of measurements, which may be obtained by adjusting the tunable center frequency 626 for each measurement until the entire RF communications band 612 has been profiled. As such, in one embodiment of the control circuitry 56, 98 (FIG. 39), at least a portion of the group of measurements is associated with at least a portion of the group of active RF signals 614.

In one embodiment of the RF communications band 612, the group of active RF signals 614 includes a pair of somewhat adjacent weak blockers 618, a pair of adjacent strong blockers 620, and a one-sided strong blocker 622. Therefore, the tunable center frequency 626 of the first tunable RF receive filter 608 (FIG. 39), the configuration of the first tunable RF receive filter 608 (FIG. 39), or both may need to be adjusted based on a distribution of the active RF signals 614.

FIG. 41A is a graph illustrating the first bandpass filter response 624 and a second bandpass filter response 628 of the first tunable RF receive filter 608 shown in FIG. 38 according to one embodiment of the first tunable RF receive filter 608. In general, in one embodiment of the first tunable RF filter 602 (FIG. 38), the first tunable RF filter 602 (FIG. 38) has either a first configuration or a second configuration based on the first filter reconfiguration signal FCS1R (FIG. 38). During the first configuration, the first tunable RF filter 602 (FIG. 38) has the first bandpass filter response 624, and during the second configuration, the first tunable RF filter 602 (FIG. 38) has the second bandpass filter response 628. An order of the first tunable RF filter 602 (FIG. 38) is higher during the second configuration than during the first configuration.

A bandwidth of the second bandpass filter response 628 is narrower than a bandwidth of the first bandpass filter response 624, as shown in FIG. 41A. As such, the first bandpass filter response 624 may have a lower slope away from the tunable center frequency 626 than the second bandpass filter response 628. Additionally, in the second bandpass filter response 628, insertion loss increases more rapidly as the frequency moves away from the tunable center frequency 626 than the second bandpass filter response 628. However, the second bandpass filter response 628 has increased insertion loss 630 toward the tunable center frequency 626 when compared to the first bandpass filter response 624. Therefore, the first configuration may be used when blockers are not close to the tunable center frequency 626. However, the second configuration may be used when blockers are somewhat close to the tunable center frequency 626, such as when the tunable center frequency 626 is between the somewhat adjacent weak blockers 618 (FIG. 40A).

FIG. 41B is a graph illustrating the first bandpass filter response 624 and a third bandpass filter response 632 of the first tunable RF receive filter 608 shown in FIG. 38 according to one embodiment of the first tunable RF receive filter 608. The first bandpass filter response 624 is shown for comparison purposes. In general, in one embodiment of the first tunable RF filter 602 (FIG. 38), the first tunable RF filter 602 (FIG. 38) has the third bandpass filter response 632 based on the first filter reconfiguration signal FCS1R (FIG. 38). The third bandpass filter response 632 includes a left-side notch filter response 634 and a right-side notch filter response 636. As such, the left-side notch filter response 634 has a tunable left-side notch frequency 638 and the right-side notch filter response 636 has a tunable right-side notch frequency 640.

A bandwidth of the third bandpass filter response 632 is narrower than the bandwidth of the first bandpass filter response 624, as shown in FIG. 41B. However, the third bandpass filter response 632 has further increased insertion loss 642 toward the tunable center frequency 626 when compared to the first bandpass filter response 624. In this regard, the third bandpass filter response 632 may be used when blockers are strong, close to the tunable center frequency 626, or both, such as when the tunable center frequency 626 is between the adjacent strong blockers 620 (FIG. 40A).

In an alternate embodiment of the first tunable RF filter 602 (FIG. 38), the first tunable RF filter 602 (FIG. 38) has the third bandpass filter response 632 based on the first filter reconfiguration signal FCS1R (FIG. 38), except that either the left-side notch filter response 634 or the right-side notch filter response 636 is omitted. As such, the first tunable RF filter 602 (FIG. 38) has a bandpass filter response with a side notch filter response. In this regard, the bandpass filter response with a side notch filter response may be used when a strong blocker on one side is close, such as when the tunable center frequency 626 is close to the one-sided strong blocker 622 (FIG. 40A). Specifically, in one embodiment of the third bandpass filter response 632, the right-side notch filter response 636 is omitted, such that the third bandpass filter response 632 has the left-side notch filter response 634 and not the right-side notch filter response 636. Conversely, in an alternate embodiment of the third bandpass filter response 632, the left-side notch filter response 634 is omitted, such that the third bandpass filter response 632 has the right-side notch filter response 636 and not the left-side notch filter response 634.

Figure 42:
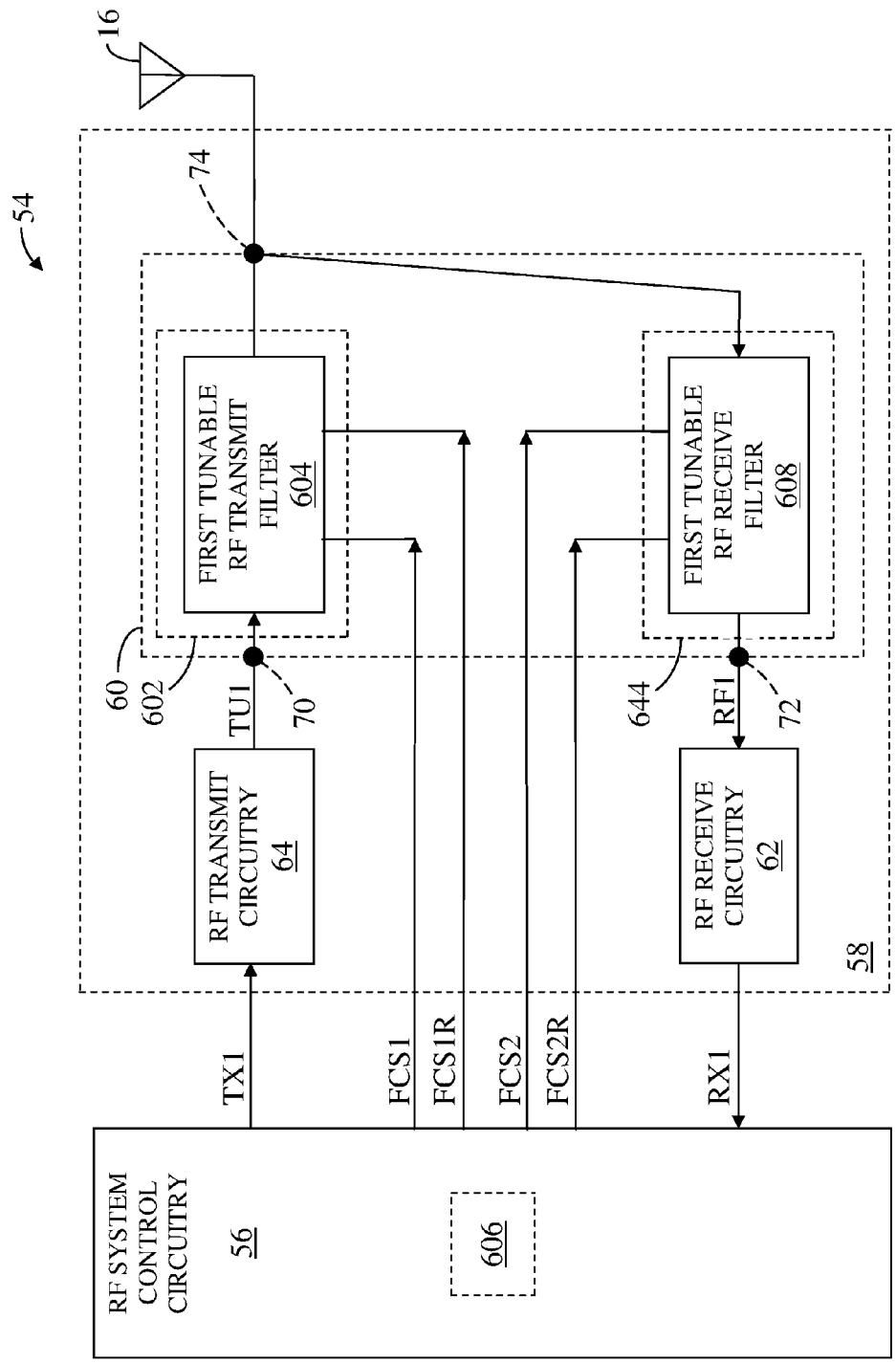
FIG. 42 shows the RF communications circuitry according to one embodiment of the RF communications circuitry.

FIG. 42 shows the RF communications circuitry 54 according to an alternate embodiment of the RF communications circuitry 54. The RF communications circuitry 54 illustrated in FIG. 42 is similar to the RF communications circuitry 54 illustrated in FIG. 37, except in the RF communications circuitry 54 illustrated in FIG. 42, the antenna matching filter 600 is omitted, the RF front-end circuitry 58 further includes the RF receive circuitry 62, and the first RF filter structure 60 further includes a second tunable RF filter 644. The first tunable RF filter 602 is directly coupled to the first RF antenna 16 via the first common connection node 74, and the second tunable RF filter 644 is directly coupled to the first RF antenna 16 via the first common connection node 74. In one embodiment of the second tunable RF filter 644, the second tunable RF filter 644 is the first tunable RF receive filter 608.

The first tunable RF receive filter 608 receives and filters a first upstream RF receive signal via the first RF antenna 16 to provide the first filtered RF receive signal RF1 to the RF receive circuitry 62 via the second connection node 72. The RF receive circuitry 62 receives and processes the first filtered RF receive signal RF1 to provide the first receive signal RX1 to the RF system control circuitry 56.

The RF system control circuitry 56 provides a second filter control signal FCS2 and a second filter reconfiguration signal FCS2R to the second tunable RF filter 644 in general, and to the first tunable RF receive filter 608 in particular. In one embodiment of the second filter control signal FCS2, the second filter control signal FCS2 is based on the measurement-based RF spectrum profile 606. In one embodiment of the second filter reconfiguration signal FCS2R, the second filter reconfiguration signal FCS2R is based on the measurement-based RF spectrum profile 606. In an alternate embodiment of the RF communications circuitry 54, the second filter reconfiguration signal FCS2R is omitted.

In general, in one embodiment of the second tunable RF filter 644, the second tunable RF filter 644 receives and filters an upstream RF signal to provide a first filtered RF signal, such that a center frequency, which is a tunable center frequency of the second tunable RF filter 644, is based on the second filter control signal FCS2. In one embodiment of the second tunable RF filter 644, the second tunable RF filter 644 is a reconfigurable tunable RF filter 644, such that a shape of a transfer function of the second tunable RF filter 644 is reconfigurable. As such, in one embodiment of the second tunable RF filter 644, a configuration of the second tunable RF filter 644 is based on the second filter reconfiguration signal FCS2R.

In one embodiment of the RF communications circuitry 54, the measurement-based RF spectrum profile 606 was previously provided to the RF system control circuitry 56, and the RF communications circuitry 54 is used to receive RF signals and transmit RF signals for normal operations, such as normal RF communications using the measurement-based RF spectrum profile 606.

Figure 43:
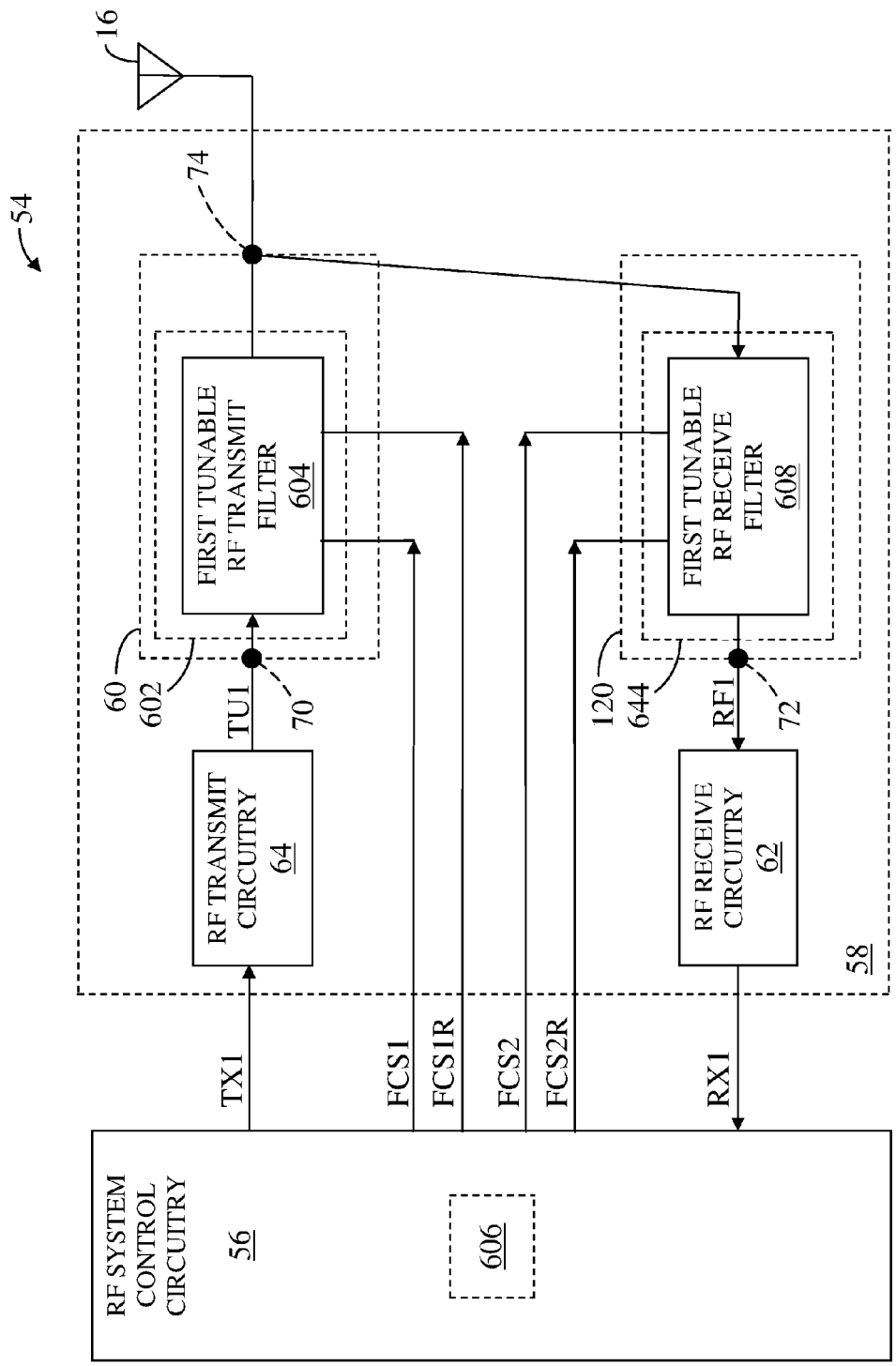
FIG. 43 shows the RF communications circuitry according to an alternate embodiment of the RF communications circuitry.

FIG. 43 shows the RF communications circuitry 54 according to an alternate embodiment of the RF communications circuitry 54. The RF communications circuitry 54 illustrated in FIG. 43 is similar to the RF communications circuitry 54 illustrated in FIG. 42, except in the RF communications circuitry 54 illustrated in FIG. 43, the RF front-end circuitry 58 further includes the second RF filter structure 120, such that the second tunable RF filter 644 is omitted from the first RF filter structure 60 and then added to the second RF filter structure 120.

Figure 44:
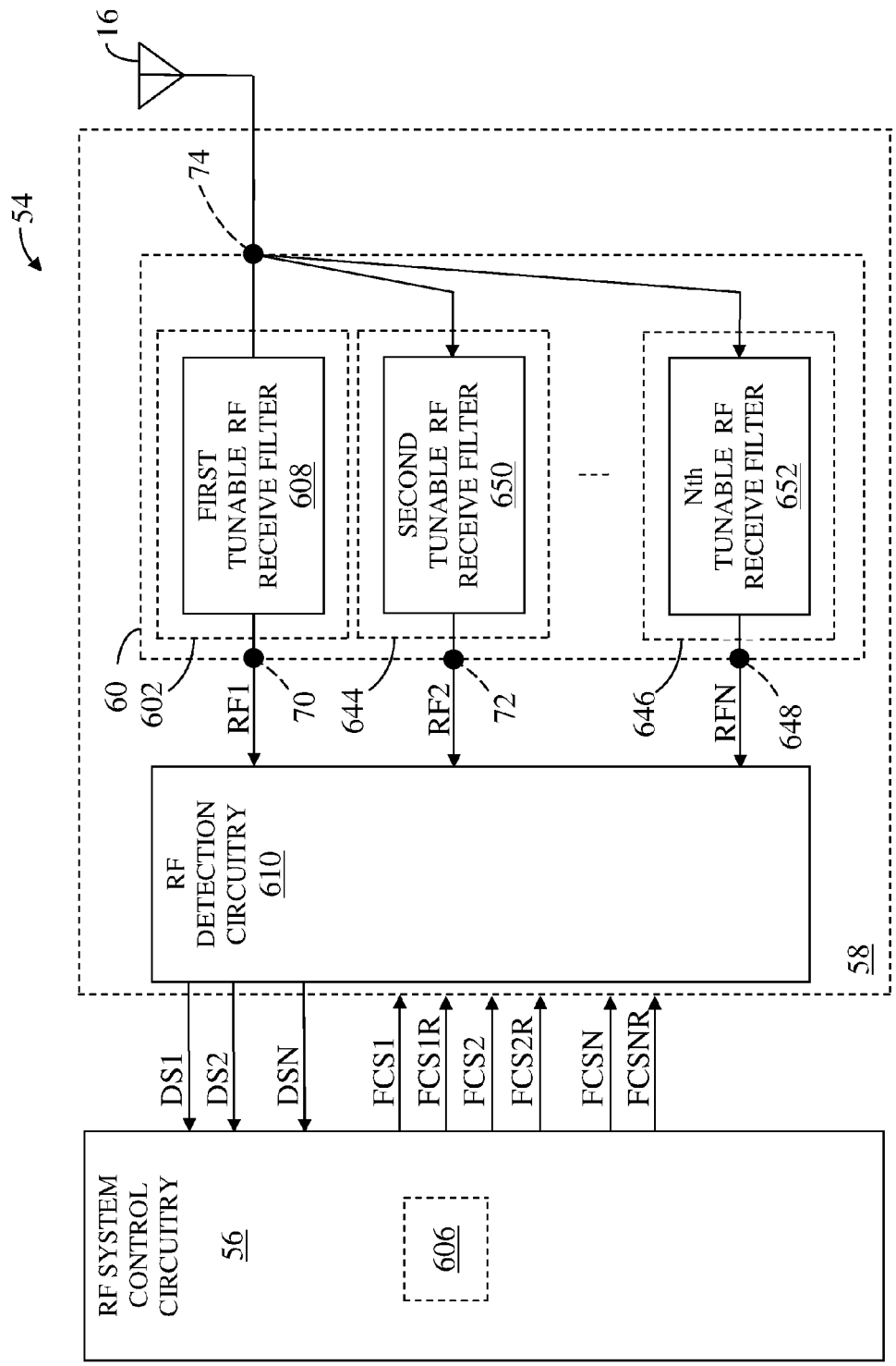
FIG. 44 shows the RF communications circuitry according to an additional embodiment of the RF communications circuitry.

FIG. 44 shows the RF communications circuitry 54 according to an additional embodiment of the RF communications circuitry 54. The RF communications circuitry 54 illustrated in FIG. 44 is similar to the RF communications circuitry 54 illustrated in FIG. 38, except in the RF communications circuitry 54 illustrated in FIG. 44, the RF receive circuitry 62 is omitted and the first RF filter structure 60 further includes the second tunable RF filter 644 and up to and including an $N^{TH}$ tunable RF filter 646. Also, the first RF filter structure 60 further includes up to and including an $N^{TH}$ connection node 648. In one embodiment of the second tunable RF filter 644 and the second tunable RF receive filter 650, the second tunable RF filter 644 is a second tunable RF receive filter 650 and the $N^{TH}$ tunable RF filter 646 is an $N^{TH}$ tunable RF receive filter 652.

The RF detection circuitry 610 provides the first detected signal DS1, a second detected signal DS2, and an $N^{TH}$ detected signal DSN to the RF system control circuitry 56 based on receiving and detecting the first filtered RF receive signal RF1, the second filtered RF receive signal RF2 and up to and including an $N^{TH}$ filtered RF receive signal RFN. The RF system control circuitry 56 provides the first filter control signal FCS1, the second filter control signal FCS2, and up to and including an $N^{TH}$ filter control signal FCSN to the RF detection circuitry 610. Additionally, the RF system control circuitry 56 provides the first filter reconfiguration signal FCS1R, the second filter reconfiguration signal FCS2R, and up to and including an $N^{TH}$ filter reconfiguration signal FCSNR to the RF front-end circuitry 58.

In general, the first RF filter structure 60 includes a group of tunable RF filters 602, 644, 646 and a group of connection nodes 70, 72, 648. The RF system control circuitry 56 provides a group of filter control signals FCS1, FCS2, FCSN to the group of tunable RF filters 602, 644, 646 to tune the group of tunable RF filters 602, 644, 646. Additionally, the RF system control circuitry 56 provides a group of filter reconfiguration signals FCS1R, FCS2R, FCSNR to configure the group of tunable RF filters 602, 644, 646. The group of tunable RF filters 602, 644, 646 provides a group of filtered RF signals RF1, RF2, RFN to the RF detection circuitry 610 via the group of connection nodes 70, 72, 648. The RF detection circuitry 610 receives and detects the group of filtered RF signals RF1, RF2, RFN to provide a group of detected signals DS1, DS2, DSN. The measurement-based RF spectrum profile 606 is based on a group of measurements using the group of detected signals DS1, DS2, DSN. In one embodiment of the RF detection circuitry 610, the RF detection circuitry 610 includes multiple AM detectors (not shown) and multiple PM detectors (not shown), such that each of the group of detected signals DS1, DS2, DSN has a corresponding detected AM signal and a corresponding detected PM signal.

Figure 45:
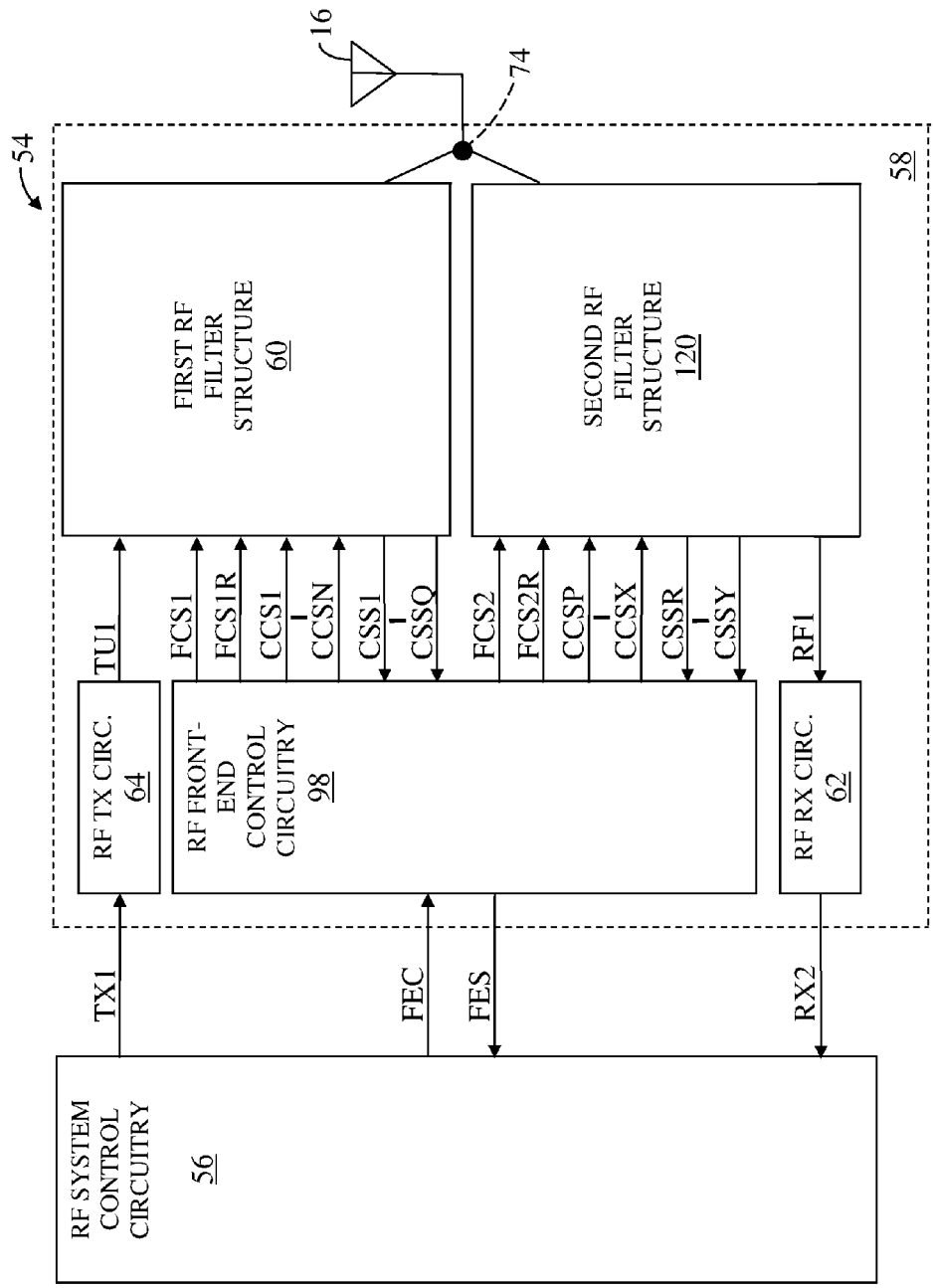
FIG. 45 shows the RF communications circuitry according to another embodiment of the RF communications circuitry.

FIG. 45 shows the RF communications circuitry 54 according to another embodiment of the RF communications circuitry 54. The RF communications circuitry 54 illustrated in FIG. 45 is similar to the RF communications circuitry 54 illustrated in FIG. 43, except in the RF communications circuitry 54 illustrated in FIG. 45, the RF front-end circuitry 58 further includes the RF front-end control circuitry 98.

The RF front-end control circuitry 98 provides the first calibration control signal CCS1 and up to and including the $N^{TH}$ calibration control signal CCSN to the first RF filter structure 60. The RF front-end control circuitry 98 provides the $P^{TH}$ calibration control signal CCSP and up to and including the $X^{TH}$ calibration control signal CCSX to the second RF filter structure 120. Details of the first RF filter structure 60 and the second RF filter structure 120 are not shown to simplify FIG. 45.

The first RF filter structure 60 provides the first calibration status signal CSS1 and up to and including the $Q^{TH}$ calibration status signal CSSQ to the RF front-end control circuitry 98. The second RF filter structure 120 provides the $R^{TH}$ calibration status signal CSSR and up to and including the $Y^{TH}$ calibration status signal CSSY to the RF front-end control circuitry 98. In an alternate embodiment of the RF front-end circuitry 58, any or all of the $N^{TH}$ calibration control signal CCSN, the $Q^{TH}$ calibration status signal CSSQ, the $X^{TH}$ calibration control signal CCSX, and the $Y^{TH}$ calibration status signal CSSY are omitted.

In one embodiment of the RF front-end circuitry 58, the RF front-end circuitry 58 operates in one of a normal operating mode and a calibration mode. During the calibration mode, the RF front-end control circuitry 98 performs a calibration of the first RF filter structure 60, the second RF filter structure 120, or both. As such, the RF front-end control circuitry 98 provides any or all of the filter control signals FCS1, FCS2, any or all of the filter reconfiguration signals FCS1R, FCS2R, and any or all of the calibration control signals CCS1, CCSN, CCSP, CCSX needed for calibration. Further, the RF front-end control circuitry 98 receives any or all of the calibration status signals CSS1, CSSQ, CSSR, CSSY needed for calibration.

During the normal operating mode, the RF front-end control circuitry 98 provides any or all of the filter control signals FCS1, FCS2, any or all of the filter reconfiguration signals FCS1R, FCS2R, and any or all of the calibration control signals CCS1, CCSN, CCSP, CCSX needed for normal operation. Further, the RF front-end control circuitry 98 receives any or all of the calibration status signals CSS1, CSSQ, CSSR, CSSY needed for normal operation. Any or all of the calibration control signals CCS1, CCSN, CCSP, CCSX may be based on the front-end control signal FEC. The front-end status signal FES may be based on any or all of the calibration status signals CSS1, CSSQ, CSSR, CSSY. Further, during the normal operating mode, the RF front-end circuitry 58 processes signals as needed for normal operation. Other embodiments described in the present disclosure may be associated with normal operation.

Figure 46:
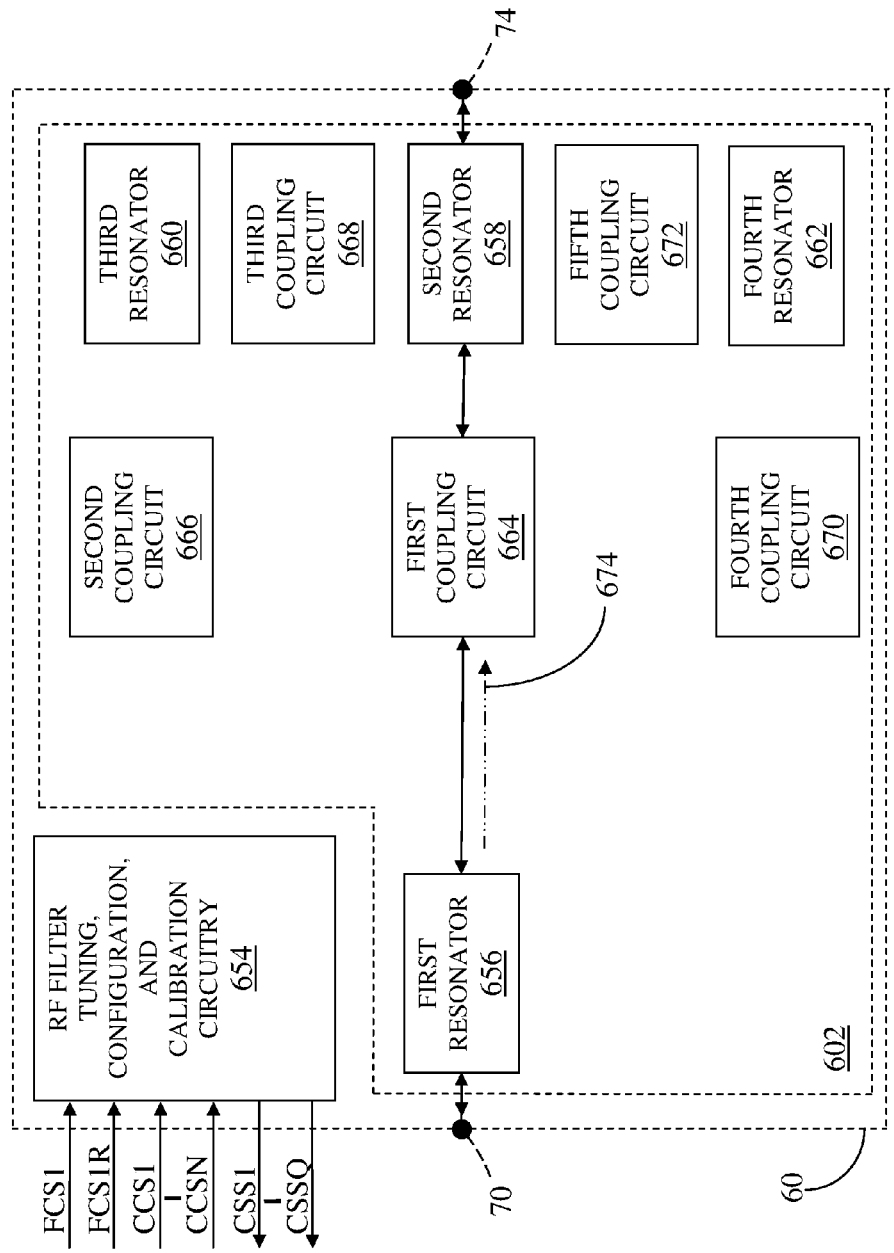
FIG. 46 shows the first RF filter structure shown in FIG. 45 according to one embodiment of the first RF filter structure.

FIG. 46 shows the first RF filter structure 60 shown in FIG. 45 according to one embodiment of the first RF filter structure 60. The first RF filter structure 60 includes the first tunable RF filter 602 and RF filter tuning, configuration, and calibration circuitry 654. The RF filter tuning, configuration, and calibration circuitry 654 is used to facilitate tuning, configuration, and calibration of the first tunable RF filter 602. As such, the RF filter tuning, configuration, and calibration circuitry 654 receives the first filter control signal FCS1 and the first filter reconfiguration signal FCS1R. The RF filter tuning, configuration, and calibration circuitry 654 further receives the first calibration control signal CCS1 and up to and including the $N^{TH}$ calibration control signal CCSN. The RF filter tuning, configuration, and calibration circuitry 654 provides the first calibration status signal CSS1 and up to and including the $Q^{TH}$ calibration status signal CSSQ.

The first tunable RF filter 602 includes a first resonator 656, a second resonator 658, a third resonator 660, a fourth resonator 662, a first coupling circuit 664, a second coupling circuit 666, a third coupling circuit 668, a fourth coupling circuit 670, and a fifth coupling circuit 672. The first resonator 656 is coupled to the first connection node 70 and the second resonator 658 is coupled to the first common connection node 74. In general, the first filter control signal FCS1 is used to tune center frequencies of the resonators 656, 658, 660, 662 and the first filter reconfiguration signal FCS1R is used to configure the coupling circuits 664, 666, 668, 670, 672 to provide connectivity between the resonators 656, 658, 660, 662.

In one embodiment of the coupling circuits 664, 666, 668, 670, 672, each of the coupling circuits 664, 666, 668, 670, 672 may be configured to provide no connectivity or a configurable magnitude of connectivity between two of the resonators 656, 658, 660, 662. Further, in one embodiment of the coupling circuits 664, 666, 668, 670, 672, each of the coupling circuits 664, 666, 668, 670, 672 may be configured to provide either additive or subtractive connectivity between two of the resonators 656, 658, 660, 662. In the embodiments that follow, unless stated otherwise, each of the coupling circuits 664, 666, 668, 670, 672 provides no connectivity between the resonators 656, 658, 660, 662.

In a first embodiment of the first tunable RF filter 602, the first tunable RF filter 602 has a first configuration based on the first filter reconfiguration signal FCS1R, as illustrated in FIG. 46. In the first configuration, the first coupling circuit 664 is configured to couple the first resonator 656 to the second resonator 658, thereby providing a first reconfigurable RF filter path 674 between the first connection node 70 and the first common connection node 74 via the first resonator 656, the first coupling circuit 664, and the second resonator 658. A first group of resonators includes the first resonator 656 and the second resonator 658. Therefore, the first group of resonators includes two resonators. In this regard, during the first configuration, the first group of resonators are coupled in series between the first connection node 70 and the first common connection node 74.

Figure 47:
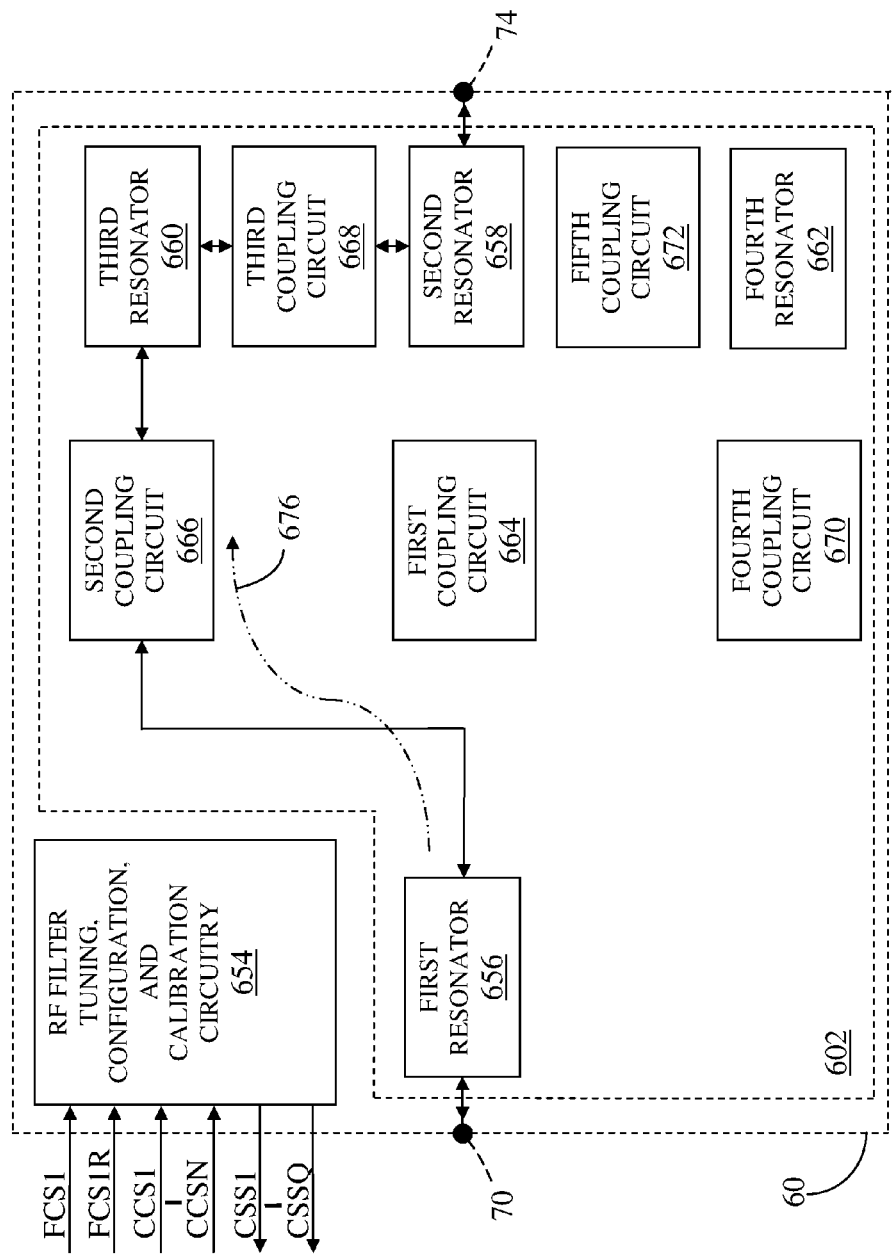
FIG. 47 shows the first RF filter structure shown in FIG. 45 according to an alternate embodiment of the first RF filter structure.

FIG. 47 shows the first RF filter structure 60 shown in FIG. 45 according to an alternate embodiment of the first RF filter structure 60. The first RF filter structure 60 illustrated in FIG. 47 is similar to the first RF filter structure 60 illustrated in FIG. 46, except in the first RF filter structure 60 illustrated in FIG. 47, the first tunable RF filter 602 has a second configuration instead of the first configuration.

As such, in a second embodiment of the first tunable RF filter 602, the first tunable RF filter 602 has the second configuration based on the first filter reconfiguration signal FCS1R, as illustrated in FIG. 47. In the second configuration, the first coupling circuit 664 provides no connectivity, the second coupling circuit 666 is configured to couple the first resonator 656 to the third resonator 660, and the third coupling circuit 668 is configured to couple the third resonator 660 to the second resonator 658, thereby providing a second reconfigurable RF filter path 676 between the first connection node 70 and the first common connection node 74 via the first resonator 656, the second coupling circuit 666, the third resonator 660, the third coupling circuit 668, and the second resonator 658. A second group of resonators includes the first resonator 656, the second resonator 658, and the third resonator 660. Therefore, the second group of resonators includes three resonators. A first group of coupling circuits includes the second coupling circuit 666 and the third coupling circuit 668. In this regard, during the second configuration, the second group of resonators and the first group of coupling circuits are coupled in series between the first connection node 70 and the first common connection node 74.

The first tunable RF filter 602 illustrated in FIGS. 46 and 47 has a bandpass filter response. However, since the second group of resonators has more resonators than the first group of resonators, an order of the first tunable RF filter 602 is higher during the second configuration than during the first configuration. Further, during both the first configuration and the second configuration, the first tunable RF filter 602 has a single path between the first connection node 70 and the first common connection node 74.

Figure 48:
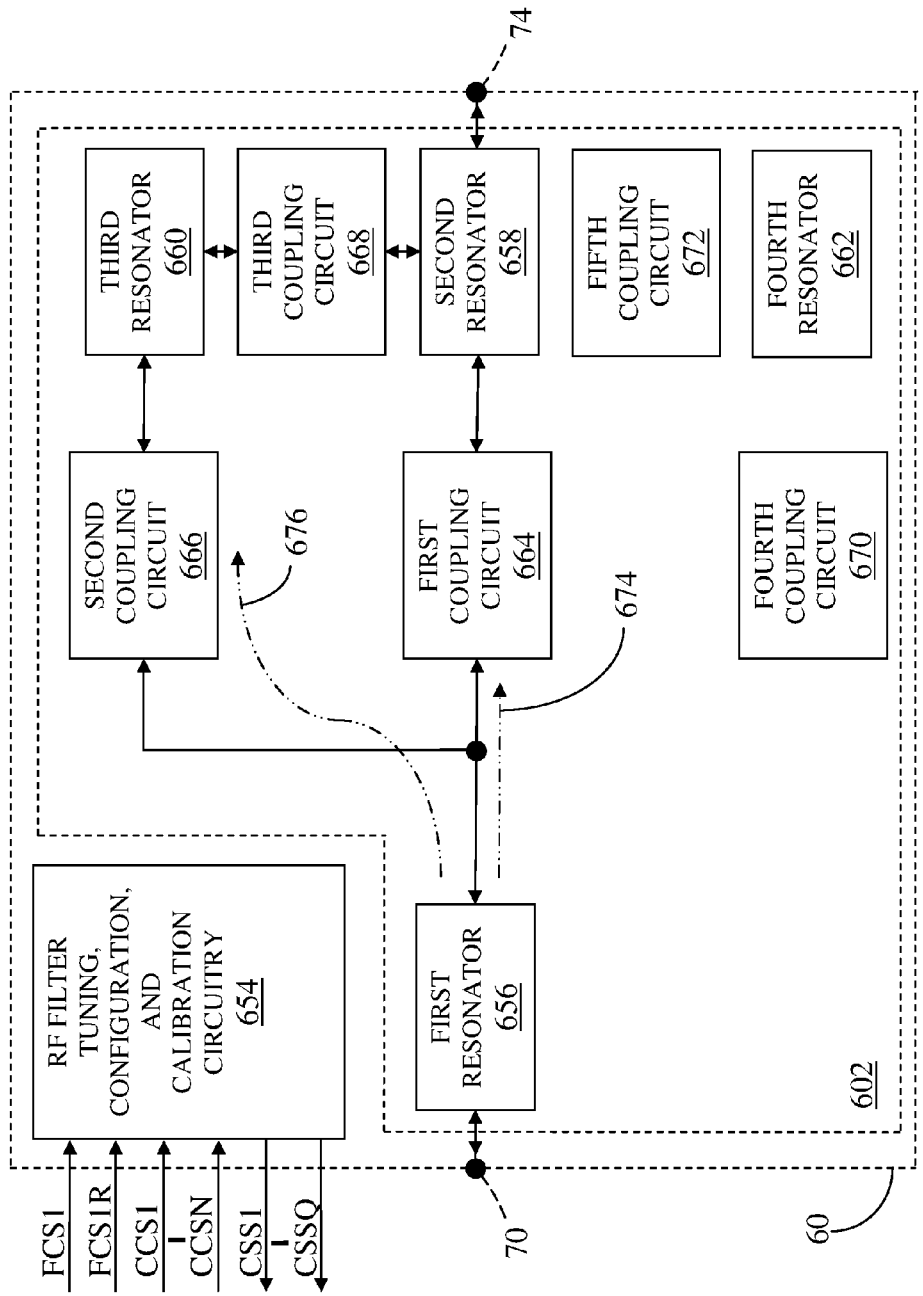
FIG. 48 shows the first RF filter structure shown in FIG. 45 according to an additional embodiment of the first RF filter structure.

FIG. 48 shows the first RF filter structure 60 shown in FIG. 45 according to an additional embodiment of the first RF filter structure 60. The first tunable RF filter 602 illustrated in FIG. 48 combines the first configuration and the second configuration illustrated in FIGS. 46 and 47, respectively. As such, the first tunable RF filter 602 illustrated in FIG. 48 includes the first reconfigurable RF filter path 674 and the second reconfigurable RF filter path 676. As such, the first reconfigurable RF filter path 674 and the second reconfigurable RF filter path 676 share at least one resonator. Further, the first tunable RF filter 602 includes the first group of resonators and the second group of resonators, such that the first group of resonators is not identical to the second group of resonators. By combining the first reconfigurable RF filter path 674 and the second reconfigurable RF filter path 676, the first tunable RF filter 602 illustrated in FIG. 48 has a bandpass filter response with a side notch filter response.

Figure 49:
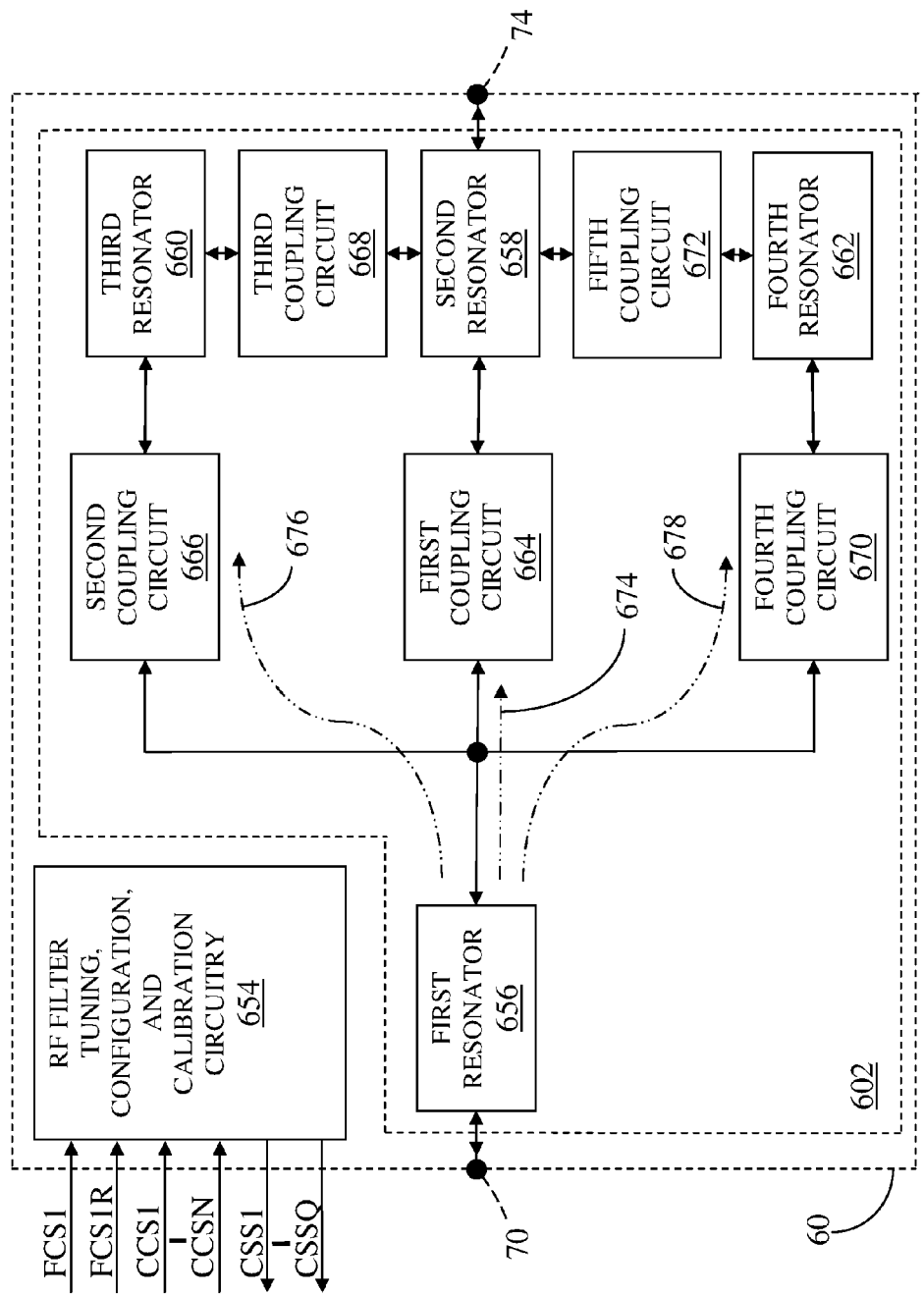
FIG. 49 shows the first RF filter structure shown in FIG. 45 according to another embodiment of the first RF filter structure.

FIG. 49 shows the first RF filter structure 60 shown in FIG. 45 according to another embodiment of the first RF filter structure 60. The first tunable RF filter 602 illustrated in FIG. 49 combines the first reconfigurable RF filter path 674 and the second reconfigurable RF filter path 676 illustrated in FIG. 48 with a third reconfigurable RF filter path 678. As such, in a third embodiment of the first tunable RF filter 602, the first tunable RF filter 602 has a third configuration based on the first filter reconfiguration signal FCS1R, as illustrated in FIG. 49. In the third configuration, the first reconfigurable RF filter path 674, the second reconfigurable RF filter path 676, and the third reconfigurable RF filter path 678 are provided.

In the third reconfigurable RF filter path 678, the fourth coupling circuit 670 is configured to couple the first resonator 656 to the fourth resonator 662, and the fifth coupling circuit 672 is configured to couple the fourth resonator 662 to the second resonator 658, thereby providing the third reconfigurable RF filter path 678 between the first connection node 70 and the first common connection node 74 via the first resonator 656, the fourth coupling circuit 670, the fourth resonator 662, the fifth coupling circuit 672, and the second resonator 658. A third group of resonators includes the first resonator 656, the second resonator 658, and the fourth resonator 662.

As such, the first reconfigurable RF filter path 674, the second reconfigurable RF filter path 676, and the third reconfigurable RF filter path 678 share at least one resonator. Further, the first tunable RF filter 602 includes the first group of resonators, the second group of resonators, and the third group of resonators, such that the first group of resonators is not identical to the second group of resonators, the second group of resonators is not identical to the third group of resonators, and the first group of resonators is not identical to the third group of resonators. By combining the first reconfigurable RF filter path 674, the second reconfigurable RF filter path 676, and the third reconfigurable RF filter path 678, the first tunable RF filter 602 illustrated in FIG. 49 has a bandpass filter response with a left-side notch filter response and a right-side notch filter response.

Figure 50:
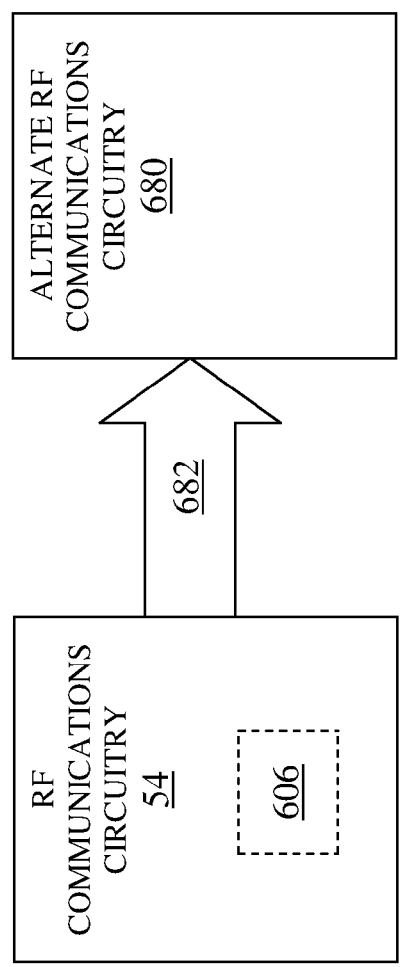
FIG. 50 shows one embodiment of the RF communications circuitry and alternate RF communications circuitry.

FIG. 50 shows one embodiment of the RF communications circuitry 54 and alternate RF communications circuitry 680. The RF communications circuitry 54 includes the control circuitry 56, 98 (FIG. 39), which includes the measurement-based RF spectrum profile 606. The measurement-based RF spectrum profile 606 may be useful for configuration of other RF communications systems. As such, the RF communications circuitry 54 provides the measurement-based RF spectrum profile 606 to the alternate RF communications circuitry 680 via an information transfer system 682. The information transfer system 682 may be manual or automated and may include any combination of analog circuitry, digital circuitry, wireless circuitry, communications circuitry, data storage circuitry, the like, or any combination thereof.

Weakly Coupled Tunable RF Receiver Architecture

RF communications circuitry, which includes a first tunable RF filter and a first RF low noise amplifier (LNA), is disclosed according to one embodiment of the present disclosure. The first tunable RF filter includes a pair of weakly coupled resonators, and receives and filters a first upstream RF signal to provide a first filtered RF signal. The first RF LNA is coupled to the first tunable RF filter, and receives and amplifies an RF input signal to provide an RF output signal.

In one embodiment of the RF communications circuitry, the RF communications circuitry includes an RF receiver, which includes the first tunable RF filter and the first RF LNA. In some embodiments of the first tunable RF filter, the first tunable RF filter provides impedance matching, noise filtering and matching, interference rejection, the like, or any combination thereof.

Figure 51:
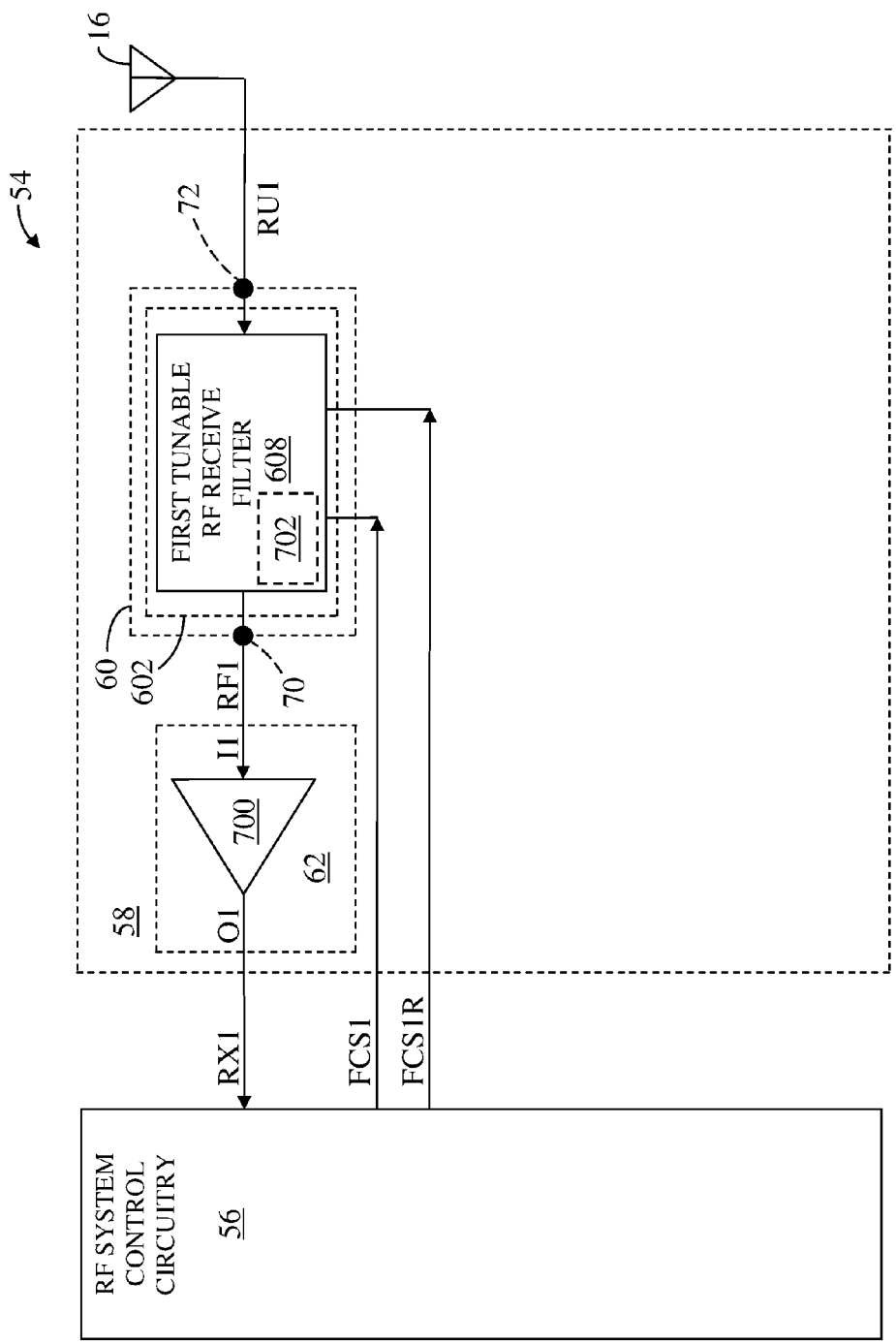
FIG. 51 shows the RF communications circuitry according to one embodiment of the RF communications circuitry.

FIG. 51 shows the RF communications circuitry 54 according to one embodiment of the RF communications circuitry 54. The RF communications circuitry 54 illustrated in FIG. 51 is similar to the RF communications circuitry 54 illustrated in FIG. 38, except in the RF communications circuitry 54 illustrated in FIG. 51, the measurement-based RF spectrum profile 606 is omitted, the RF detection circuitry 610 is omitted, and the first RF filter structure 60 includes the second connection node 72 instead of the first common connection node 74. As such, the first tunable RF filter 602 is coupled between the first connection node 70 and the second connection node 72 instead of being coupled between the first connection node 70 and the first common connection node 74.

Additionally, the RF receive circuitry 62 includes a first RF LNA 700 and the first tunable RF filter 602 includes a pair 702 of weakly coupled resonators. In one embodiment of the pair 702 of weakly coupled resonators, the pair 702 of weakly coupled resonators includes the pair of weakly coupled resonators R(1,1), R(1,2) (FIG. 21). Additionally, in one embodiment of the pair 702 of weakly coupled resonators, an energy transfer factor between a first of the pair 702 of weakly coupled resonators and a second of the pair 702 of weakly coupled resonators is less than ten percent. In the general case, more than one filtering structure and/or more than one LNA/amplifier stage may exist in the communications system. They may be coupled in an intermingled fashion or all filters in cascade and all amplifiers in cascade.

The first RF LNA 700 receives and amplifies a first RF input signal I1 to provide a first RF output signal O1. The first tunable RF filter 602 receives and filters the first upstream RF receive signal RU1 to provide the first filtered RF receive signal RF1. In the embodiment illustrated in FIG. 51, the first tunable RF filter 602 is coupled to an input of the first RF LNA 700. As such, the first filtered RF receive signal RF1 is the first RF input signal I1 and the first RF output signal O1 is the first receive signal RX1. In general, the first tunable RF filter 602 is coupled to the first RF LNA 700.

In one embodiment of the first tunable RF filter 602, the first tunable RF filter 602 provides at least partial power matching, at least partial noise matching, or both between the first RF antenna 16, which is a main antenna, and the first RF LNA 700. In one embodiment of the first RF antenna 16, a nominal impedance from the first RF antenna 16 is 50 ohms or 75 ohms. The first RF antenna 16 provides the first upstream RF receive signal RU1. In one embodiment of the first RF LNA 700, the first RF input signal I1 feeds FET transistors (not shown) in the first RF LNA 700. The FET transistors (not shown) typically have high input impedances compared with the impedance from the first RF antenna 16.

If the filters and LNAs are providing characteristic input and output impedances, such as 50 ohms, power match is achieved but noise performance is suboptimal. Optimum noise performance is achieved when the output impedance of the filter is close to the noise impedance of the active device. FET input amplifiers typically have high noise impedances and need a large impedance at the filter output.

To maximize power transfer, impedance matching is needed. To minimize noise, the impedance at the LNA input needs to be matched to the noise impedance of the LNA. As a result, simultaneous power impedance matching and noise impedance matching are needed. Therefore, to maximize power transfer from the first RF antenna 16 to the first RF LNA 700, the first tunable RF filter 602 transforms an input impedance to the first tunable RF filter 602 to an output impedance from the first tunable RF filter 602. In one embodiment of the first tunable RF filter 602, the output impedance from the first tunable RF filter 602 is greater than the input impedance to the first tunable RF filter 602. In one embodiment of the first tunable RF filter 602, the output impedance from the first tunable RF filter 602 is at least 10 times greater than the input impedance to the first tunable RF filter 602. In one embodiment of the first tunable RF filter 602, the output impedance from the first tunable RF filter 602 is at least 100 times greater than the input impedance to the first tunable RF filter 602. As such, in one embodiment of the first tunable RF filter 602, the first tunable RF filter 602 provides at least a partial impedance match to the first RF LNA 700 to maximize power transfer. Additionally, in one embodiment of the first tunable RF filter 602, the first tunable RF filter 602 is a passive device with no active components, the first tunable RF filter 602 operates with high efficiency. Therefore, since the output impedance from the first tunable RF filter 602 is greater than the input impedance to the first tunable RF filter 602, the first tunable RF filter 602 provides voltage gain.

In one embodiment of the first tunable RF filter 602, the input impedance to the first tunable RF filter 602 is on the order of 50 ohms. In one embodiment of the first tunable RF filter 602, the input impedance to the first tunable RF filter 602 is on the order of 75 ohms. Noise in the first RF LNA 700 is minimized when matched to its noise impedance, which is equal to a complex noise voltage at the input of the first RF LNA 700 divided by a complex noise current of the first RF LNA 700. Since the first RF LNA 700 may have predominantly noise voltage, a noise impedance of the first RF LNA 700 may also be high. As such, in one embodiment of the first tunable RF filter 602, the output impedance from the first tunable RF filter 602 is on the order of the noise impedance of the first RF LNA 700. In one embodiment of the first tunable RF filter 602, the output impedance from the first tunable RF filter 602 is within a factor of two or three of the noise impedance of the first RF LNA 700. As such, in one embodiment of the first tunable RF filter 602, the output impedance from the first tunable RF filter 602 provides at least a partial noise impedance match to the first RF LNA 700. In one embodiment of the first tunable RF filter 602, the first tunable RF filter 602 simultaneously provides at least a partial impedance match to the first RF LNA 700 and at least a partial noise impedance match to the first RF LNA 700.

In one embodiment of the RF communications circuitry 54, the first RF antenna 16 may be associated with a voltage standing wave ration (VSWR) due to changing loading conditions. As a result, the impedance of the first RF antenna 16 may change due to the changing loading conditions, such that the VSWR is indicative of the impedance of the first RF antenna 16. Therefore, in one embodiment of the RF communications circuitry 54, the RF system control circuitry 56 estimates the VSWR and adjusts the input impedance to the first tunable RF filter 602 based on the estimated VSWR. This reduces the noise degradation over antenna VSWR due to deviations from noise impedance matching.

In one embodiment of the RF communications circuitry 54, the RF communications circuitry 54 transmits the first filtered RF transmit signal TF1 (FIG. 4). However, the first filtered RF transmit signal TF1 (FIG. 4), or some other RF transmit signal, may interfere with the first upstream RF receive signal RU1 (FIGS. 4 and 51). As a result, even though the first filtered RF transmit signal TF1 (FIG. 4) is at a different frequency than the first upstream RF receive signal RU1, the first RF LNA 700 may have to receive and amplify effects of the first filtered RF transmit signal TF1 (FIG. 4), thereby increasing current consumption of the first RF LNA 700 and degrading efficiency. As a result, the RF system control circuitry 56 monitors the current consumption of the first RF LNA 700 and if the current consumption of the first RF LNA 700 exceeds a current threshold, the RF system control circuitry 56 tunes, reconfigures, or both, the RF receive circuitry 62 to add at least one notch filter response to the frequency response of the first tunable RF filter 602. In one embodiment of the first tunable RF filter 602, notch filter response has a notch frequency, such that the notch frequency is about equal to a frequency of the first filtered RF transmit signal TF1, or some other RF interference signal. In one embodiment of the notch filter response, the notch filter response is either the left-side notch filter response 634 (FIG. 41B) or the right-side notch filter response 636 (FIG. 41B).

Figure 52:
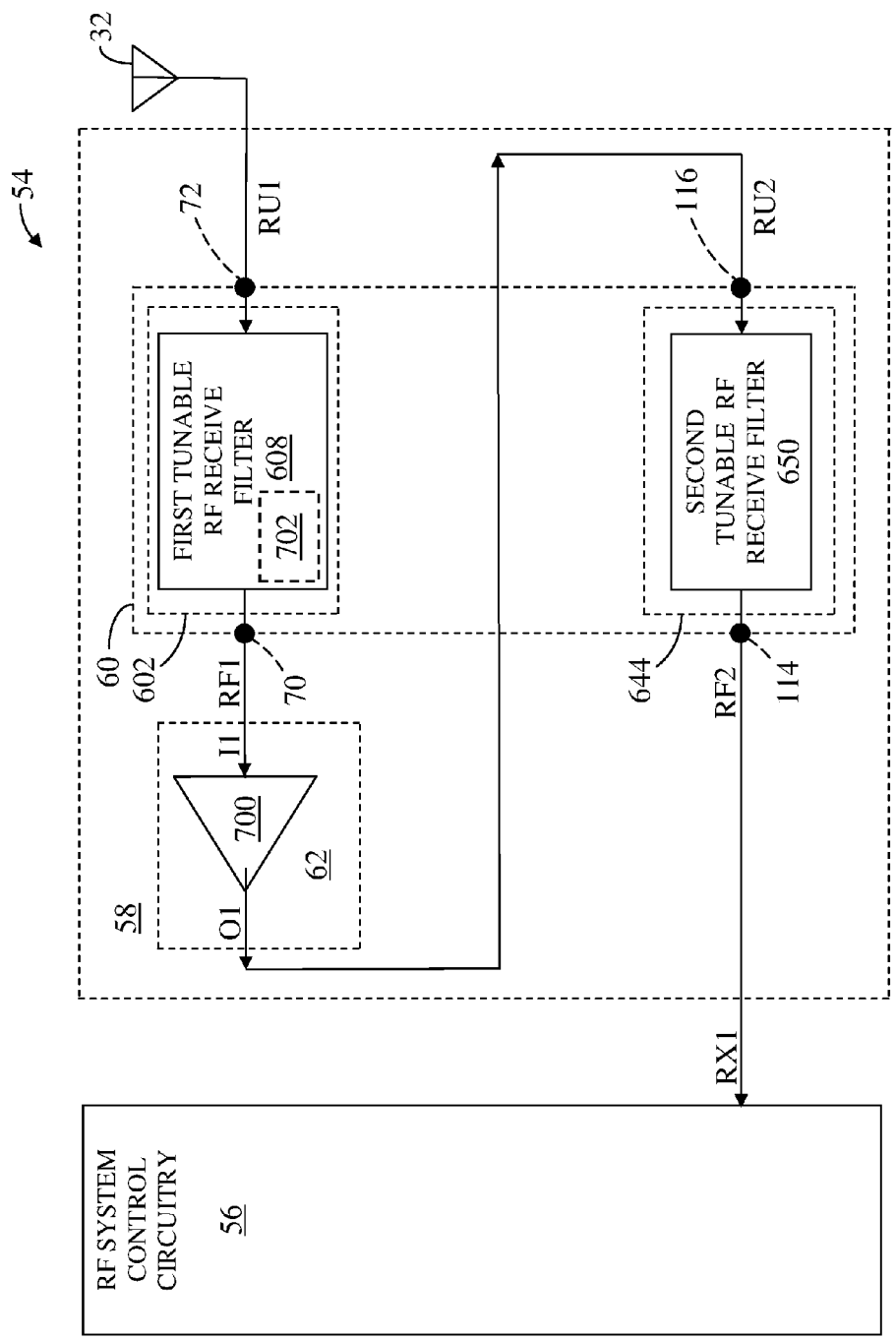
FIG. 52 shows the RF communications circuitry according to an alternate embodiment of the RF communications circuitry.

FIG. 52 shows the RF communications circuitry 54 according to an alternate embodiment of the RF communications circuitry 54. The RF communications circuitry 54 illustrated in FIG. 52 is similar to the RF communications circuitry 54 illustrated in FIG. 51, except in the RF communications circuitry 54 illustrated in FIG. 52, the first RF antenna 16 is replaced with a second RF antenna 32; the first RF filter structure 60 further includes the second tunable RF filter 644, which is the second tunable RF receive filter 650; the first RF output signal O1 is the second upstream RF receive signal RU2 instead of the first receive signal RX1; and the second filtered RF receive signal RF2 is the first receive signal RX1. The second tunable RF filter 644 receives and filters the second upstream RF receive signal RU2 to provide the second filtered RF receive signal RF2. The first RF filter structure 60 further has the third connection node 114 and the fourth connection node 116, such that the second tunable RF filter 644 is coupled between the third connection node 114 and the fourth connection node 116. The second RF antenna 32, which is a diversity antenna, provides the first upstream RF receive signal RU1.

Figure 53:
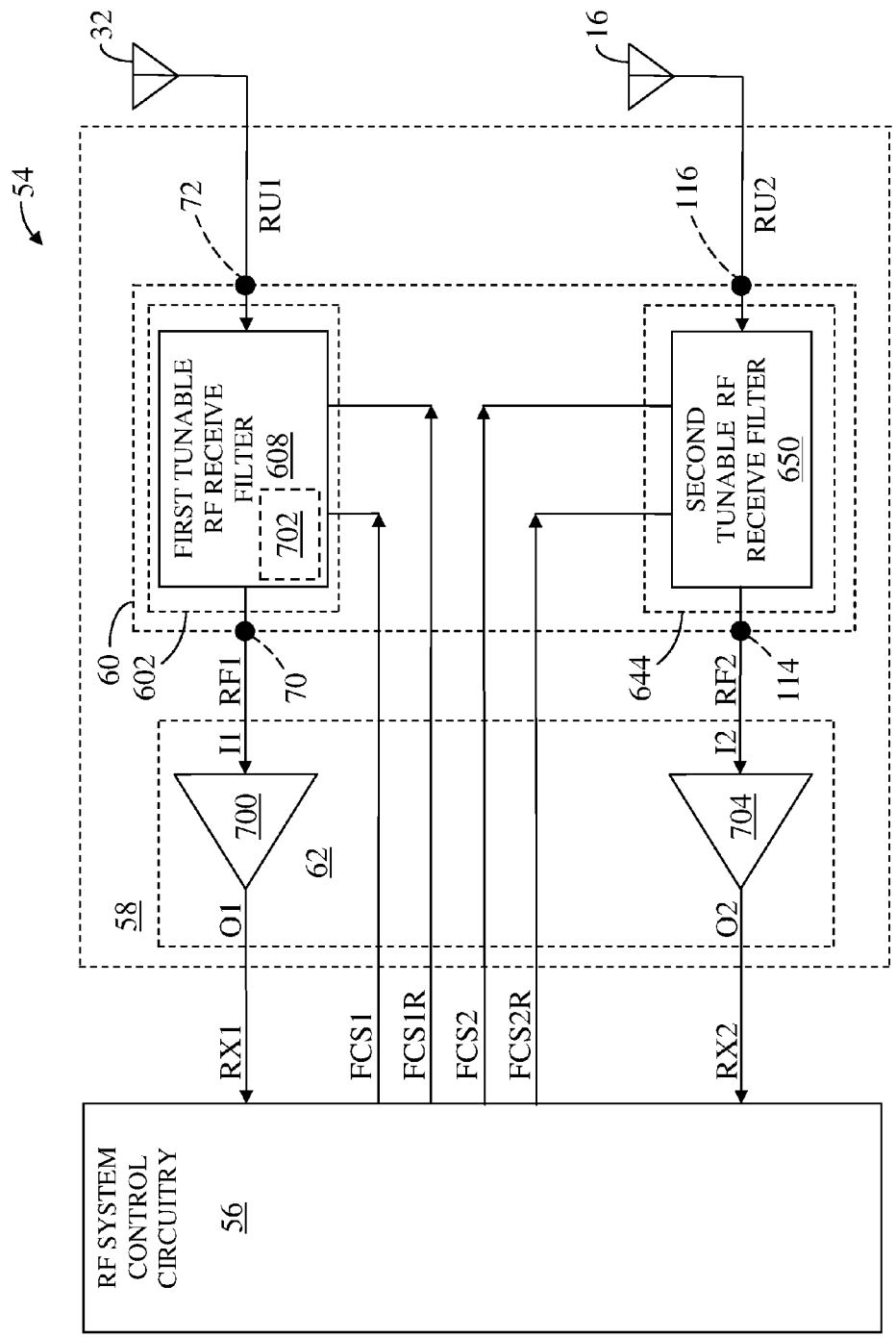
FIG. 53 shows the RF communications circuitry according to an additional embodiment of the RF communications circuitry.

FIG. 53 shows the RF communications circuitry 54 according to an additional embodiment of the RF communications circuitry 54. The RF communications circuitry 54 illustrated in FIG. 53 is similar to the RF communications circuitry 54 illustrated in FIG. 52, except the RF communications circuitry 54 illustrated in FIG. 53, further includes the first RF antenna 16, the RF receive circuitry 62 further includes a second RF LNA 704; instead of the first RF output signal O1 providing the second upstream RF receive signal RU2, the first RF antenna 16 provides the second upstream RF receive signal RU2; and instead of the second filtered RF receive signal RF2 providing the first receive signal RX1, the first RF output signal O1 provides the first receive signal RX1.

The second RF LNA 704 is coupled to the second tunable RF filter 644. Specifically, the second tunable RF filter 644 is coupled to an input of the second RF LNA 704. The second RF LNA 704 receives and amplifies a second RF input signal I2 to provide a second RF output signal O2. The second filtered RF receive signal RF2 is the second RF input signal I2 and the second RF output signal O2 is the second receive signal RX2, which is received by the RF system control circuitry 56. The first filter control signal FCS1, the first filter reconfiguration signal FCS1R, the second filter control signal FCS2, and the second filter reconfiguration signal FCS2R are shown for clarity.

In one embodiment of the RF communications circuitry 54, the first tunable RF filter 602 and the second tunable RF filter 644 simultaneously receive and filter the first upstream RF receive signal RU1 and the second upstream RF receive signal RU2, respectively, thereby providing receive carrier aggregation. One such example is in receive carrier aggregation front-ends when two or more channels are received simultaneously. Single antennas or multiple antennas may be used.

Figure 54:
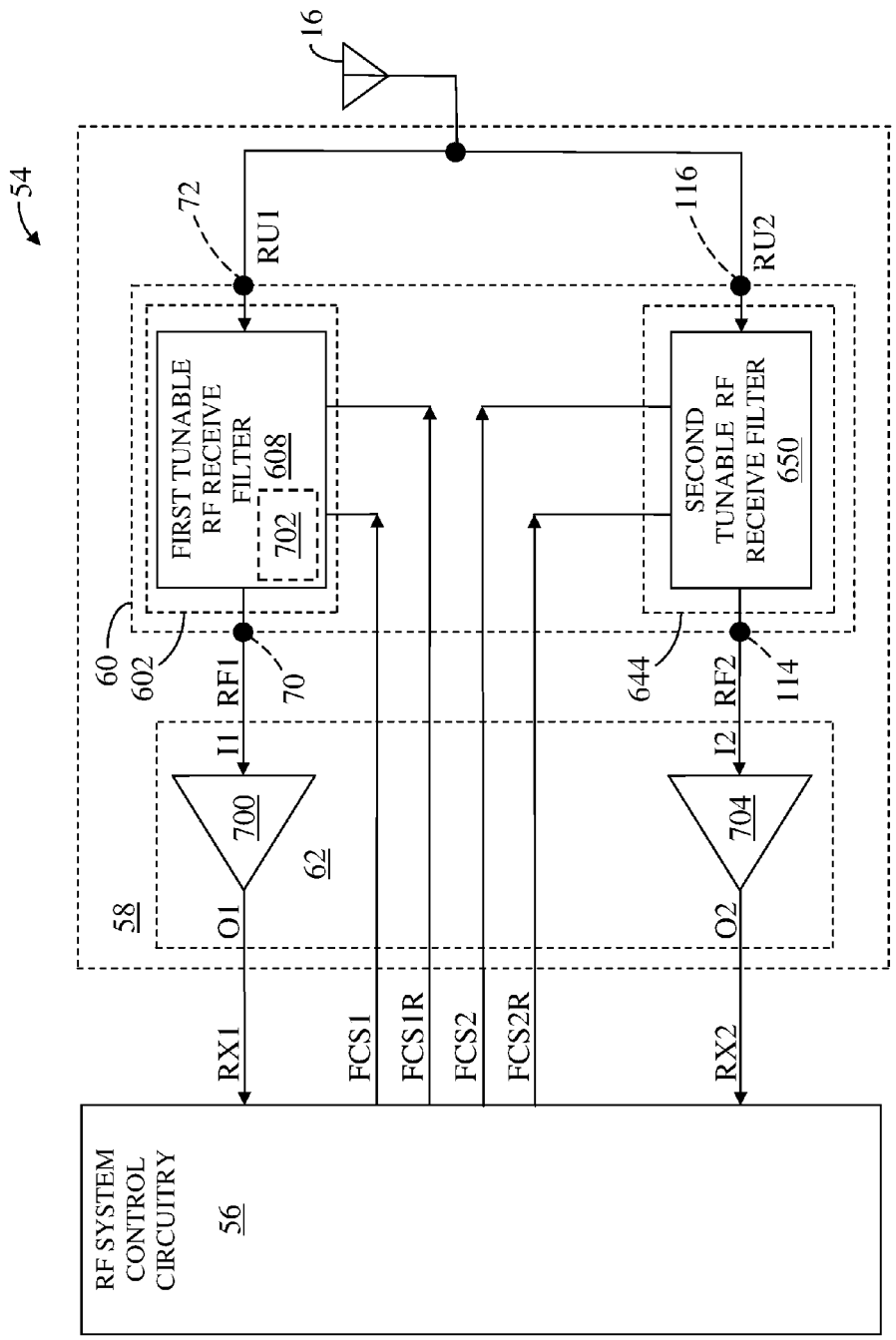
FIG. 54 shows the RF communications circuitry according to another embodiment of the RF communications circuitry.

FIG. 54 shows the RF communications circuitry 54 according to another embodiment of the RF communications circuitry 54. The RF communications circuitry 54 illustrated in FIG. 54 is similar to the RF communications circuitry 54 illustrated in FIG. 53, except in the RF communications circuitry 54 illustrated in FIG. 54, the second RF antenna 32 is omitted and the first RF antenna 16 is coupled to the second connection node 72 and the fourth connection node 116. As such, an input to the first tunable RF filter 602 is coupled to an input to the second tunable RF filter 644. Therefore, the first tunable RF filter 602 and the second tunable RF filter 644 provide direct input de-multiplexing.

Figure 55:
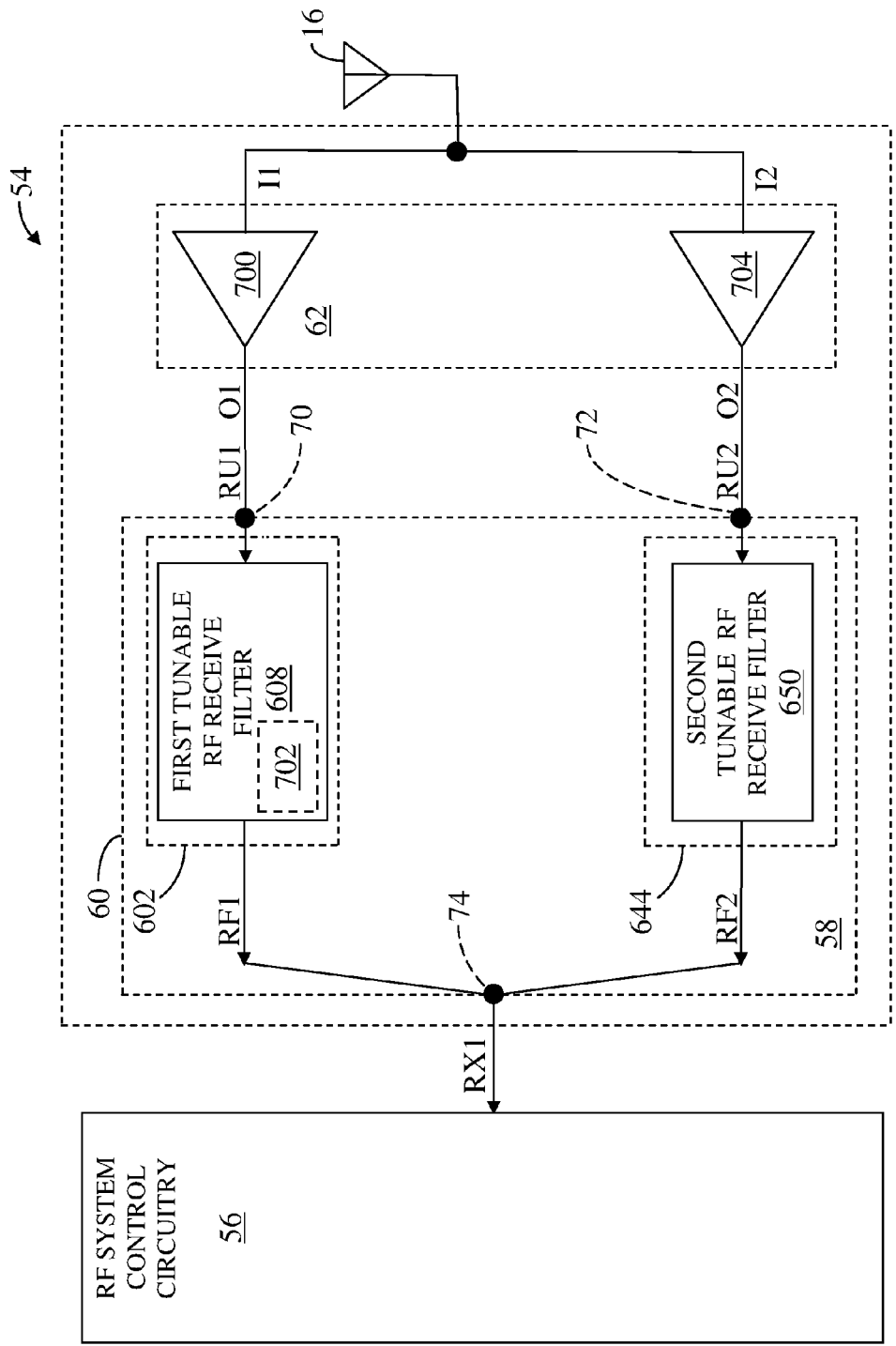
FIG. 55 shows the RF communications circuitry according to a further embodiment of the RF communications circuitry.

FIG. 55 shows the RF communications circuitry 54 according to a further embodiment of the RF communications circuitry 54. The RF communications circuitry 54 illustrated in FIG. 55 is similar to the RF communications circuitry 54 illustrated in FIG. 54, except in the RF communications circuitry 54 illustrated in FIG. 55, instead of the first tunable RF filter 602 and the second tunable RF filter 644 are coupled to the inputs of the first RF LNA 700 and the second RF LNA 704, respectively, as shown in FIG. 54; the first tunable RF filter 602 and the second tunable RF filter 644 being coupled to outputs of the first RF LNA 700 and the second RF LNA 704, respectively, as shown in FIG. 55.

As such, the first RF antenna 16 provides the first RF input signal I1 and the second RF input signal I2. The first RF output signal O1 is the first upstream RF receive signal RU1. The second RF output signal O2 is the second upstream RF receive signal RU2. An output from the first tunable RF filter 602 is coupled to an output from the second tunable RF filter 644. Therefore, either the first filtered RF receive signal RF1 or the second filtered RF receive signal RF2 provides the first receive signal RX1. As such, the first tunable RF filter 602 and the second tunable RF filter 644 provide direct output multiplexing. As a result, the RF system control circuitry 56 receives the first filtered RF receive signal RF1 and the second filtered RF receive signal RF2.

The first filter control signal FCS1, the first filter reconfiguration signal FCS1R, the second filter control signal FCS2, the second filter reconfiguration signal FCS2R, the first connection node 70, the second connection node 72, the third connection node 114 and the fourth connection node 116 are not shown for clarity.

Figure 56:
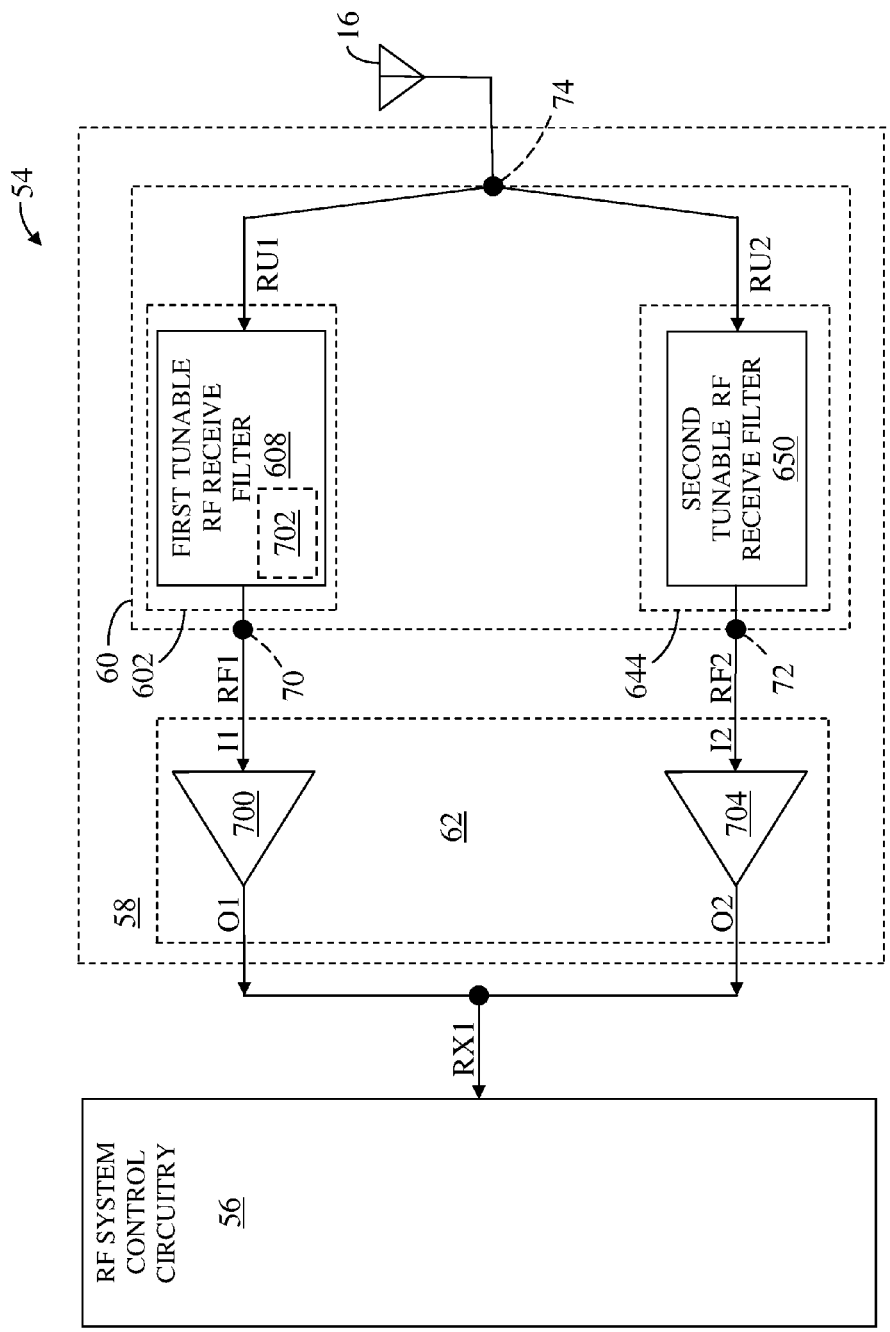
FIG. 56 shows the RF communications circuitry according to one embodiment of the RF communications circuitry.

FIG. 56 shows the RF communications circuitry 54 according to one embodiment of the RF communications circuitry 54. The RF communications circuitry 54 illustrated in FIG. 56 is similar to the RF communications circuitry 54 illustrated in FIG. 54, except in the RF communications circuitry 54 illustrated in FIG. 56, outputs from the first RF LNA 700 and the second RF LNA 704 are coupled to one another to provide the first receive signal RX1 to the RF system control circuitry 56. Additionally, the first RF filter structure 60 has the second connection node 72 and the first common connection node 74, such that the first RF antenna 16 is coupled to the first common connection node 74, the first tunable RF filter 602 is coupled between the first connection node 70 and the first common connection node 74, and the second tunable RF filter 644 is coupled between the second connection node 72 and the first common connection node 74.

Only one of the first RF LNA 700 and the second RF LNA 704 is allowed to provide the first receive signal RX1 at a time. As a result, an output from a non-selected one of the first RF LNA 700 and the second RF LNA 704 is disabled. As such, a selected one of the first RF LNA 700 and the second RF LNA 704 provides a selected one of the first RF output signal O1 and the second RF output signal O2 based on a selected one of the first filtered RF receive signal RF1 and the second filtered RF receive signal RF2. The output disablement provides output multiplexing of the first RF LNA 700 and the second RF LNA 704.

In one embodiment of the first tunable RF filter 602 and the second tunable RF filter 644, a right-side notch filter response 636 (FIG. 41B) is associated with the second RF output signal O2 and a left-side notch filter response 634 (FIG. 41B) is associated with the first RF output signal O1. The first filter control signal FCS1, the first filter reconfiguration signal FCS1R, the second filter control signal FCS2, and the second filter reconfiguration signal FCS2R are not shown for clarity. In an alternate embodiment of the first RF LNA 700 and the second RF LNA 704, the first RF LNA 700 and the second RF LNA 704 connect at different points of a single tunable RF filter, such that one filter has a left side notch and the other filter has a right side notch.

Figure 57:
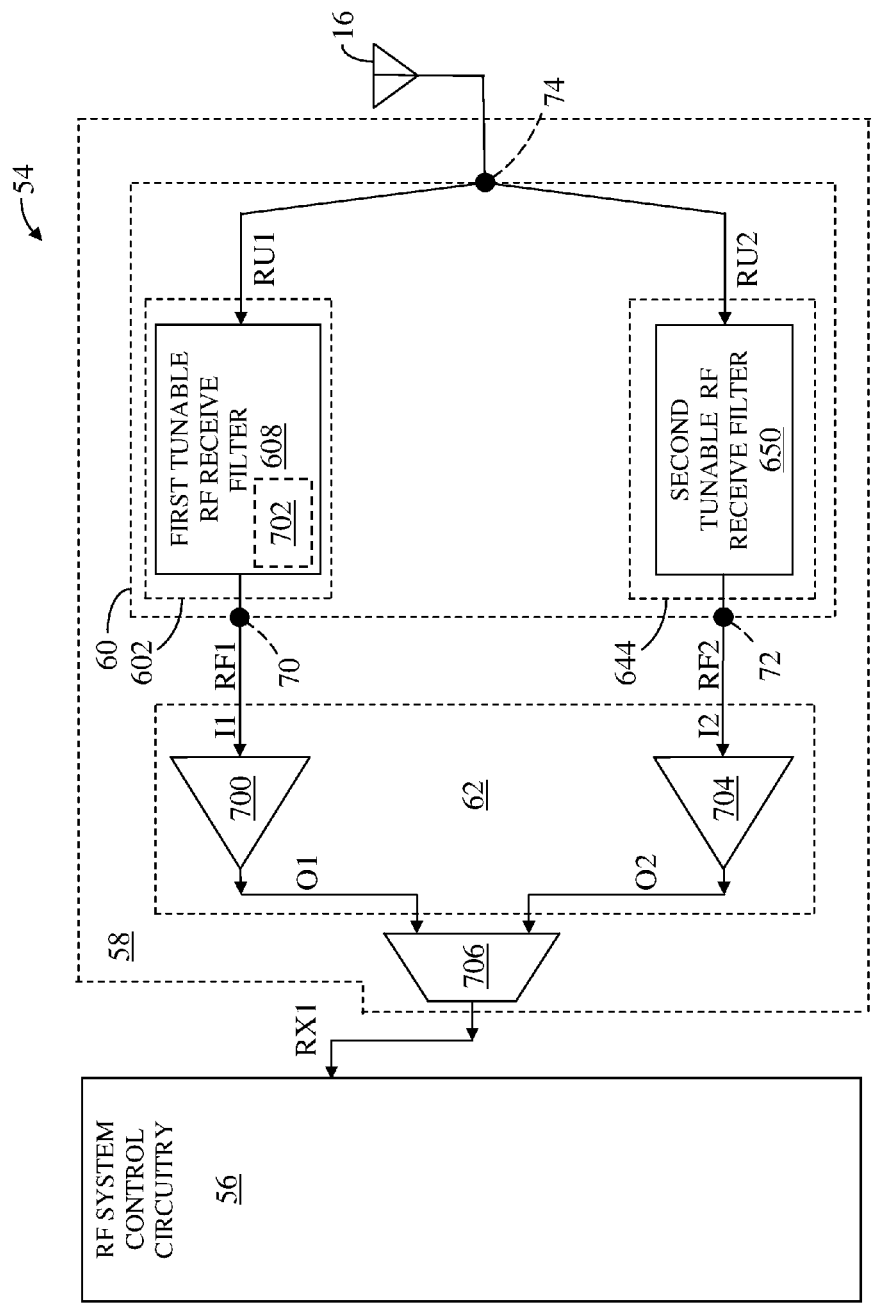
FIG. 57 shows the RF communications circuitry according to an alternate embodiment of the RF communications circuitry.

FIG. 57 shows the RF communications circuitry 54 according to an alternate embodiment of the RF communications circuitry 54. The RF communications circuitry 54 illustrated in FIG. 57 is similar to the RF communications circuitry 54 illustrated in FIG. 56, except in the RF communications circuitry 54 illustrated in FIG. 57, the RF front-end circuitry 58 further includes a multiplexer 706, which receive the first RF output signal O1 and the second RF output signal O2, and provides the first receive signal RX1 based on a selected one of the first RF output signal O1 and the second RF output signal O2, wherein the selected one of the first RF output signal O1 and the second RF output signal O2 is based on a selected one of the first filtered RF receive signal RF1 and the second filtered RF receive signal RF2.

Figure 58:
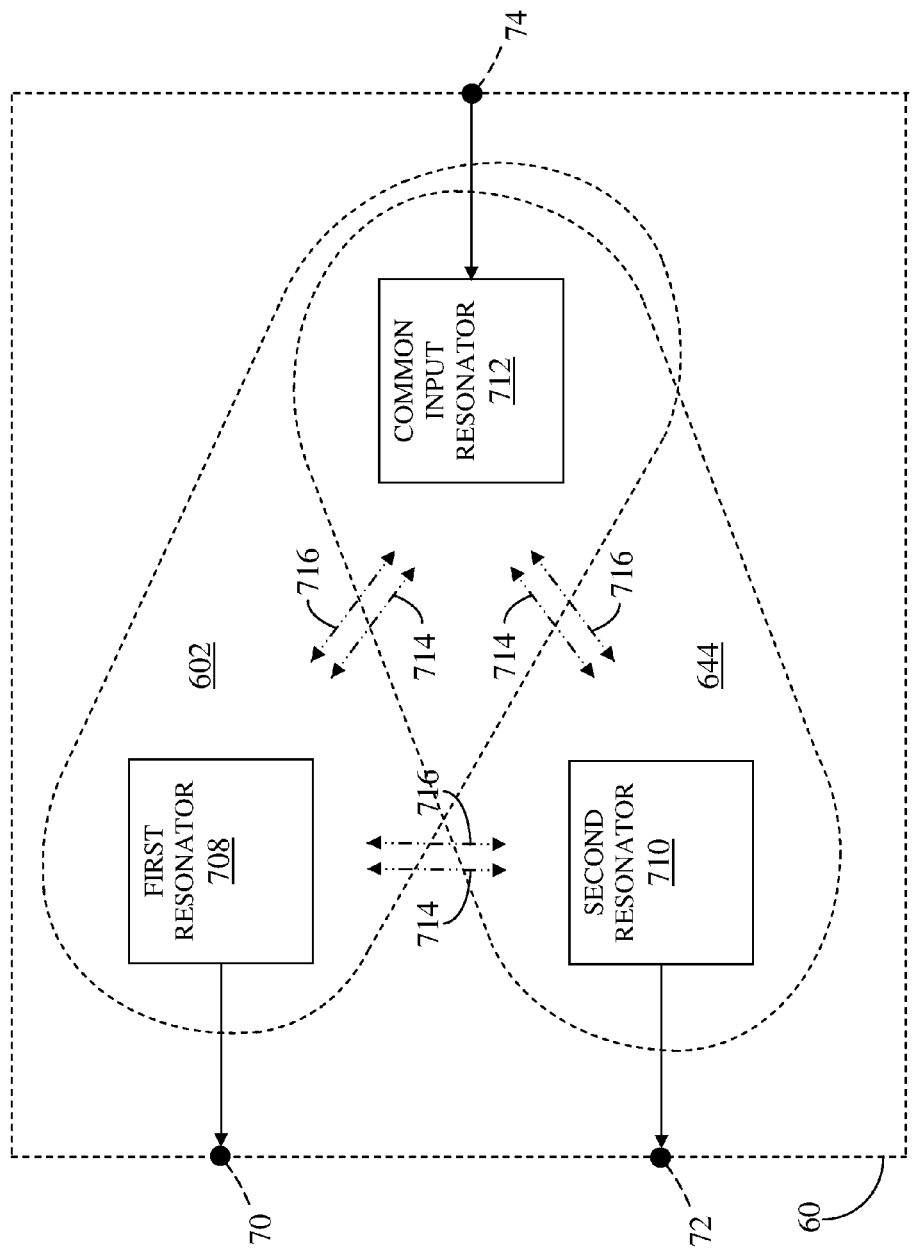
FIG. 58 shows details of a first RF filter structure illustrated in FIG. 56 according to one embodiment of the first RF filter structure.

FIG. 58 shows details of the first RF filter structure 60 illustrated in FIG. 56 according to one embodiment of the first RF filter structure 60. The first RF filter structure 60 has the first connection node 70, the second connection node 72, and the first common connection node 74. Additionally, the first RF filter structure 60 includes a first resonator 708, a second resonator 710, and a common input resonator 712.

The first resonator 708 is electrically connected to the first connection node 70. The second resonator 710 is electrically connected to the second connection node 72 and the common input resonator 712 is electrically connected to the first common connection node 74. In alternate embodiments of the first RF filter structure 60, any or all of the first resonator 708, the second resonator 710, and the common input resonator 712 may be magnetically coupled to their respective connection nodes 70, 72, 74 instead of being electrically connected to respective connection nodes 70, 72, 74.

The first tunable RF filter 602 includes the first resonator 708, the second tunable RF filter 644 includes the second resonator 710, and the first tunable RF filter 602 and the second tunable RF filter 644 share the common input resonator 712. There is magnetic coupling 714 and electric coupling 716 between the first resonator 708 and the second resonator 710. There is magnetic coupling 714 and electric coupling 716 between the first resonator 708 and the common input resonator 712. There is magnetic coupling 714 and electric coupling 716 between the second resonator 710 and the common input resonator 712. By creating imbalances between the magnetic coupling 714 and the electric coupling 716, different frequency responses may be obtained, such as the left-side notch filter response 634 (FIG. 41B) or the right-side notch filter response 636 (FIG. 41B). If the magnetic coupling 714 is positive and the electric coupling 716 is negative, when the magnetic coupling 714 is larger than the electric coupling 716, a total positive coupling results. Conversely, when the electric coupling 716 is larger than the magnetic coupling 714, a total negative coupling results. As such, the first tunable RF filter 602 and the second tunable RF filter 644 provide direct input de-multiplexing.

In one embodiment of the first RF filter structure 60, the electric coupling 716 is completely eliminated, such that only the magnetic coupling 714 is present between the resonators 708, 710, 712. As such, the first resonator 708 is magnetically coupled to the second resonator 710, the first resonator 708 is magnetically coupled to the common input resonator 712, and the second resonator 710 is magnetically coupled to the common input resonator 712. In one embodiment of the first resonator 708, the second resonator 710 and the common input resonator 712, any or all the first resonator 708, the second resonator 710 and the common input resonator 712 have switching elements coupled to ground. By enabling one or more of these switching elements a notch filter can be switched from a left side notch to a right side notch, and vice versa.

In this regard, the first resonator 708 is coupled between the common input resonator 712 and the first RF LNA 700 (FIG. 56), and the second resonator 710 is coupled between the common input resonator 712 and the second RF LNA 704 (FIG. 56).

Figure 59:
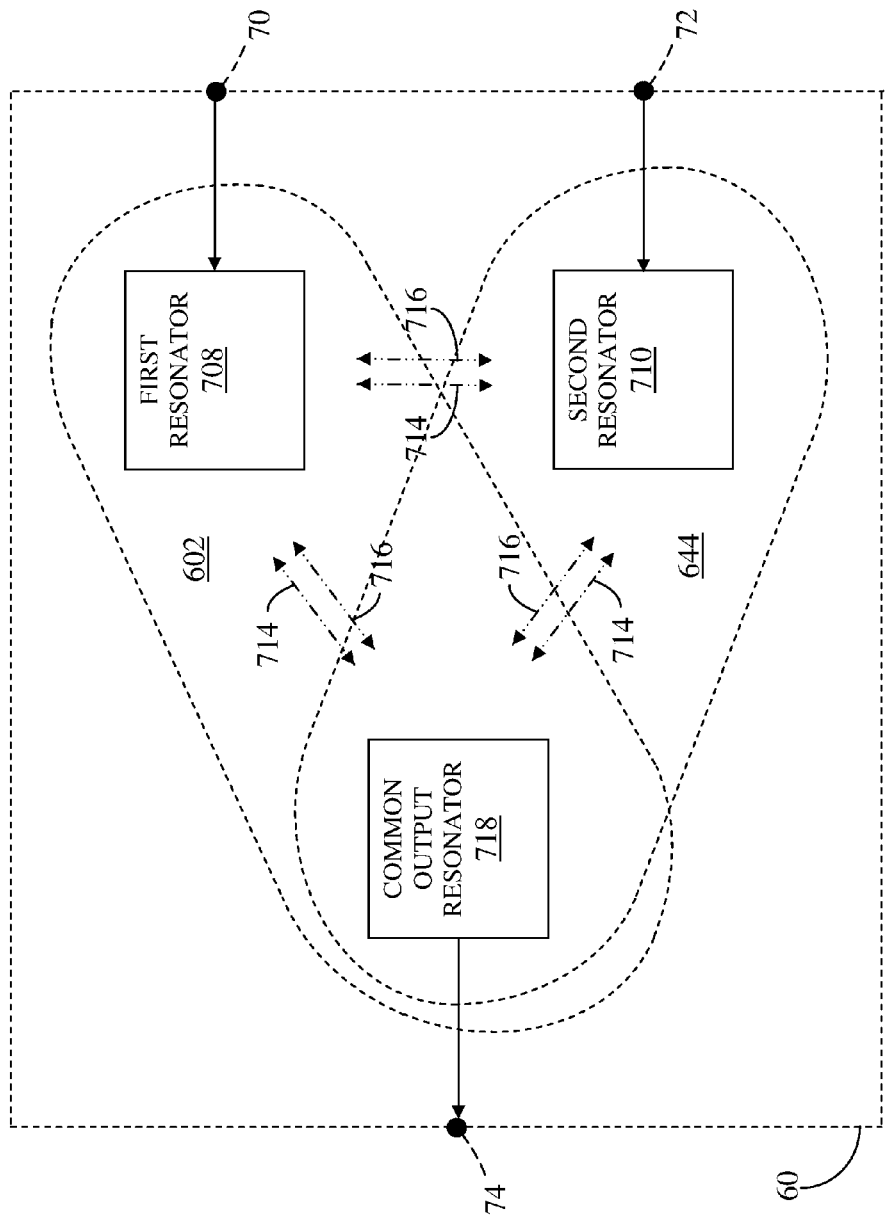
FIG. 59 shows details of the first RF filter structure illustrated in FIG. 55 according to an alternate embodiment of the first RF filter structure.

FIG. 59 shows details of the first RF filter structure 60 illustrated in FIG. 55 according to an alternate embodiment of the first RF filter structure 60. The first RF filter structure 60 has the first connection node 70, the second connection node 72, and the first common connection node 74. Additionally, the first RF filter structure 60 includes the first resonator 708, the second resonator 710, and a common output resonator 718.

The first resonator 708 is electrically connected to the first connection node 70. The second resonator 710 is electrically connected to the second connection node 72 and the common output resonator 718 is electrically connected to the first common connection node 74. In alternate embodiments of the first RF filter structure 60, any or all of the first resonator 708, the second resonator 710, and the common output resonator 718 may be electrostatically coupled to their respective connection nodes 70, 72, 74 instead of being electrically connected to respective connection nodes 70, 72, 74.

The first tunable RF filter 602 includes the first resonator 708, the second tunable RF filter 644 includes the second resonator 710, and the first tunable RF filter 602 and the second tunable RF filter 644 share the common output resonator 718. There is magnetic coupling 714 and electric coupling 716 between the first resonator 708 and the second resonator 710. There is magnetic coupling 714 and electric coupling 716 between the first resonator 708 and the common output resonator 718. There is magnetic coupling 714 and electric coupling 716 between the second resonator 710 and the common output resonator 718. By creating imbalances between the magnetic coupling 714 and the electric coupling 716, different signs, positive or negative, can be created for the total overall coupling, such that different frequency responses may be obtained, such as the left-side notch filter response 634 (FIG. 41B) or the right-side notch filter response 636 (FIG. 41B). As such, the first tunable RF filter 602 and the second tunable RF filter 644 provide direct output multiplexing.

In one embodiment of the first RF filter structure 60, the electric coupling 716 is completely eliminated, such that only the magnetic coupling 714 is present between the resonators 708, 710, 718. As such, the first resonator 708 is magnetically coupled to the second resonator 710, the first resonator 708 is magnetically coupled to the common output resonator 718, and the second resonator 710 is magnetically coupled to the common output resonator 718.

Figure 60A:
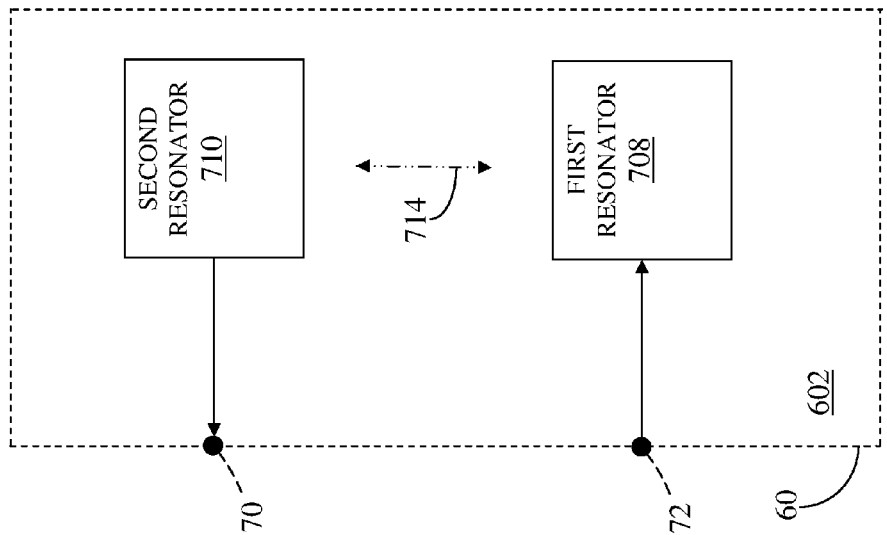
FIG. 60A shows details of the first RF filter structure illustrated in FIG. 51 according to an additional embodiment of the first RF filter structure.

FIG. 60A shows details of the first RF filter structure 60 illustrated in FIG. 51 according to an additional embodiment of the first RF filter structure 60. The first RF filter structure 60 includes the first tunable RF filter 602, which includes the first resonator 708 and the second resonator 710. There is both magnetic coupling 714 and electric coupling 716 between the first resonator 708 and the second resonator 710. As such, the first resonator 708 receives the first upstream RF receive signal RU1 (FIG. 51) via the second connection node 72 and the second resonator 710 provides the first filtered RF receive signal RF1 (FIG. 51) via the first connection node 70.

Figure 60B:
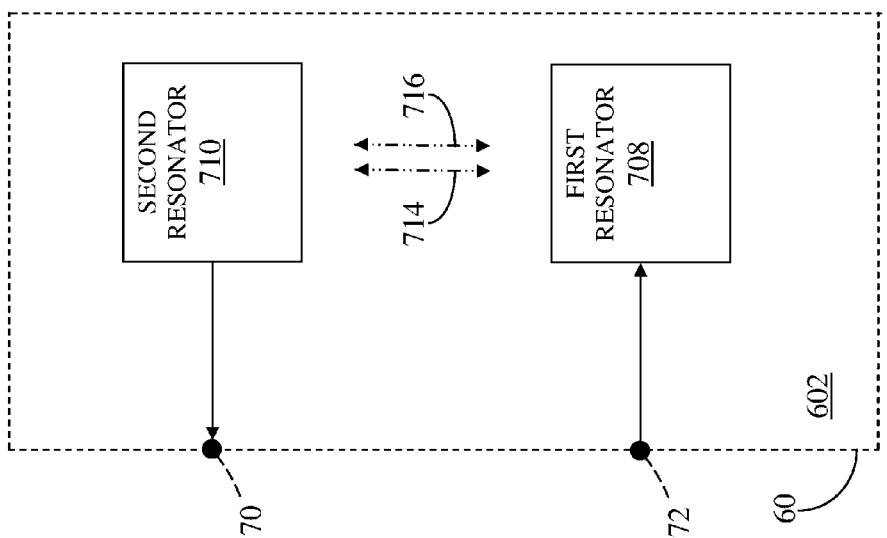
FIG. 60B shows details of the first RF filter structure illustrated in FIG. 51 according to another embodiment of the first RF filter structure.

FIG. 60B shows details of the first RF filter structure 60 illustrated in FIG. 51 according to another embodiment of the first RF filter structure 60. The first RF filter structure 60 illustrated in FIG. 60B is similar to the first RF filter structure 60 illustrated in FIG. 60A, except the first RF filter structure 60 illustrated in FIG. 60B includes only the magnetic coupling 714 between the first resonator 708 and the second resonator 710, and excludes the electric coupling 716 (FIG. 60A). In one embodiment, the first resonator 708 is a single-ended resonator and the second resonator 710 is a differential resonator. By using only the magnetic coupling 714, the translation between differential and single-ended is simpler. This may be very useful in pseudo-differential amplifier architectures since the common mode gain is very small. It can also help in cases when feed-forward paths in the filter introduce a significant common mode signal.

Figure 61:
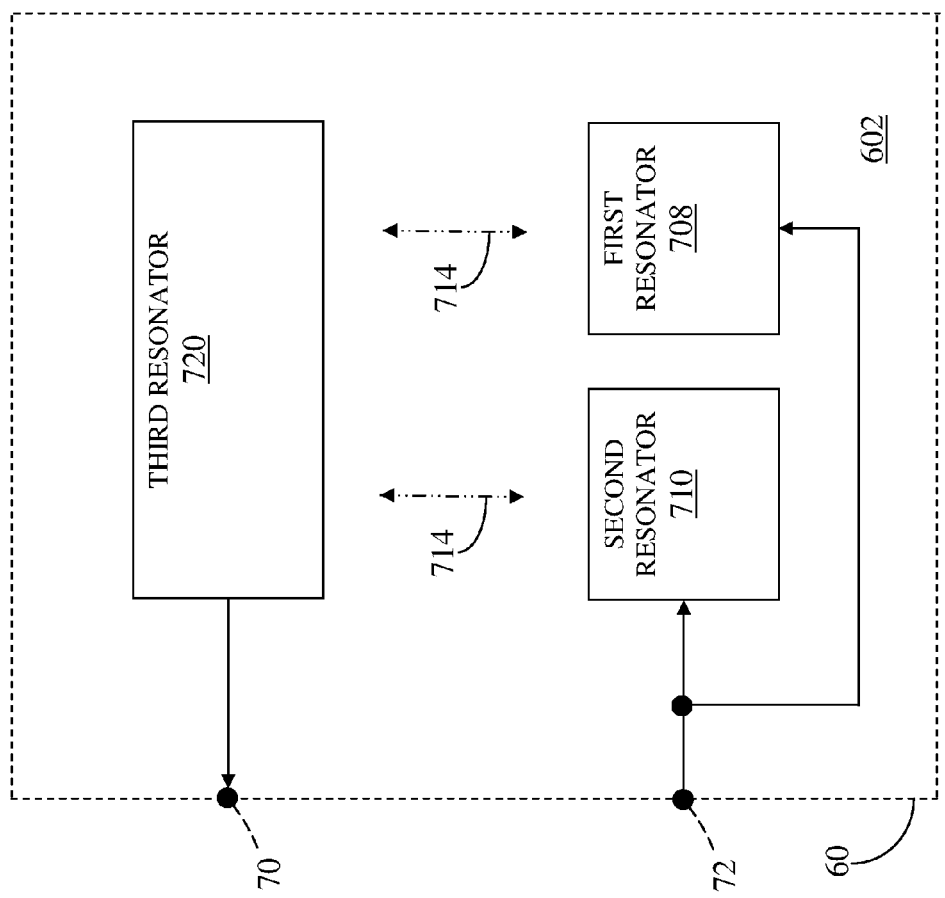
FIG. 61 shows details of the first RF filter structure illustrated in FIG. 51 according to a further embodiment of the first RF filter structure.

FIG. 61 shows details of the first RF filter structure 60 illustrated in FIG. 51 according to a further embodiment of the first RF filter structure 60. The first RF filter structure 60 includes the first tunable RF filter 602, which includes the first resonator 708, the second resonator 710, and a third resonator 720. There is magnetic coupling 714 between the first resonator 708 and the third resonator 720. Additionally, there is magnetic coupling 714 between the second resonator 710 and the third resonator 720. As such, the first resonator 708 receives the first upstream RF receive signal RU1 (FIG. 51) and the second resonator 710 provides the first filtered RF receive signal RF1 (FIG. 51). Both the first resonator 708 and the second resonator 710 receive the first upstream RF receive signal RU1 (FIG. 51) via the second connection node 72.

The third resonator 720 provides the first filtered RF receive signal RF1 (FIG. 51) via the first connection node 70. In one embodiment of the first RF filter structure 60, there is no electric coupling 716 (FIG. 60A) between the first resonator 708 and the third resonator 720 and there is no electrostatic coupling 716 (FIG. 60A). Both the first resonator 708 and the second resonator 710 are single-ended resonators. The third resonator 720 is a differential resonator.

Those skilled in the art will recognize improvements and modifications to the preferred embodiments of the present disclosure. All such improvements and modifications are considered within the scope of the concepts disclosed herein and the claims that follow.

What is claimed is:
1. An apparatus comprising:
   a first tunable RF filter configured to receive and filter a first upstream RF signal to provide a first filtered RF signal, wherein a frequency response of the first tunable RF filter is tunable in response to a control signal; and a first RF low noise amplifier (LNA) coupled to the first tunable RF filter and configured to receive and amplify a first RF input signal to provide a first RF output signal, wherein the first tunable RF filter comprises a first resonator and a second resonator, such that the first resonator and the second resonator are magnetically coupled to one another; the first resonator is a single-ended resonator, which is configured to receive the first upstream RF signal; and the second resonator is a differential resonator, which is configured to provide the first filtered RF signal.

2. The apparatus of claim 1 wherein the first RF LNA comprises a field effect transistor (FET) configured to receive and amplify the first RF input signal.

3. The apparatus of claim 1 wherein the first tunable RF filter is further configured to provide at least a partial impedance match to the first RF LNA.

4. The apparatus of claim 1 wherein the first RF LNA is further configured to have an input noise voltage and the first tunable RF filter is further configured to provide at least a partial noise impedance match to the first RF LNA.

5. The apparatus of claim 1 wherein the first tunable RF filter is further configured to simultaneously provide at least a partial impedance match to the first RF LNA and at least a partial noise impedance match to the first RF LNA.

6. The apparatus of claim 1 wherein the first tunable RF filter is coupled to an input of the first RF LNA.

7. The apparatus of claim 1 wherein the first tunable RF filter is further configured to transform an input impedance to the first tunable RF filter to an output impedance from the first tunable RF filter.

8. The apparatus of claim 7 wherein the output impedance is greater than the input impedance, such that the first tunable RF filter is further configured to provide voltage gain.

9. The apparatus of claim 7 wherein the input impedance is on the order of 50 ohms.

10. The apparatus of claim 7 wherein the output impedance is on the order of a noise impedance of the first RF LNA.

11. The apparatus of claim 7 further comprising control circuitry configured to estimate a voltage standing wave ration (VSWR) of the apparatus and adjust the input impedance based on the VSWR.

12. The apparatus of claim 1 further comprising control circuitry configured to receive the first filtered RF signal.

13. The apparatus of claim 1 further comprising control circuitry and configured to transmit an RF transmit signal, which is an interference signal, wherein the control circuitry is configured to monitor current consumption of the first RF LNA and add a notch filter response to the first tunable RF filter if the current consumption exceeds a current threshold, such that a notch frequency of the notch filter response is about equal to a frequency of the RF transmit signal.

14. The apparatus of claim 1 further comprising a second tunable RF filter configured to receive and filter a second upstream RF signal to provide a second filtered RF signal, wherein the first filtered RF signal is the first RF input signal and the first RF output signal is the second upstream RF signal.

15. The apparatus of claim 1 wherein a main antenna is configured to provide the first upstream RF signal.

16. The apparatus of claim 1 wherein a diversity antenna is configured to provide the first upstream RF signal.

17. The apparatus of claim 1 further comprising:
a first RF filter structure comprising the first tunable RF filter and a second tunable RF filter, wherein the second tunable RF filter is configured to receive and filter a second upstream RF signal to provide a second filtered RF signal; and
a second RF LNA coupled to the second tunable RF filter and configured to receive and amplify a second RF input signal to provide a second RF output signal.

18. The apparatus of claim 17 wherein an output from the first tunable RF filter is coupled to an output from the second tunable RF filter, the first RF output signal is the first upstream RF signal, the second RF output signal is the second upstream RF signal, and the first tunable RF filter and the second tunable RF filter provide direct output multiplexing.

19. The apparatus of claim 17 wherein the first tunable RF filter and the second tunable RF filter are configured to simultaneously receive and filter the first upstream RF signal and the second upstream RF signal, respectively, thereby providing receive carrier aggregation.

20. The apparatus of claim 1 wherein the first tunable RF filter further comprises a third resonator, which is magnetically coupled to the second resonator; the first resonator and the third resonator are not electrically coupled to the second resonator; and the third resonator is a single-ended resonator, which is configured to receive the first upstream RF signal.

* * * * *